(12) United States Patent
Lu et al.

(10) Patent No.: US 11,942,920 B2
(45) Date of Patent: *Mar. 26, 2024

(54) LOW-LOSS AND WIDE-BAND ACOUSTIC DELAY LINES USING X-CUT AND Y-CUT LITHIUM NIOBATE PIEZOELECTRIC THIN FILMS

(71) Applicant: Board of Trustees of the University of Illinois, Urbana, IL (US)

(72) Inventors: Ruochen Lu, Champaign, IL (US); Tomas Manzaneque Garcia, Voorburg (NL); Yansong Yang, Urbana, IL (US); Songbin Gong, Champaign, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 723 days.

This patent is subject to a terminal disclaimer.

(21) Appl. No.: 17/073,059

(22) Filed: Oct. 16, 2020

(65) Prior Publication Data
US 2021/0119606 A1    Apr. 22, 2021

Related U.S. Application Data

(60) Provisional application No. 62/923,213, filed on Oct. 18, 2019.

(51) Int. Cl.
*H03H 9/02*    (2006.01)
*H03H 9/145*   (2006.01)
(Continued)

(52) U.S. Cl.
CPC .... *H03H 9/02228* (2013.01); *H03H 9/02543* (2013.01); *H03H 9/02559* (2013.01);
(Continued)

(58) Field of Classification Search
CPC ...... H03H 9/02842; H03H 9/145; H03H 9/25; H03H 3/02; H03H 9/175; H03H 9/02543;
(Continued)

(56) References Cited

U.S. PATENT DOCUMENTS

| 5,532,538 A | 7/1996 | Jin |
| 6,924,715 B2 | 8/2005 | Beaudin et al. |

(Continued)

FOREIGN PATENT DOCUMENTS

| CN | 101742738 | 6/2010 |
| JP | 6193035 B2 | 9/2017 |
| JP | 2017216705 A | 12/2017 |

OTHER PUBLICATIONS

Parkvall, S et al., "NR: The new 5G Radio Access Technology," IEEE Commun. Stand. Mag., vol. 1, No. 4, pp. 24-30, 2017.
(Continued)

*Primary Examiner* — Daniel L Murphy
*Assistant Examiner* — Amie M Ndure
(74) *Attorney, Agent, or Firm* — Lowenstein Sandler LLP

(57) ABSTRACT

A piezoelectric thin film (PTF) is located above a carrier substrate. The PTF may be X-cut $LiNbO_3$ thin film adapted to propagate an acoustic wave in at least one of a first mode excited by an electric field oriented in a longitudinal direction along a length of the PTF or a second mode excited by the electric field oriented at least partially in a thickness direction of the PTF. A first interdigitated transducer (IDT) is disposed on a first end of the PTF. The first IDT is to convert a first electromagnetic signal, traveling in the longitudinal direction, into the acoustic wave. A second IDT is disposed on a second end of the PTF with a gap between the second IDT and the first IDT. The second IDT is to convert the acoustic wave into a second electromagnetic signal.

25 Claims, 54 Drawing Sheets

(51) Int. Cl.
  *H03H 9/25* (2006.01)
  *H03H 9/72* (2006.01)
  *H04L 5/14* (2006.01)
(52) U.S. Cl.
  CPC .... *H03H 9/02574* (2013.01); *H03H 9/02637* (2013.01); *H03H 9/02842* (2013.01); *H03H 9/145* (2013.01); *H03H 9/14505* (2013.01); *H03H 9/14511* (2013.01); *H03H 9/25* (2013.01); *H03H 9/725* (2013.01); *H04L 5/1461* (2013.01)
(58) Field of Classification Search
  CPC ............... H03H 9/706; H03H 9/02015; H03H 9/02228; H03H 9/725; H03H 9/02637; H03H 9/36; H03H 9/02559; H03H 9/14511; H03H 9/02574; H03H 9/14505; H03H 2003/0232; H04L 5/1461
  See application file for complete search history.

(56) References Cited

U.S. PATENT DOCUMENTS

| | | | |
|---|---|---|---|
| 6,963,257 B2 | 11/2005 | Ella et al. | |
| 7,173,360 B2 | 2/2007 | Hartmann | |
| 10,261,078 B2 | 4/2019 | Branch | |
| 11,165,406 B2 | 11/2021 | Lin | |
| 11,621,689 B2 * | 4/2023 | Lu | H03H 9/36 333/193 |
| 2015/0078217 A1 | 3/2015 | Choi | |
| 2020/0106420 A1 | 4/2020 | Kodama | |

OTHER PUBLICATIONS

Pijolat, M. et al., "Large Qxf Product for HBAR using Smart Cut™ Transfer of LiNbO 3 Thin Layers onto LiNbO 3 Substrate," in Ultrasonics Symposium, 2008, IUS 2008, IEEE, 2008, pp. 201-204.
Plessky, V. et al., "5 GHZ Laterally-Excited Bulk-wave Resonators (XBARs) Based on thin Platelets of Lithium Niobate," Electron. Lett. vol. 55, No. 2, pp. 98-100, 2018.
Pohl, A., "A Review of Wireless SAW Sensors," IEEE Trans. Ultrason., Ferroelectr., Freq. Control, vol. 47, No. 2, pp. 317-332, Mar. 2000.
Popovski, P. et al., "5G Wireless Network Slicing eMBB, URLLC, and mMTC: A Communication-Theoretic View," IEEE Access, vo.. 6, pp. 55765-55779, 2018.
Reible, S.A. et al., "Convolvers for DPSK Demodulation of Spread Spectrum Signals," 1976 Ultrasonics Symposium, 1976, pp. 451-455.
Reindl, L, et al., "Design Fabrication, and Application of Precise SAW Delay Lines Used in a FMCW Radar System," EEE Trans. Microw. Theory Tech., vol. 49, No. 4, pp. 787-794, Apr. 2001.
Rosenfeld, R.C. et al., "Unidirectional Acoustic Surface Wave Filters with 2 dB Insertion Loss," in 1974 Ultrasonics Symposium, 1974, pp. 425-428.
Ruby, R. et al., "Acoustic FBAR for Filters, Duplexers, and Front-End Modules," Microwave Symposium Digest, 2004, IEEE MTT-S International, 2004, vol. 2, pp. 931-934.
Ruby, R., "A Snapshot in Time: The Future in Filters for Cell Phones," IEEE Microw. Mag., vol. 16, No. 7, pp. 46-59, 2015.
Ruby, R.C., et al. Thin Film Bulk Wave Acoustic Resonators (FBAR) for Wireless Applications, in 2001 IEEE Ultrasonic Symposium, Proceedings, An International Symposium (Cat No. 01CH37263), Oct. 2001, vol. 1, pp. 813-821.
Sarabalis, C.J. et al., "The Role of Resonance and Bandgaps in High Keff2 Transducers," arXiv Prepr. arXiv1904.04981, 2019.
Scherr, H. et al., "Quartz Pressure Sensor Based on SAW Reflective Deay Line," IUS 1996, pp. 347-350.

Shreve, W.R., et al., "Reduced Insertion-Loss Broadband SAW Delay Lines", in IEEE 1987 Ultrasonics Symposium, 1987, pp. 155-160.
Siddiqui, A. et al., "Lamb Wave Focusing Transducer for Efficient Coupling ot Wavelength-Scale Structures in Thin Piezoelectric Films," J. Microelectromech. Syst., vol. 27, No. 6, pp. 1054-1070, Dec. 2018.
Smith, W.R. et al., "Analysis and Design of Dispersive Interdigital Surface-Wave Transducers," IEEE Trans. Microw Theory Tech., vol. 20, No. 7, pp. 458-471, 1972.
Song, Y.H. et al., "Analysis and Removal of Spurious Response in SH0 Lithium Niobate MEMS Resonators," IEEE Trans., Electron Devices, vol. 63, No. 5, pp. 2066-2073. May 2016.
Song, Y.H. et al., "Eliminations of Spurious Modes in SH0 Lithium Niobate Laterally Vibrating Resonators," IEEE Electron Devices Lett., vol. 36, No. 11, pp. 1198-1201, 2015.
Sotnikov, A.V. et al., "Elastic and Piezoelectric Properties of AlN and LiAIO2 Signle Cyrstals," IEEE Trans. Ultrason., Ferreolectr. Freq. Control, vol. 57, No. 4, pp. 808-811, Apr. 2010.
Takai, T. et al., "High-Performance SAW Resonator on New Multilayered Substrate Using LiTaO 3 Crystal," IEEE Trans.. Ultrason. Ferroelectr. Freq. Control, vol. 64, No. 9, pp. 1382-1389, Sep. 2017.
Tancrell, R.H. et al., "Acoustic Surface Wave Filters," Proc. IEEE, vol. 59, No. 3, pp. 393-409, Jan. 1971.
Uehara, K. et al., "Fabrication of 5-GHz-Band SAW Filter with Atomically-Flat-Surface AlN on Sapphire," in IEEE Ultrasonics Symposium, 2004, 2004, vol. 1, pp. 203-206.
Vecchi, F. et al., "Deisgn of Low-Loss Transmission Lines in Scaled CMOS by Accurate Electromagnetic Simulations," IEEE J. Solid-State Circuits, vol. 44, No. 9, pp. 2605-2615, Sep. 2009.
Ventura et al., "A new concept in SPUDT Design: The RSPUDT (resonant SPUDT)," in Proceeding of IEEE Ultrasonics Symposium ULTSYM-94, 1994, vol. 1, pp. 1-6.
Vidal-Alvarez, G. et al., "Delay Lines Based on a Suspended Thin Film of X-Cut Lithium Niobate," in Ultrasonics Symposium (IUS), 2017 IEEE 2017.
Wang, L. et al., "Group Velocity and Characteristic Wave Curves of Lamb waves in Composites: Modeling and Experiments," Comps. Sci. Technol. vol. 67, No. 7-8, pp. 1370-1384, 2007.
Wang, R. et al., "Design and Fabrication of S0 Lamb-Wave Thin-Film Lithium Niobate Micromechanical Resonators," J. Microelectromech. Syst., vol. 24, No. 2, pp. 300-308, Apr. 2015.
Wang, R. et al., "Multi-Frequency LiNbO3 Lamb Wave Resonators with <3Ω Impedance," in Proc. IEEE 29th Int. Conf. Micro Eelctro Mech. Syst. (MEMS), Jan. 2016, pp. 679-682.
Wang, R. et al., "Thin-Film Lithium Niobate Contour-Mode Resonators," in Proc. IEEE Int. Ultrason. Symp., Oct. 2012, op. 303-306.
Warder, P. et al., "Golden Age for Filter Design: Innovative and Proven Approaches for Acoustic Filter, Duplexer, and Multiplexer Design," IEEE Mircow. Mag., vol. 16, No. 7, pp. 60-72, 2015.
Warner, A.W. et al., Determination of Elastic and Piezoeletric Constants for Crystals in Class (3 m), J. Accounts. Soc. Am, vol. 42, No. 6, pp. 1223-1231, 1967.
Weigel, R. et al., "Microwave Acoustic Materials, Devices, and Applications," IEEE Trans Microw. Theory Tech., vol. 50, No. 3, pp. 738-749, Mar. 2002.
Weis, R.S. et al., "Lithium Niobate Summary of Physical Properties and Crystal Structure," Appl. Physs. A, vol. 37, No. 4, pp. 191-203, 1985.
Weisstein, E.W., "Exponential Sum Formulas," [Online], Avaible: http://mathworld.wolfram.com/ExponentialSumFormulas.html.
Wright, P.V., "The Natural Single-Phase Unidirectional Transducer: A New Low-Loss WAS Transducer," in IEEE 1985 Ultrasonics Symposium, 1985, pp. 58-63.
Wu, X. et al., "The Power Delay Profile of the Single-Antenna, Full-Duplex Self-Interference Channel in Indoor Environments at 2.6 Ghz," IEEE Antennas Wireless Progag. Lett., vol. 13, pp. 1561-1564, 2014.
Yamanouchi, K. et al., "Low-Loss SAW Filter Using Internal Reflection Types of Single-Phase Unidirectional Transducer", Electron, Lett., vol. 20, No. 20, p. 819, 1984.

(56) References Cited

OTHER PUBLICATIONS

Yang, Y. et al., "1.7 GHZ Y-Cut Lithium Niobate MEMS Resonators with FoM of 336 and fQ of 9. 15x1012," 2018 IEEE MTT-S International Microwave Symposium, pp. 563-566 (2018).
Yang, Y. et al., "4.5 GHZ Lithium Niobate MEMS filters with 10% Fractional Bandwidth for 5G Front-Ends," J. Microelectromechanical Syst., 2019.
Yang, Y. et al., "5 GHZ Lithium Niobate MEMS Resonators with High FoM of 153," in IEEE 30th International Confernce on Micro Electro Mechanical Systems, 2017, 2017, pp. 942-945.
Yang, Y. et al., "Toward Ka Band Acoustics: Lithium Niobate Asymmetrical Mode Piezoelectric MEMS Resonators," in Proc. IEEE Int. Freq. Control Symp. (IFCS), May 2018, pp. 1-5.
York, D., "Least-Squares Fitting of a Straight Line," Can. J. Phys. vol. 44, No. 5, pp. 1079-1086, 1966.
Yu, P.L. et al., "Acoustic Delay Lines to Measure Piezoelectricity in 4H Silicon Carbide," 2017 Joint Conference of the European Frequency and Time Forum and IEEE International Frequency Control Symposium (EFTF/IFCS), 2017, pp. 139-142.
Zhang, Z. et al., "Full Duplex Techniques for 5G Networks: Self-Interference Cancellation, Protocol Deisgn, and Relay Selection," IEEE Commun. Mag., vol. 53, No. 5, pp. 128-137, May 2015.
Zhou, J. et al., "Integrated Full Duplex Radios," IEEE Commun. Mag., vol. 55, No. 4, pp. 142-151, Apr. 2017.
Zhou, J. et al., "Integrated Wideband Self-Interference Cancellation in the RF domain for FDD and Full-Duplex Wireless," IEEE J. Solid State Circuits, vol. 50 No. 12, pp. 3015-3031, Dec. 2015.
Zhu, H. et al., "Switchable Lamb Wave Delay Lines Using AlGaN/GaN Heterostructure," 2017 19th International Conference on Solid-State Sensors, Actuators, and Microsystems (TRANSDUCERS), 2017, vol. 2, No. II, pp. 179-182.
Zhu, Y. et al., "A High Coupling Coefficient 2.3-GHz AlN Resonator for High Band LTE Filtering Application," IEEE Electron Device Lett., vol. 37, No. 10, pp. 1344-1346, Oct. 2016.
Jyoumura, S. et al., "SAW Propagation Loss Mechanism in Piezoelectric Ceramics," J. Appl. Phys., vol. 52, No. 7, pp. 4472-4478, 1981.
Kadota, M. et al., "High-Frequency Lamb Wave Device Composed of MEMS Structure Using LiNbO3 Thin Film and Air Gap," IEEE Trans. Ultrason. Ferroelectr. Freq. Control, vol. 57, No. 11, pp. 2564-2571, Nov. 2010.
Kadota, M. et al., "Suprious-Free, Near-Zero-TCF Hetero Acoustic Layer (HAL) SAW Resonators Using LiTaO 3 Thin Plate on Quartz," 2018 IEEE Inernational Ultrasonics Symposium (IUS), 2018, pp. 1-4.
Kadota, M. et al., "Wideband Acoustic Wave Resonators Composed of Hetero Acoustic Layer Structure," Jpn. J. Appl. Phys., vol. 57, No. 7S1, p. 07LD12, 2018.
Kallmann, H.E., "Transversal Filters," Proc. IRE, vol. 28, No. 7, pp. 302-310, Jul. 1940.
Kao, H-S. et al., "A Delay-Line-Based GFSK Demodulator for Low-IF Receivers," 2007 IEEE International Solid-State Circuits Conference Digest of Technical Papers, 2007, pp. 88-589.
Kodama, T. et al., "Design of Low-Loss Saw Filters Employing Distributed Acoustic Reflection Transducers," Electron. Commun. Japan (Part II Electron., vol. 70, No. 9, pp. 32-44, 1987.
Koshiba, M. et al., "Finite-Element Solutions of Horizontally Polarized Shear Wave Scattering in an Elastic Plate," IEEE Trans. Ultrason. Ferroelectr. Freq. Control, vol. 34, No. pp. 461-466, 1987.
Kosinski, J.A., "Effects fo Non-Uniform Distribution of Motion on Determinations of Piezoelectric Coupling and Constants Using IEEE 176-1987", IEEE Ultrasonics Symposium pp. 537-540, 1993.
Kuo, N. et al., "Ultra High Frequency Phononic Crystal in Silicon Carbide," Proc. 16th Int. Solid-State Sens., Actuators Microsyst. Conf., Jun. 2011, pp. 2486-2489.
Kuo, N-K. et al., "Microscale Inverse Acoustic Band Gap Structure in Aluminum Nitride," Appl. Phys. Letter., vol. 95, 9, 2009, Art. No. 093501.
Kuo, N-K. et al., "X-Shaped Phononic Crystals for Side Lobe Reduction in Ultra High-Frequency Slanted Finger Inter-Digitated Aluminum Nitride Lamb Wave Transducers," 2012 IEEE International Ultrasonics Sympoium, 2012, pp. 1145-1148.
Kuznetova, I.E. et al., "The Power Flow Angle of Acoustic Waves in Thin Piezoelectric Plates," IEEE Trans. Ultrason., Ferroelectr. Freq. Control, vol. 55, No. 9, pp. 1984-1991, Sep. 2008.
Kuznetsova, I.E. et al., "Investigation of Acoustic Waves in Thin Plates of Lithium Niobate and Lithium Tantalate," IEEE Trans. Ultrason. Ferroelectr. Freq. Control, vol. 48, No. 1, pp. 322-328, Jan. 2001.
Lakin, K.M., "Electrode Resistance Effects in Interdigital Transducers," IEEE Trans. Microw. Theory Tech., vol. 22, No. 4, pp. 418-424, 1974.
Lam, C.S. et al., "A Low-Loss SAW Filter Using Two-Finger per Wavelength Electrodes on the NSPUDT Orientation of Quartz," Proc. IEEE Ultrason. Symp., Oct./Nov. 1993, pp. 185-188.
Lee, B. et al. "Relected Self-Interference Channel Measurement for mmWave Beamformed Full-Duplex System," in Proc. IEEE Globecom Workshop (GC Wkshps), Dec. 2015, pp. 1-6.
Lee, M.T.C. et al., Power Analysis and Minimization Techniques for Embedded DSP Software, IEEE Trans. Very Large Scale Integr. Syst., vol. 5, No. 1, pp. 123-135, 1997.
Lehtonen, S. et al., "SPUDT Filters for the 2.45 Ghz ISM Band," IEEE Trans. Ultrason, Ferroelectr. Freq. Control, vol. 51, No. 12, pp. 1697-1703, Dec. 2004.
Levy, M. et al., "Fabrication of Single-Crystal Lithium Niobate Films by Crystal Ion Slicing," Appl. Phys. Lett., vol. 73, No. 16, pp. 2293-2295. 1998.
Lien, S.Y. et al., "5G New Radio: Waveform, Frame Structure, Multiple Access, and Initial Access," IEEE Commun. Mag., vol. 55, No. 6, pp. 64-71, 2017.
Liu, D. et al., "On the Analog Self-Interference Cancellation for Full-Duplex Communications with Imperfect Channel State Information," IEEE Access, vol. 5, pp. 99277-99290, 2017.
Liu, Q. et al., "Electromechanical Brillouin Scattering in Integrated Optomechanical Waveguides," Optica, vol. 6, No. 6, pp. 778-785, 2019.
Lu, R. et al., "A Frequency Independent Framework for Synthesis of Programmable Non-Reciprocal Networks," Sci. Rep., vol. 8, Oct. 2018, Art. No. 14655, 8:14655, DOI:10.1038/s441598-0318-32898-x.
Lu, R. et al., "A Radio Frequency Non-Reciprocal Network Based on Switched Low-Loss Acoustic Delay Lines," arXiv Prepr. Arxiv1801.03814, 2018.
Lu, R. et al., "A Radio Frequency Nonreciprocal Network based on Swithched Acoustic Delay Lines", IEEE Trans. Microw., Theory Tehcn., vol. 67, No. 4, pp. 1516-1530, Apr. 2019.
Lu, R. et al., "Aluminum Nitride Lamb Wave Delay Lines with Sub-6 dB Insertion Loss," J. Microelectromechanical Syst., No. 99, pp. 569-571, 2019.
Lu, R. et al., "Exploiting Parallelism in Resonators for Large Voltage Gain in Low Power Wake up Radio Front Ends," Proceedings of the IEEE International Conference on Micro Electro Mechanical Systems (MEMS), Jan. 2018 pp. 747-750.
Lu, R. et al., "GHz Broadband SH0 Mode Lithium Niobate Acoustic Delay Lines", IEEE Trans. Ultrason. Ferroelectr. Freq. Control, vol, submitted.
Lu, R. et al., "Gigahertz Low-Loss and Wide-Band S0 Mode Lithuim Niobate Acoustic Delay Lines," IEEE Trans. Ultrason. Ferroelectr. Freq. Control, vol. 66, No. 8, pp. 1373-1386, Aug. 2019.
Lu, R. et al., "Lithium Niobate Phononic Crystals for Tailoring Performance of RF Latterally Vibrating Devices," IEEE Trans. Ultrason. Ferroelectr. Freq. Control, vol. 65, No. 6, pp. 934-944, Jan. 2018.
Lu, R. et al., "RF Filters with Periodic Passbands for Sparse Fourier Transformbased Spectrum Sensing," J. Microelectromech. Syst., vol. 27, No. 5, pp. 931-944, Oct. 2018.
Lu, R. et al., "S0-Mode Lithium Niobate Acoustic Delay Lines with 1 dB Inseration Loss," IEEE International Ultrasonic Symposium, (IUS), Kobe, Japan, Oct. 2018, pp. 1-4.
Lu, R. et al., "Study of Thermal Nonlinearity in Lithium Niobate-Based MEMS Resonators," Proc. 18th Int. Conf. Solid-State Sens., Actuators Microsyst., Jun. 2015, pp. 1993-1996.

(56) References Cited

OTHER PUBLICATIONS

Lu, R. et al., "Towards Digitally Addressable Delay Synthesis: GHz Low-Loss Acoustic Delay Elements from 20 ns to 900 ns," 2019 IEEE Micro Electro Mechanical Sylstems (MEMS), 2019.

Lu, R., et al., "Accurate Extraction of Large Electromechanical Coupling in Piezoelectric MEMS Resonators," J. MicroElectromech. Syst., vol. 28, No. 2, pp. 209-218, Apr. 2019.

Makkonen, T. et al., "Surface-Acoustic-Wave Devices for the 2.5-5 GHz Frequency Range Based on Longitudinal Leaky Waves," Appl. Phys. Lett., vol. 82, No. 19, pp. 3351-3353, 2003.

Malocha, D.C. et al., "Orthogonal Frequency Coding for SAW Device Applications", 2004 IEEE International Ultrasonics, Ferroelectrics, and Frequency Control Joitn 50th Anniversary Conference pp. 1082-1085, 2004.

Manzaneque, R. et al., "Lithium Niobate MEMS Chirp Compressors for Near Zero Power Wake-Up Radios," Journal of Microelectromechanical Systems, vol. 26, No. 6, pp. 1204-1215, Dec. 2017.

Manzaneque, T. et al., "An SH0 Lithium Niobate Correlator for Orthogonal Frequency Coded Spread Spectrum Communications," Proc. Joint Conference of the European Frequency and Time Forum and IEEE International Frequency Control Symposium (EFTF/IFC), Jul. 2017, pp. 143-147.

Manzaneque, T. et al., "An SH0 Lithium Niobate Dispersive Delay Line for Chirp Compression-Eneable Low Power Radios," Proc. IEEE 30th Int. Conf. Micro Electro Mech. Syst. (MEMS), Jan. 2017, pp. 155-158.

Manzaneque, T. et al., "An SH0 Lithium Niobate Trans-Impedance Chirp Compressor with High Voltage Gain," Micro Electro Mechanical Systems (MEMS), IEEE 31 rd International Conference on, 2018, pp. 783-786.

Manzaneque, T., et al., Low-Loss and Wide-Band Acoustic Delay Lines, IEEE Trans. Microw. Theory Tech., vol. 67, No. 4, pp. 1379-1391, Apr. 2019.

Martin, G. et al., "Synthesizing and Optimizing Spudt Saw Filters," 1998 IEEE Ulgtrasonics Symposium, Proceeding (Cat No. 98Ch36102), 1998, vol. 1, pp. 165-168.

Mizutaui, K. et al., "Analysis of Lamb Wave Propagation Characteristics in Rotated Y-Cut X-Propagation LiNbO3 plates," Electron. Commun. Japan (Part I Commun., vol. 69, No. 4, pp. 47-55, 1986.

Odagawa, H. et al., "10 GHz Range Extremely Low-Loss Ladder Type Surface Acoustic Wave Filter," 1998 IEEE Ultrasonic Symposium, Proceedings, 1998, vol. 1, pp. 103-106.

Okano, H. et al., "GHz-Band Surface Acoustic Wave Devices Using Aluminum Nitride Thin Films Deposited by Electron Cyclotron Resonance Dual Ion-Beam Sputtering," Jpn. J. Appl. Phys., vol. 32, No. 9B, p. 4052, 1993.

Olsson, R.H, et al., "Post-CMOS Compatible Aluminum Nitride MEMS Filters and Resonant Sensors," Proc. IEEE Int. Freq. Control Symp. Joint 21st Eur. Freq. Time Forum, May/Ju. 2007, pp. 412-419.

Olsson, R.H. et al., "A High Electromechanical Coupling Coefficient SH0 Lamb Wave Lithium Niobate Micromechanical Resonator and a Method for Fabrication," Sensors Actuators A Phys., vol. 209, pp. 183-190, Mar. 2014.

Olsson, R.H. et al., "Event-Driven Persistent Sensing," Overcoming the Energy and Lifetime limitations in unattended Wireless Sensors, Proc. IEEE Sensors, pp. 3-5, 2017.

Akiyama, M.et al., "Enhancement of Piezoelectric Response in Scandium Aluminum Nitride Alloy Thin Films Prepared by Dual Reactive Cosputtering," Adv. Mater., vol. 21, No. 5, pp. 593-596, 2009.

Anand, A. et al., "Joint Scheduling of URLLC and eMBB Traffic in 5G Wireless Networks," IEEE INFOCOMM 2018—IEEE Conference on Computer Communications, 2018, pp. 1970-1978.

Ansari, A. et al., "Gallium Nitride High-Order Mode Lamb-Wave Resonators and Delay-Lines," Proc. Solid-State Sens. Actuators Microsyst. Workshop, Jun. 2016, pp. 1-2.

Bajak, I.L. et al., "Attenuation of Acoustic Waves in Lithium Niobate," J. Acoust. Soc. AM., vol. 69, No. 3, pp. 689-695, 1981.

Barlow, E. J., "Doppler Radar," Proc. IRE, vol. 37, No. 4, pp. 340-355, Apr. 1949.

Bartasyte, A. et al., "Toward High-Quality Epitaxial LiNbO3 and LiTaO3 Thin Films for Acoustic and Optical Applications," Adv. Mater. Interfaces, vol. 4, No. 8, p. 1600998, 2017.

Benoit, R.R. et al., "Advances in Piezoeletric PZT-based RF MEMS Advances," Piezoelectric PZT-Based RF MEMS Components and Systems, 2017.

Bharadia, D. et al., "Full Duplex Radios," ACM SIGCOMM Computer Communication Review, 2013, vol. 43, No. 4, pp. 375-386, Oct. 2013.

Bi, F.Z. et al., "A Fast Algorithm of Designing Mininmum Phase Transducer and its Application to SPUDT Filter Design," Proc. IEEE Symp. Ultrason., Oct. 2003, pp. 522-525.

Biedka, M.M. et al., "Ultra-Wide Band Non-Reciprocity through Sequentially-Switched Dealy Lines," Sci Rep., vol. 7, No. January, p. 40014, Jan. 2017.

Biot, M.A., "General Theorems on the Equivalence of Group Velocity and Energy Transport," Phys. Rev., vol. 105, No. 4, p. 1129, Feb. 1957.

Blomley P.F. et al., "A S.A.W. Frequency Discriminator," 1973 Ultrasonics Symposium, 1973, pp. 468-471.

Brown, M.A.C.S. et al., "Use of a Surface-Acoustic-Wave Delay Line to provide Pseudocoherence in a Clutter-Reference Pulse Doppler Radar," Electron. Lett., vol. 9, No. 2, p. 17, 1973.

Brown, R.B., "Electrical Matching of Unidirectional Surface Wave Devices," MTT-S International Microwave Symposium Digest, vol. 75, No. 0, pp. 359-361.

Cassella, C. et al., "Aluminum Nitride Cross-Sectional Lame Mode Resonators," J. Microelectromechanical Syst. vol. 25, No. 2, pp. 275-285, 2016.

Chen, D-P. et al., "Analysis of Metal-Strip SAW Gratings and Transducers," IEEE Transs. Sonic Ultrason., vol. 32, No. 3, pp. 395-408, May 1985.

Chvets, V.B. et al., "Low-Loss SAW Filters Using new SPUDT Structures," 1997 IEE Ultrasonics Symposium Proceeding, An International Symposium Cat No. 97CH36118), 1997, vol. 1, pp. 69-72.

Ciplys, D. et al., "GaN-Based SAW Delay-line Oscillator," Electron. Lett., vol. 37, No. 8, pp. 546-546, Apr. 2001.

Collins, J.H. et al., "Unidirectional Surface Wave Transducer," Proc. IEEE, vol. 57, No. 5, pp. 833-835, 1969.

Colombo, L. et al., "Investigation of 20% Scandium-Doped Aluminum Nitride Films for MEMS Laterally Vibrating Resonators," in Ultrasonics Symposium (IUS), 2017 IEEE, 2017.

Colombo, L. et al., "X-Cut Lithium Niobate Laterally Vibrating MEMS Resonator With Figure of Merit of 1560," J. Microelectromechanical Syst., vol. 27, No. 4, pp. 602-604, Aug. 2018.

Commission, F.C., "FCC Online Table of Frequency Allocations," Online: [https://transition.fcc.gov/oet/spectrum/table/fcctable.pdf], Revised on Oct. 9, 2020.

Crespin, E.R. et al., "Fully Integrated Swithchable Filter Banks," IEEE/MTT-S Int. Microw. Symp. Dig., Jun. 2012, pp. 1-3.

Datta, S. et al., "An Analytical Theory for the Scattering of Surface Acoustic Waves by a Single Electrode in a Periodic Array on a Piezoelectric Substrate," Journal of Applied Physics, vol. 51, No. 9, 1980.

Demma, A. et al., "Scattering of the Fundamental Shear Horizontal Mode from Steps and Notches in Plates," J. Acoust. Soc. Am., vol. 113, No. 4, pp. 1880-1891, Apr. 2003.

Devkota, J. et al., "SAW Sensors for Chemical Vapors and Gases," Sensors, vol. 17, No. 4, p. 801, 2017.

Didenko, I.S. et al., "The Experimental and Theoretical Characterization of the SAW Propagation Properties for Zinc Oxide Films on Silicon Carbide," IEEE Trans. Ultrason. Ferroelectr., Freq. Control, vol. 47, No. 1, pp. 179-187, Jan. 2000.

Dinc, T. et al., "Synchronized Conductivity Modulation to Realize Broadband Lossless Magnetic-Free Non-Reciprocity," Nat Commun., vol. 8, No. 1, pp. 1-9, 2017.

(56) References Cited

OTHER PUBLICATIONS

Fang, G.W. et al., "A VHF Temperature Compensated Lithium Niobate-on-Oxide Resonator with Q> 3900 for Low Phase Noise Oscillators," Micro Electro Mechanical Systems (MEMS), 2018 IEE, 2018, pp. 723-726.
Feigelson, R., "Physics and Chemistry of Crystalline Lithium Niobate," Science, vol. 251, No. 5000, pp. 1510-1511, 1991.
Ghosh, S. et al., "SAW Correlators in LiNbO 3 and GaN on Sapphire," 2018 IEEE International Frequency Control Symposium (IFCS), 2018, pp. 1-4.
Ghosh, S., "Nonreciprocal Accoustoelectric Interaction of Surface Waves and Fluorine Plasma-Treated AlGan/GaN 2DEG," 2017 19th International Conference on Solid-State Sensors, Actuators and Microsystems (TRANSDUCERS), 2017, pp. 1939-1942.
Gong, S. et al., "Design and Analysis of Lithium-Niobate-Based High Electromechanical Coupling RF-MEMS Resonators for Wideband Filtering," IEEE Trans. Microw. Theory Tech., vol. 61, No. 1, pp. 403-414, Jan. 2013.
Gong, S. et al., "High Electromechanical Coupling MEMS Resonators at 530 MHz using Ion Sliced X-Cut LiNbO3 Thin Film," IEEE MTT-S Int. Microw. Sump. Dig. No. August, pp. 29-32. 2012.
Gong, S. et al., "Monolithic Multi-Frequency Wideband RF Filters Using Two-Port Laterally Vibrating Lithium Niobate MEMS Resonators," J. Microelectromechanical Syst., vol. 23, No. 5, pp. 1188-1197, Oct. 2014.
Goto, M. et al., "Power Flow Angles for Slanted Finger Surface Acoustic Wave Filters on Langasite Substrate," Jpn. J. Appl. Phys., vol. 46, No. 7, p. 4744, 2007.
Grasse, C.L. et al., "Acoustic Surface Wave Dispersive Delay Lines as High-Resoultion Frequency Discriminator," 1972 Ultrasonics Symposium, 1972, vol. 24, pp. 233-236.
Gubbi, J. et al., "Internet of Things (Iot): A Vision, Architectural Elements, and Future Directions," Futtur. Gener. Comput. Syst., vol. 2, No. 7, pp. 1645-1660, 2013.
Guo, X. et al., "A Miniaturized Reconfigurable Broadband Attenuator Based on RF MEMS Switches," J. Micromech. Microeng., vol. 26, No. 7, p. 74002, May 2016.
Hackett, L. et al., "High-Gain Leaky Surface Acoustic Wave Amplifier in Epitaxial InGaAs on Lithium Niobate Heterostructure," Appl. Phys. Lett., vol. 114, No. 25, p. 253503, Jun. 2019.
Hartmann, C.S. et al., "An Analysis of SAW Interdigital Transducers with Internal Reflections and the Application to the Design of Single-Phase Uniderctional Transducers," 1982 Proc. Ultrasonic Symposium, Oct. 1982, pp. 40-45.
Hartmann, C.S. et al., "Improved Accuracy for Determining SAW Transducer Capacitance and K2," Proc. IEEE Ultrason. Symp., Oct. 1987, pp. 161-167.
Hartmann, C.S. et al., "Overview of Design Challenges for Single Phase Unidirectional SAW Filters," Proceeding, IEEE Ultrasonic Symposium, 1989, Date of Conference Oct. 3-6, 1989, pp. 79-89.
Hartmann, C.S. et al., "Wideband Unidirectional Interdigtial Surface Wave Transducers," IEEE Trans. Sonic Ultrason, vol. 19, No. 3, pp. 378-381, Jul. 1972.
Hickernell, F.S., "Thin-Films for SAW Devices," Int. J. High Speed Electron. Syst., vol. 10, No. 03, pp. 603-652, Sep. 2000.
Hode, J.M., et al., "SPUDT-Based Filters: Design Principles and Optimization," Proc. IEEE Int. Symp. Ultrason, vol. 1, Nov. 1995, pp. 39-50.
Hong, S. et al., "Application of Self-Interference Canellation in 5G and Beyond," IEEE Commun. Mag., vol. 52, No. 2, pp. 114-121, Feb. 2014.
Hossain, E. et al., "Evolution Toward 5G Multi-Tier Cellular Wireless Networks: An Interference Management Perspective," IEEE Wirel. Commu., vol. 21, No. 3, pp. 118-127, 2014.
IEEE Standard on Piezoelectricity, IEEE Standard 176-1987, New York, NY, USA, 1987.
Joshi, S.G. et al., "Propagation of Ultrasonic Lamb Waves in Piezoelectric Plates," J. Appl. Phys., vol. 70, No. 8, pp. 4113-4120, 1991.
Non-final Office Action for U.S. Appl. No. 17/073,083, dated Jul. 28, 2022, 40 pages.
Non-final Office Action for U.S. Appl. No. 17/073,100, dated May 11, 2023, 44 pages.

\* cited by examiner

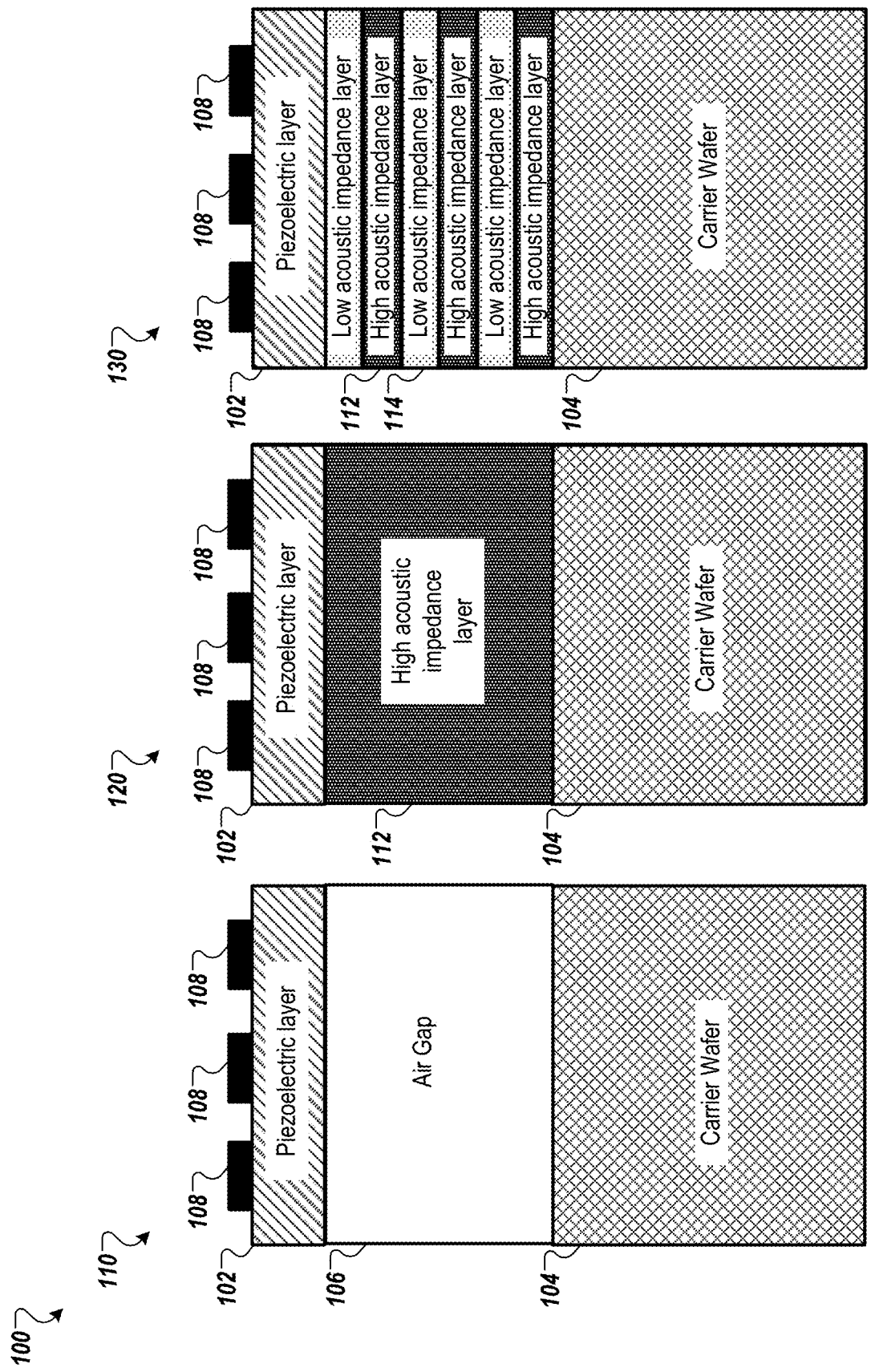

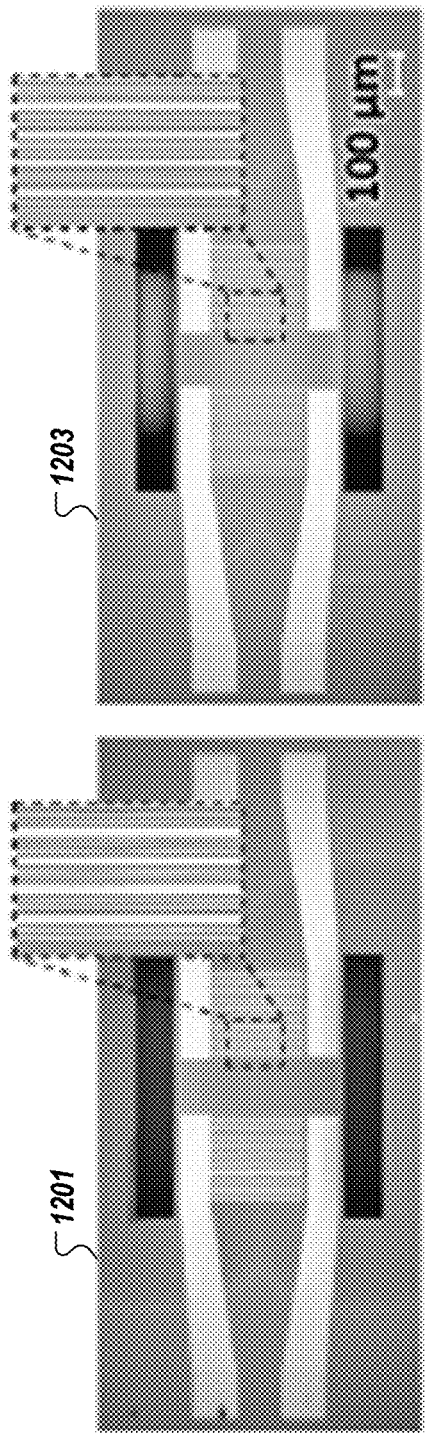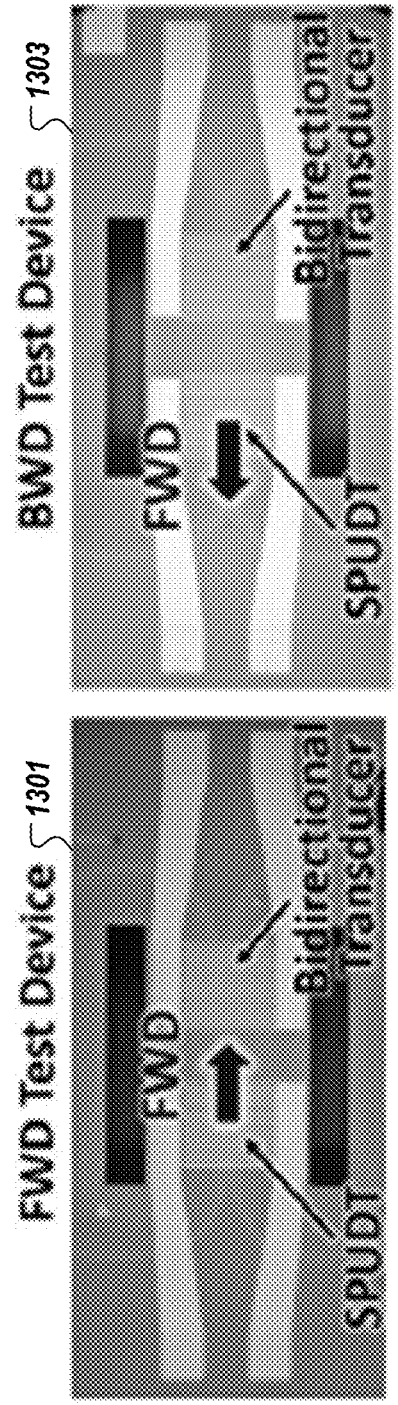
FIG. 12
FIG. 13

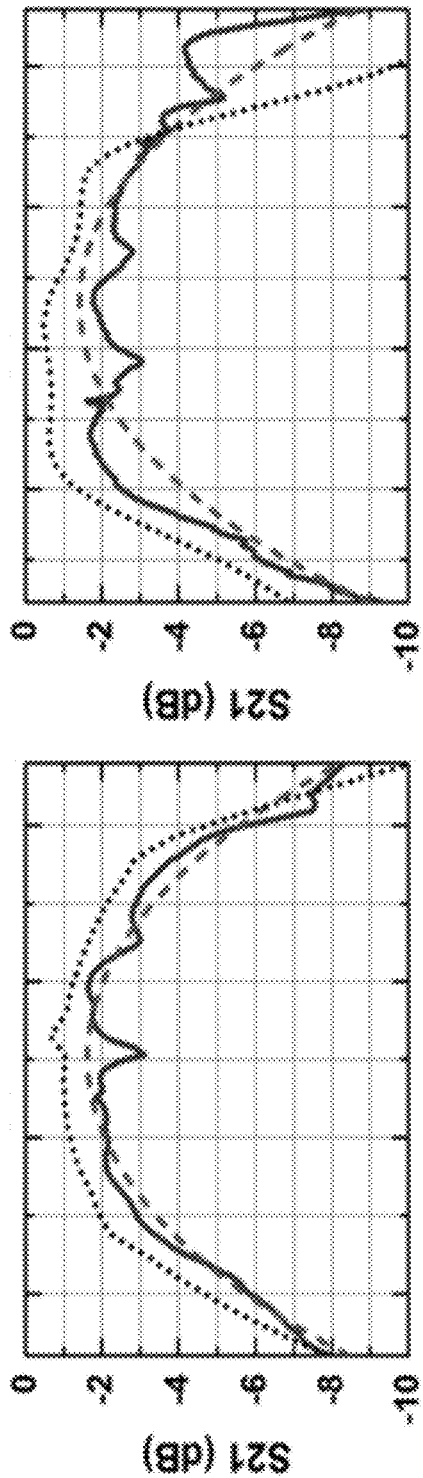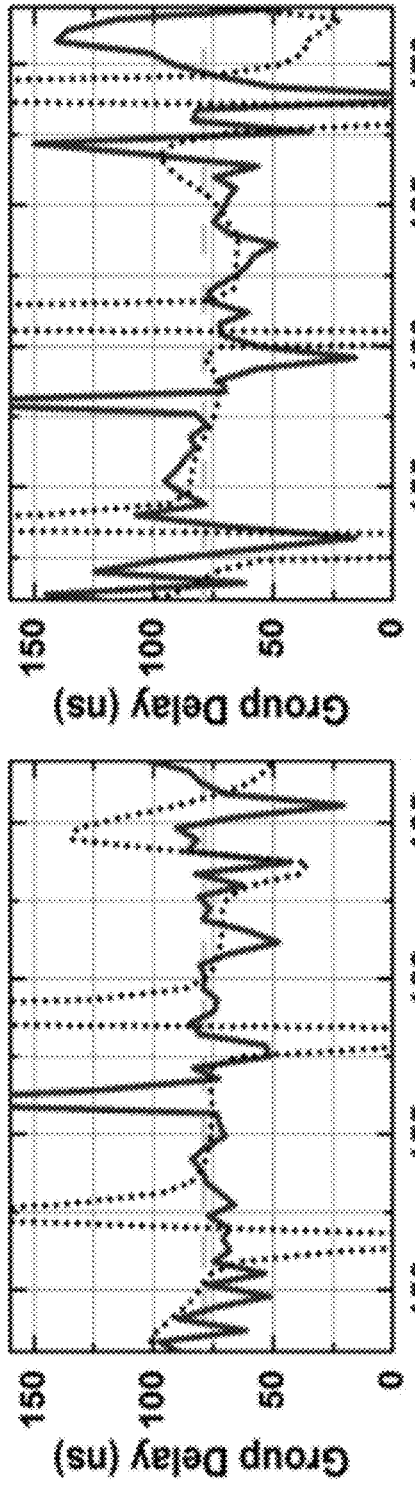
FIG. 15E  FIG. 15F  FIG. 15G  FIG. 15H

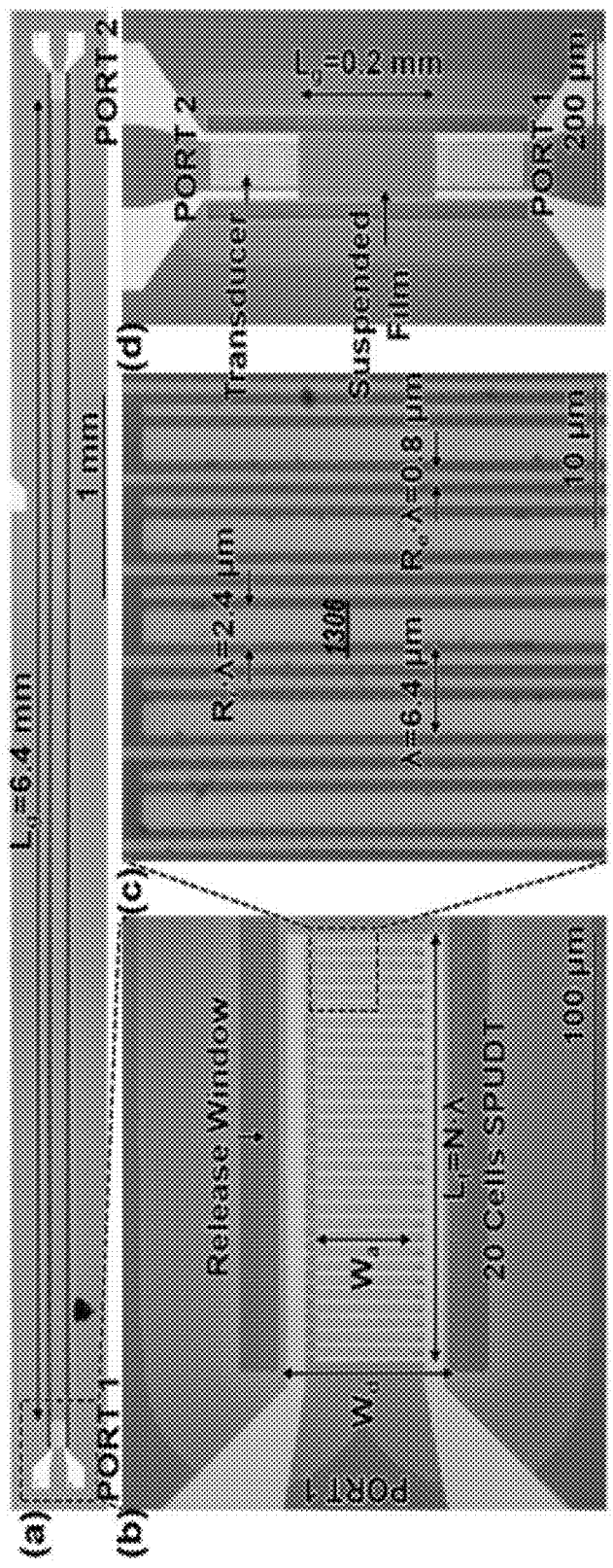
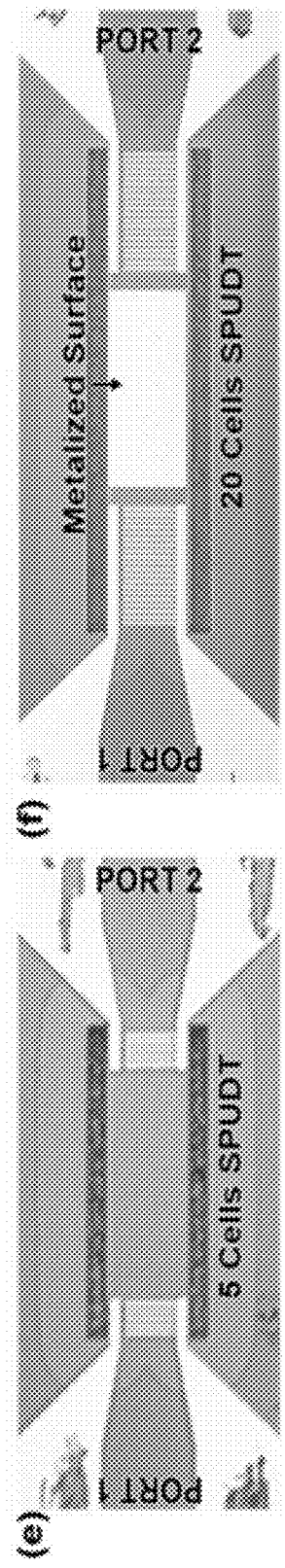
FIG. 29A  FIG. 29B  FIG. 29C  FIG. 29D  FIG. 29E  FIG. 29F

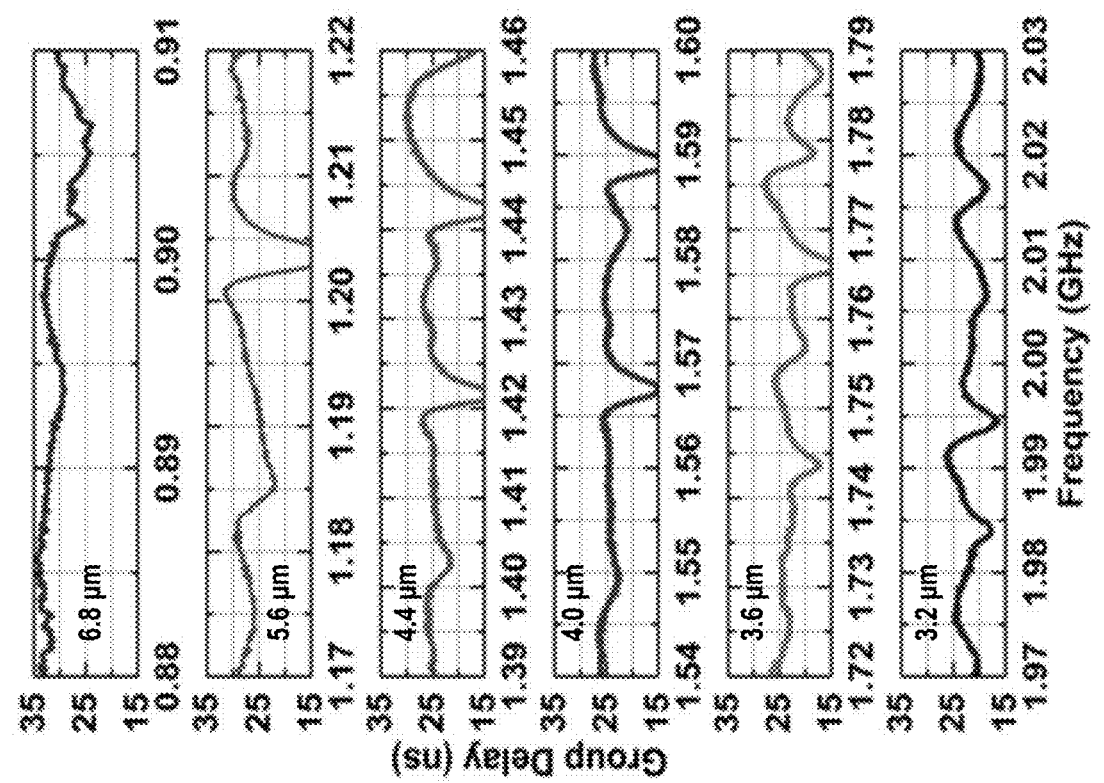
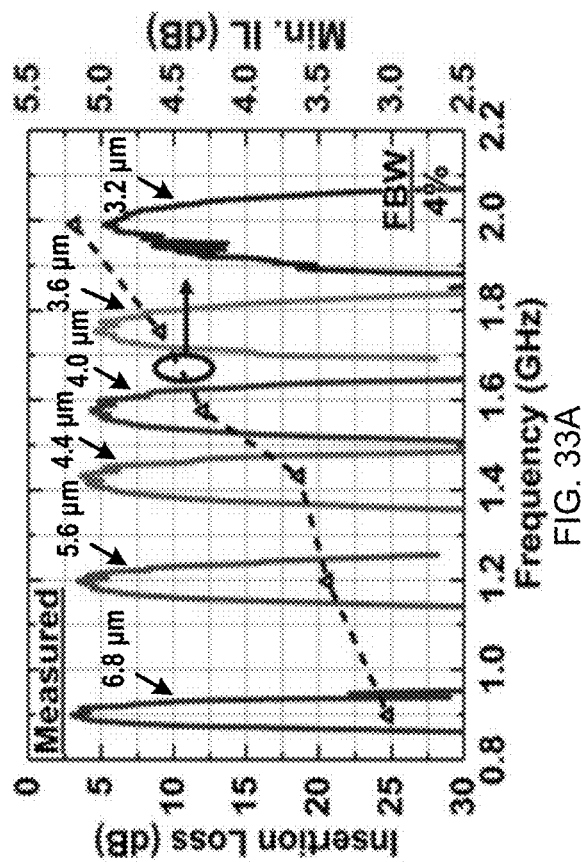
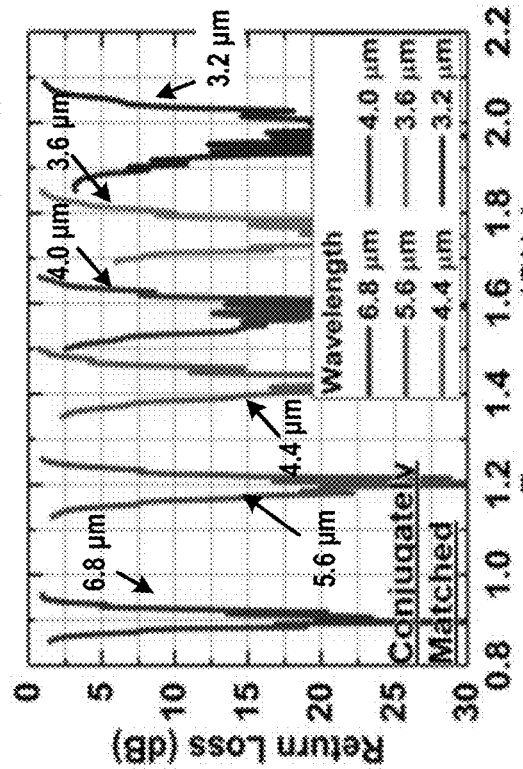
FIG. 33A
FIG. 33B
FIG. 33C

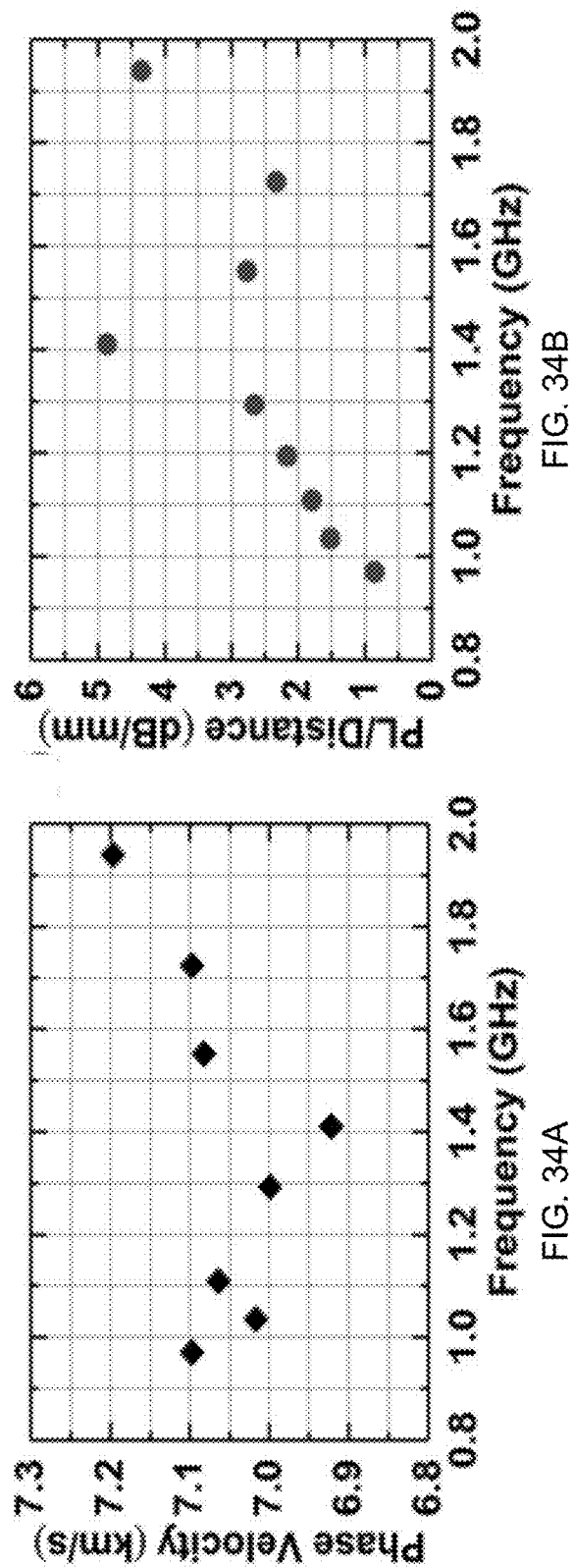
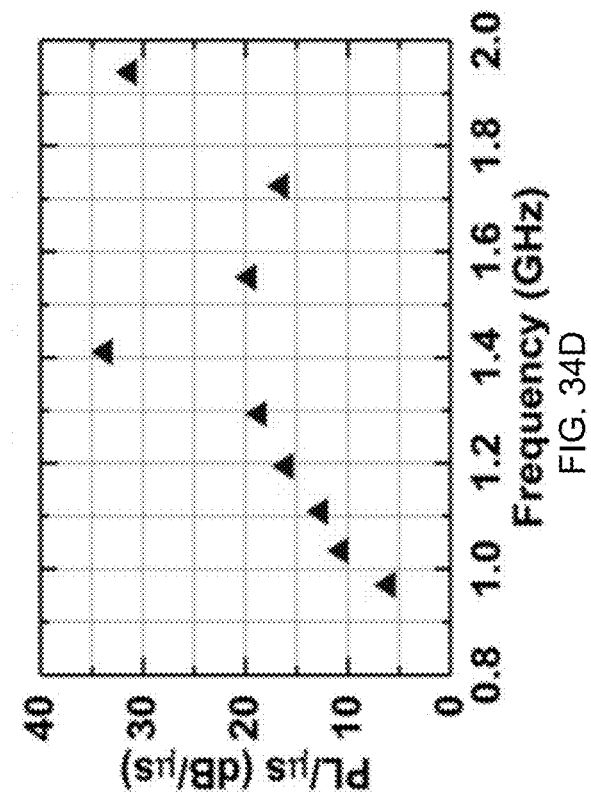
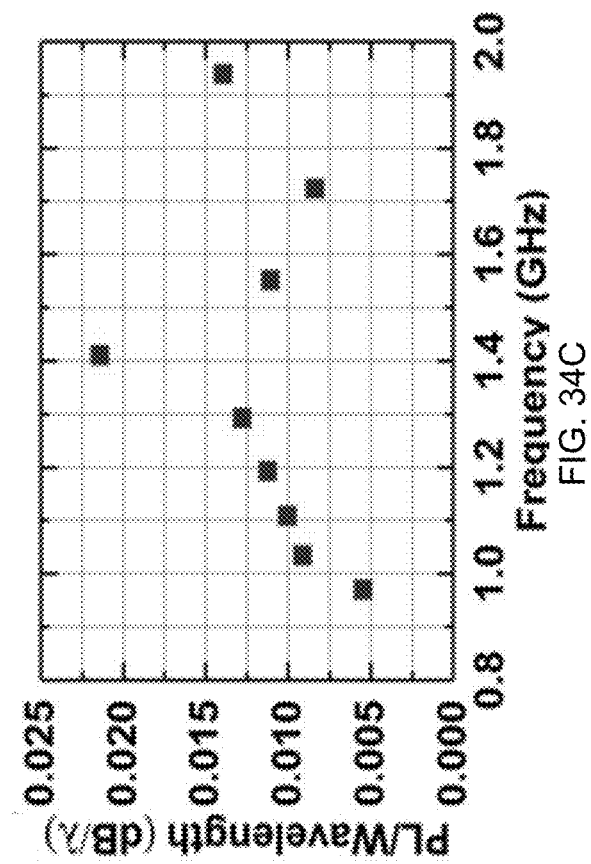
FIG. 34A
FIG. 34B
FIG. 34C
FIG. 34D

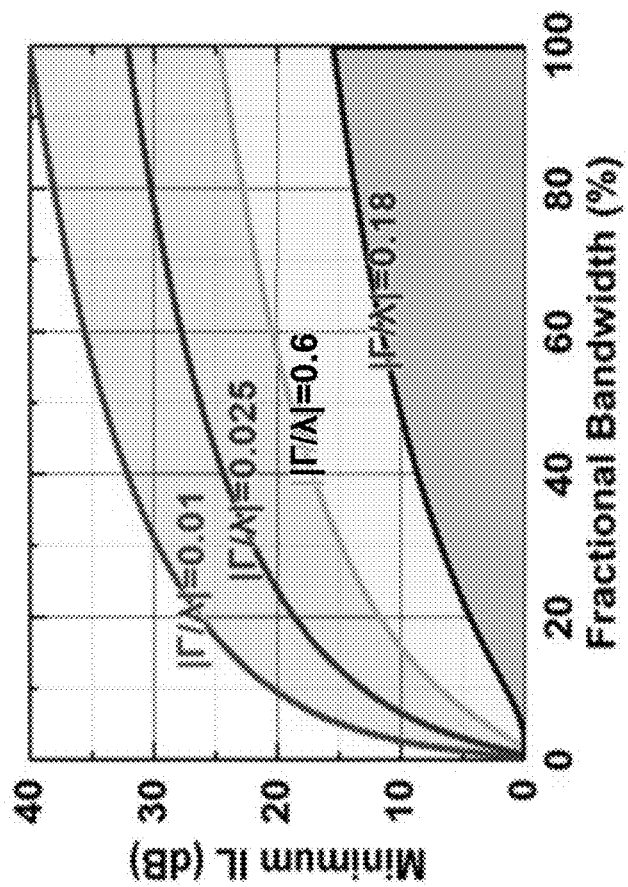
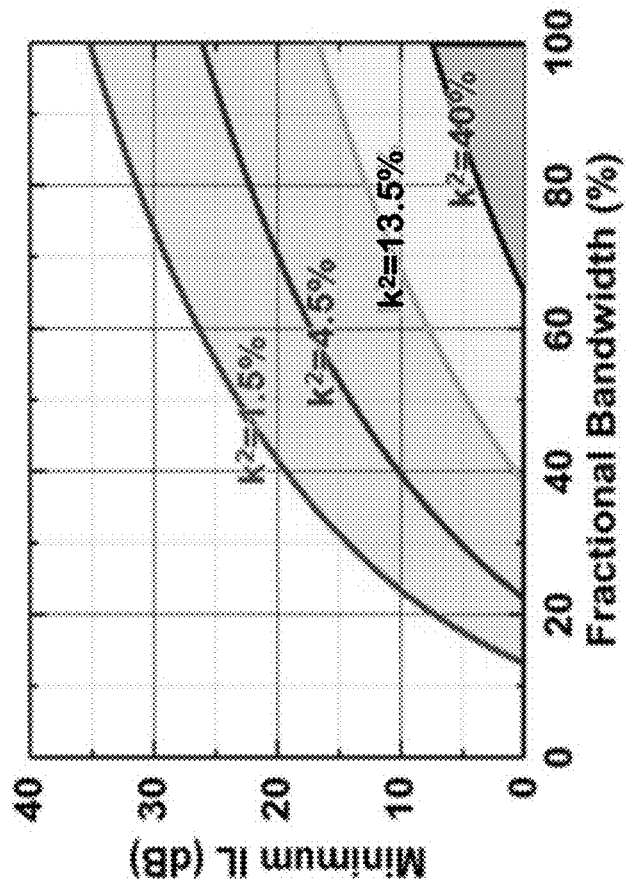
FIG. 40B
FIG. 40A

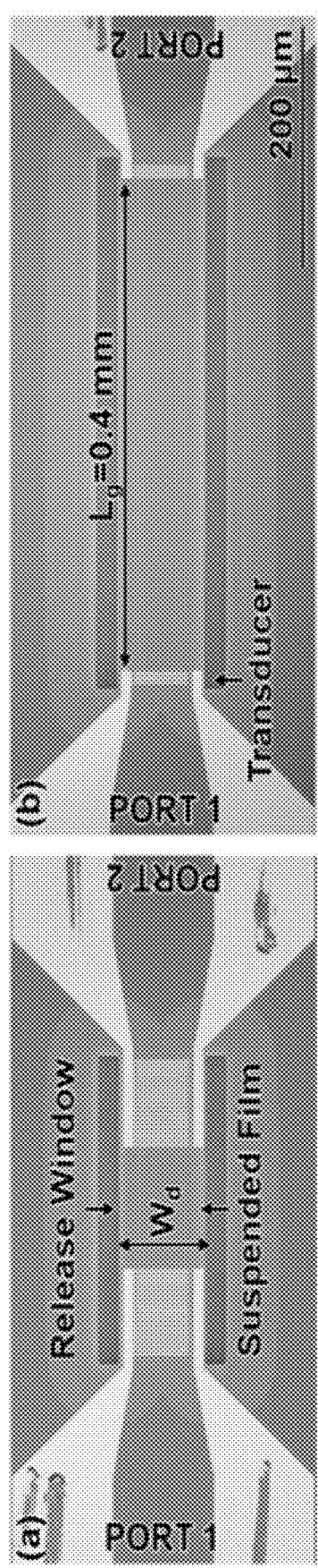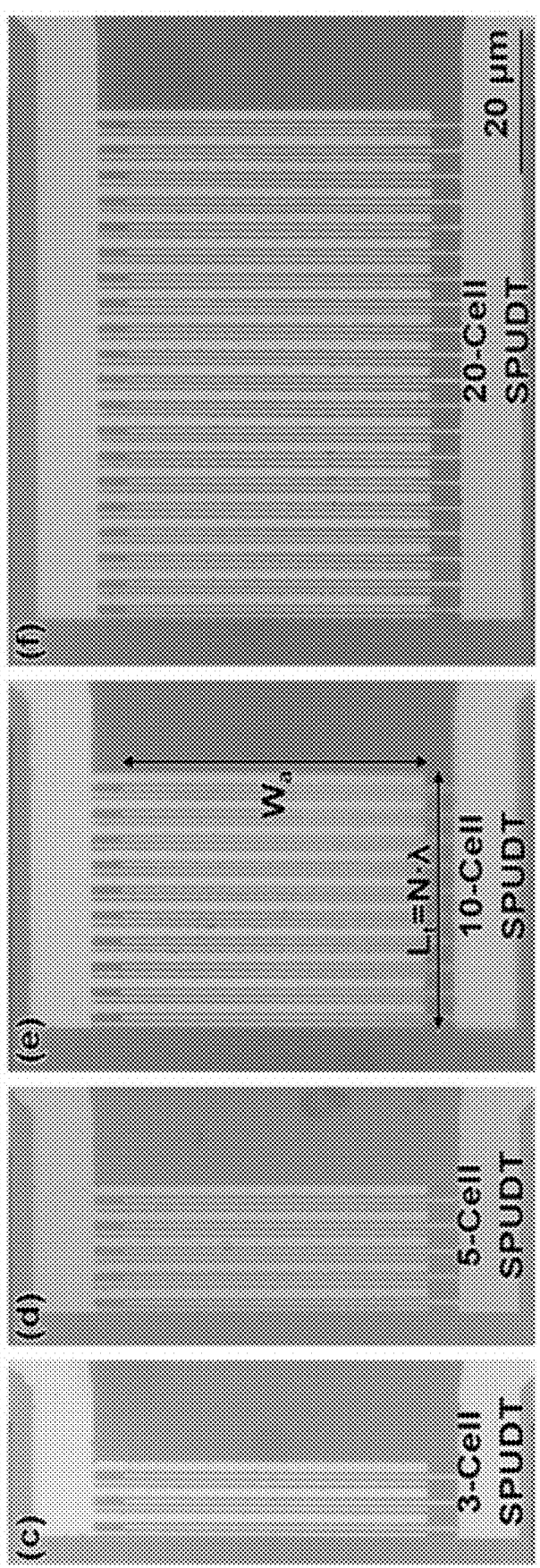
FIG. 43A  FIG. 43B  FIG. 43C  FIG. 43D  FIG. 43E  FIG. 43F

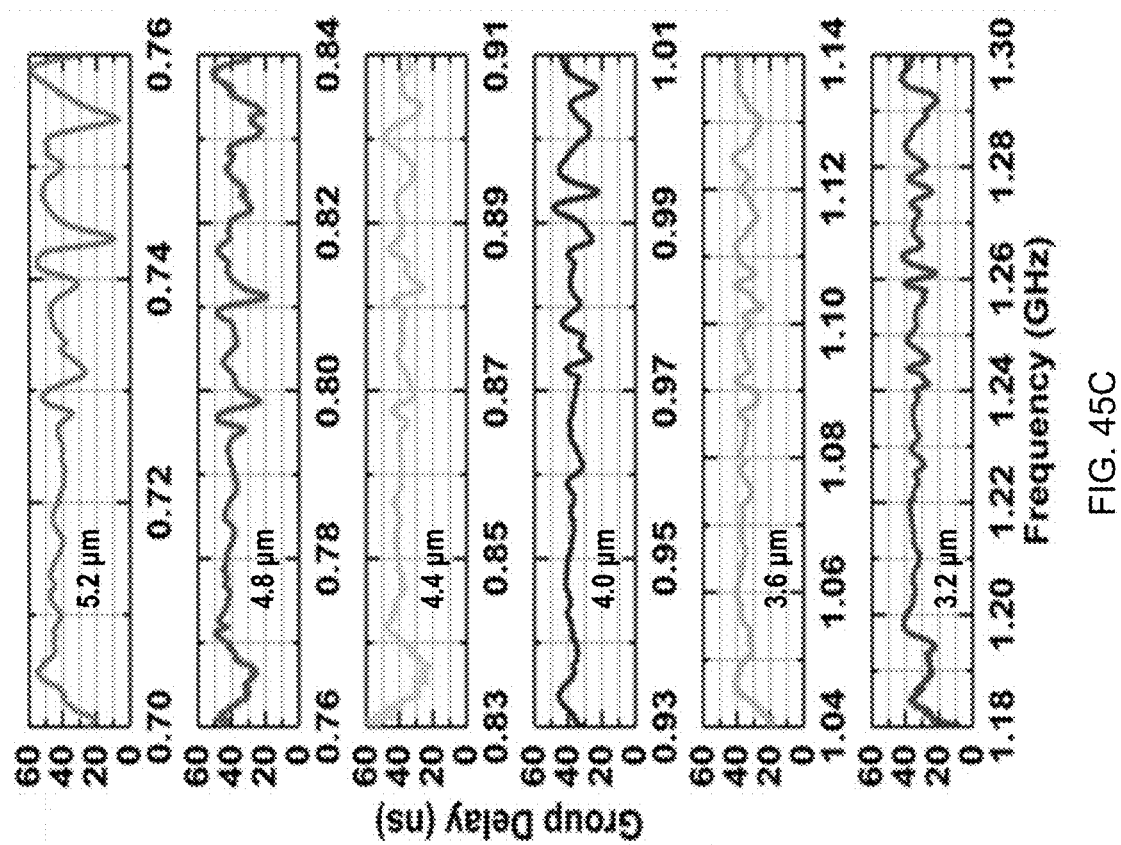
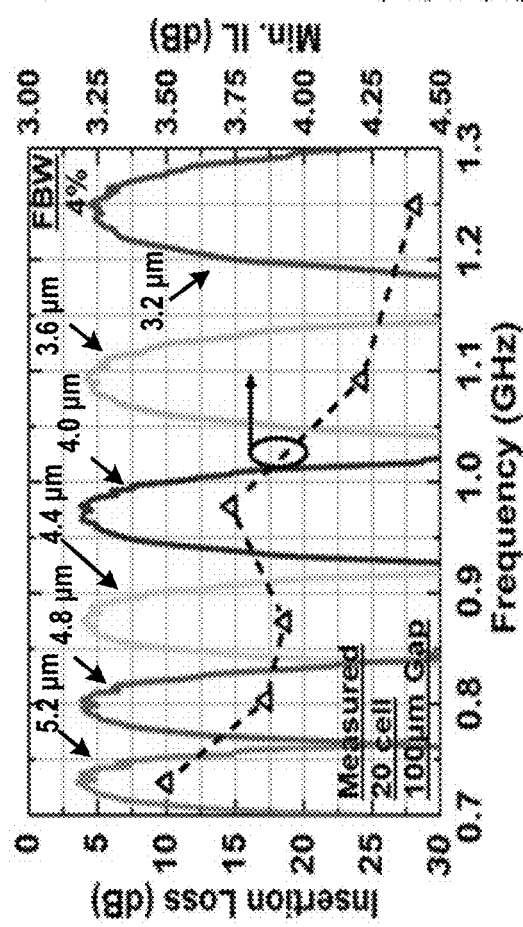
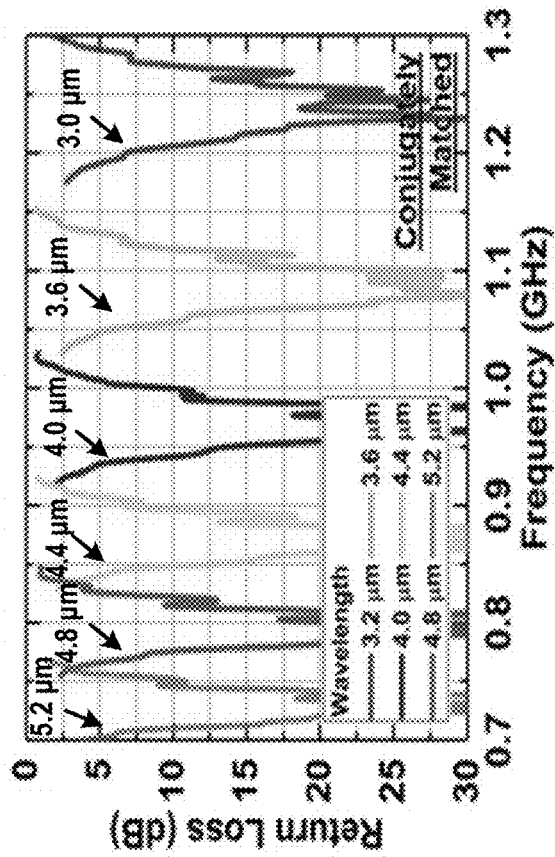
FIG. 45A
FIG. 45B
FIG. 45C

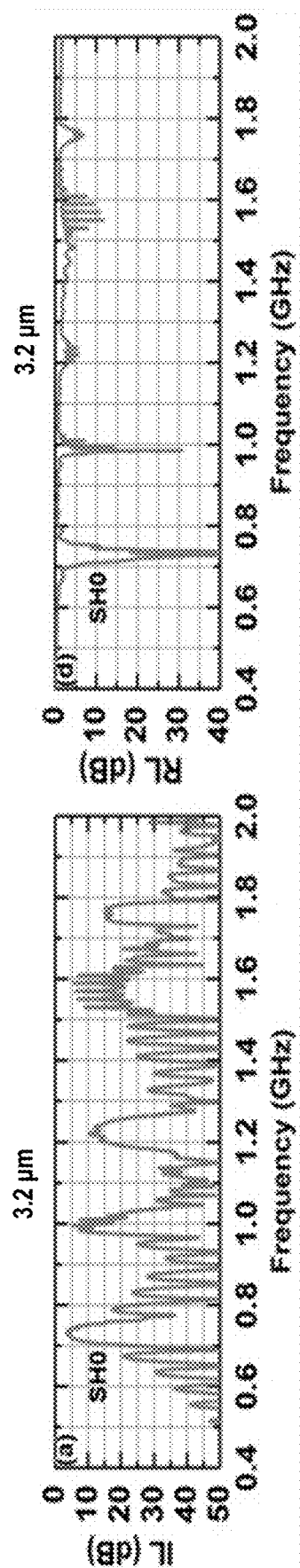
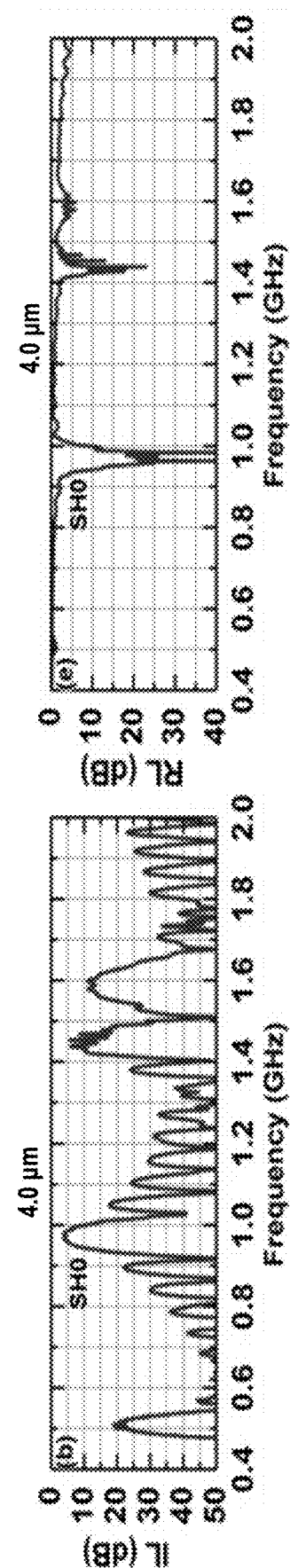
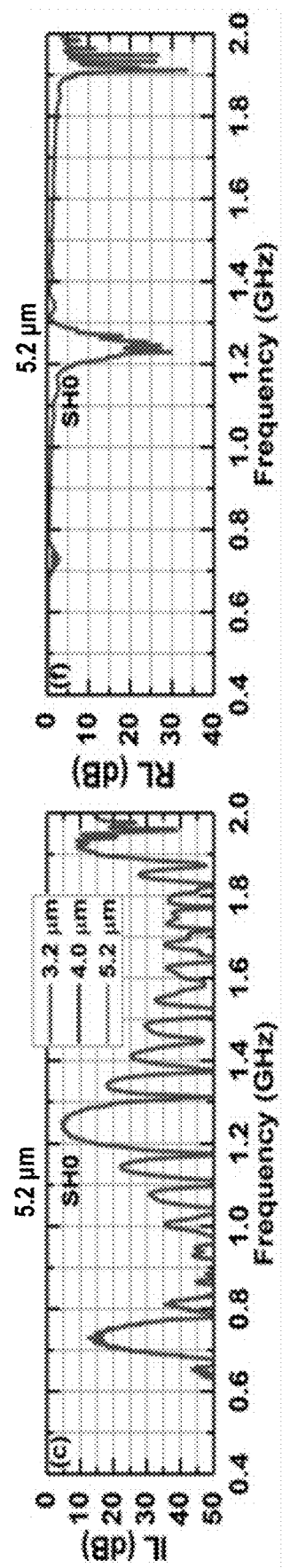
FIG. 46A  FIG. 46B  FIG. 46C
FIG. 46D  FIG. 46E  FIG. 46F

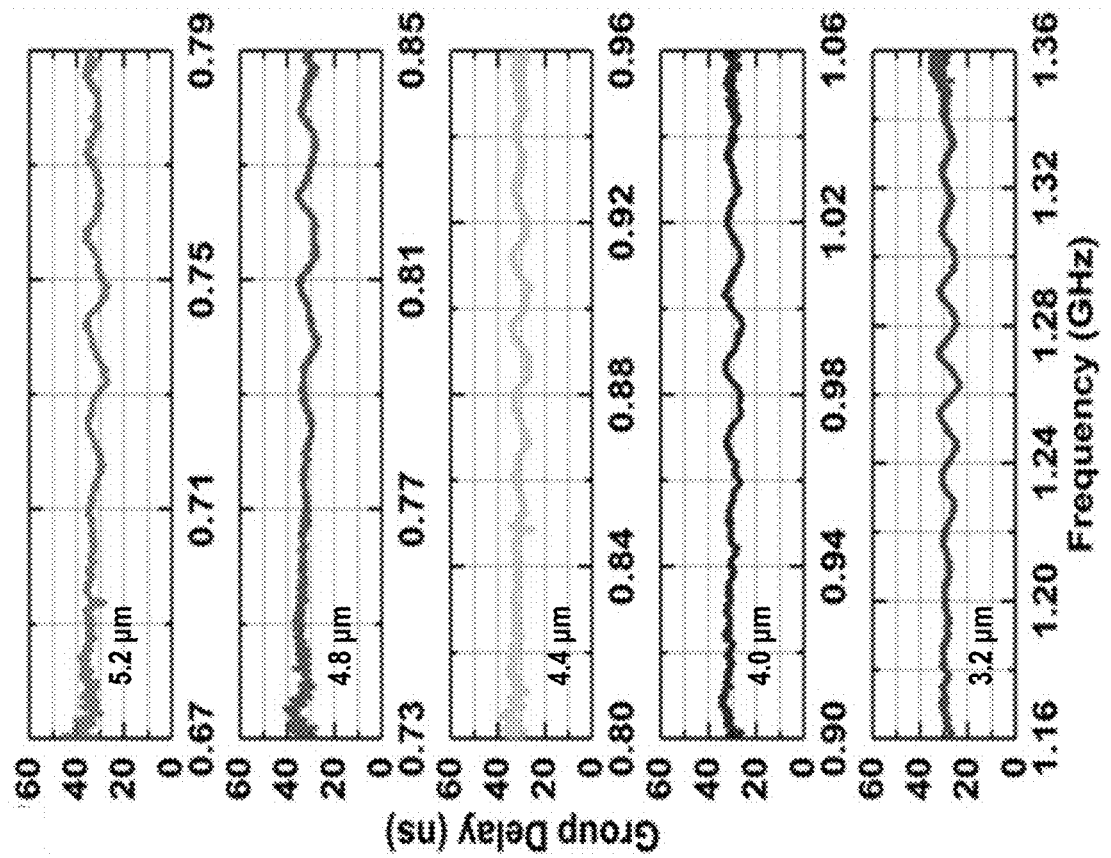
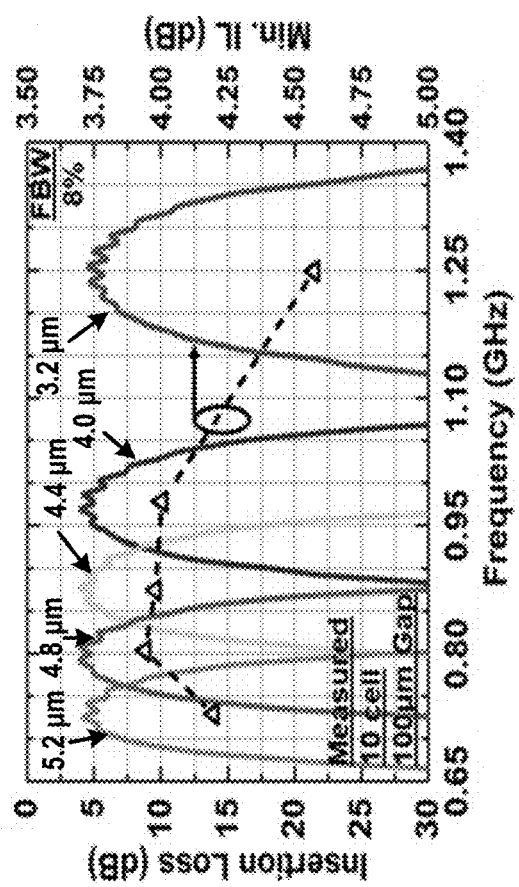
FIG. 47A
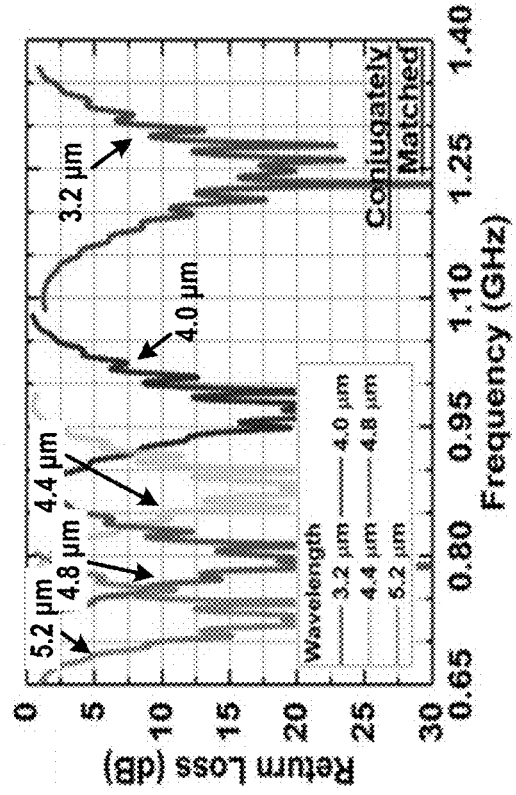
FIG. 47B
FIG. 47C

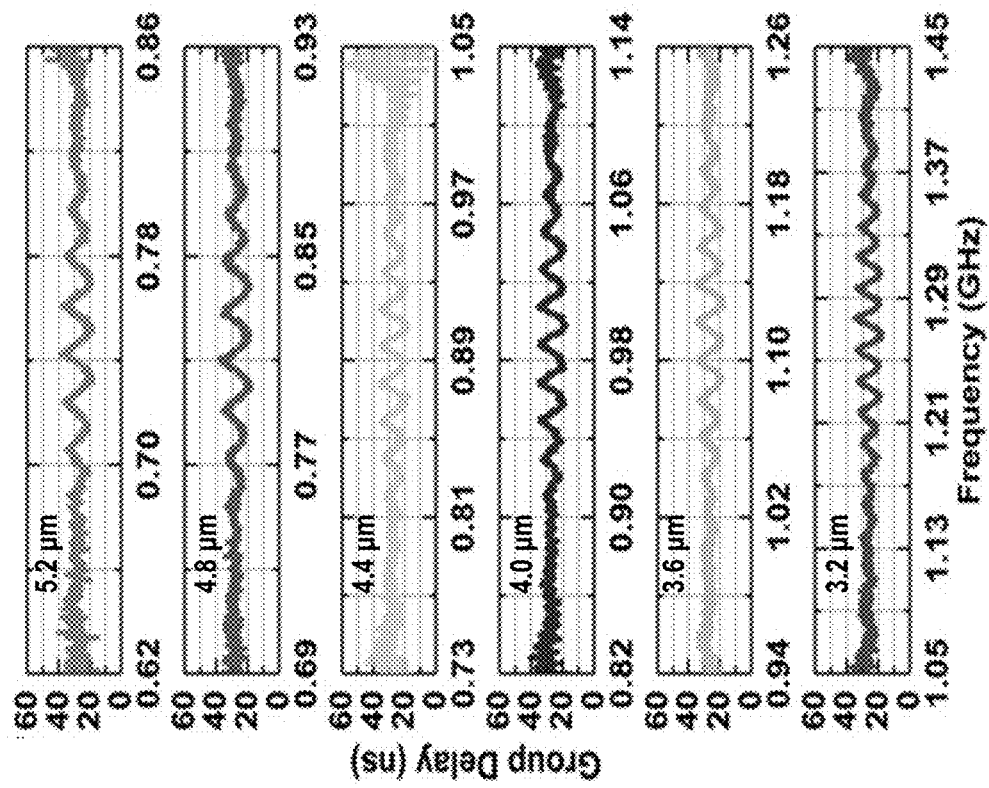
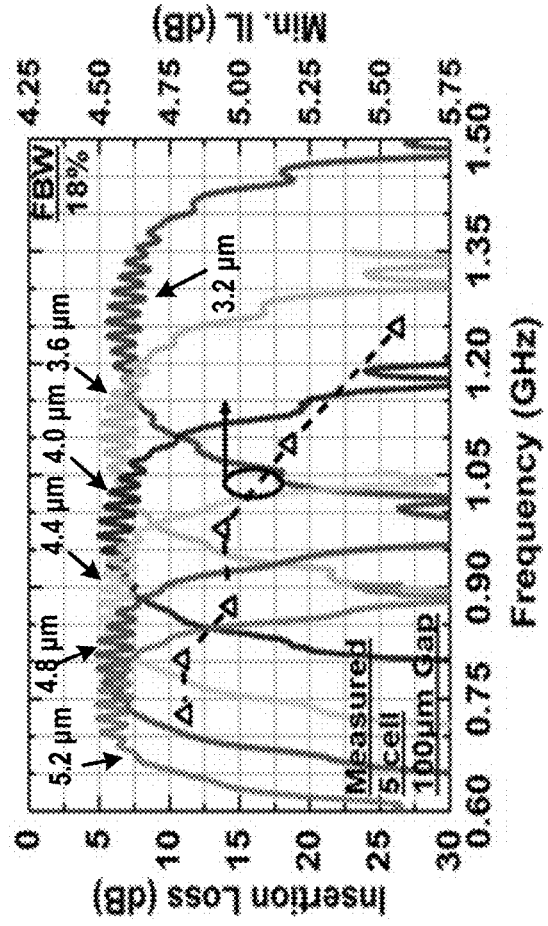
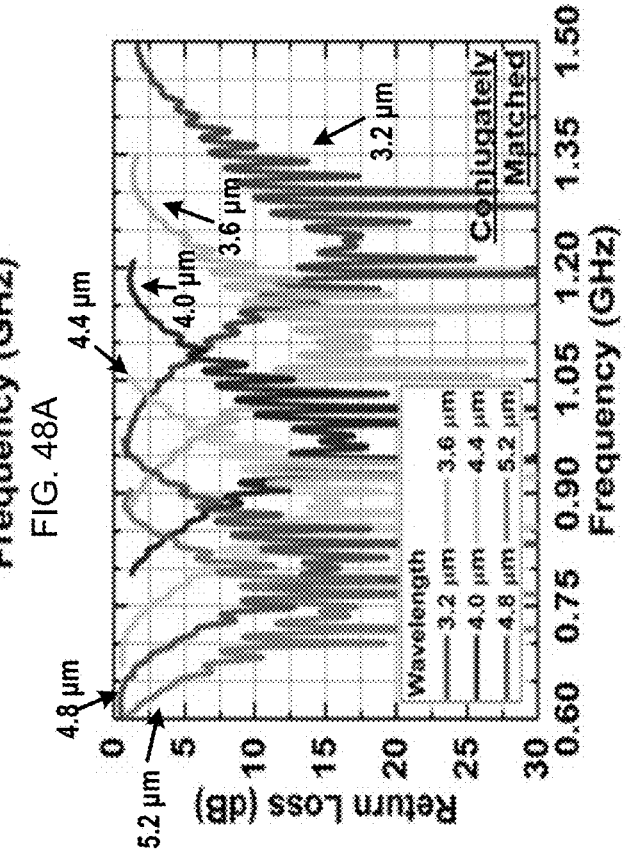
FIG. 48A
FIG. 48B
FIG. 48C

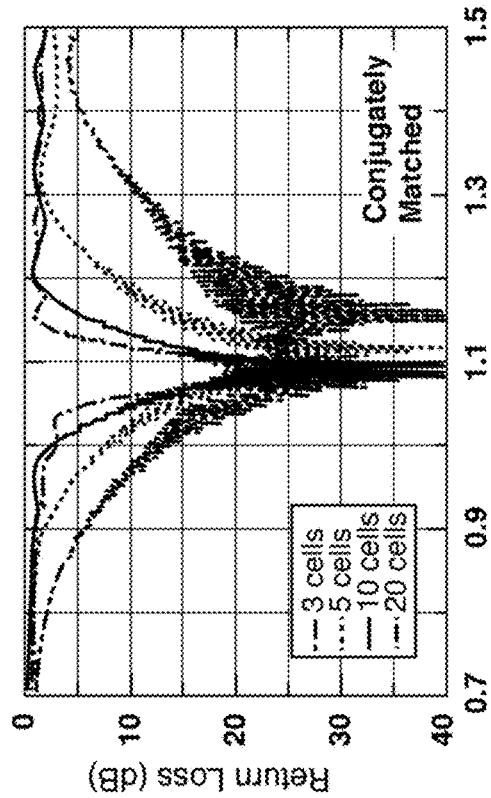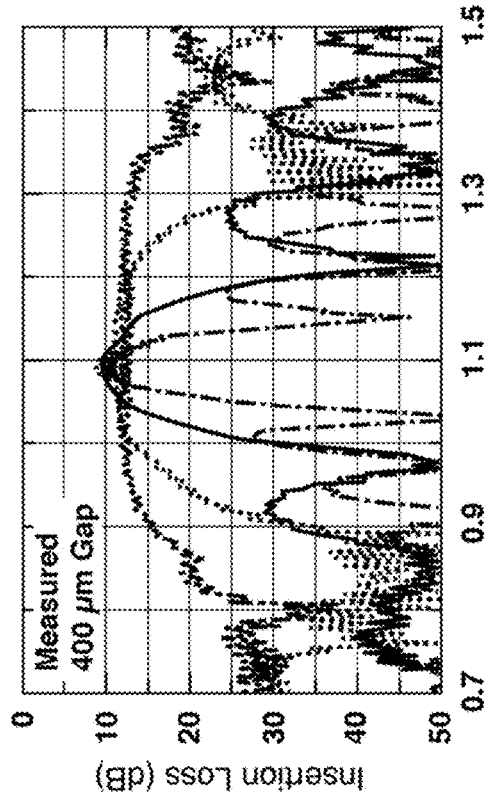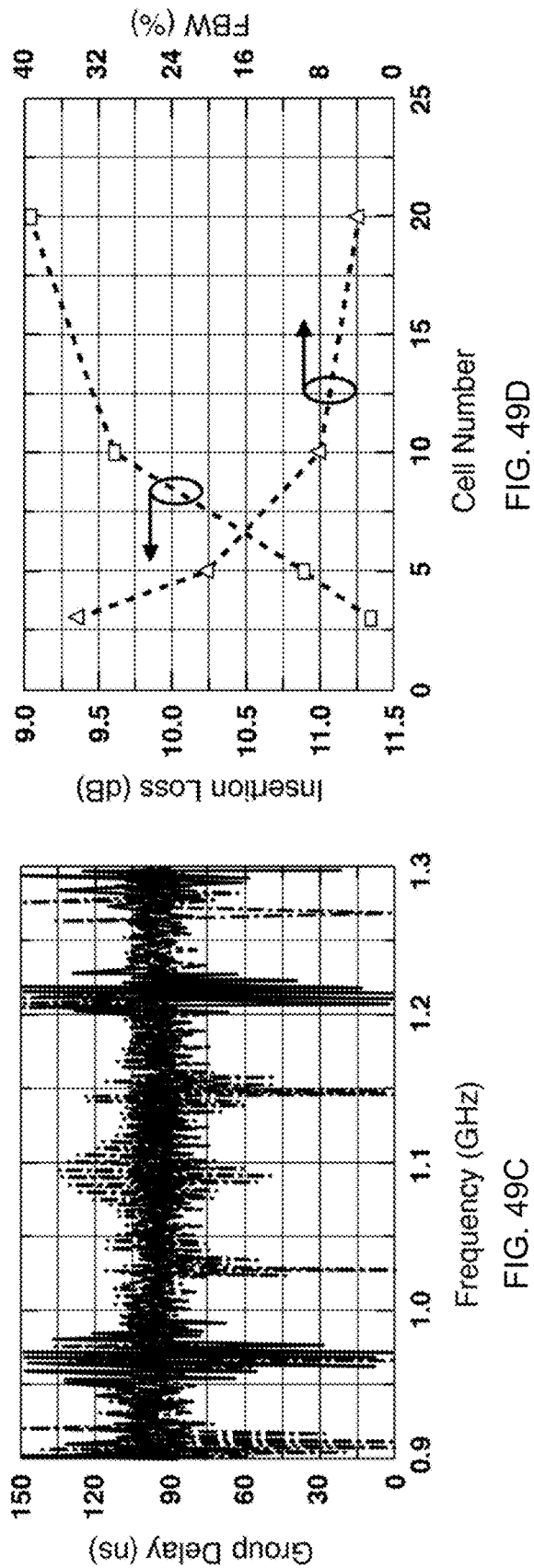
FIG. 49A
FIG. 49B
FIG. 49C
FIG. 49D

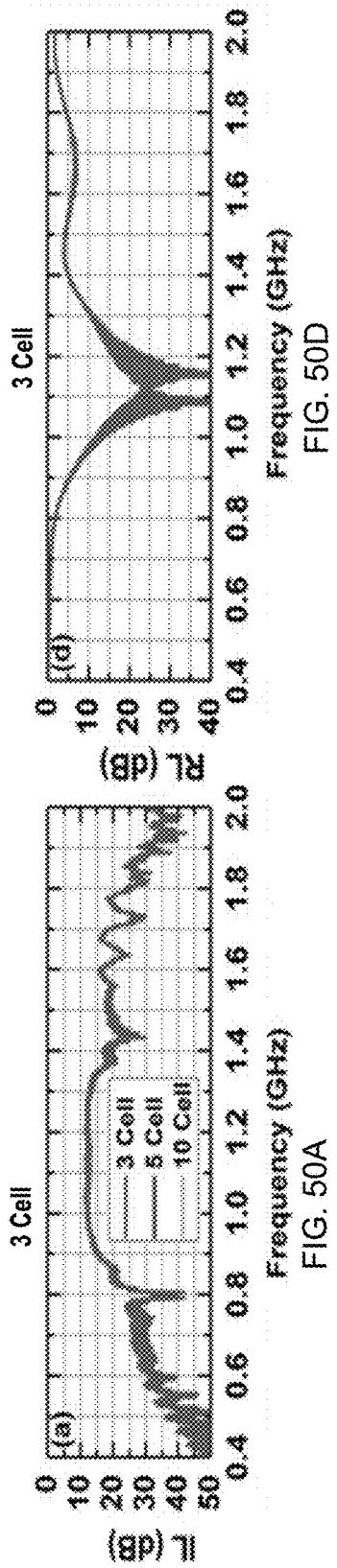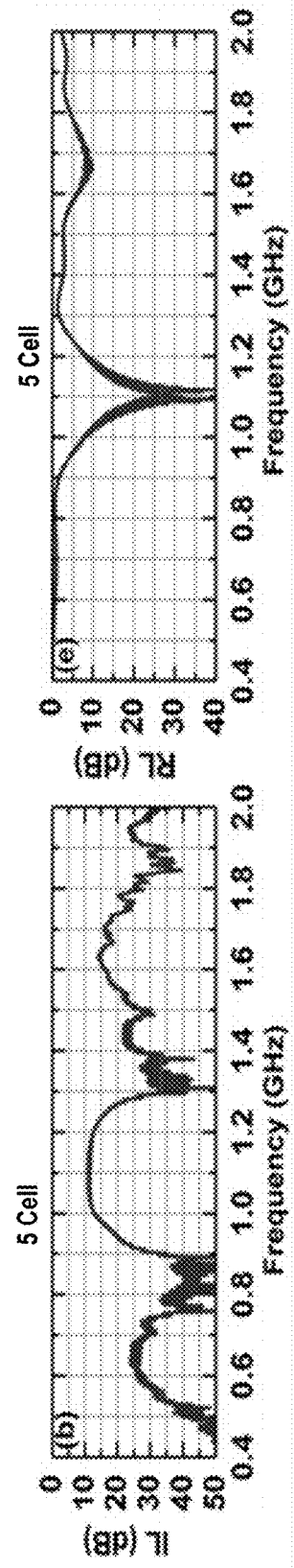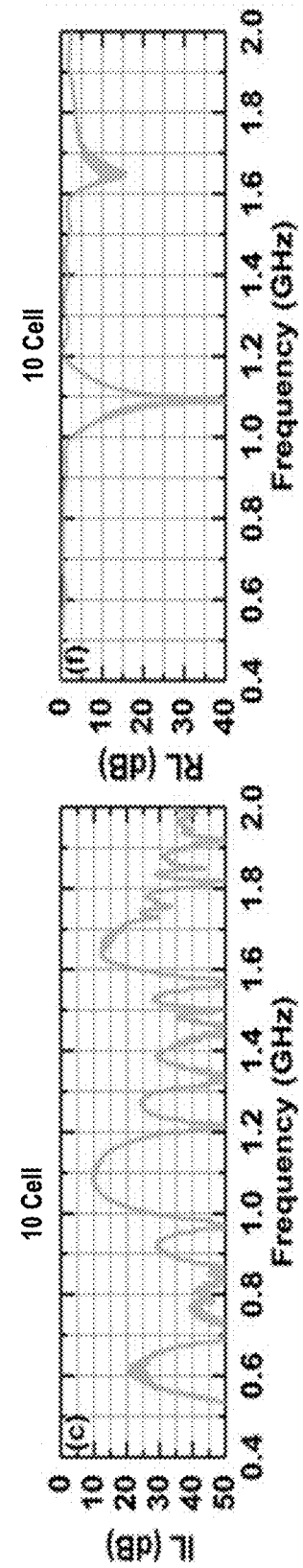
FIG. 50

LOW-LOSS AND WIDE-BAND ACOUSTIC DELAY LINES USING X-CUT AND Y-CUT LITHIUM NIOBATE PIEZOELECTRIC THIN FILMS

RELATED APPLICATIONS

This application claims the benefit under 35 U.S.C. § 119(e) of U.S. Provisional Patent Application No. 62/923,213, filed Oct. 18, 2019, which is incorporated herein by this reference in its entirety.

FEDERALLY SPONSORED RESEARCH OR DEVELOPMENT

This disclosure was made with government support under Grant No. HR0011-15-C-0139 awarded by the Department of Defense (DOD). The government has certain rights in the invention.

TECHNICAL FIELD

Embodiments of the disclosure relate generally to acoustic delay lines, and more specifically, relate to interdigital transducers on a suspended piezoelectric thin-film for radio frequency acoustic signal processing.

BACKGROUND

Full-duplex radios, where the transmitters and receivers operate simultaneously in the same frequency the transmitters and band, have sparked great research interest due to their great potential to enhance spectrum utilization efficiency and reduce networking complexity.

BRIEF DESCRIPTION OF THE DRAWINGS

A more particular description of the disclosure briefly described above will be rendered by reference to the appended drawings. Understanding that these drawings only provide information concerning typical embodiments and are not therefore to be considered limiting of its scope, the disclosure will be described and explained with additional specificity and detail through the use of the accompanying drawings.

FIG. 1A is a schematic illustration of an acoustic delay line (ADL) with an air gap according to one embodiment.

FIG. 1B is a schematic illustration of an ADL device with a high-acoustic impedance layer according to one embodiment.

FIG. 1C is a schematic illustration of an ADL device with a set of high-acoustic impedance layers and a set of low-acoustic impedance layers according to one embodiment.

FIG. 12 shows optical top-view images of ADLs 1 and 8 according to one embodiment.

FIG. 13 shows optical images of SPUDT ADLs 13 and 14 (Table 1) according to one embodiment.

FIGS. 15A-15H are graphs illustrating measured and simulated S-parameters according to some embodiments.

FIGS. 29A-29F are optical microscope images of fabricated ADLs according to some embodiments.

FIGS. 33A-33C are a set of graphs that illustrate measured S-parameters of the ADLs (N=20, $L_g$=0.1 mm) with identical gap lengths but different λ (3.2-6.8 μm) or center frequencies according to some embodiments.

FIGS. 34A-34D are a set of graphs that illustrate extracted propagation parameters of the gigahertz S0 mode acoustic waves according to some embodiments.

FIGS. 40A-40B are a set of graphs that illustrate the performance trade-off between minimum IL and FBW of SPUDT in various platforms according to some embodiments.

FIGS. 43A-43F are optical microscope images of the fabricated SH0-mode ADLs according to some embodiments.

FIGS. 45A-45C are a set of graphs that show the measured performance of the ADLs (Group B, N=20, $L_g$=0.1 mm) with different λ (32-52 μm) or center frequencies according to some embodiments.

FIGS. 46A-46F are a set of graphs that illustrate the measured wideband performance of different ADLs in Group B according to some embodiments.

FIGS. 47A-47C are a set of graphs that illustrate the measured performance of the ADLs (Group C, N=10, $L_g$=0.1 mm) with different λ (3.2-5.2 μm) or center frequencies according to some embodiments.

FIGS. 48A-48C are a set of graphs that illustrate the measured performance of the ADLs (Group C, N=5, $L_g$=0.1 mm) with different λ (32-52 μm) or center frequencies according to some embodiments.

FIGS. 49A-49D are a set of graphs that illustrate the measured performance of the ADLs (Group E, λ=36 μm, $L_g$=04 mm) with different N(3-20) or FBW according to some embodiments.

FIGS. 50A-50F are a series of graphs illustrating the measured wideband performance of different devices in Group E according to some embodiments.

DETAILED DESCRIPTION

Figure 2A:
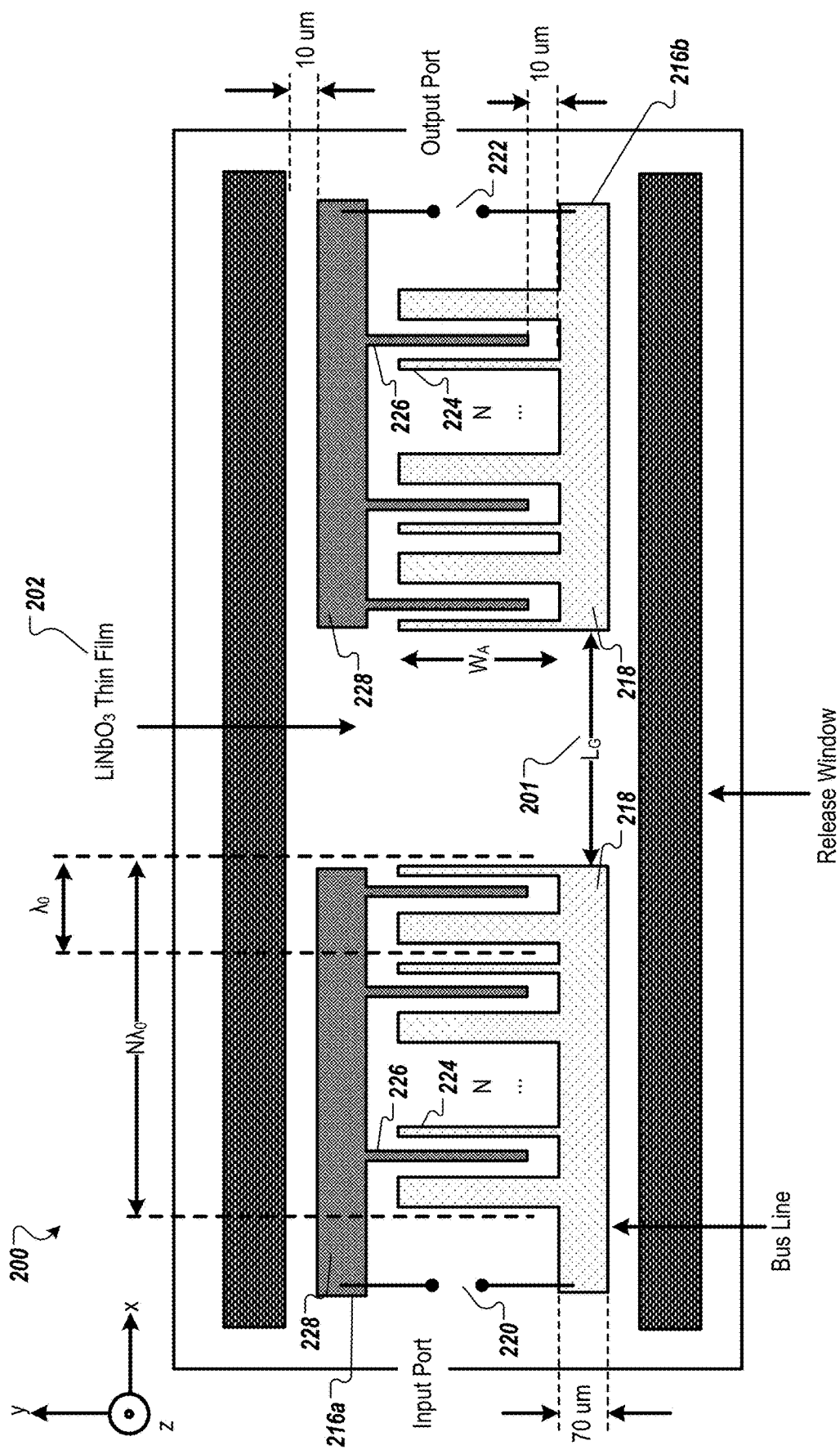
FIG. 2A is a top view of an ADL according to one embodiment.

By way of introduction, the present disclosure relates to acoustic delay lines (ADLs) with interdigital transducers (IDTs) on a piezoelectric thin film, an apparatus, and a full-duplex radio that include disclosed ADLs. Lithium niobate (LiNbO$_3$) thin films can be excellent platforms for implementing low-loss ADLs based on unidirectional transducers. The reason lies in the high acoustic reflections caused by a mechanical loading of electrodes on the LiNbO$_3$ thin film. Low-loss ADLs can be based on shear-horizontal waves in thin-film LiNbO$_3$. These propagation modes are known for their high electromechanical coupling, thus producing devices (e.g., ADLs) with large bandwidths. Such ADLs can be based on their acoustic vibration modes. Lamb modes (S0, A0, S1, A1, . . . ) and shear modes (SH0, SH1, SH2 . . . ) can both be used.

The expansion of wireless interconnectivity among autonomous sensors or mobile devices seeks analog signal processing functions with low loss, small form factors, and low or zero power consumption at radio frequencies (RF). In this context, acoustic devices may constitute an excellent chip-scale and low-loss platform, in which electromagnetic (EM) waves can be converted into the acoustic domain for processing, and can subsequently be converted back to the EM domain for interfacing with the rest of the system. In the RF domain, the propagation of acoustic waves in some piezoelectric thin films can exhibit much lower loss than the propagation of EM waves in planar waveguide structures (e.g., microstrips). Moreover, given the low phase velocities, typically below 10000 m/s, and the low propagation loss of acoustic waves, high-performance waveguide structures can be designed with sizes comparable to the acoustic wavelengths (e.g., on the order of tens of micrometers) for RF applications. As a result of the above-mentioned benefits in the acoustic domain, wave phenomena can be exploited for signal processing functions (e.g., time delay or transversal filtering) in a very small form factor that otherwise may not be accessible in the EM domain at RF.

The study of signal processing functions in the acoustic domain could be motivated by radar system implementations. Surface acoustic waveguide structures, namely ADLs can be built on piezoelectric bulk substrates, with which the electromechanical transduction from the electrical domain to the acoustic domain is provided by piezoelectricity of the material. By storing a received pulse in an ADL for comparison with a subsequent pulse, the scattering from static objects can be canceled, thus diminishing clutter in the radar displays. Following the advances made for radars, other applications for ADL, such as frequency discriminators and modulators/demodulators for frequency shift keying (FSK), also emerged. These applications can all leverage the large time-delay structure accessible only in ADLs to introduce delays over a broad bandwidth for signal processing. For instance, an FSK-based spread spectrum communication scheme can represent each data symbol with a code formed by a sequence of frequencies at RF. An ADL can then be used to impose delays to the incoming signal as a function of its frequency to perform matched filtering for demodulation of the signal. Similarly, such a function of ADLs can be also dual-purposed as a modulator on the transmitter side.

In addition to various flavors of matched filtering, perhaps the most pervasive application of ADLs is transversal filtering. Transversal filters based on ADLs can offer flexibility in designing both the amplitude and phase responses while achieving high out-of-band (OOB) rejection. The operating principle of transversal filtering relies on tapping a delay line at different points. By connecting these taps situated at different sections of the ADL, the output signals can be combined in the electrical domain to form a finite Fourier series. With properly designed electrode pitch, polarity, and electrode sections in the ADL, the frequencies, phases, and relative amplitudes of the terms in the Fourier series can be varied to obtain a quasi-arbitrarily configurable filter response. Because of such addressability in their response, transversal filters understandably may be favored over filters based on coupled resonators, such as those based on surface acoustic waves (SAW), lamb waves, or thickness modes, for certain applications.

Some ADLs have applications in enabling compact and low-power non-reciprocal networks using time-varying circuit structures. In these approaches, a pair of an array of ADLs can be controlled and accessed by switches on both ends so that signals can be routed between ports on opposite sides of delay lines only in certain allowed paths. Such an ability to engineer chip-scale non-reciprocal response without resorting to magnetic materials can provide for implementing front-ends with the simultaneous transmit and receive capability.

The ADLs formed by piezoelectric interdigital transducers of the simplest type may suffer from high bi-directionality losses and may entail a minimum insertion loss (IL) of 6 dB. Transducers with a predominant radiation direction, known as unidirectional transducers (UDTs), can enable lower IL ADLs. Single-phase unidirectional transducers (SPUDTs) can be used to overcome the complexity in impedance matching. These designs can be based on embedding acoustic reflectors formed by grounded or floating electrodes in an asymmetrical arrangement with respect to the signal electrodes. The performance of ADLs formed by SPUDTs may be limited by the imperfect unidirectionality of the transducers that is caused by the finite reflectivity achievable with the electrodes.

Some ADLs are based on SAWs excited on a piezoelectric substrate, which may be made of lithium niobate (LiNbO$_3$), lithium tantalate (LiTaO$_3$), or quartz. LiNbO$_3$ devices can additionally or alternatively be based on plate modes, like Lamb and shear-horizontal waves. Because of the high electro-mechanical coupling ($k_t^2$) of these vibrational modes, resonators can be demonstrated with fractional bandwidths (FBWs) that can outperform SAW ADLs. The advantage of this high coupling can also be demonstrated in dispersive delay lines. A mechanical loading produced by the metal electrodes on the thin-film structure can be expected to be more pronounced than in SAW devices, in which the wave propagates on the surface of a thick substrate. The higher reflectivity of the electrodes provided by the mechanical loading can be exploited to reduce the bi-directionality losses of SPUDTs.

In some embodiments, ADLs based on the fundamental shear-horizontal waves (SH0) in LiNbO$_3$ can be used to implement delays with low loss and large bandwidth. For example, in some embodiments, an ADL can produce a delay of 75 ns with an IL below 2 dB over a 3 dB bandwidth of 16 MHz, centered at 160 MHz.

Aspects of the present disclosure address the above challenges among others by using low-loss and wide-band acoustic delay lines (ADLs). The ADLs include a piezoelectric thin film located above a carrier substrate. A first interdigitated transducer (IDT) may be disposed at a first end of the thin film and a second IDT may be disposed at a second end of the piezoelectric thin film. The first IDT is to convert an input electromagnetic signal (e.g., an RF signal traveling along a longitudinal direction along a length of the piezoelectric thin film) into an acoustic wave. The second IDT is to convert the acoustic wave into an output electromagnetic signal, which can be delayed in time compared to the first electromagnetic signal. In some embodiments, the IDTs are unidirectional. In other embodiments, the IDTs are bi-directional.

In some embodiments, the piezoelectric thin film is suspended above the carrier substrate. In other embodiments, the piezoelectric thin film is disposed on a high acoustic impedance layer interposed between the piezoelectric thin film and the carrier substrate. In still further embodiments, the high acoustic impedance layer includes at least one of silicon (Si), sapphire, fused silica, quartz, silicon carbide (SiC), diamond, aluminum nitride (AlN), aluminum oxide ($Al_2O_3$), tungsten, molybdenus, platinum, or combinations thereof. In some embodiments, the piezoelectric thin film is disposed on a Bragg reflector interposed between the piezoelectric thin film and the carrier substrate. In some embodiments the Bragg reflector includes a set of alternating high acoustic impedance layers and low acoustic impedance layers. The low acoustic impedance carrier may be at least one of silicon nitride ($Si_3N_4$) or silicon dioxide ($SiO_2$). In some embodiments, interfaces between the high acoustic impedance layers and low acoustic impedance layers can reflect the acoustic waves, and can lead to multiple reflections from the alternating layers. In further embodiments, acoustic energy can be confined in a layer (e.g., the piezoelectric thin film) above the Bragg reflector, which may prevent or minimize energy leakage into the carrier substrate via the multiple reflections.

In various embodiments, the acoustic wave travels within the piezoelectric thin film in at least one of a fundamental symmetrical (S0) mode, a first-order symmetrical (S1) mode, a second-order symmetrical (S2) mode, a fundamental shear-horizontal (SH0) mode, a first-order shear-horizontal (SH1) mode, a first-order antisymmetric (A1), or a third-order antisymmetric (A3) mode. In some embodiments, the modes are excited by at least one of a longitudinal-direction (e.g., along a length of the piezoelectric thin film) component of an electric field or a thickness-direction component of the electric field. In some embodiments, the electric fields are induced by incoming electromagnetic signal(s) (e.g., RF signal(s)). In some embodiments, the orientation of the induced electric field is determined by the configuration of electrodes of the IDTs in relation to a particular cut of the piezoelectric thin film. In some embodiments, the electric field is generated by a voltage potential that is applied between a signal bus line and a ground bus line.

In various embodiments, the piezoelectric thin film includes one of an X-cut, Y-cut, Z-cut, 128Y-, 54Y-, or 36Y-cut lithium niobate ($LiNbO_3$) thin film. For example, the 128Y-cut, 54Y-cut, or 36Y-cut can be considered as rotated cut variations of the Y-cut $LiNbO_3$ thin film. In some embodiments, the piezoelectric thin film includes one of a reactively sputtered c-axis aluminum nitride (AlN) or scandium aluminum nitride (ScAlN). In some embodiments, the piezoelectric thin film includes one of an X-cut $LiNbO_3$ thin film or a Y-cut $LiNbO_3$ thin film that is rotated with respect to the longitudinal direction by an angle, such as between −30° to +30°. In other words, a y-axis of the $LiNbO_3$ thin film can be rotated by the angle, either in a clockwise or counterclockwise direction, with respect to the longitudinal direction. In some embodiments, the longitudinal direction can be oriented between 10 degrees clockwise and 30 degrees counterclockwise to a Y-direction of the $LiNbO_3$ thin film. In other embodiments, the longitudinal direction can be oriented between 10 degrees counterclockwise and 30 degrees clockwise to a Y-direction of the $LiNbO_3$ thin film.

FIGS. 1A-1C are schematic illustrations of a cross-sectional view of an ADL device 100, according to one embodiment. FIG. 1A is a schematic illustration of an ADL 110 with an air gap 106 according to one embodiment. The ADL device 110 includes a piezoelectric thin film 102 suspended above a carrier substrate 104. An air gap 106 is located between the carrier substrate 104 (e.g., carrier wafer) and the piezoelectric thin film 102 (e.g., piezoelectric layer). Electrodes and/or reflectors are located above the piezoelectric thin film 102, and are represented generally by 108. The electrodes and/or reflectors 108 can be physically and electrically coupled to the piezoelectric thin film 102.

FIG. 1B is a schematic illustration of an ADL device 120 with a high-acoustic impedance layer 112 according to one embodiment. The ADL device 120 is similar to the ADL device 110 except that the air gap is replaced by a high-acoustic impedance layer 112. In other words, the piezoelectric thin film 102 is located on the high-acoustic impedance layer 112. Illustrated is an ADL mock-up including single-phased unidirectional transducers (SPUDTs) disposed on top of a suspended $LiNbO_3$ thin film The high-acoustic impedance layer is located between the piezoelectric thin film 102 and the carrier substrate 104. In various embodiments, the high-acoustic impedance layer can be composed of one of silicon (Si), sapphire, fused silica, quartz, silicon carbide (SiC), diamond, aluminum nitride (AlN), aluminum oxide ($Al_2O_3$), tungsten, molybdenus, platinum, combinations thereof, or the like. Electrodes and/or reflectors 108 are located on top of the piezoelectric thin film 102. Electrodes and/or reflectors are located above the piezoelectric thin film 102, and are represented generally by 108. The electrodes and/or reflectors 108 can be physically and electrically coupled to the piezoelectric thin film 102.

FIG. 1C is a schematic illustration of an ADL device 130 with a set of high-acoustic impedance layers 112 and a set of low-acoustic impedance layers 114 according to one embodiment. The ADL device 130 is similar to the ADL device 110 except that the air gap is replaced by the set of high-acoustic impedance layers 112 and set of low-acoustic impedance layers 114. The piezoelectric thin film 102 is located on a combination of high acoustic impedance layers 112 and a combination of low acoustic impedance layers 114. In some embodiments, the high acoustic impedance layers 112 and the low acoustic impedance layers 114 form a stack in an alternating pattern and that stack is interposed between the piezoelectric thin film 102 and the carrier substrate 104. For example, respective ones of the low acoustic impedance layers 114 can be alternately disposed on respective ones of the high acoustic impedance layers 112.

The ADL device 130 illustrates a further embodiment in which the piezoelectric thin film 102 is disposed on a Bragg reflector which is composed of multiple alternating layers of high acoustic impedance layers 112 and low acoustic impedance layers 114. In some embodiments, each of the high acoustic impedance layers 112 and the low acoustic impedance layers 114 have the same thickness. In other embodiments, the high acoustic impedance layers 112 can have a different thickness than the low acoustic impedance layers 114. The low acoustic impedance carrier of the low acoustic impedance layers can be at least one of silicon nitride ($Si_3N_4$), silicon dioxide ($SiO_2$), benzocyclobutene (BCB), or other suitable polymers. The Bragg reflector can be disposed between the carrier substrate 104 (e.g., carrier wafer) and the piezoelectric thin film 102 (e.g., piezoelectric layer). Electrodes and/or reflectors 108 can be located on top of or above the piezoelectric layer. In some embodiments, interfaces between the high acoustic impedance layers 112 and the low acoustic impedance layers 114 can reflect the acoustic waves, and can lead to multiple reflections from the alternating layers. In further embodiments, acoustic energy can be confined in a layer above the Bragg reflector, and can prevent energy leakage into the carrier substrate. In some embodiments, high impedance devices, such as ADL 120) can provide better power handling. Further, air gap devices, such as the ADL 110, can provide higher quadrature (Q) values compared to devices that have no air gap.

FIG. 2A is a top view of an ADL 200 according to one embodiment. Illustrated is a mock-up of the ADL 200 including SPUDTs disposed on top of a suspended $LiNbO_3$ thin film. In one embodiment, the ADL 200 includes a suspended thin film 202 made of $LiNbO_3$. The suspended thin film 202 may constitute a propagation medium for the SH0 acoustic waves. In other embodiments, the suspended thin film may be AlN, ScAlN, or other suitable piezoelectric thin film. For the following discussion, X-cut $LiNbO_3$ is used as an illustrative example, although, in other embodiments, the $LiNbO_3$ thin film can have a Y cut. The choice of cuts may affect the propagation of acoustic wave modes. These modes may be excited by electric fields oriented in a longitudinal direction, e.g., along a direction of propagation of the acoustic wave, or in other words along the x-axis in FIG. 2A, or in the thickness direction, e.g., normal to a direction of propagation of the acoustic wave, or in other words along the y-axis in FIG. 2A.

In some embodiments the X-cut or the Y-cut $LiNbO_3$ thin film can be adapted to propagate an acoustic wave in at least one of a first mode excited by an electric field oriented in the longitudinal direction along a length of the piezoelectric thin film or in a second mode excited by the electric field oriented at least partially in the thickness direction of the piezoelectric thin film. The first mode can include at least one of a fundamental symmetrical (S0) mode, a first-order symmetrical (S1) mode, a fundamental shear-horizontal (SH0) mode, or a first-order antisymmetric (A1) mode. The second mode can include at least a first-order antisymmetric (A1) mode or a first-order shear-horizontal (SH1) mode. In some further embodiments, the Y-cut $LiNbO_3$ thin film includes one of a 128Y-cut, 54Y-cut, or 36Y-cut (also referred to as rotated Y cuts herein) $LiNbO_3$ thin film and the second mode includes one of a first-order symmetric (S1) mode. In some cases, the rotated Y cuts can also additionally propagate the acoustic wave in at least one of the first modes (S0, S1, SH0, and A1) excited by the electric field oriented in the longitudinal direction or one of the second modes (A1 and SH1) excited by the electric field oriented at least partially in the thickness direction. A thickness of the $LiNbO_3$ thin film can be taken to be between 30 nm and 100 μm. For illustrative purposes herein, the thickness of the $LiNbO_3$ thin film can be chosen to be 800 nm. As such, by way of example, the thickness of the $LiNbO_3$ thin film will be understood to be approximately 800 nm unless otherwise mentioned herein.

With continued reference to FIG. 2A, two sets of interdigital transducers (IDTs) 216a and 216b may include metal electrodes interconnected by bus lines 218 and may be disposed on top of the $LiNbO_3$ thin film 202. The IDTs 216a and 216b may be composed of at least one of gold (Au), aluminum (Al), molybdenum (Mo), platinum (Pt), or any other suitable conductive material. In one embodiment, the IDTs 216a and 216b may be unidirectional. In other embodiments, the IDTs 216a and 216b may be bi-directional. Either set of IDTs 216a and 216b can serve as the transmitting transducer (input port), while the other IDT serves as the receiving transducer (output port). In the depicted embodiment, the IDTs 216a and 216b are separated by a gap length 201 $L_G$ that may set the time delay experienced by an electrical signal traversing from an input port 220 to an output port 222. In some cases, the gap length 201 can be between 0 μm and several centimeters. In some cases, the gap length 201 may be larger. Each IDT 216a and 216b can be formed by cascading N identical transducer unit cells (which are described in more detail in reference to FIGS. 2B-2C). In some embodiments, the number N of transducer unit cells may range from 1 to 20. The number N of identical transducer cells may be as large as required for a given application. In some embodiments, the transducer unit cell may be a distributed acoustic reflector transducer (DART) unit cell (such as transducer unit cell 230b of FIG. 2B). In other embodiments, the transducer unit cell may be an electrode width controlled (EWC) unit cell (such as transducer unit cell 230c of FIG. 2C).

Figure 2B:
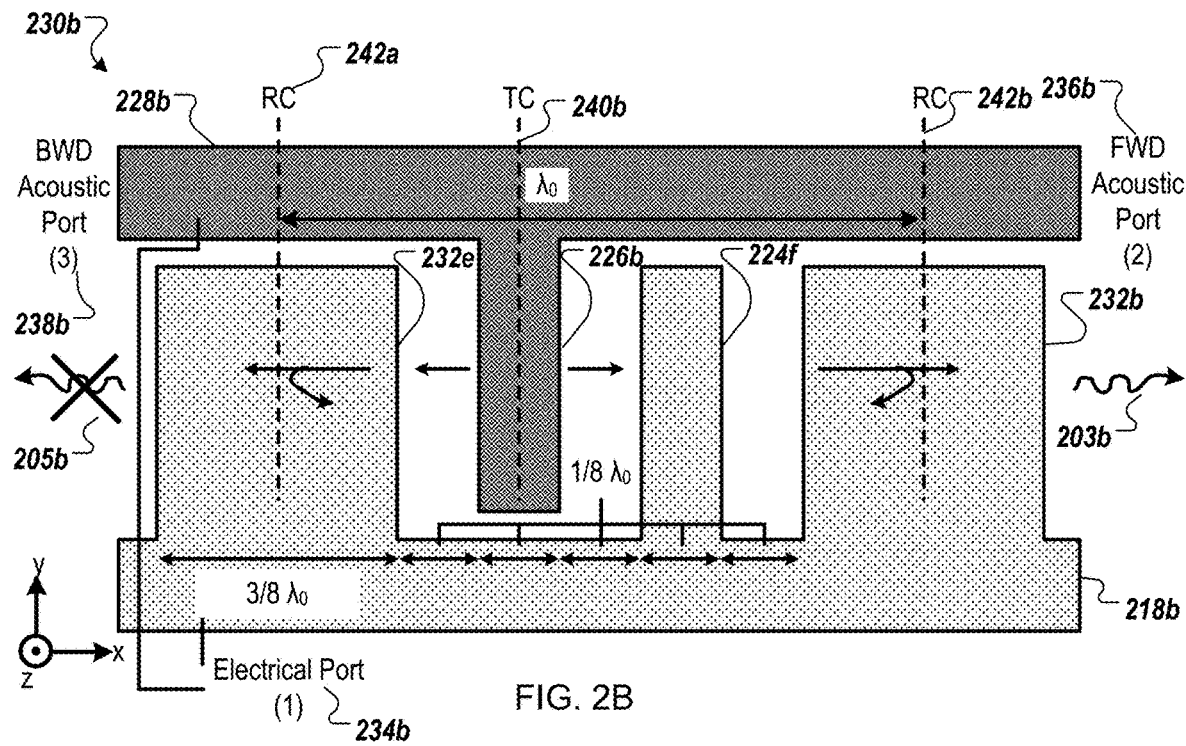
FIG. 2B is a top view of a distributed acoustic reflector transducer (DART) unit cell according to one embodiment.

FIG. 2B is a top view of a DART unit cell 230b according to one embodiment. The DART unit cell 230b is one example of a SPUDT. The DART unit cell 230b includes a signal electrode 226b coupled to an upper bus line 228b and a ground electrode 224b coupled to a ground bus line 218b. The signal electrode 226b and the ground electrode 224b can be collectively referred to as transduction electrodes herein. The transduction electrodes have a width of $\lambda_0/8$. The DART unit cell 230b also includes wider electrodes that are reflectors 232a and 232b (e.g., acoustic reflectors). A width of the reflectors 232a and 232b of the DART unit cell 230b is $3\lambda_0/8$.

While an ADL, such as the ADL 200, itself can be treated as an electrical device with two ports, the individual IDTs, as well as each included transducer unit cell (such as the DART unit cell 230b), can be analyzed as a three-port network that effectively has one electrical port 234b and two acoustic ports, including a forward (FWD) acoustic port 236b and a backward (BWD) acoustic port 238b. The two acoustic ports 236b and 238b effectively represent the two propagation directions (e.g., +x axis and −x-axis) into the acoustic medium.

In some cases, a transducer unit cell, and thus the corresponding IDT, can be a bi-directional transducer with no directionality. Such a transducer can emit the same amount of power towards both acoustic ports. Thus, in an ADL formed by bi-directional transducers and an acoustic media, only half of the acoustic power available at the input transducer is sent towards the output transducer, while the other half may get lost. By reciprocity, the bi-directional output transducer may only convert half of the incident acoustic power to the electric domain. Consequently, ADLs formed by bi-directional transducers may suffer from an intrinsic minimum IL of 6 dB.

In order to mitigate the acoustic power loss due to bi-directionality, unidirectional transducers, such as single-phased unidirectional transducers (SPUDTs), such as the DART unit cell 230b can be employed, although this may come at the cost of reduced bandwidth. The operation principle of SPUDTs can be explained from the analysis of the transduction and reflection centers founded in their electrode layouts. A transduction center (TC) is a reference plane at which the acoustic waves launched towards both longitudinal directions (e.g., the +x and −x directions) have the same amplitude and phase. Similarly, a reflection center (RC) is a reference plane at which the wave reflections from both longitudinal directions (e.g., the +x and −x directions) are equal.

In some IDTs, such as bi-directional IDTs, the TCs and RCs can be evenly distributed along the transducer. Alternatively, in SPUDTs, TC 240b can be arranged asymmetrically with respect to the RCs 242a and 242b, in a way such that the launched acoustic waves, through both transduction and reflection, interfere constructively (illustrated by acoustic wave 203b) towards one of the acoustic ports, while the waves launched towards the opposite acoustic port interfere destructively (illustrated by acoustic wave 205b), thus leading to the unidirectionality. For simplicity, and by way of example, the former port will be referred to as the FWD acoustic port 236b and the latter port will be referred to as the BWD acoustic port 238b in the present disclosure. However, it should be noted that in other embodiments, the former port can be referred to as the BWD acoustic port and the latter port can be referred to as the FWD acoustic port. In some cases, the TC can be placed closer to the nearest RC towards the BWD acoustic port than to the nearest RC towards the FWD acoustic port. The difference between these distances may be $\lambda_0/4$ to produce the mentioned constructive (destructive) interaction at the FWD (BWD) port.

Figure 2C:
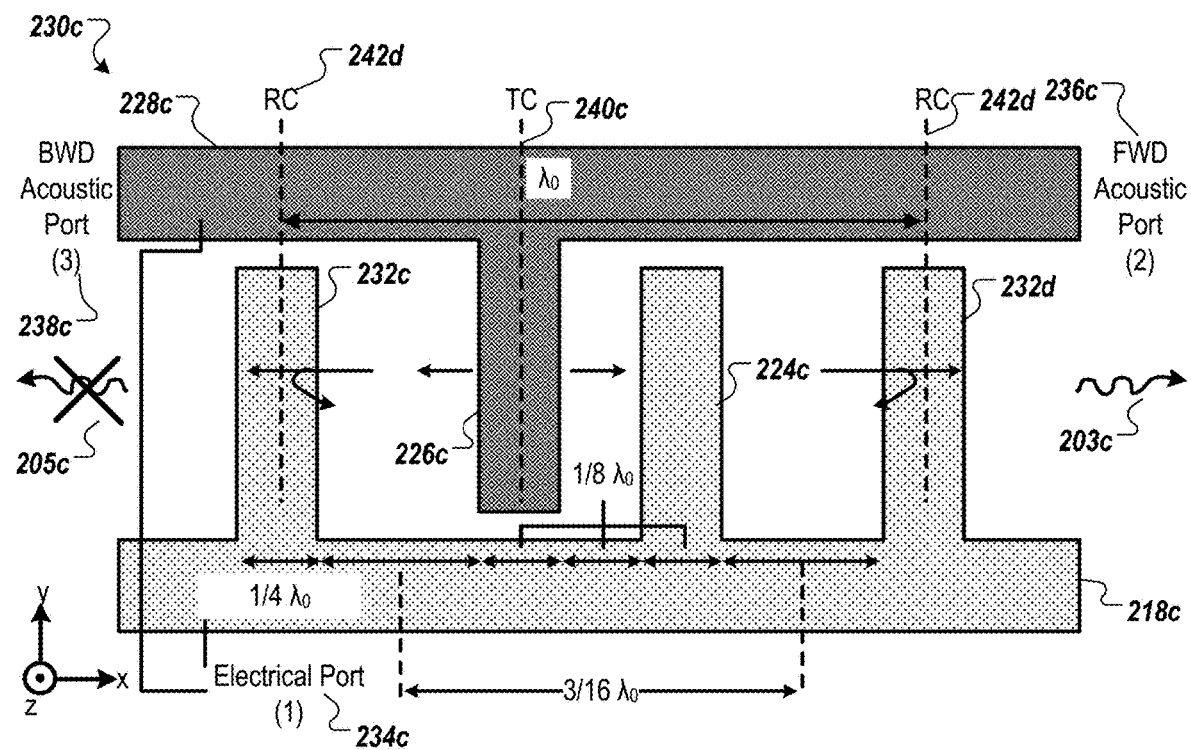
FIG. 2C is a top view of an electrode width controlled (EWC) unit cell according to one embodiment.

FIG. 2C is a top view of an EWC unit cell 230c, according to one embodiment. The EWC unit cell 230c is another example of a SPUDT. The EWC unit cell 230c includes a signal electrode 226c coupled to an upper bus line 228c and a ground electrode 224c coupled to a ground bus line 218c. The signal electrode 226c and the ground electrode 224c can be collectively referred to as transduction electrodes herein. The transduction electrodes have a width of $\lambda_0/8$. The EWC unit cell 230c also includes wider electrodes that are reflectors 232c and 232d (e.g., acoustic reflectors). A width of the reflectors 232c and 232d of the EWC unit cell 230c is $\lambda_0/4$.

The EWC unit cell 230c can also be analyzed as a three-port network that effectively has one electrical port 234b and two acoustic ports, including an FWD acoustic port 236c and a BWD acoustic port 238c. The two acoustic ports 236c and 238c effectively represent the two propagation directions (e.g., +x axis and −x axis) into the acoustic medium.

Similar to the DART unit cell 230b, in the case of the EWC unit cell 230c, the TC 240c can be arranged asymmetrically with respect to the RCs 242c and 242c, in a way such that the launched acoustic waves, through both transduction and reflection, interfere constructively (illustrated by acoustic wave 203c) towards one of the acoustic ports, while the waves launched towards the opposite acoustic port interfere destructively (illustrated by acoustic wave 205c), thus leading to the unidirectionality. For simplicity, and by way of example, the former port will be referred to as the FWD acoustic port 236c and the latter port will be referred to as the BWD acoustic port 238c in the present disclosure. However, it should be noted that in other embodiments, the former port can be referred to as the BWD acoustic port and the latter port can be referred to as the FWD acoustic port. In some cases, the TC can be placed closer to the nearest RC towards the BWD acoustic port than to the nearest RC towards the FWD acoustic port. The difference between these distances may be $\lambda_0/4$ to produce the mentioned constructive (destructive) interaction at the FWD (BWD) port.

With reference to FIGS. 2A-2C, each transducer unit cell can contain two types of electrodes: ground electrodes 232 and 224 that are connected to a lower bus line 218 and signal electrodes 226 that are connected to an upper bus line 228. In some cases, the thickness of the electrodes (including the ground electrodes 224 and 232 as well as the signal electrodes 226) may be between 5 nm and 10 μm. In some cases, the thickness of the electrodes may be larger. When a voltage is applied between the lower bus line 218 and the upper bus line 228 (e.g., from an electromagnetic signal, for example, an RF signal), electric fields (e.g., E-fields) may be generated between the signal electrodes 226 and the ground electrodes 224 along the propagation direction (e.g., the x-axis). In some embodiments, the electric fields may be induced by one or more incoming electromagnetic signals. Further, the orientation of the induced electric fields may be determined by the configuration of the electrodes 224 and 226. Through the inverse piezoelectric effect, the E-fields can subsequently launch fundamental shear-horizontal strain and stress waves (SH0) in the xy-plane towards both the +x and −x directions. By reciprocity, the shear stress and/or strain in the xy-plane associated with an acoustic wave propagating through the receiving IDT 216 can generate a voltage difference across the corresponding input electrical port 220. The efficiency of the conversion between electrical and acoustic energy can be maximum at a center frequency, $f_0$, at which an acoustic wave is phase-delayed by 360° after traveling through a transducer unit cell. The value of $f_0$ can be determined by the length of the unit cells $\lambda_0$ as $$f_0 = \frac{v_t}{\lambda_0}, \tag{1}$$

where $v_t$ is the average phase velocity of the acoustic wave in the transducer unit cell. In some cases, the length of the transducer unit cell can range between 0.1 μm to 100 μm. An average phase velocity of the acoustic wave can be calculated as a weighted average between a phase velocity $v_\infty$ of the un-metallized LiNbO$_3$ film and a phase velocity $v_m$, of the metallized film which can be expressed as $$v_t = \eta v_m + (1-\eta) v_\infty, \tag{2}$$

where η is the metallization ratio of the transducer unit cell. The dependence of $f_0$ on the thickness of the piezoelectric thin film can be neglected, due to the weak dispersive nature of SH0 waves.

Figure 3A:
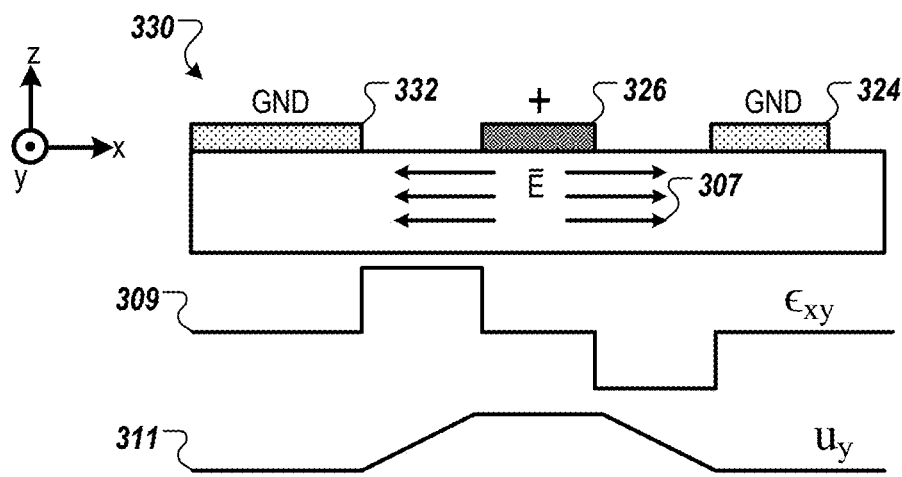
FIG. 3A is a side-view of a single-phase unidirectional transducer (SPUDT) with an effective electric field and a corresponding strain curve and displacement curve according to one embodiment.

FIG. 3A is a side-view of a SPUDT 330 with an effective electric field 307 and a corresponding strain 309 curve and displacement 311 curve according to one embodiment. Although not all components of the SPUDT 330 are shown, the SPUDT 330 is similar to the DART unit cell 230b and/or the EWC unit cell 230c as noted by similar reference numbers.

To locate the TCs 240b and 240c of the transduction unit cells 230b and 230c of FIGS. 2B-2C, respectively it should first be noted that shear-horizontal waves can be generated through piezoelectricity in the areas with x-polarized electric fields, such as the electric field 307. These areas may be the gaps between the signal electrode 326 and the adjacent ground electrodes 324 and 332 on either side. In adjacent gap areas, the x-polarized electric fields induced by the electrodes may have opposite signs, as seen in FIG. 3A. Therefore, in a transduction unit cell (such as the DART unit cell 230b), a center of the signal electrode 326 may be approximately an axis of anti-symmetry for a generated xy-plane strain $\epsilon_{xy}$ 309. Since $\epsilon_{xy}$ 309 is the derivative of a y-axis displacement $u_y$ 311 with respect to x, $u_y$ 311 is symmetric with respect to the center of the signal electrode 326. Thus, this point can be considered the TC for the displacement wave $u_y(x, t)$ 311. The same approximation can be adopted for EWC unit cells. FIG. 3A shows that the induced strain 309 and displacement 311 may be respectively antisymmetric and symmetric with respect to the center of the signal electrode 326.

Figure 3B:
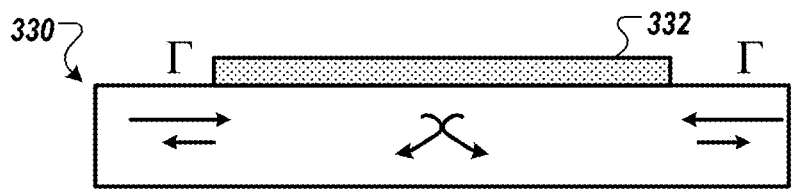
FIG. 3B is a side-view of the SPUDT to illustrate a reflection center (RC) according to one embodiment.

FIG. 3B is a side-view of the SPUDT 330 to illustrate an RC according to one embodiment. Following the same symmetry rationale as for the TC, the center of a reflection electrode 332 can be regarded as a reflection center. Due to the symmetry of the electrodes and the law of conservation of power, the reflection coefficients of metal electrodes referred to their centers may be purely imaginary. FIG. 3B shows equal reflection coefficients with respect to to the center of the electrode for incidences from both sides.

Figure 3C:
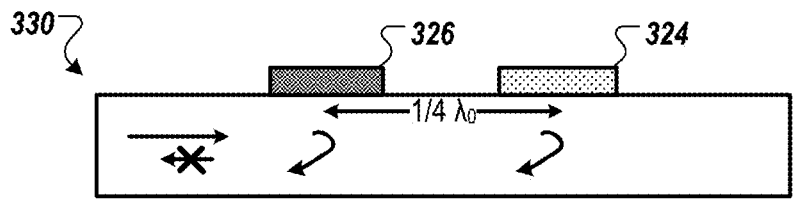
FIG. 3C is a side-view of the SPUDT to illustrate unidirectionality according to one embodiment.

FIG. 3C is a side-view of the SPUDT 330 to illustrate unidirectionality according to one embodiment. As seen in FIG. 3C, in either a DART unit cell or an EWC unit cell, there can be a pair of electrodes 324 and 325 which have a width of $\lambda_0/8$ and are connected to ground and signal, respectively, with a center-to-center distance of $\lambda_0/4$. The acoustic waves respectively reflected by these electrodes can have a phase difference of 180° at the center frequency $f_0$ and interfere destructively. Assuming small reflections, their amplitudes can be considered equal, resulting in a perfect theoretical cancellation. In other words, acoustic waves reflected by the two adjacent $\lambda_0/8$ electrodes 324 and 326 can produce an overall substantially zero reflection coefficient. As a result, the $\lambda_0/8$-wide electrodes 324 and 326 with a center-to-center distance of $\lambda_0/8$ can be omitted from the analysis for reflections within the SPUDTs. Different from $\lambda_0/8$-wide electrodes, the wider electrodes (such as the acoustic reflectors, or the wider electrodes 332) may be intended to produce pronounced reflections. In other words, FIG. 3C shows a reflection-less nature of two identical electrodes 324 and 326 separated by a distance of $\lambda_0/4$ at $f_0$.

Figure 3D:
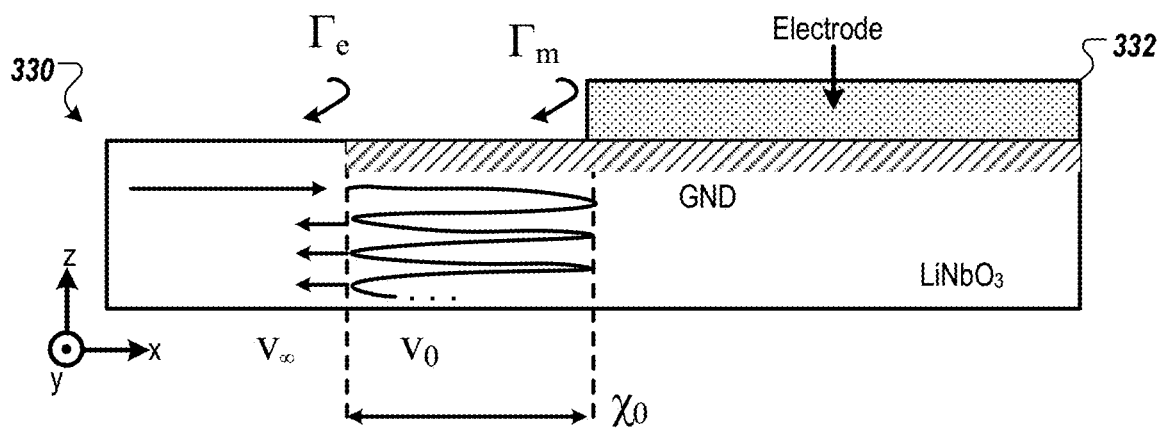
FIG. 3D is a side-view of the SPUDT to illustrate multiple reflections of acoustic waves according to one embodiment.

FIG. 3D is a side-view of the SPUDT 330 to illustrate multiple reflections of acoustic waves according to one embodiment. As seen FIGS. 2B-2C, the acoustic emission towards the FWD acoustic port 236 can be a combination of the waves generated at the TC 240 towards the FWD acoustic port 236 and the acoustic waves towards the BWD acoustic port 238 that are reflected from the closest RC on the left. For both DART and EWC designs, the RCs 242a and 242d can be separated from TCs 240b and 240c, respectively, by a distance of $3\lambda_0/8$. Assuming a negative imaginary reflection coefficient F (with a phase angle of 90 degrees), the reflected acoustic waves can be in phase with the acoustic waves generated at the TC towards the FWD acoustic port 236 at $f_0$. Note that the acoustic waves sent by the further transduction unit cells on the left may also interfere constructively given the $\lambda_0$ periodicity. The acoustic emission towards BWD acoustic port 238 may be the result of the interference of the waves generated at the TC and their reflection from the closest RC on the right. Due to the $5\lambda_0/8$ separation between the TCs 240b and 240 and RCs 242b and 242d, respectively, on the right, the directly transduced waves towards the BWD acoustic port 238 and their reflection from RCs may be out of phase. Hence, the BWD acoustic port 238 may receive less acoustic power than the FWD acoustic port 236 due to the partial cancellation of the directly transduced acoustic waves by the reflection. In some cases, a single reflection may not be sufficient to achieve the elimination of transduction towards the BWD acoustic port 238 and unidirectionality towards the FWD acoustic port 236. More transduction unit cells may be required for this purpose. In a multi-cell ∞configuration (e.g., with N transduction unit cells), the RC in each cell can all serve to produce reflection for every TC. Therefore, the interference in both directions combines all the directly transduced waves from all TCs and all the reflections generated by all the RCs. The dynamics in a multi-cell configuration can be analyzed, and it can be shown that a near-perfect unidirectionality is thus possible with multiple cells and multi-reflections.

The total reflection illustrated by FIG. 3D is induced by a metal electrode as a combination of two contributions, one electrical ($\Gamma_e$) and one mechanical ($\Gamma_m$). As discussed above, the directionality of the SPUDT 330 may be based on the reflectivity of the wide electrodes 332 in each unit cell. The reflectivity of each reflector can be quantitatively modeled. The reflection coefficient F of an electrode can be considered as the result of two phenomena. First, it can have a mechanical component, $\Gamma_m$, caused by the edges of the electrode on the film, along with the change in the acoustic impedance in sections with metal coverage. The change in acoustic impedance can arise from unequal mass density and stiffness of the electrode metal and LiNbO$_3$. Second, F can have an electrical contribution, $\Gamma_e$, caused by a constant potential boundary condition created on the top surface of the LiNbO$_3$ film by the metallization. In other words, $\Gamma_e$ is the reflection coefficient created by a strip of perfect electric conductor (PEC) of zero thickness. To calculate the total reflection coefficient, the mechanical and electrical reflections can be treated as if they were produced at different locations separated by a distance Xo, as seen in FIG. 3D. By solving the multiple reflections between these two locations and taking a limit $\chi_0 \to 0$, the total reflection coefficient can be obtained as $$\Gamma = \frac{\Gamma_e + \Gamma_m}{1 + \Gamma_e \Gamma_m} \quad (3)$$

for small reflections, e.g., $\Gamma_e\Gamma_m \ll 1$, $\Gamma \approx \Gamma_e + \Gamma_m$.

For the reflections that are mechanically-induced by metal electrodes, analytical expressions can be found for SAW devices. For wave propagation in plates, the methods to predict the reflections from mechanical discontinuities can rely on finite element method (FEM) simulations. For an electrode on a thin film, acoustic waves can be reflected as they travel from an un-metalized section to a metalized portion of the LiNbO$_3$ film (e.g., step-up). Further, acoustic waves can be reflected as they travel from a metalized portion to an un-metalized section (e.g., step-down). As a result of both reflections, an equivalent overall mechanical reflection coefficient $\Gamma_m$ can be defined for a single electrode.

Figure 4A:
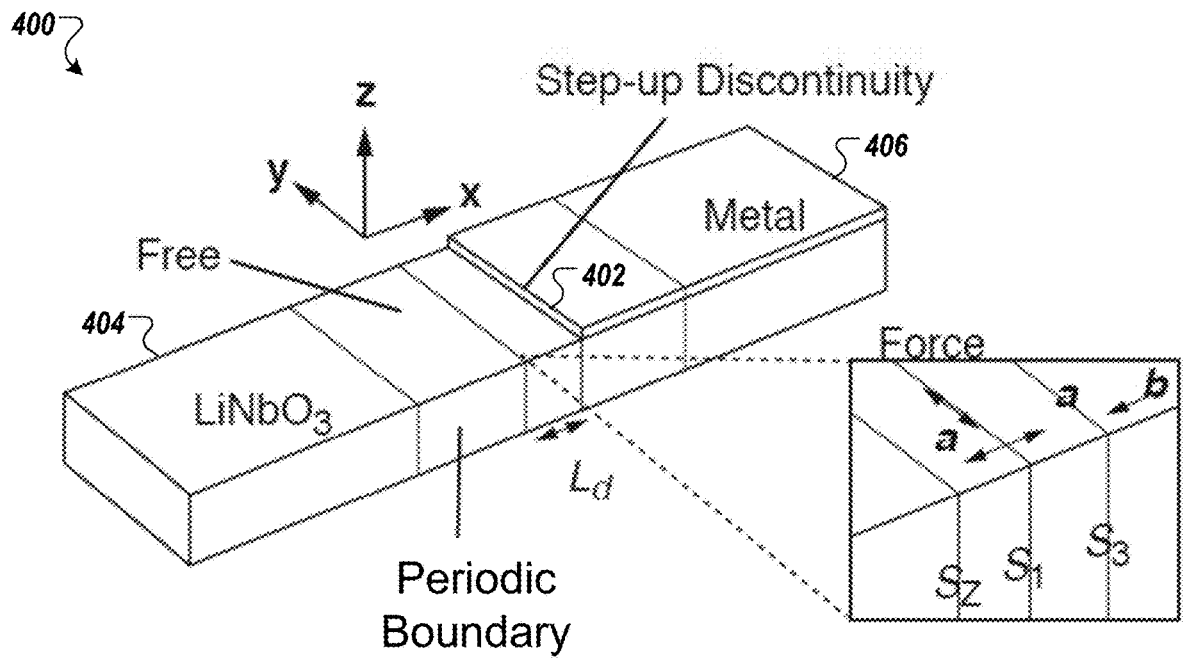
FIG. 4A illustrates a COMSOL model for calculating the mechanical reflection coefficient from a step-up discontinuity caused by metallization, according to one embodiment.

FIG. 4A illustrates a COMSOL model 400 for calculating the mechanical reflection coefficient from a step-up discontinuity 402 caused by metallization, according to one embodiment. The model 400 shown in FIG. 4A can be built in COMSOL to evaluate the mechanical reflection from the step-up discontinuity 402 created by an electrode. The model may be composed of sections of the delay medium, including a non-metallized region 404 in one end and metallized region 406 in the other. Perfectly matched layer (PML) conditions can be set at both ends of the model to emulate an infinitely long mechanical medium along −x and +x. The faces (e.g., surfaces) at −y and +y can be modeled as periodic boundaries. Acoustic waves can be excited by a harmonic force applied at the cross-section at x=0 and $s_1$ in FIG. 4A, separated from the discontinuity by a distance $L_d$. With an excitation force along the y-axis, a first SH0 wave can be propagated in a first direction (e.g., along −x) and a second SH0 wave with the same amplitude as the first SH0 wave can be propagated in a second direction opposite to the first direction (e.g., along +x). The first SH0 wave and the second SH0 wave can have opposite phases if the strain $\epsilon_{xy}$ is considered as the wave variable. Alternatively, the first SH0 wave and the second SH0 wave can have the same phase if the displacement, $u_y$ is considered as the wave variable.

Figure 4B:
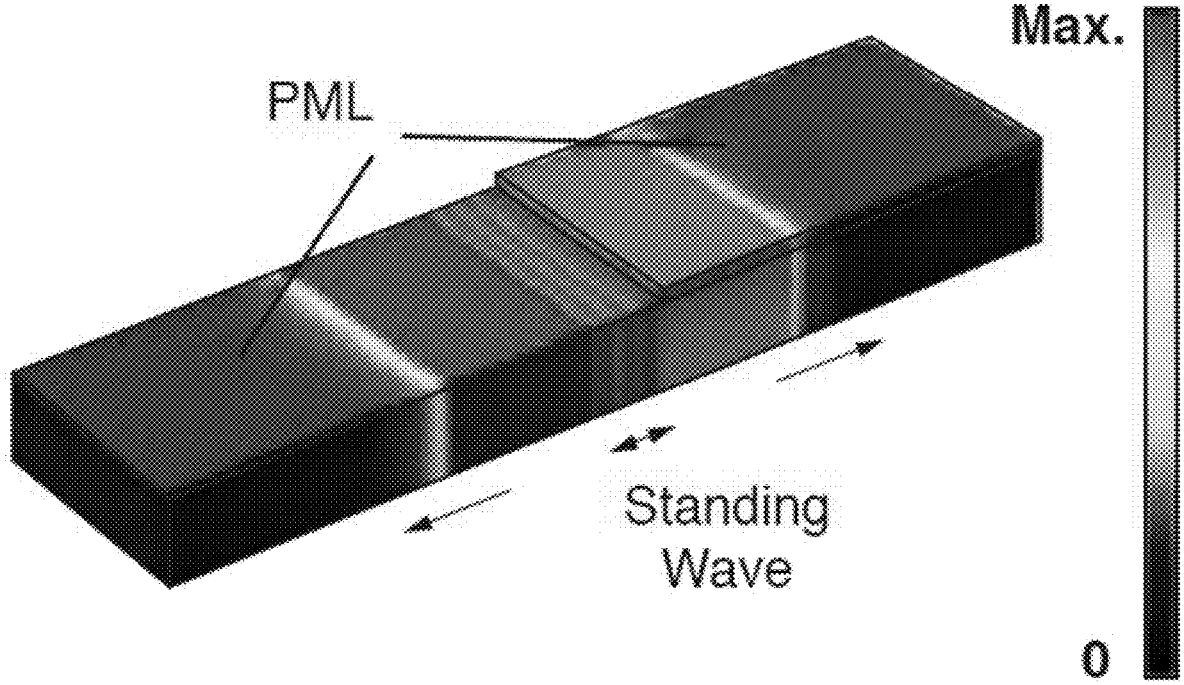
FIG. 4B shows a magnitude of y-axis displacement $u_y$ at 160 MHz, according to one embodiment.

FIG. 4B shows a magnitude of y-axis displacement $u_y$ at 160 MHz, according to one embodiment. In particular, FIG. 4B shows the solution for the magnitude of $u_y$. A standing wave can be created between $s_1$ and the metallization edge as a result of the interference of $a(x, t)$ with the reflected wave $b(x, t)$. A constant amplitude can be observed between $s_1$ and the PML in the −x region, and between the discontinuity and the PML in the +x region. This can indicate a perfect absorption of the acoustic power by the PMLs. The strain field $\epsilon_{xy}$ associated with the wave a can be written as $$\epsilon_{xy}^a(x,t) = Ae^{-j\beta_\infty x}e^{j\omega t} \text{ for } x > 0$$

$$\epsilon_{xy}^a(x,t) = -Ae^{-j\beta_\infty x}e^{j\omega t} \text{ for } x > 0, \quad (4)$$

where $\omega$ is the angular frequency and $\beta_\infty = \omega/v_\infty$ is the wave-number in the un-metallized LiNbO$_3$ film. The strain field associated with the reflected wave b can then be obtained as $$\epsilon_{xy}^b(x, t) = Ae^{j\beta_\infty x}e^{-j\beta_\infty x 2L_d}\Gamma_{su}e^{j\omega t} \text{ for } x < L_d, \quad (5)$$

where the subscript su denotes the mechanical reflection coefficient associated with the step-up discontinuity. The stress at the cross-sections $s_2$ and $s_3$, separated from $s_1$ by a distance $\Delta x$ (e.g., see FIG. 4A), can be obtained as the superposition of a and b waves at $x = -\Delta x$ and $x = \Delta x$ respectively:

$$\epsilon_{xy}^{s2}(t) = A(-e^{j\beta_\infty \Delta x} + e^{j\beta_\infty \Delta x}e^{-\beta_\infty x 2L_d}\Gamma_{su})e^{j\omega t} \quad (6)$$

$$\epsilon_{xy}^{s3}(t) = A(e^{j\beta_\infty \Delta x} + e^{j\beta_\infty \Delta x}e^{-\beta_\infty x 2L_d}\Gamma_{su})e^{j\omega t} \quad (7)$$

By taking a limit $\Delta x \to 0$, the expression below can be obtained:

$$\Gamma_{su} = \frac{u_y^b(x, t)}{u_y^a(x, t)} = -\frac{\epsilon_{xy}^b(x, t)}{\epsilon_{xy}^a(x, t)} = e^{-j\beta_\infty 2L_d}\frac{\epsilon_{xy}^{s3} + \epsilon_{xy}^{s2}}{\epsilon_{xy}^{s3} - \epsilon_{xy}^{s2}} \quad (8)$$

where $u_y^a$ and $u_y^b$ are the displacements associated with the incident and reflected waves, respectively. Using this expression, the reflection coefficient $\Gamma_{su}$ can then be obtained by evaluating $\epsilon_\chi^{s2}$ and $\epsilon_\chi^{s3}$ in the COMSOL simulation. As an illustrative example, the procedure described above can be performed for an 800 nm-thick LiNbO$_3$ film and four metals that are commonly used as electrodes in microsystems: gold (Au), aluminum (Al), molybdenum (Mo) and platinum (Pt). In all cases, it can be found that $\Gamma_{su}$ is substantially constant as a function of frequency up to 500 MHz.

Figure 4C:
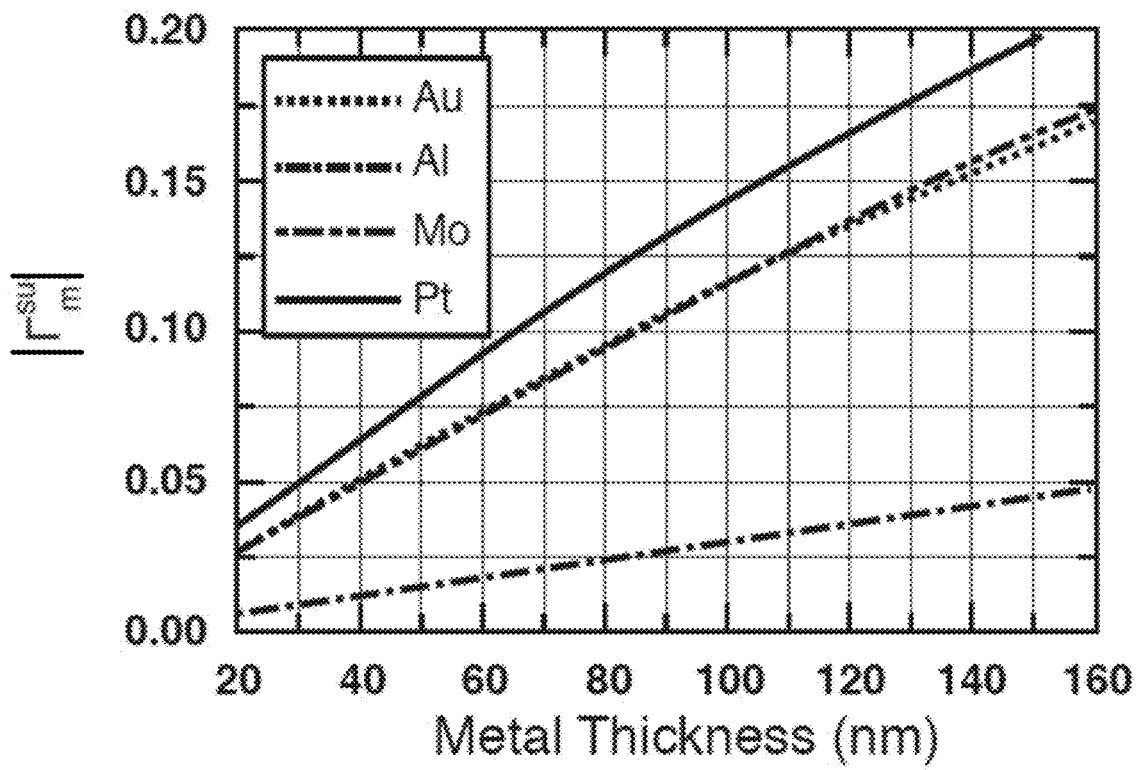
FIG. 4C is a graph illustrating an amplitude of the mechanical reflection coefficient $\Gamma_m^{su}$ as a function of metal thickness for different metals at 160 MHz, according to one embodiment.

FIG. 4C is a graph illustrating an amplitude of the mechanical reflection coefficient $\Gamma_m^{su}$ as a function of metal thickness for different metals at 160 MHz, according to one embodiment. The magnitude of $\Gamma_{su}$ can be found to be nearly linearly dependent on the metal thickness.

Figure 4D:
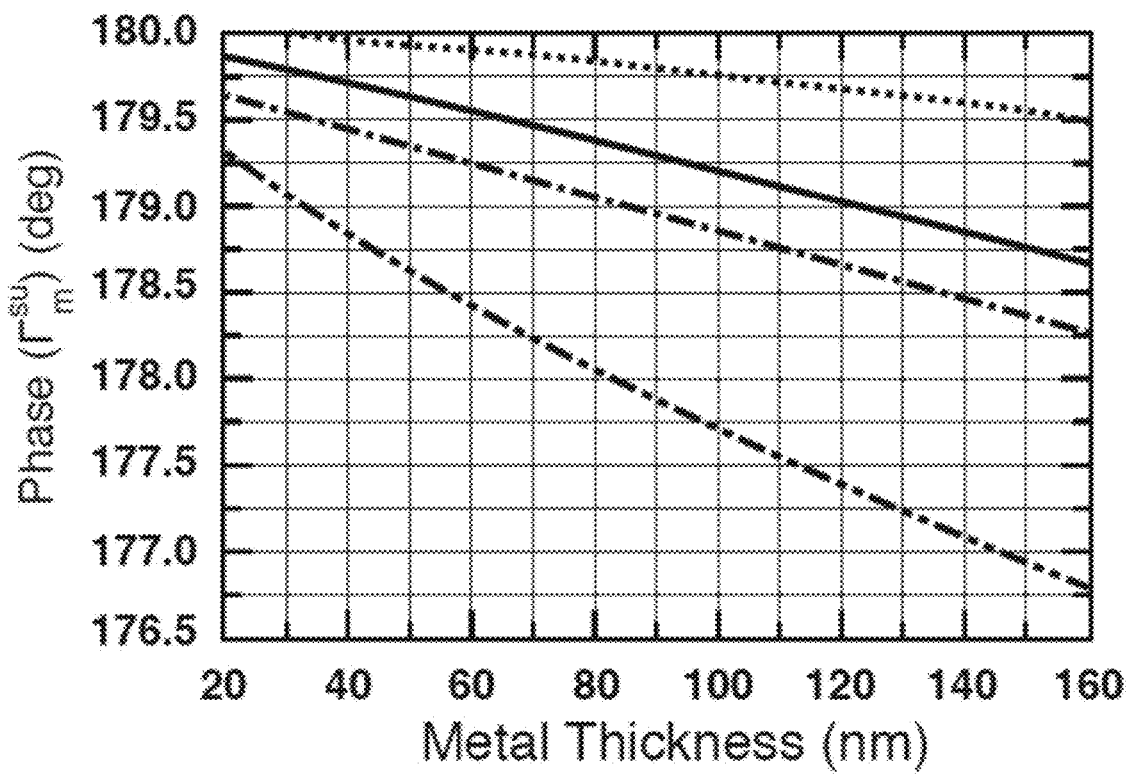
FIG. 4D shows a phase of the mechanical reflection coefficient $\Gamma_m^{su}$ as a function of metal thickness for different metals at 160 MHz, according to one embodiment.

FIG. 4D shows a phase of the mechanical reflection coefficient $\Gamma_m^{su}$ as a function of metal thickness for different metals at 160 MHz, according to one embodiment. The phase of $\Gamma_{su}$ is close to 180° for the simulated thickness range. The reflection coefficient of the electrode step-down, $\Gamma_{sd}$, can be found to have the same magnitude but opposite phase as the reflection coefficient of the electrode step-up, (e.g., $\Gamma_{sd} = -\Gamma_{su}$). The overall mechanical reflection coefficient of an electrode can be found by summing the multiple reflections produced by the step-up and step-down discontinuities. Referencing the reflections to the center of the electrode, the following expression can be obtained $$\Gamma_m = \Gamma_{su}e^{j\alpha}\left(1 - e^{-j2\alpha}T_{su}\sum_{n=0}^{\infty}(\Gamma_{su}e^{-j\alpha})^{2n}\right) \quad (9)$$

where $\alpha$ is the phase retardation for traversing half of the width of a reflector. $\alpha$ is be $3\pi/4$ for DART and $\pi/2$ for EWC reflectors. $T_{su}$ is the transmission coefficient of the step-up discontinuity, given by $$T_{su} = 1 + \Gamma_{su}. \quad (10)$$

Introducing $T_{su}$ to Eq. (9) and simplifying the geometric series, the following result can be obtained $$\Gamma_m = \Gamma_{su}e^{j\alpha}\frac{1 - e^{-j2\alpha}(1 - \Gamma_{su}^2)}{1 - \Gamma_{su}^2 e^{-j2\alpha}}. \quad (11)$$

The electrical reflection can be calculated in a similar way by considering the change in phase velocity produced by the ground condition set by the reflector electrodes on top of the piezoelectric film. Similar to the approach with the mechanical reflection, a reflection coefficient can be defined as the wave passes from an un-metalized to a metalized section, $$\Gamma_{\infty 0} = \frac{v_0 - v_\infty}{v_0 + v_\infty}, \quad (12)$$

where $v_0$ and $v_\infty$ are the phase velocities for a piezoelectric medium with the free and electrically shorted top surfaces, respectively. The reflection coefficient as the wave passes from a metallized to an un-metallized section is $\Gamma_{0\infty} = -\Gamma_{\infty 0}$. The phase velocities of the SH0 mode can be determined using the finite element method (FEM) in COMSOL. For an 800 nm-thick LiNbO$_3$ film, the phase velocity $v_\infty$ for a piezoelectric medium with an electrically shorted top surface can be calculated to be 4507 m/s. For the same film with the ground as the electrical boundary condition on the top surface, a phase velocity $v_0$ for a piezoelectric medium with a free top surface can be found to be 3550 m/s. The overall electrical reflection coefficient of an electrode can be obtained following the same procedure as for Eq. (11), as follows:

$$\Gamma_e = \Gamma_{0\infty}e^{j\alpha}\frac{1 - e^{-j2\alpha}(1 - \Gamma_{0\infty}^2)}{1 - \Gamma_{0\infty}^2 e^{-j2\alpha}}. \quad (13)$$

It should be noted that Eq. (13) may not account for non-uniform electric fields created by the uneven charge distribution in an electrode when surrounded by other electrodes in an array or multi-cell configuration. An analytical method to calculate the electrical reflection accounting for this phenomenon can be used. Such a method can assume an array of electrodes with constant width and separation. Since this condition may not be met by the reflectors in SPUDTs, the method may have to be revised before being applied.

Based on FIGS. 4A-4D, as an illustrative example, 100 nm-thick Au can be chosen to implement the electrodes for simultaneously enabling sufficient reflections and avoiding fabrication complications. In other embodiments, electrodes can be composed of at least one of gold (Au), aluminum (Al), molybdenum (Mo), platinum (Pt), or other suitable conductive material. In some embodiments, the thickness of the electrode can be between 5 nm and 10 µm. For such a configuration, $\Gamma_s = -0.116$ can be obtained in the case where the imaginary part is neglected. Using Eq. (11), the mechanical reflection coefficients can be obtained for the wide electrodes in DART unit cells (such as the DART unit cell 230b of FIG. 2B) and EWC unit cells (such as the EWC unit cell 230c of FIG. 2C): $\Gamma_m^{DART} = -0.164\,j$, $\Gamma_m^{EWC} = -0.229\,j$. For the electrical reflection, Eq. (12) can result in $\Gamma_{\infty 0} = -0.119$, which, from Eq. (3), yields: $\Gamma_e^{DART} = -0.168\,j$, $\Gamma_e^{EWC} = -0.235\,j$. The total reflection coefficients, arising from both mechanical and electrical reflection phenomena, can be obtained through Eq. (3) as $\Gamma^{DART} = -0.323\,j$, $\Gamma^{EWC} = -0.440\,j$. These values can be negative and imaginary as assumed in the analysis for RCs with respect to FIGS. 3A-3D.

In various embodiments, with electrodes of the same material and thickness, the reflection coefficients of reflectors in a SAW device on a YZ-LiNbO$_3$ substrate may be at least one order of magnitude smaller. As shown in the following description, a higher reflectivity per reflector can permit a higher unidirectionality in a multi-cell configuration (e.g., in a multi-cell ADL). Considering that the bandwidth (BW) of unidirectionality scales down as the number of unit cells increases, a higher reflectivity can also imply a better tradeoff between delay line insertion loss (IL) and BW.

Figure 5:
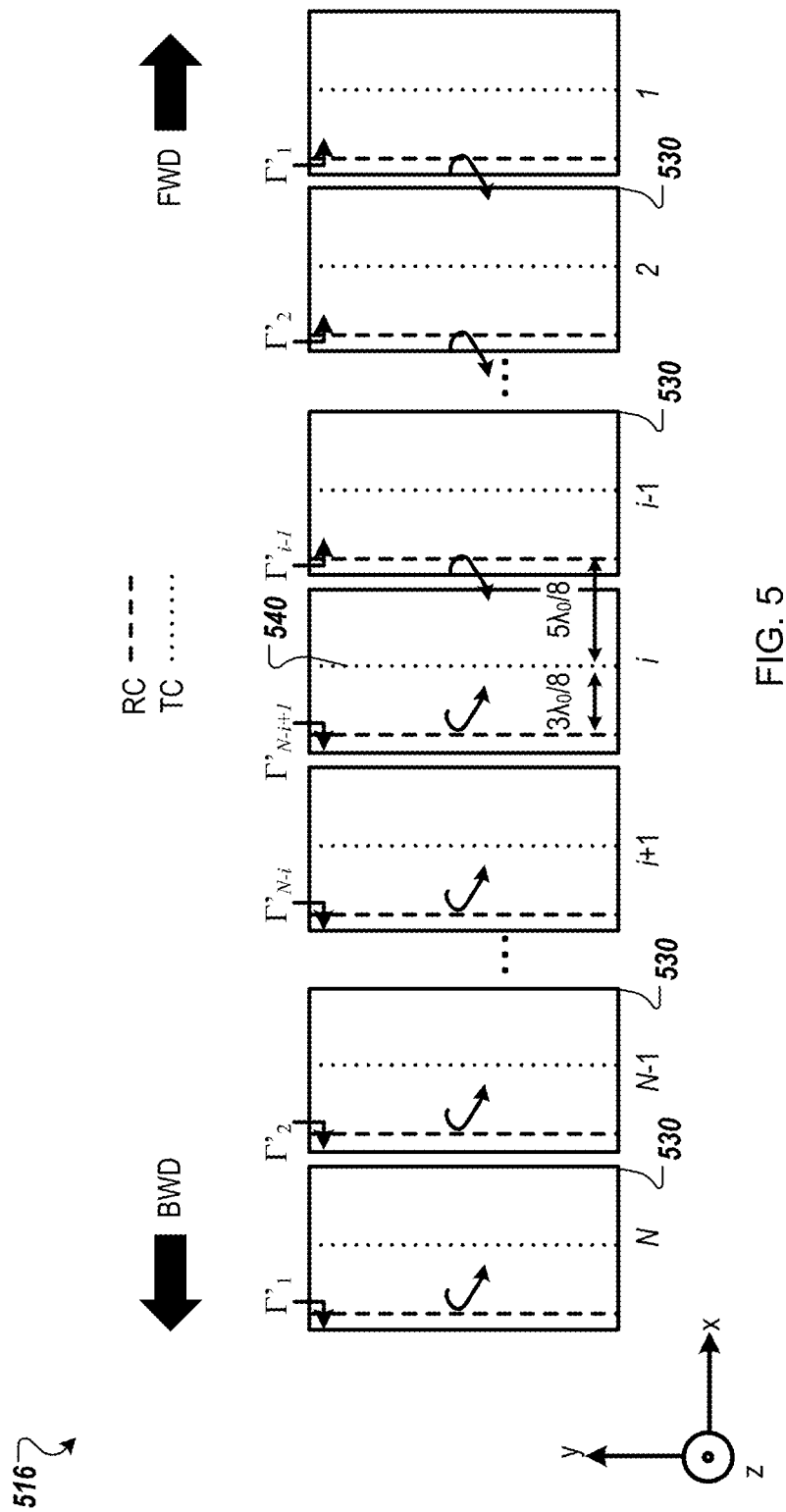
FIG. 5 shows a schematic of a SPUDT formed by N transducer unit cells, according to one embodiment.

As previously described, multiple unit cells that are spaced by $\lambda_0$ disposed in a cascaded configuration may be required to attain highly unidirectional transduction. In order to be consistent with the framework used for analyzing a single cell, a multi-cell transducer can also be considered with three ports (as described with respect to FIGS. 2B-2C): one electric port that is connected to all the cells for excitation, and two acoustic ports that can be situated at the opposite ends of the multi-cell transducer. To quantitatively measure the directionality of multiple cells, a figure of merit (FoM) dubbed as directionality of transduction can be defined as $$D = \frac{P_{FWD}}{P_{BWD}}, \tag{14}$$

where $P_{FWD}$ is the power emitted towards the FWD acoustic port and $P_{BWD}$ is the power emitted towards the BWD acoustic port. When a time-harmonic voltage is applied at the electrical port, a transducer (e.g., with N transducer unit cells) can emit acoustic power towards both acoustic ports. The total emission to each port can be calculated as the superposition of the waves emitted by each TC in the transducer. To determine the power emitted by a single TC in a multi-cell configuration, a voltage source can connected to one TC at a time, while all other TCs are grounded.$\Gamma'_1$ FIG. 5 shows a schematic of a SPUDT 516 formed by N transducer unit cells 530, according to one embodiment. Although not all components of the SPUDT 516 are shown, the SPUDT 516 is similar to the IDT 216 of FIG. 2A. The number of transducer unit cells N is an integer number that can range from 1 to as many as is necessary for a given application. Increasing the number of transducer unit cells (also referred to simply as "unit cells" herein) can increase the unidirectionality of the SPUDT and can result in a narrower bandwidth. In some embodiments, increasing the unidirectionality can be preferable. In FIG. 5, each rectangle corresponds to a unit cell with marked RC and TC. For the $i^{th}$ unit cell, the directionality can be calculated by considering its TC and all the RCs at both sides.

As seen, the transduction center 540 at the unit cell i can have i−1 reflectors on its right (FWD) and (N−i+1) reflectors on its left (BWD), with all reflectors being characterized by the same reflection coefficient, Γ. Each RC in the transducer can be denoted by an index k. At the $(i-1)^{th}$ RC which is on the immediate right of the $i^{th}$ TC (i.e., k=i−1), an equivalent reflection coefficient $\Gamma'_k$ can be defined, that accounts for all the reflections produced by the unit cells from 1 to k. For k=1, this may simply be $\Gamma'_1 = \Gamma$. For k=2, the equivalent reflection coefficient must account for the multiple reflections between the RCs of unit cells 1 and 2. At $f_0$, there may be a $2\pi$ phase separation between the RCs, giving:

$$\Gamma'_2 = \Gamma + T^2 \Gamma'_1 \sum_{n=0}^{\infty} (\Gamma'_1 \Gamma)^n \tag{15}$$

where T is the transmission coefficient of the RCs, and can be obtained as:

$$T = \frac{1 - \Gamma_{\infty m}^2}{1 - \Gamma_{\infty m}^2 e^{-j2\alpha}}, \tag{16}$$

where $\Gamma_\infty = (\Gamma_{su} + \Gamma_{\infty 0})/(1 + \Gamma_{su}\Gamma_{\infty 0})$ is the total reflection experienced by a wave traveling from a non-metallized to a metallized section. By substituting Eq. (16) into Eq. (15) and simplifying the geometric series, Eq. (15) can be reduced to $$\Gamma'_2 = \Gamma + \frac{T\Gamma}{1 - \Gamma^2}. \tag{17}$$

This method can be applied to the successive RCs, leading to the recursive definition of $\Gamma'_k$:

$$\Gamma'_k = \Gamma + \frac{T\Gamma'_{k-1}}{1 - \Gamma\Gamma'_{k-1}}. \tag{18}$$

The equivalent reflection coefficients of the RCs on the left of the $i^{th}$ TC 540 can be obtained in the same way from the right to the left as $\Gamma'_{N-k+1}$ (see FIG. 5). Associated to the $\Gamma'_k$, the equivalent transmission coefficients to each RC can be defined as:

$$T'_k = e^{j\phi_k}\sqrt{1 - |\Gamma'_k|^2}, \tag{19}$$

where $\phi_k$ is the phase of the transmission coefficient. Then, the calculation of the directionality of unit cell i can be reduced to attending the $i^{th}$ TC 540 with two overall reflections at the locations of the two most adjacent RCs on the left and right, with reflection coefficients $\Gamma_{N-i+1}$ and $\Gamma_{i-1}$ respectively. By solving the multiple reflections for the two waves generated at the TC in the opposite directions, the wave amplitude emitted to the FWD port can be found to be:

$$\alpha_i^{FWD} = \psi \frac{e^{-j(3\pi/4-\phi_{i-1})}\sqrt{1-|\Gamma'_{i-1}|^2}(e^{-j\pi/2}+\Gamma'_{N-i+1})}{1-\Gamma'_{i-1}\Gamma'_{N-i+1}}, \quad (20)$$

where $\psi$ is the transduction coefficient. For the wave radiated to the BWD port, the wave amplitude emitted to the BWD port can be found to be:

$$\alpha_i^{BWD} = \psi \frac{e^{-j(3\pi/4-\phi_{N-i+1})}\sqrt{1-|\Gamma'_{N-i+1}|^2}(1+e^{-j\pi/2}+\Gamma'_{i-1})}{1-\Gamma'_{i-1}\Gamma'_{N-i+1}} \quad (21)$$

Imposing that, from Eq. (18), all the $\Gamma'_k$ may be negative and imaginary, the directionality of the unit cell i can be obtained as $$D_i = \frac{|\alpha_i^{FWD}|^2}{|\alpha_i^{BWD}|^2} = \frac{(1+|\Gamma'_{i-1}|)(1+|\Gamma'_{N-i+1}|)}{(1-|\Gamma'_{i-1}|)(1-|\Gamma'_{N-i+1}|)}. \quad (22)$$

By evaluating Eq. (18) into Eq. (22), it can be shown that the directionality of each unit cell in a multi-cell configuration has the same value $$D_i = \left(\frac{1+|\Gamma|}{1-|\Gamma|}\right)^N \quad (23)$$

which, by linear superposition, may also be the overall directionality of the whole transducer, D. The transducer directionality calculated in this way is plotted in FIG. 6 as a function of the number of cells, for different values of the reflection coefficient. The specific values calculated above for the DART and EWC, $\Gamma^{DART}=-0.204$ j and $\Gamma^{EWC}=-0.359$ j, are represented by solid lines. If (3) is introduced in (23), the directionality is obtained as a composition of two factors, the directionality due to the electrical reflection, $D_e$, and the directionality due to the mechanical reflection, $D_m$:

$$D = D_e D_m = \left(\frac{1+|\Gamma_e|}{1-|\Gamma_e|}\right)^N \left(\frac{1+|\Gamma_m|}{1-|\Gamma_m|}\right)^N \quad (24)$$

Figure 6:
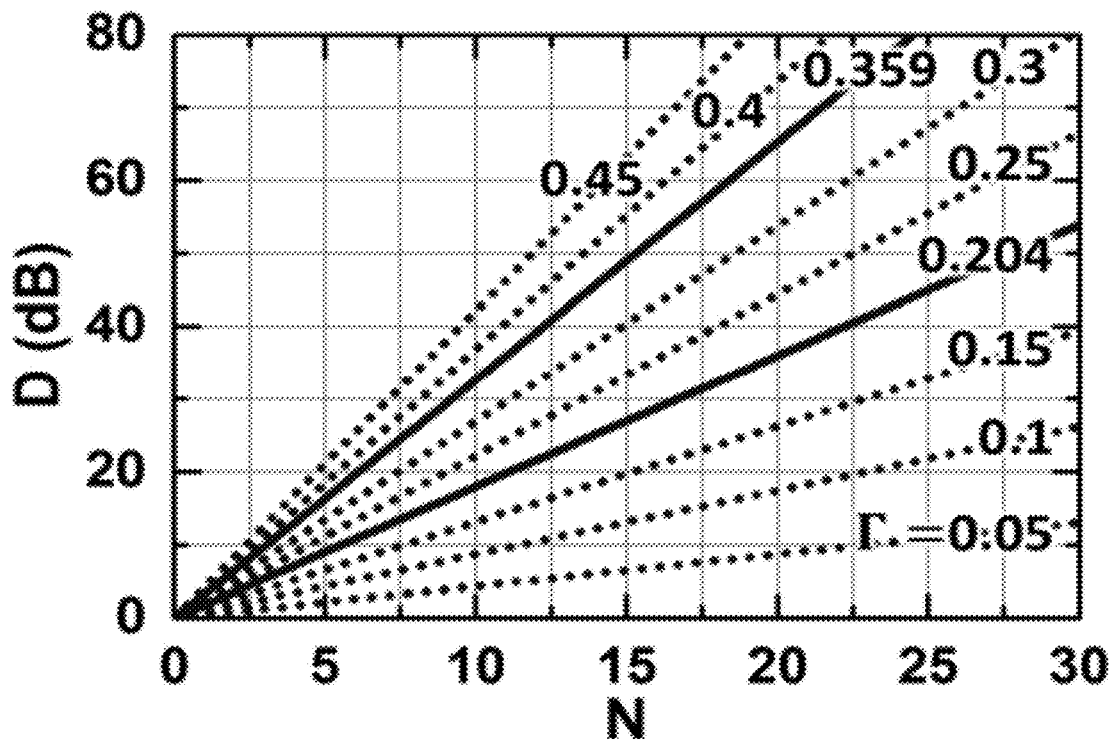
FIG. 6 illustrates the transducer directionality as a function of the number unit cells (N) for different values of the overall reflection coefficient ($\Gamma$), according to one embodiment.

FIG. 6 illustrates the transducer directionality as a function of the number unit cells (N) for different values of the overall reflection coefficient ($\Gamma$), according to one embodiment. The solid lines correspond to the reflection coefficients derived for DART and EWC reflectors with 100 nm thick Au.

The group delay of an ADL (also referred to simply as a delay line herein) employing the abovementioned transducers can be challenging to precisely predict with a closed-form expression. This can be due to the complexity introduced by the multiple reflections between the different cells in each transducer. A simplified analysis can be done by disregarding these internal reflections. This can be achieved by considering the transfer function F($\omega$) from the input port to the center of the ADL. It can be expressed as the superposition of N phase-retarded acoustic waves generated by the transducer unit cells. Assuming lossless propagation, each term in F($\omega$) can have three-phased delays: the one due to the propagation over a distance from the TC to the right edge of each unit cell, the phase delay from the right edge of each unit cell to the right edge of the entire input transducer, and the phase delay from the right edge of the input transducer to the center of the delay line, over a distance $L_G/2$. This can be expressed as:

$$F(\omega) = \sum_{n=1}^{N} e^{-j(\beta_t d_c + \beta_t \lambda_0 (n-1) + \beta_\infty L_G/2)} \quad (25)$$

where $\beta_t = \omega/v_t$ is the average wave number within the unit cell. The phase of F($\omega$) can be calculated at least by using Euler's identity as $$\angle F(\omega) = \\ -\frac{\omega L_G}{2v_\infty} - \frac{\omega d_c}{v_t} - \arctan\left(\frac{\sin(N\lambda_0\omega/v_t)}{\cos(N\lambda_0\omega/v_t)-1}\right) + \arctan\left(\frac{\sin(\lambda_0\omega/v_t)}{\cos(\lambda_0\omega/v_t)-1}\right). \quad (26)$$

By reciprocity and symmetry of the transducers, this can also be equal to the phase shift experienced by a signal from the center of the ADL to the output port. Thus, the total group delay at $f_0$ can be obtained as $$\tau_g(f_0) = -2\frac{d\angle F(\omega)}{d\omega}\bigg|_{\omega=\omega_0} = \frac{L_G}{v_\infty} + \frac{2d_c}{f_0 \lambda_0} + \frac{N-1}{f_0}. \quad (27)$$

The first term is the delay introduced by the gap $L_G$ between transducers. The second and third terms correspond to the wave propagation within the transducers.

Figure 7:
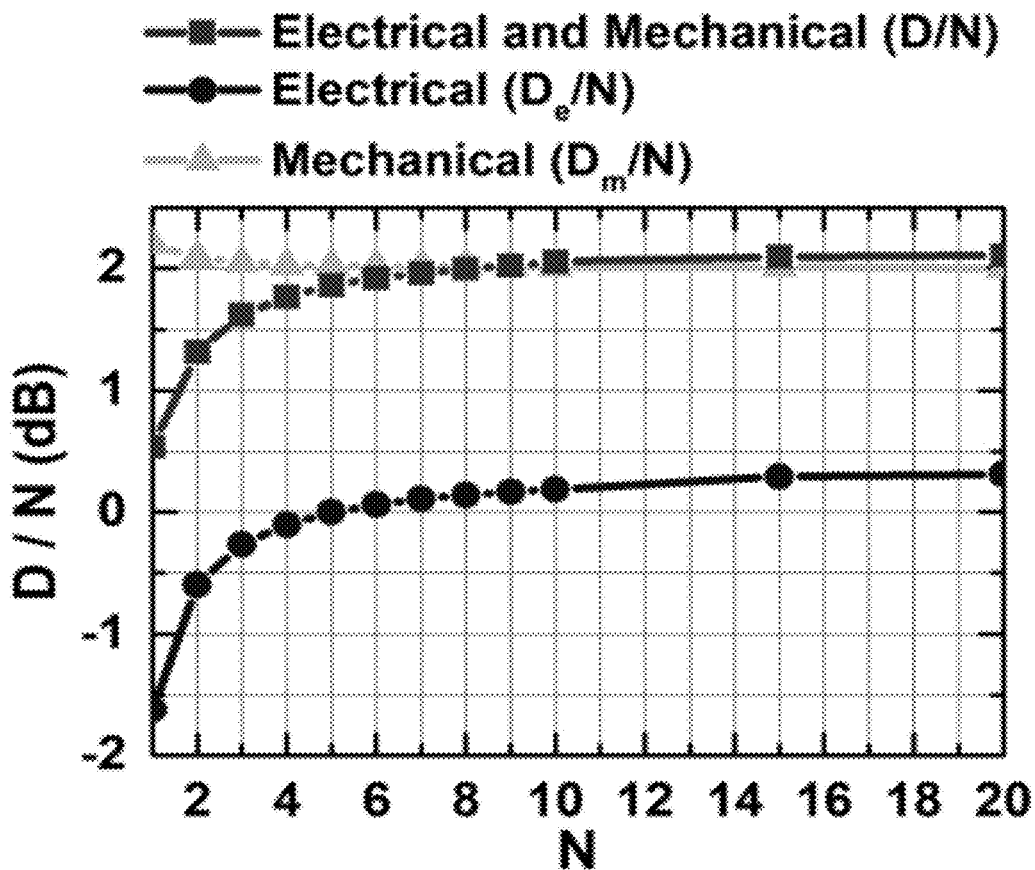
FIG. 7 illustrates FEM simulated overall directionality per unit cell (D/N), and calculated directionality per unit cell due to electrical ($D_e$/N) and mechanical ($D_m$/N) reflections, according to one embodiment.

FIG. 7 illustrates FEM simulated overall directionality per unit cell (D/N), and calculated directionality per unit cell due to electrical ($D_e/N$) and mechanical ($D_m/N$) reflections, according to one embodiment. A COMSOL-based FEM model of a unidirectional transducer can be built to more precisely predict the directionality as a function of the number of transducer unit cells. The directionality per transducer unit cell can be simulated for an EWC transducer formed by 100 nm of Au for different values of N. The results are shown in FIG. 7. Theoretically, this value can be predicted from Eq. (23) as $$D/N(dB) = \left(\frac{1+|\Gamma|}{1-|\Gamma|}\right). \quad (28)$$

It should be noted that, contrary to Eq. (28), the simulated D/N can show a dependence on N for low values of N. This can be explained by fringe effects in the transducer, which can make the transducer unit cells close to the edges present a smaller directionality than those cells located in the middle of the transducer. To gain insight into this phenomenon, additional simulations can be performed. In the first simulation, zero thickness electrodes can be used to obtain the directionality, $D_e$ due to electrical reflections. In the other embodiments, in FIG. 7, a pure solid mechanical simulation can be performed, disregarding the piezoelectricity, in order to obtain the directionality, $D_m$ due to the mechanical reflections. In such an embodiment, the excitation can be performed by harmonic y-axis forces on the signal electrodes.

Figure 8:
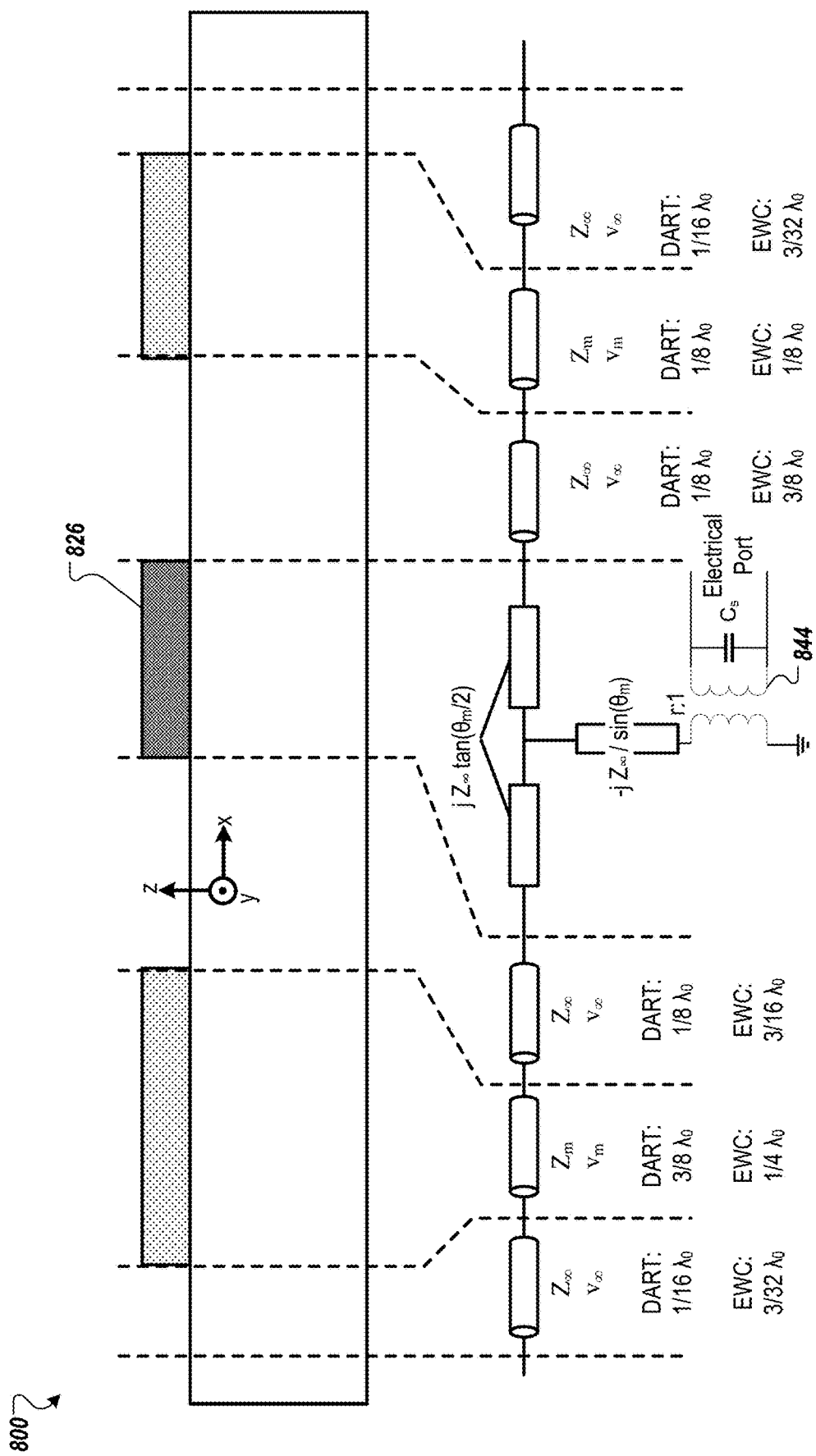
FIG. 8 illustrates a sectional Mason's model for a single unit cell, according to one embodiment.

From these results, it can be seen that, first, the mechanical reflections can be dominant for high values of N. Second, the fringe effects can primarily pertain to the electrical part of the reflections due to the distorted electric field distribution near the transducer edges. Third, the electrical reflection coefficient approximated by Eq. (13) may be overestimated. A directionality of 2.1 dB per transducer unit cell can be deduced for EWC transducers with many cells. The total reflection coefficient can be indirectly obtained from Eq. (28) as $|\Gamma_{EWC}|=0.24$. With the same method, the reflectors in DART transducers show $|\Gamma^{DART}|=0.17 \cdot j\, Z_\infty \tan(\theta_m/2)$ FIG. 8 illustrates a sectional Mason's model 800 for a single unit cell, according to one embodiment. Each uniform portion of the unit cell is represented by an acoustic transmission-line section. The acoustic impedance, phase velocity, and length of each section are labeled with symbols. In order to predict the response of the described ADLs with intricacies that may have been omitted in the closed-form analysis, an equivalent circuit model can be used. This method, based on Mason's model, can employ a 1D discretization of the ADL by representing each transducer unit cell of the transducers with a sectional equivalent circuit. The schematic of the implemented model for a single transducer unit cell can be found in FIG. 8. Each section with uniform properties can be modeled by a transmission line. The phase velocities for the un-metalized and metalized sections can be calculated in COMSOL as $v_\infty=4507$ m/s and $v_m=2958$ m/s. The reflections due to the discontinuities can be modeled by the different characteristic impedances of the sections representing metallized and un-metallized $LiNbO_3$, respectively $Z_m$ and $Z_\infty$. The ratio can be calculated as $$\frac{Z_m}{Z_\infty} = \frac{1+\Gamma_{\infty m}}{1-\Gamma_{\infty m}}, \tag{29}$$

where $\Gamma_{\infty m}$ is the reflection coefficient for an acoustic wave passing from un-metallized to metallized $LiNbO_3$. The reflection coefficient of an electrode can be approximated as a sum of two reflections at the step-up and step-down discontinuities, assuming small reflections. Given the width of the reflectors, these reflections may be in quadrature for DART and in-phase for EWC. Thus, it can be deduced that $$\Gamma^{DART}_{\infty m} = \frac{1}{\sqrt{2}}\left|\Gamma^{DART}\right|, \tag{30}$$

$$\Gamma^{EWC}_{\infty m} = \frac{1}{2}\left|\Gamma^{EWC}\right|, \tag{31}$$

The lengths of the transmission line sections are labeled in FIG. 8 for both the DART and EWC designs. The transduction section, which may include the signal electrode 826, can be modeled as a T-shaped network with an ideal transformer 844 connecting to the electrical port. The transformation ratio can be determined by the electromechanical coupling and is given by $$r=\sqrt{2\pi f_0 C_s k^2 Z_m}, \tag{32}$$

where $C_s$ represents the static capacitance per transduction unit cell. From an electrostatic simulation in COMSOL, $C_s/W_A=250$ aF/μm can be calculated for an 800 nm-thick $LiNbO_3$ film, where $W_A$ is the acoustic aperture (e.g., see FIG. 2A). The value for the electromechanical coupling $k^2$ can be assumed to be 40%. Note the ratio $Z_m/Z_\infty$ defines the reflections, but the value of $Z_\infty$ (or $Z_m$) may be irrelevant for the electric response. Hence, $Z_\infty=1$ can be taken. The angle $\theta_m$ can be obtained as $$\theta_m = \frac{\pi}{4}\frac{f\lambda_0}{v_m} \tag{33}$$

for both DART and EWC transducers.

Figure 9A:
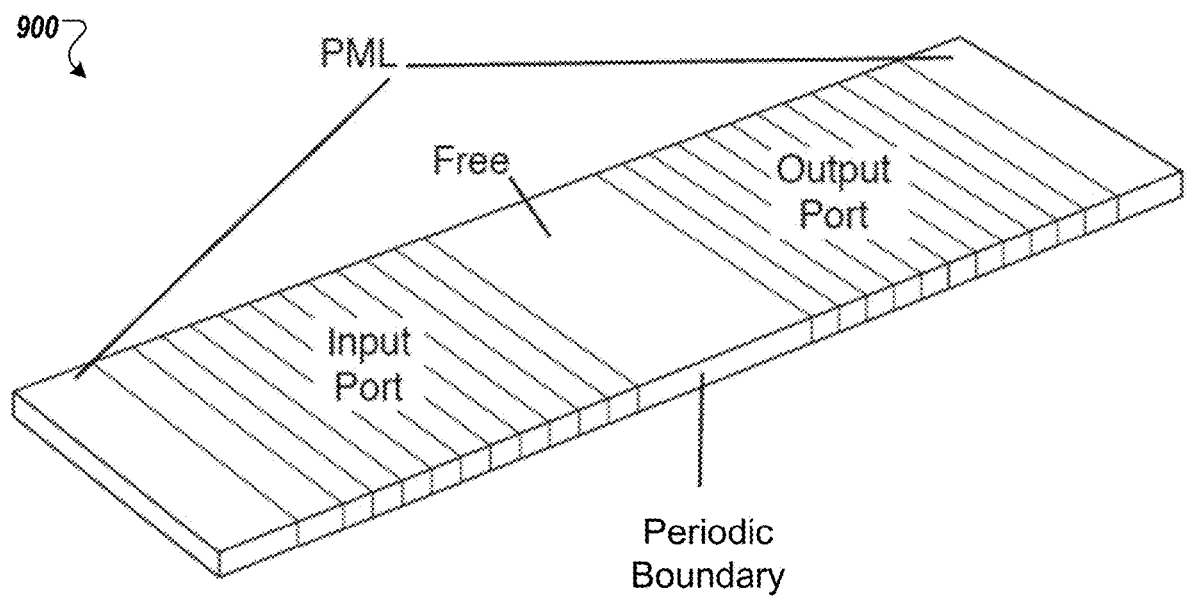
FIG. 9A illustrates a finite element method (FEM) model built in COMSOL to simulate the response of the ADLs to validate the circuit model of FIG. 8 according to one embodiment.

FIG. 9A illustrates an FEM model 900 built in COMSOL to simulate the response of the ADLs to validate the circuit model 800 of FIG. 8 according to one embodiment. A 3D model 900 for an ADL with EWC transducers that has N=10, $\lambda_0=20$ μm, $W_A=200$ μm, and $L_G=120$ μm is shown in FIG. 9A.

Figure 9B:
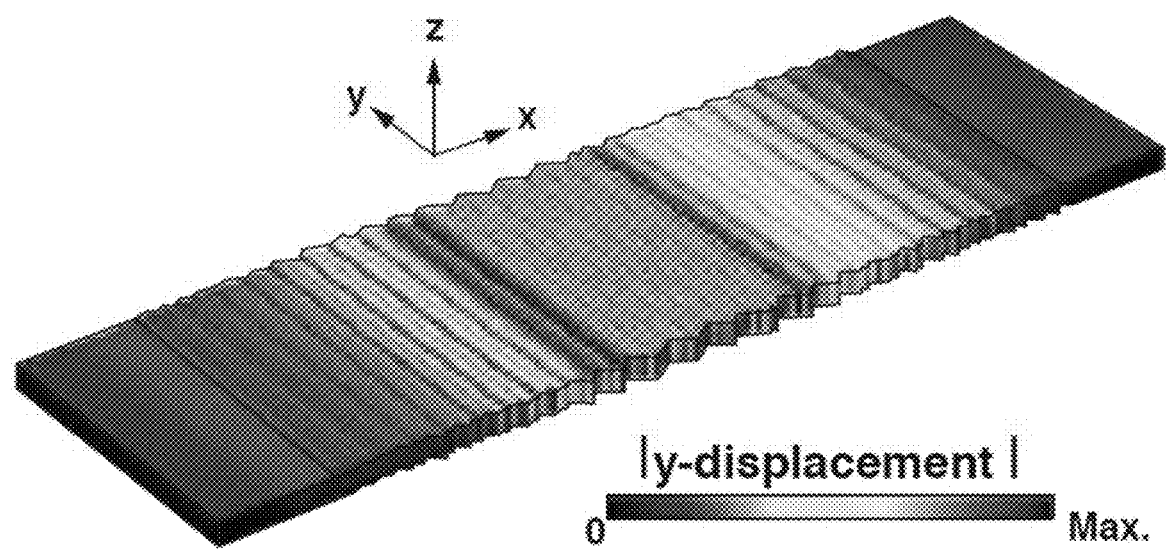
FIG. 9B illustrates a magnitude of a displacement along the y-axis at the center frequency according to one embodiment.

FIG. 9B illustrates a magnitude of a displacement along the y-axis at the center frequency according to one embodiment. With all the parameters defined, a model for a complete transducer can be built by concatenating the models of its unit cells. The unit cells can be connected in series in the acoustic domain, and in parallel in the electrical domain to form the electrical port of the transducer. A complete ADL can be simulated by connecting the models of two transducers in the acoustic domain with their FWD ports facing each other. The gap between the transducers can be modeled by an acoustic transmission line with characteristic impedance $Z_\infty$, phase velocity $v_\infty$ and length $L_G$. To ensure no reflection at the BWD acoustic ports of both transducers, these can be terminated by an impedance $Z_\infty$.

Figure 10:
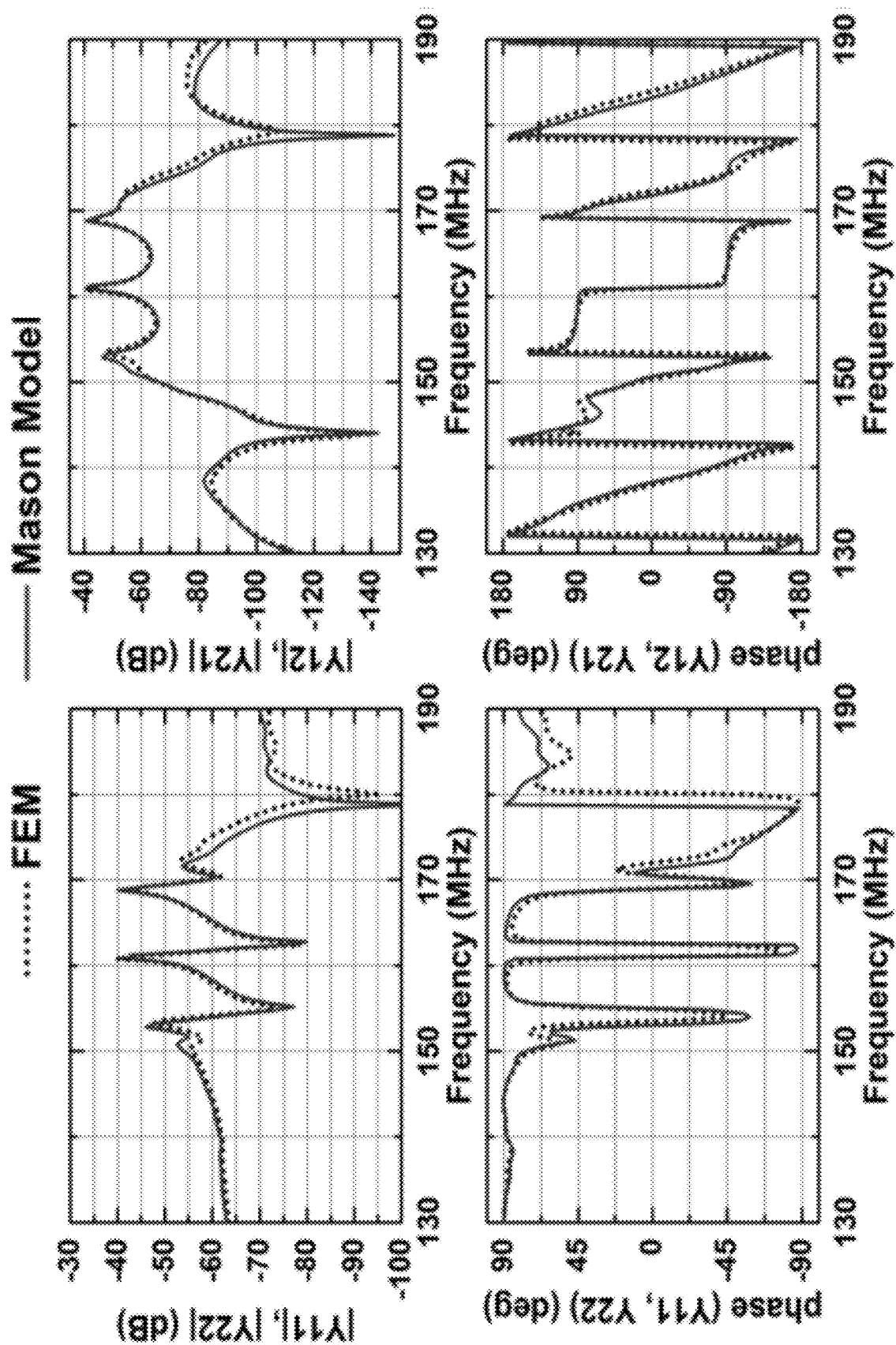
FIG. 10 illustrates simulated Y-parameters using the FEM model of FIG. 9 and Mason's model of FIG. 8, assuming zero propagation loss in the ADL according to one embodiment.

FIG. 10 illustrates simulated Y-parameters using the FEM model 900 of FIG. 9 and Mason's model 800 of FIG. 8, assuming zero propagation loss in the ADL according to one embodiment. An excellent match can be achieved between the two models. It should be noted that these models may not incorporate considerations for dissipative loss in the ADL structure.

Figure 11:
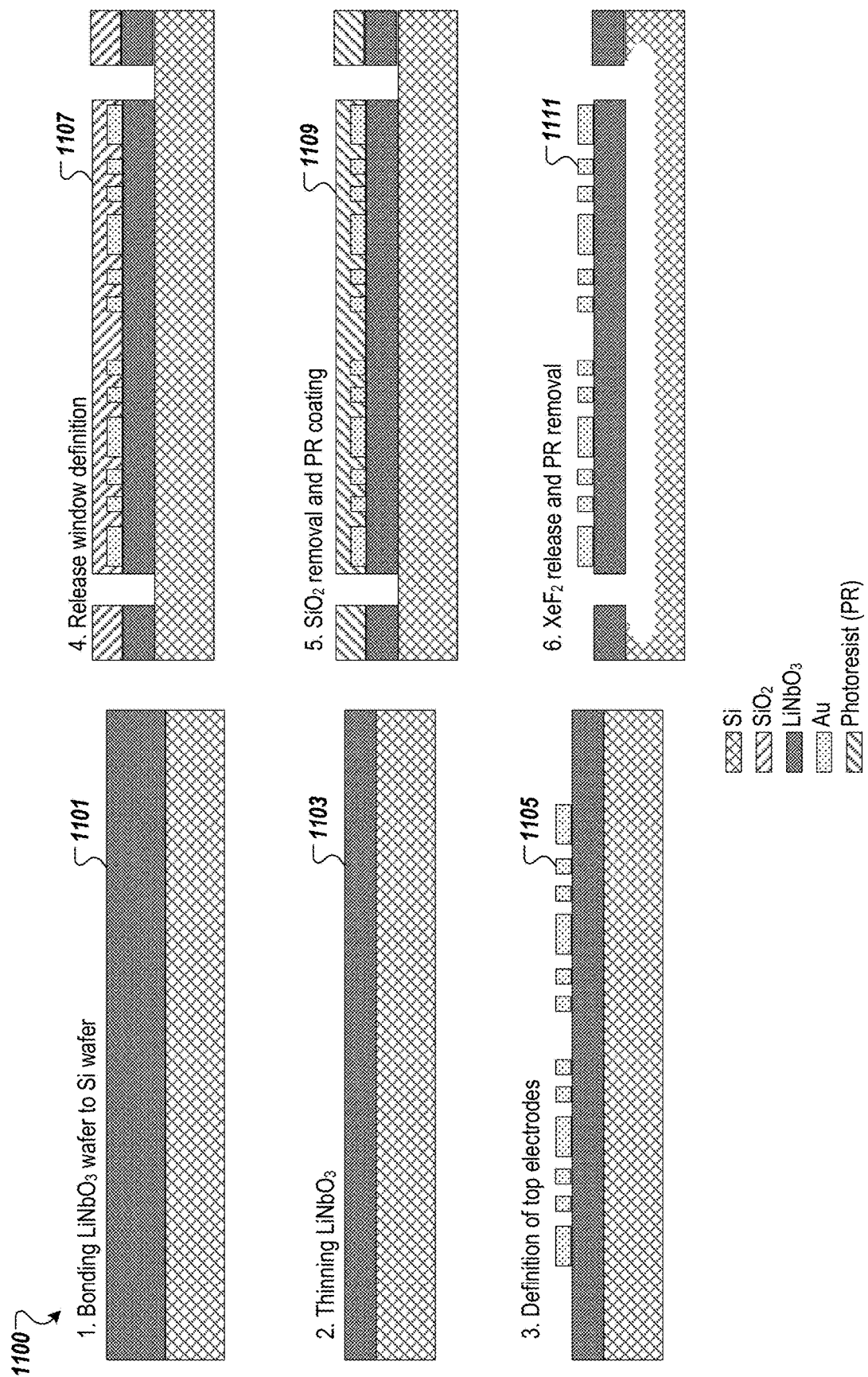
FIG. 11 is a flow chart of a fabrication process of the ADL according to one embodiment.
Figure 14A:
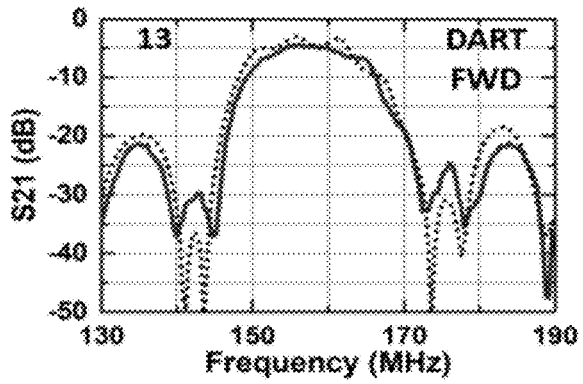
FIGS. 14A-14F are graphs illustrating the measured and simulated S21 for ADLs 13, 14, 15, and 16 (Table 1) as well as the simulated directionality of the DART and EWC transducers with 10 unit cells according to some embodiments.
Figure 14B:
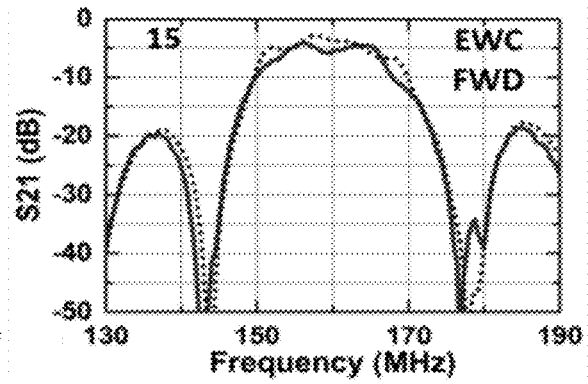
Figure 14C:
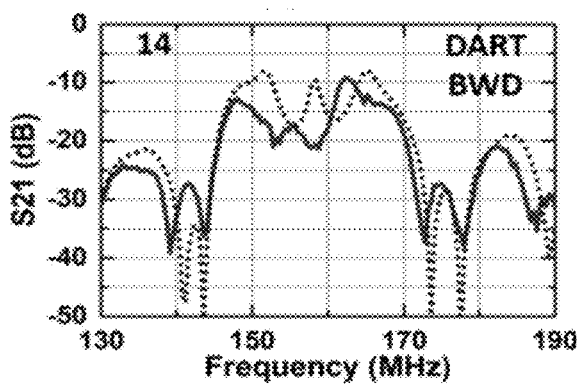
Figure 14D:
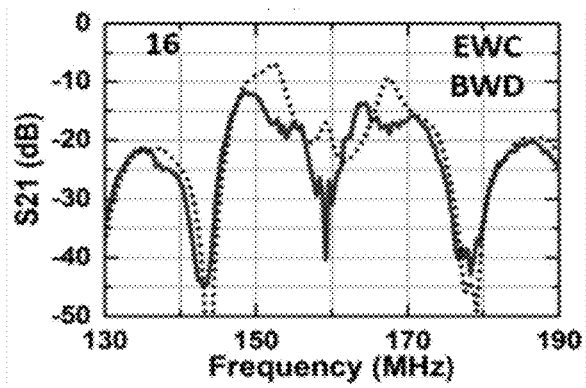
Figure 14E:
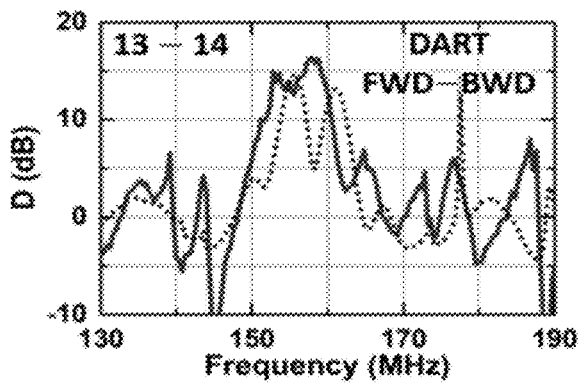
Figure 14F:
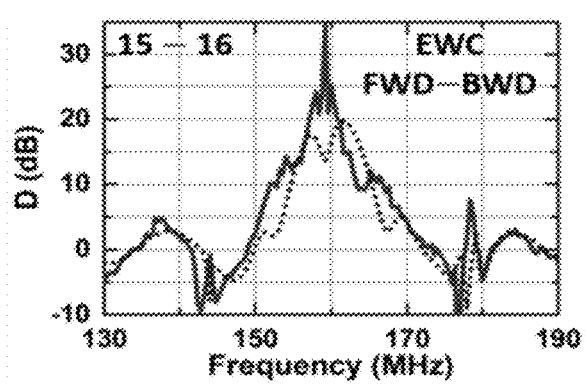

FIG. 11 is a flow chart of a fabrication process 1100 of the ADL according to one embodiment. Guided by the reflectivity analysis presented above, as an illustrative example, Au can be chosen as the material for the electrodes, with a thickness of 100 nm. Further, an X-cut $LiNbO_3$ thin film with a thickness of 800 nm can be chosen as the propagation medium since this platform may demonstrate high coupling and low loss for SH0 waves. The propagation direction, e.g., the longitudinal direction can be chosen as −10° with respect to the +Y crystallographic axis of $LiNbO_3$ to maximize $k^2$. Table 1 below lists the parameters of the implemented ADL designs.

TABLE 1

DESIGN PARAMETERS OF THE FABRICATED ACOUSTIC DELAY LINES

| ID | Type of Transducers | N | $L_G$ (μm) | $\lambda_0$ (μm) | $W_A$ (μm) | $\tau_g$ (ns) |
|---|---|---|---|---|---|---|
| 1 | DART | 10 | 120 | 20 | 200 | 79 |
| 2 | DART | 10 | 500 | 20 | 200 | 164 |
| 3 | DART | 10 | 1000 | 20 | 200 | 274 |
| 4 | DART | 15 | 120 | 20 | 200 | 106 |
| 5 | DART | 15 | 500 | 20 | 200 | 190 |
| 6 | DART | 20 | 120 | 20 | 200 | 132 |
| 7 | DART | 20 | 500 | 20 | 200 | 217 |
| 8 | EWC | 10 | 120 | 20 | 200 | 79 |
| 9 | EWC | 10 | 1000 | 20 | 200 | 274 |
| 10 | EWC | 15 | 120 | 20 | 200 | 106 |
| 11 | EWC | 20 | 120 | 20 | 200 | 132 |
| 12 | EWC | 20 | 1500 | 20 | 200 | 439 |

TABLE 1-continued

DESIGN PARAMETERS OF THE FABRICATED
ACOUSTIC DELAY LINES

| ID | Type of Transducers | N | $L_G$ (μm) | $\lambda_0$ (μm) | $W_A$ (μm) | $\tau_g$ (ns) |
|---|---|---|---|---|---|---|
| 13 | DART/Bid (FWD) | 10 | 120 | 20 | 200 | |
| 14 | DART/Bid (BWD) | 10 | 120 | 20 | 200 | |
| 15 | EWC/Bid (FWD) | 10 | 120 | 20 | 200 | |
| 16 | EWC/Bid (BWD) | 10 | 120 | 20 | 200 | |

ADLs 1-12 can be designed in order to sweep the main design parameters as a way to characterize the propagation loss in the $LiNbO_3$ film, as well as the loss associated with the transducers, for a constant center frequency, $f_0$, and acoustic aperture, $W_A$. The expected group delays according to Eq. (27) are also listed in Table 1. ADLs 13-16 are example test structures to characterize the directionality of DART and EWC transducers formed by 10 cells. These ADLs can be formed by a SPUDT transducer and a bi-directional transducer with regular-width electrodes. In the bi-directional transducer, each period of $\lambda_0$ contain 54 electrodes of width $\lambda_0/8$ to minimize reflections. The electrodes can be connected in the sequence of 'ground-ground-signal-signal' to have the same center frequency as the SPUDT. In addition, both transducers may be of the same length in order to similar bandwidths. In ADLs 13 and 15, the FWD acoustic ports of the SPUDTs are facing the bi-directional transducers. In ADLs 14 and 16, the BWD acoustic ports of the SPUDTs are facing the bi-directional transducers.

The sixteen ADLs listed in Table 1 can be fabricated on a single chip with the fabrication process 1100. The film transfer process can involve two steps. In the first step, an X-cut $LiNbO_3$ wafer can be bonded to a Si carrier wafer (1101). Second, the bonded $LiNbO_3$ layer can be thinned down to a thickness of 800 nm or other appropriate thickness (1103). Next, the 100 nm-thick Au electrodes can be defined with sputter-deposition and lift-off (1105). Then, the release windows can be defined, e.g., through etching (1107). For this purpose, a 1 μm-thick hard mask of $SiO_2$ can be created by plasma-enhanced chemical vapor deposition (PECVD) and can be patterned with fluorine-based reactive ion etching (RIE). The release windows in the $LiNbO_3$ film can then be etched by chlorine-based inductive coupled plasma (ICP)-RIE before the $SiO_2$ is removed with a buffered oxide etch (BOE). To prevent the Au electrodes from being exposed to $XeF_2$ and etched in the device release step, a photoresist (PR) can be spun and patterned to protect the electrodes and leave the release windows exposed (1109). The ADLs can then be released by isotropic $XeF_2$ etching, and the PR removed with acetone (1111).

FIG. 12 shows optical top-view images 1201 and 1203 of ADLs 1 and 8 according to one embodiment. The ADLs 1 and 8 can be fabricated using the fabrication method 1100 as described with respect to FIG. 11.

FIG. 13 shows optical images 1301 and 1303 of SPUDT ADLs 13 and 14 (Table 1) according to one embodiment. Both ADLs 13 and 14 are designed to test the directionality of the DART SPUDT for SH0 waves in $LiNbO_3$. The S-parameters of all the fabricated devices can be characterized using a network analyzer (e.g., such as a Keysight performance network analyzer PNA-XN5249A or the like) at room temperature. The measured data can then be normalized to a matching complex port impedance in an advanced design software (ADS) to extract the IL over the transmission bands. In implementation, the impedance matching to 50Ω can be done with an inductor-capacitor (LC) matching network with sufficient bandwidth. The ADLs can present bandwidths under 15%. Matching networks with LC circuits can be implemented to cover such bandwidths, given the high $k^2$ of the SH0 waves in $LiNbO_3$ thin films.

FIGS. 14A-14F are graphs illustrating the measured and simulated S21 for ADLs 13, 14, 15, and 16 (Table 1) as well as the simulated directionality of the DART and EWC transducers with 10 unit cells according to some embodiments. For both the measured and simulated S21, the directionality is defined as the difference in S21 between FWD ADLs and BWD ADLs.

The measured S21 with normalization to matched port impedances is shown for ADLs 13 and 14 with the DART design (e.g., FIGS. 14A and 14B, respectively), and for ADLs 15 and 16 (e.g., FIGS. 14C and 14D, respectively) with the SPUDT design. In both cases, the directionality of the SPUDT can be obtained by subtracting the S21 of the BWD devices from the S21 of the FWD devices. For the DART transducer with 10 unit cells, the measurements show a maximum directionality of about 15 dB. For the EWC transducer, the directionality can reach more than 20 dB at the center frequency, $f_0$. Both values are in reasonable agreement with the analytical model (FIG. 7) and FEM simulation.

Figures 15A, 15B, 15C, 15D:
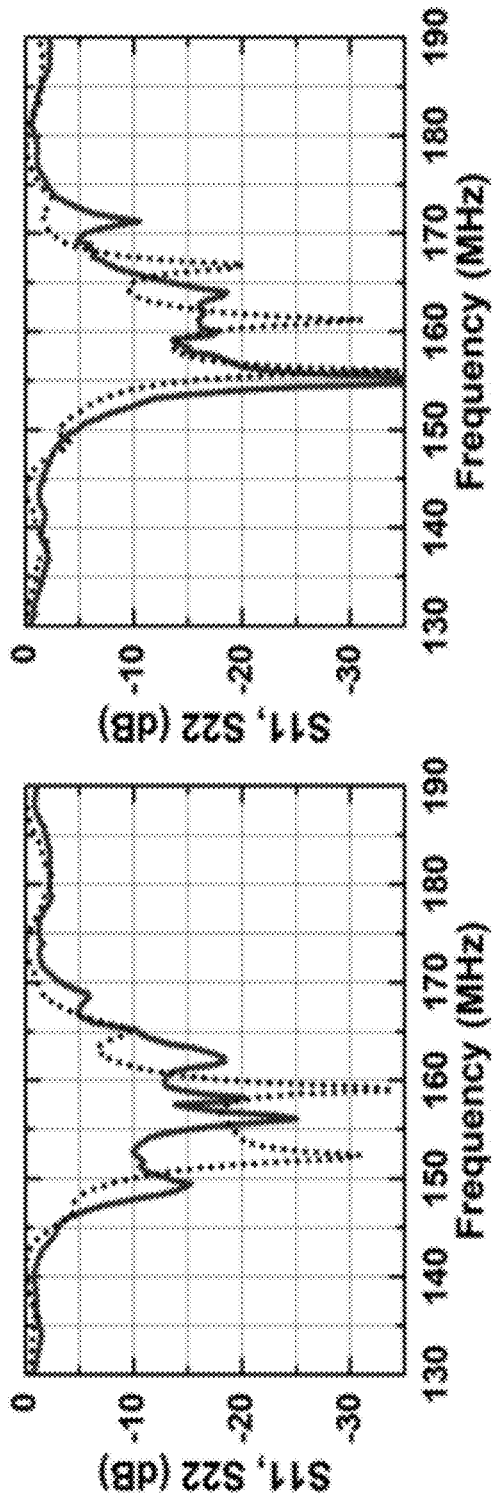

FIGS. 15A-15H are graphs illustrating measured and simulated S-parameters according to some embodiments. FIG. 15A and FIG. 15B show S11 for ADLs 1 and 8, respectively. FIG. 15C and FIG. 15D show S21 for ADLs 1 and 8. FIG. 15E and FIG. 15F show zoomed-in views of S21, showing a comparison between the measurements and the fitting curves for ADLs 1 and 8. FIG. 15G and FIG. 15H show measured and simulated group delays for ADLs 1 and 8. The analytically calculated delay based on Eq. (27) is also shown in FIG. 15G and FIG. 15H for comparison.

Among the fabricated devices, ADLs 1 and 8, that use DART and EWC transducers respectively, present the lowest IL. Their S-parameters are plotted in FIGS. 15A-15F, along with their group delays in FIGS. 15G-15H. The simulated S-parameters and calculated group delays according to Eq. (27) are also plotted. Both ADLs can show a minimum IL around 2 dB. In spite of the low reflectivity of SPUDT transducers when their electrical ports are matched, ripples with amplitudes of about 1 dB can be observed in the passbands of both ADLs. The ripples can potentially create challenges for comparing the IL of different ADLs and evaluating the loss contributions from different loss mechanisms. In order to overcome this issue, the measured S21 results can be fitted by the following expression:

$$S21 = a_1 \text{sinc}^2\left(a_2 \frac{f - a_3}{a_3}\right) \tag{34}$$

which describes the transmission band of a piezoelectric delay line (e.g., and ADL) with no reflections between the transducers.

Figure 16:
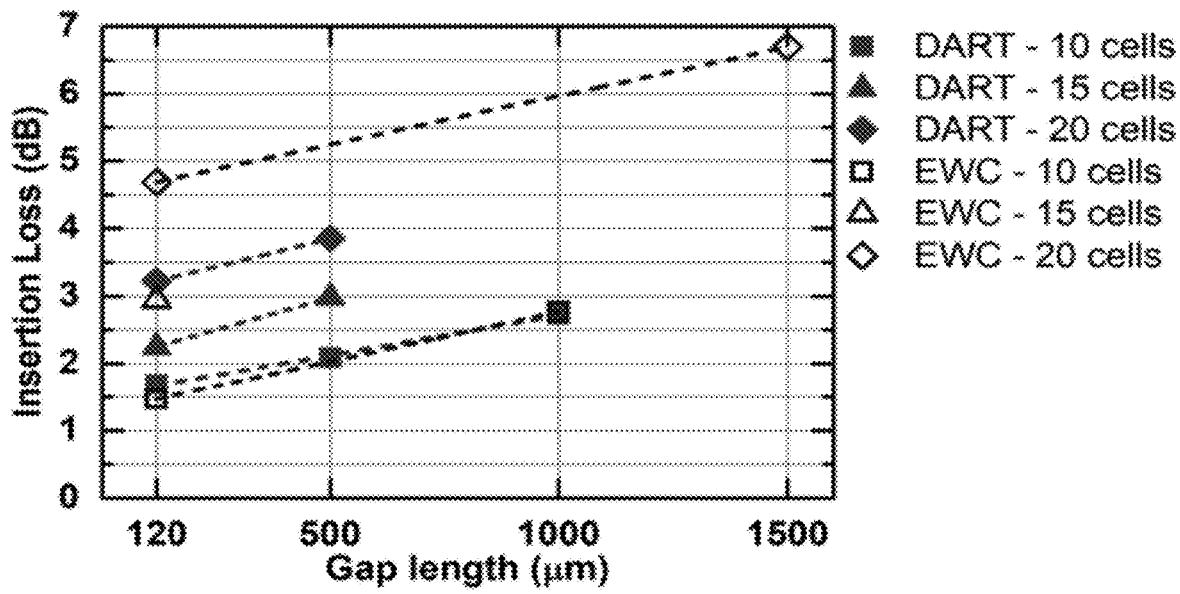
FIG. 16 is a graph illustrating an average minimum insertion loss (IL) as a function of the gap length, $L_G$, for various DART and EWC transducers according to one embodiment.

FIG. 16 is a graph illustrating an average minimum IL as a function of the gap length, $L_G$, for various DART and EWC transducers according to one embodiment. The average minimum IL can be obtained by fitting the measured response of each ADL with Eq. (34).

Two general trends can be observed in FIG. 16. First, IL tends to be larger for a longer ADL with the same number of unit cells. Second, IL tends to increase as more transducer unit cells are used for an ADL of the same length. In other words, FIG. 16 can indicate that the IL obtained for each ADL can be attributed to two distinctive causes. First, there can be loss due to the propagation through the separation introduced by the gap ($L_G$) between the input and output transducers, which can be denoted as $IL_p$. The second loss component IL can be caused by the transducers which corresponds to the interception points of the lines with the y-axis in FIG. 16.

The $IL_p$ can be extracted as the slope of the lines in FIG. 16. An average value of $IL_p$ of 1.19 dB/mm can be extracted from all the lines. From Eq. (27), it can be seen that the separation introduced by the gap may be responsible for a delay of 222 ns/mm. Therefore, the $IL_p$ per unit delay can be found to be: $IL_p$=5.8 dB/μs.

On the other hand, $IL_t$ may be more complex to analyze. The transducer directionality can be predicted to grow with the number of cells in the transducers, which may enable ADLs with decreasing $IL_t$ as N increases. However, the trend seen in measurements, which shows that $IL_t$ increases with N, can indicate a contradiction with the theoretical prediction. This can suggest a second transducer loss component that also scales with the number N of unit cells, and which may be more dominant than the loss due to imperfect unidirectionality. The second transducer loss can result from dissipation at the electrode and piezoelectric interface, thermos-elastic damping (TED), acoustic attenuation in the metal, or a combination of the above. It should be noted that it can be challenging to separate the dissipative loss component caused from the loss given by the imperfect unidirectionality in measurements due to the ripples. However, the latter can be indirectly estimated from FEM simulation.

Figure 17:
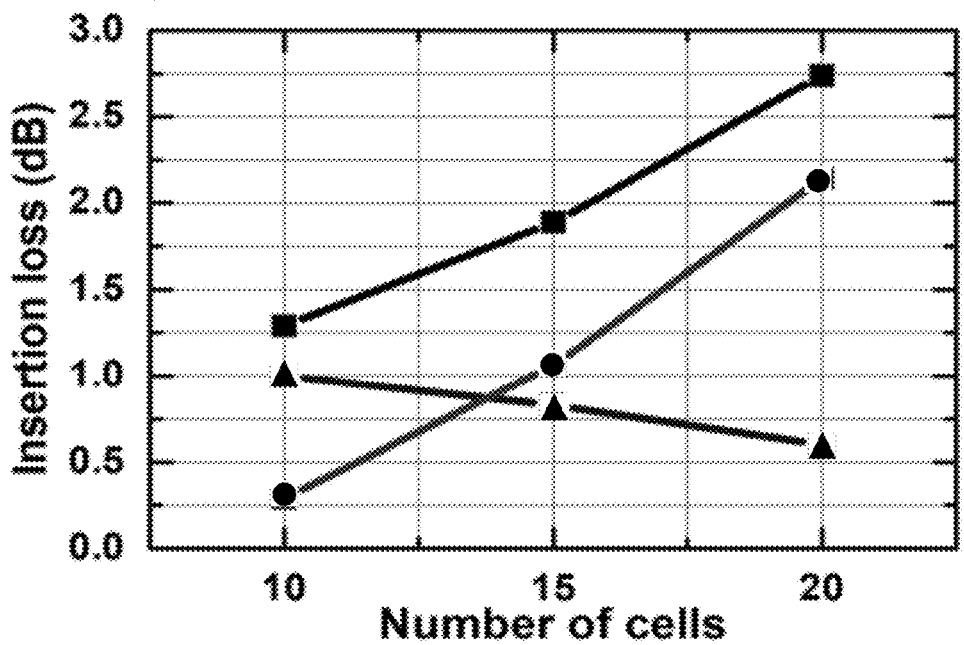
FIG. 17 is a graph illustrating the total loss in the transducers, $IL_t$ for ADLs formed by DART transducers according to one embodiment.

FIG. 17 is a graph illustrating the total loss in the transducers, $IL_t$ for ADLs formed by DART transducers according to one embodiment. Illustrated is a loss breakdown in the transducers (including both the input transducers and the output transducers), including the total loss due to the transducers (extracted from the measurements) and the loss due to imperfect unidirectionality (calculated from simulation) for ADLs 1, 4, and 6. The difference between these loses allows for obtaining the dissipation due to metal. Also shown is the total loss in the transducers, $IL_t$ for ADLs formed by DART transducers of 10, 15, and 20 unit cells with the same $L_G$ and $W_A$. The loss from imperfect unidirectionality, which can be derived from a simulation (such as in COMSOL), is also plotted. The remainder of the IL can then be attributed to the dissipative effects associated with the metal electrodes.

From the analysis shown in FIG. 17, it can be concluded that the IL of a device formed by either DART or EWC transducers of 10 cells can be expressed as $$IL\ (dB)=1.29+5.8\tau_g(\mu s). \tag{35}$$

In summary, a type of ADL can be demonstrated based on shear-horizontal waves propagating in a thin film of $LiNbO_3$. An analysis of the acoustic reflections can be done, showing the promising prospects of this platform for building transducers with large unidirectionality. The results show that time delays of tens of ns can be achieved with a low IL of 2 dB and an FBW in excess of 10%. These ADLs may open possibilities for RF signal processing in compact low-power applications.

The remainder of this disclosure will illustrate some specific examples of ADLs, in particular for ADLs using X-cut or Y-cut $LiNbO_3$. It should be noted, however, that the embodiments presented herein are for illustrative purposes only and do not limit the scope of the present disclosure.

S0-Mode Lithium Niobate Acoustic Delay Lines

Figure 18:
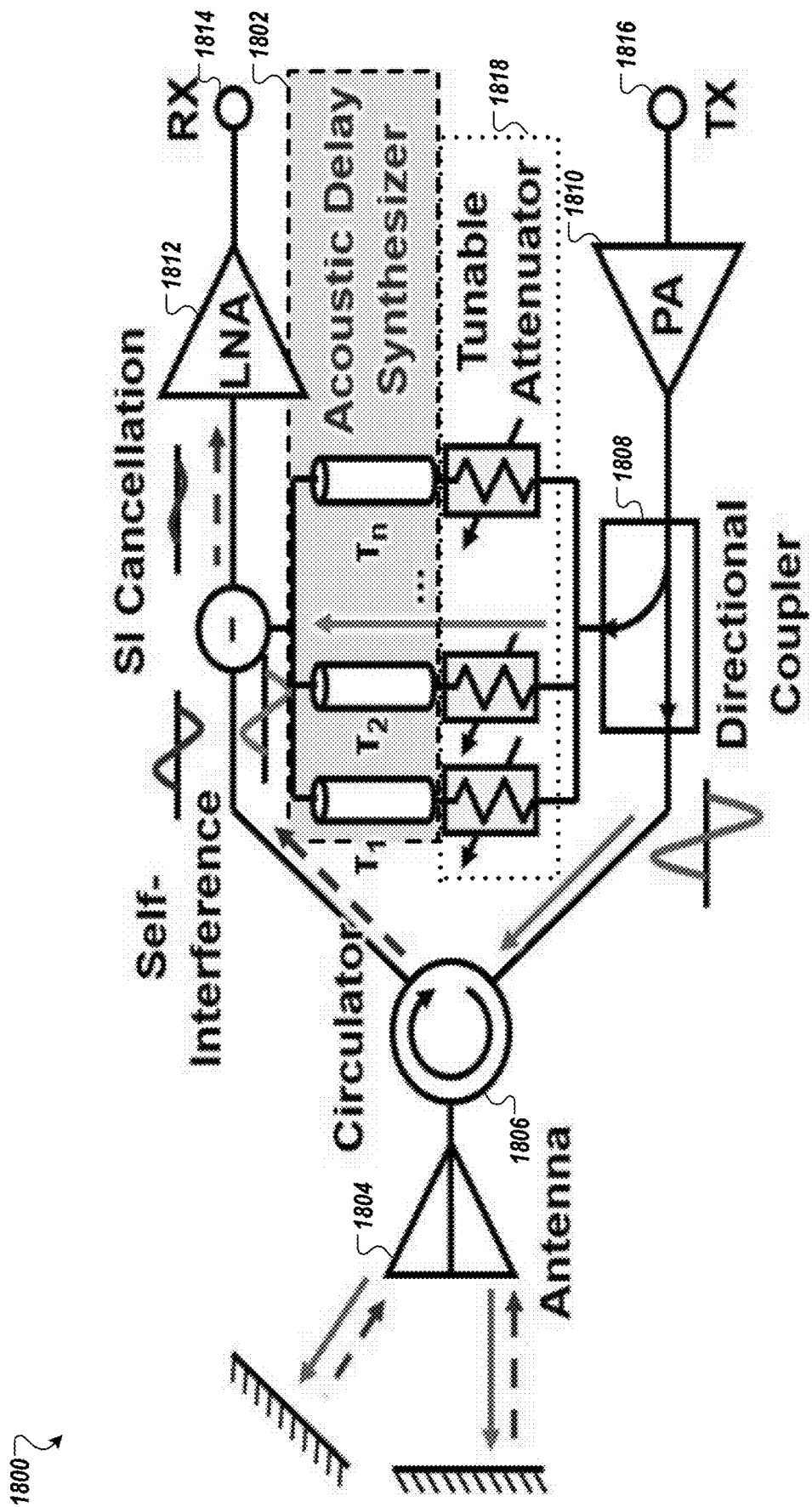
FIG. 18 is a schematic diagram of a full-duplex transceiver with an acoustic delay synthesizer to attain self-interference cancellation (SIC) according to one embodiment.

FIG. 18 is a schematic diagram of a full-duplex transceiver 1800 with an acoustic delay synthesizer 1802 to attain self-interference cancellation (SIC) according to one embodiment. In some embodiments, the full-duplex transceiver 1800 may include an antenna 1804, a circulator 1806, a directional coupler 1808, a power amplifier (PA) 1810, a low noise amplifier (LNA) 1812, a receiver 1814, a transmitter 1816, a tunable attenuator 1818, and the acoustic delay synthesizer 1802. In some embodiments, the acoustic delay synthesizer 1705 may include at least one acoustic delay line (ADL), as disclosed in the various embodiments herein.

ADLs can be useful in implementing full-duplex radios, such as the full-duplex transceiver 1800. One potential challenge for implementing full-duplex radios can include self-interference (SI). Due to the absence of frequency- or time-domain multiplexing, SI can occur when high-power transmitted signals are reflected from antenna packaging or obstacles in the ambiance, and inadvertently received by a highly sensitive receiver, typically after a 0.01-1 μs delay. To reduce the SI, e.g., attain SI cancellation (SIC), one approach can be to provide wideband time-domain equalization using true-time delays.

In such a method, a fraction of the transmitted signal is sent into a time-domain equalizer that emulates the channel transfer function of the SI before it is combined with the SI to render cancellation through destructive interference. To accommodate the dynamic in-field conditions, such a system is typically required to provide reconfigurable delays and tunable attenuations. The challenge with such a method is that, although chip-scale tunable attenuation is attainable, miniature delay synthesis over a sufficiently wide bandwidth (BW) and a necessary delay range remains inaccessible. The unavailability of wide-range delay synthesis originates from the fact that the electromagnetic (EM) delay lines in the existing prototypes can hardly provide delays of more than 1 ns on chip-scale due to the fast group velocities of EM waves in state-of-the-art slow-wave waveguide-related structures. Therefore, EM-based delay synthesis is inadequate for enabling full-duplex in urban environments with dense reflectors (e.g., moving vehicles and buildings). Moreover, the dynamic range of EM-based SIC is also limited. The minimum insertion loss (IL) in the cancellation path is required to be no larger than that in the free space. However, the intrinsically high propagation loss (PL) in the EM delay lines leads to high IL. Moreover, the additional IL from the directional coupler strengthens the requirement of IL, which is challenging for the EM delay lines.

In some embodiments, the full-duplex transceiver 1800 can also be referred to as a full-duplex radio. A full-duplex radio can transmit and receive signals in the same frequency band simultaneously. The full-duplex transceiver 1800 includes transmit (TX) chain circuitry and receive (RX) chain circuitry. The TX chain circuitry includes at least the directional coupler 1808, the PA 1810, and the transmitter 1816. The RX chain circuitry includes at least the LNA 1812 and the receiver 1814. The TX chain circuitry transmits a first RF signal in a first frequency range via the antenna 1804. The RX chain circuitry receives a second RF signal in the first frequency range via the antenna 1804. The TX chain circuitry can further include the directional coupler 1808, which directs a portion of the first RF signal (e.g., that is transmitted) to the RX chain circuitry. The acoustic delay synthesizer 1802 includes a set of ADLs and is coupled between the TX chain circuitry and the RX chain circuitry in order to provide a signal delay. In other words, the acoustic delay synthesizer 1802 provides a delay to the portion of the first RF signal to the RX chain circuitry such that the first RF signal experiences the signal delay and destructively interferes with a reflected portion of the first RF signal.

As described above, in an ADL, radio frequency (RF) signals are first converted into the acoustic domain by transducers on one end of the ADL via piezoelectricity. The signals can then propagate as acoustic waves and experience the designed delay before they are turned back into electrical signals by transducers on the other end. In some embodiments, RF ADLs may be realized using surface acoustic waves (SAW) technologies due to their compact sizes and easy fabrication processes. ADLs can be used to enable time delays, filtering, and correlation for improving the signal-to-noise ratios in radar front ends. ADLs can also be used for various sensing applications and the construction of nonreciprocal networks. SAW ADLs may not provide sufficiently low IL and wide BW simultaneously for self-interference cancelation (SIC) applications even when custom-designed unidirectional transducers are adopted. Such a performance limit can arise from the intrinsic tradeoff between the IL and fractional BW (FBW), which can be fundamentally imposed by the attainable reflectivity of the distributed reflectors and the maximum electromechanical coupling ($k^2$) of the SAW modes. In addition, the transducer-induced SAW scattering into the substrate may further exacerbate the PL of the SAW and the tradeoff between IL and delay. To work toward an acoustic delay synthesizer, the fundamental performance bounds may be considerably lifted by resorting to a new piezoelectric platform with higher coupling, larger available reflectivity, and better-confined waveguiding at the same time, as will be described in the following embodiments and in more detail with reference to the various figures.

In some embodiments, longitudinally vibrating modes in thin-film lithium niobate ($LiNbO_3$), namely, the fundamental shear-horizontal (SH0) mode and fundamental symmetrical (S0) mode, can be utilized in ADL structures for their simultaneously large $k^2$ and low loss. The large coupling can be harnessed to widen the BW of ADLs, while the confined waveguide within a suspended $LiNbO_3$ thin film can lower PL and thus also lower IL. Moreover, reflectors on a suspended thin film can provide more substantial reflections in comparison to the same type of reflectors on a SAW structure, which can further improve the tradeoff between IL and BW.

Such longitudinally vibrating modes can be used for the acoustic delay synthesizer 1802 of the full-duplex transceiver 1800. The acoustic delay synthesizer includes a set of ADLs. Each of the ADLs includes an X-cut or Y-cut $LiNbO_3$ piezoelectric thin film, a first IDT, and a second IDT. The piezoelectric thin film is located above a carrier substrate. The piezoelectric thin film is adapted to propagate an acoustic wave in at least one of a first mode excited by an electric field oriented in a longitudinal direction along a length of the piezoelectric thin film or a second mode excited by the electric field oriented at least partially in a thickness direction of the piezoelectric thin film. In such embodiments, the first mode is one of a fundamental symmetrical (S0) mode, a first-order symmetrical (S1) mode, a fundamental shear-horizontal (SH0) mode, or a first-order antisymmetric (A1) mode and the second mode is one of a first-order antisymmetric (A1) mode or a first-order shear-horizontal (SH1) mode. In some further embodiments, the Y-cut $LiNbO_3$ thin film includes one of a 128Y-cut, 54Y-cut, or 36Y-cut (also referred to as rotated Y cuts herein) $LiNbO_3$ thin film and the second mode includes one of a first-order symmetric (S1) mode. In some cases, the rotated Y cuts can also additionally propagate the acoustic wave in at least one of the first modes (S0, S1, SH0, and A1) excited by the electric field oriented in the longitudinal direction or one of the second modes (A1 and SH1) excited by the electric field oriented at least partially in the thickness direction.

The first IDT is disposed on a first end of the piezoelectric thin film and converts a first electromagnetic signal, which is traveling in the longitudinal direction, into the acoustic wave. The second IDT is disposed on a second end of the piezoelectric thin film. There is a gap between the second IDT and the first IDT. The second IDT converts the acoustic wave into a second electromagnetic signal. In some embodiments, the first mode can be one of an S0 mode, an S1 mode, or an SH0 mode and the second mode can be one of an A1 mode or an SH1 mode.

Figure 19A:
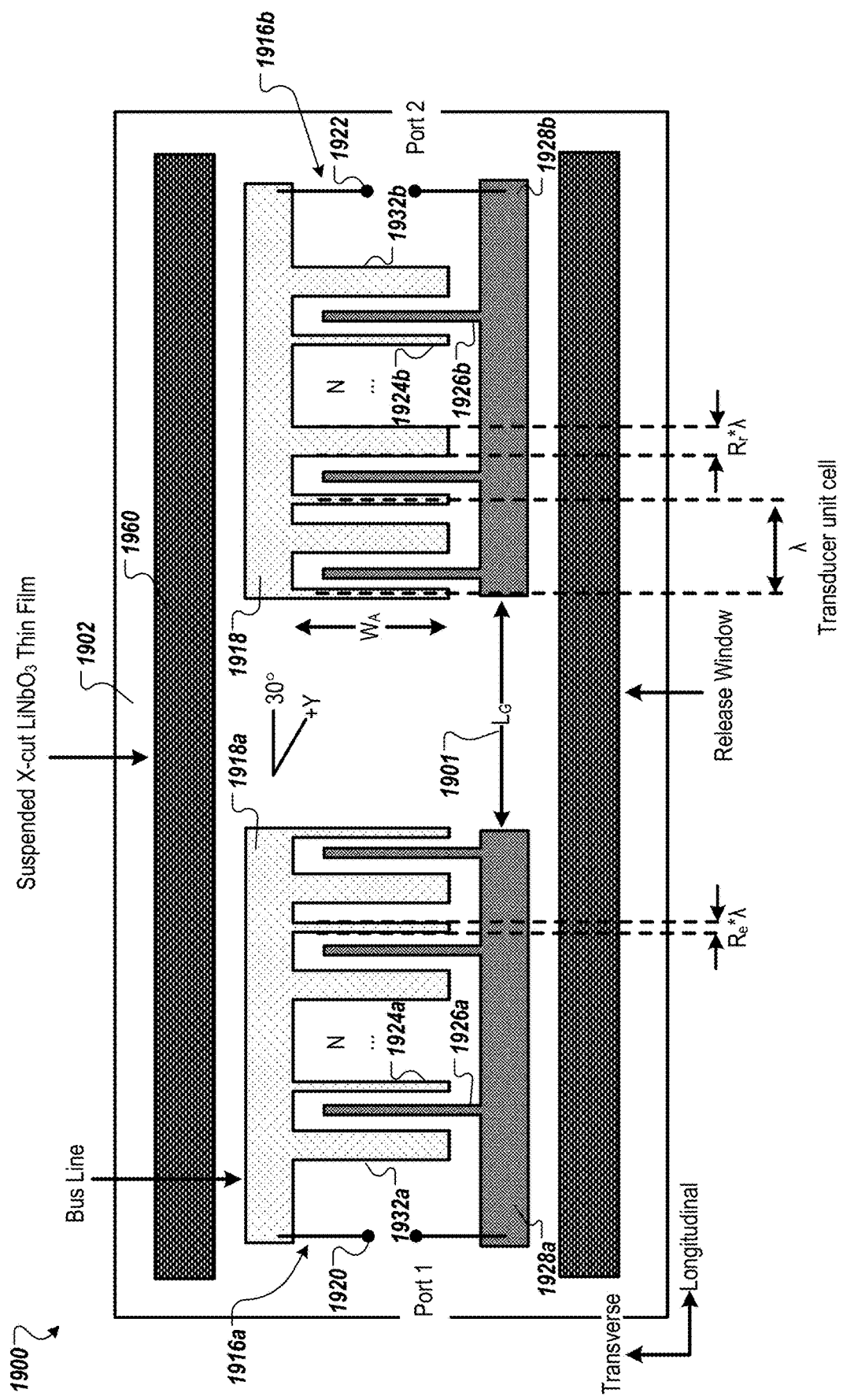
FIG. 19A is a schematic diagram of a fundamental symmetric (S0) mode ADL with a pair of IDTs according to one embodiment.

FIG. 19A is a schematic diagram of an S0 mode ADL 1900 with a pair of IDTs 1916a and 1916b according to one embodiment. The ADL 1900 includes a piezoelectric thin film 1902 located above a carrier substrate. The piezoelectric thin film 1902 is an X-cut or Y-cut $LiNbO_3$ thin film adapted to propagate an acoustic wave in at least one of a fundamental symmetrical (S0) mode, a first-order symmetrical (S1) mode, a fundamental shear-horizontal (SH0) mode, or a first-order antisymmetric (A1) mode excited by an electric field oriented in a longitudinal direction along a length of the piezoelectric thin film. The piezoelectric thin film 1902 can further be adapted to propagate an acoustic wave in at least one of an antisymmetric (A1) mode or a first-order shear-horizontal (SH1) mode excited by the electric field oriented at least partially in a thickness direction (e.g., mutually perpendicular to the longitudinal and transverse directions indicated) of the piezoelectric thin film 1902. In some further embodiments, the Y-cut $LiNbO_3$ thin film includes one of a 128Y-cut, 54Y-cut, or 36Y-cut $LiNbO_3$ thin film and the second mode includes one of a first-order symmetric (S1) mode. In some cases, the rotated Y cuts can also additionally propagate the acoustic wave in at least one of the first modes (S0, S1, SH0, and A1) excited by the electric field oriented in the longitudinal direction or one of the second modes (A1 and SH1) excited by the electric field oriented at least partially in the thickness direction. A first IDT 1916a can be disposed on a first end of the piezoelectric thin film 1902. The first IDT 1916a can convert a first electromagnetic signal, traveling in the longitudinal direction, into the acoustic wave. A second IDT 1916b can be disposed on a second end of the piezoelectric thin film, opposite the first end of the piezoelectric thin film, with a gap 1901 $L_g$ between the second IDT 1916b and the first IDT 1916a. The second IDT 1916b can convert the acoustic wave (that has traveled across the gap 1901) into a second electromagnetic signal. In some embodiments, the ADL 1900 can support at least one of an S0, S1, S2, SH0, SH1, A0, A1, or A3 mode. In the present disclosure, as an illustrative example, the ADL 1900 includes 135 nm aluminum IDTs 1916a and 1916b on top of a suspended 800 nm X-cut or Y-cut $LiNbO_3$ thin film 1902. In some embodiments, the piezoelectric thin film 1902 can be suspended above a carrier substrate. In other embodiments, the piezoelectric thin film 1904 may be disposed on a high acoustic impedance layer interposed between the piezoelectric thin film 1902 and the carrier substrate. The high acoustic impedance layer can be composed of at least one silicon (Si), sapphire, fused silica, quartz, silicon carbide (SiC), diamond, aluminum nitride (AlN), or aluminum oxide ($Al_2O_3$). In other embodiments, the piezoelectric thin film 1902 may be disposed on a Bragg reflector interposed between the piezoelectric thin film 1902. The carrier substrate and the Bragg reflector can be composed of multiple alternating layers including a first layer with a first acoustic impedance (e.g., a high acoustic impedance layer or a high velocity layer) and a second layer with a second acoustic impedance (e.g., a low acoustic impedance layer or a low velocity layer). The second acoustic impedance may be lower than the first acoustic impedance.

In some embodiments, the ADL 1900 further includes a waveguide 1960 inside of which is disposed the piezoelectric thin film 1902, the first IDT 1916a, the second IDT 1916b, a first port 1920 coupled to the first IDT 1916a, and a second port 1922 coupled to the second IDT 1916b. The first port 1920 is to receive the first electromagnetic signal and the second port 1922 is to output the second electromagnetic signal.

In some embodiments, the first IDT 1916a is an input transducer in order to convert an RF signal into an acoustic signal. The first IDT 1916a can include an input ground line 1918a, and an input signal line 1928a. The input ground line 1918a can be coupled to an input ground transduction electrode 1924a and an input acoustic reflector 1932a. In some embodiments, the input ground line 1918a can be coupled to more than one input ground transduction electrode and more than one input acoustic reflector. The input signal line 1928a can be coupled to an input signal electrode 1926a. In some embodiments, the input signal line 1928a can be coupled to more than one input signal electrode. The first IDT 1916a can serve as an input port (e.g., PORT 1) for an input signal (e.g., an RF signal).

In some embodiments, the second IDT 1916b is an output transducer in order to convert an acoustic signal into an RF signal. The second IDT 1916b can include an output ground line 1918b, and an output signal line 1928b. The output ground line 1918b can be coupled to an output ground transduction electrode 1924b and an output acoustic reflector 1932b. In some embodiments, the output ground line 1918b can be coupled to more than one output ground transduction electrode and more than one output acoustic reflector. The output signal line 1928b can be coupled to an output signal electrode 1926b. The second IDT 1916b can serve as an output port (e.g., PORT 2) for an output signal (e.g., an RF signal).

The ADL 1900 can include IDTs 1916a and 1916b disposed on top of a suspended piezoelectric thin film 1902. In operation, the RF signals can be sent to an input port 1920 and converted into acoustic waves through input piezoelectric transducers. The launched acoustic waves propagate toward an output port 1922. After traversing through the waveguide 1960, the acoustic wave can be picked up by output piezoelectric transducers and converted back into the EM domain. Various acoustic signal processing functions can be passively implemented through designing the IDTs 1916a and 1916b and the waveguide 1960.

ADLs can be sorted into different types from the following aspects, transducer types, electrical excitation direction, acoustic vibration modes, and thin-film material. The high-performance ADLs may require a combination of the proper electrical excitation direction for a certain acoustic mode in a specific material.

In some embodiments, ADLs can be bi-directional or unidirectional based on the transducer shapes (e.g., IDT configurations). Bi-directional devices have a minimum 6 dB IL because bi-directional transducers lose half of the energy due to wave attenuation at both ports. Unidirectional devices can eliminate or significantly reduce the bi-directional loss, but the structures tend to be more complex and may require smaller feature sizes.

ADLs can be sorted by which modes are excited by one or more of a longitudinal direction electric field or a thickness direction electric field. When the ADL includes electrodes with different polarizations on the top and bottom of the piezoelectric thin film, then the electric field is in the thickness direction. The longitudinal directional field devices have electrodes on the top, bottom, or both sides, but the polarizations of the electrodes facing towards each other in the thickness direction are the same (or the ADL only has electrodes on one side). In some embodiments, ADLs can be sorted based on their acoustic vibration modes (e.g., Lamb modes and shear modes). Lamb modes (e.g., S0, A0, S1, A1, and the like) and shear modes (e.g., SH0, SH1, SH2, and the like) can be both be used. In some embodiments, ADLs can be sorted based on the material, e.g., ADLs may be present on $LiNbO_3$ thin films, AlN thin films, or the like.

In various embodiments, a gap length ($L_G$) may be defined as the distance (e.g., gap 1901) between the first IDT 1916a (input transducer) and the second IDT 1916b (output transducer). In some cases, the length of the gap 1901 can range between 0.1 mm and 6.4 mm. In other cases, the length of the gap 1901 can range between 0 mm to several centimeters. In alternate embodiments, the first IDT 1916a can be the output transducer and the second IDT 1916b can be the input transducer. In some embodiments, electric fields can be induced by the electromagnetic signal(s) (e.g., RF signal(s)) received by the first IDT 1916a. Further, the orientation of the induced electric fields can be determined by the configuration of electrodes of the first IDT 1916a.

The ADL 1900 can be oriented between −10° to 30° with respect to the +y-axis of the X-cut or Y-cut $LiNbO_3$ for harnessing the high phase velocity and large coupling of the S0 mode. In some other embodiments, the first IDT 1916a and the second IDT 1916b can be oriented at an angle between −10° to 30° with respect to the positive y-axis of the piezoelectric thin film. The S0 mode can be chosen to create gigahertz ADLs for two primary reasons. First, a high electromechanical coupling, $k^2$, up to 40% may be accessible in X-cut or Y-cut $LiNbO_3$, thus allowing a better BW-IL tradeoff for ADLs. Second, in contrast to the SH0 mode, the high phase velocity (over 7000 m/s) of the S0 mode can permit the scaling to higher frequencies with larger feature sizes.

Figure 19B:
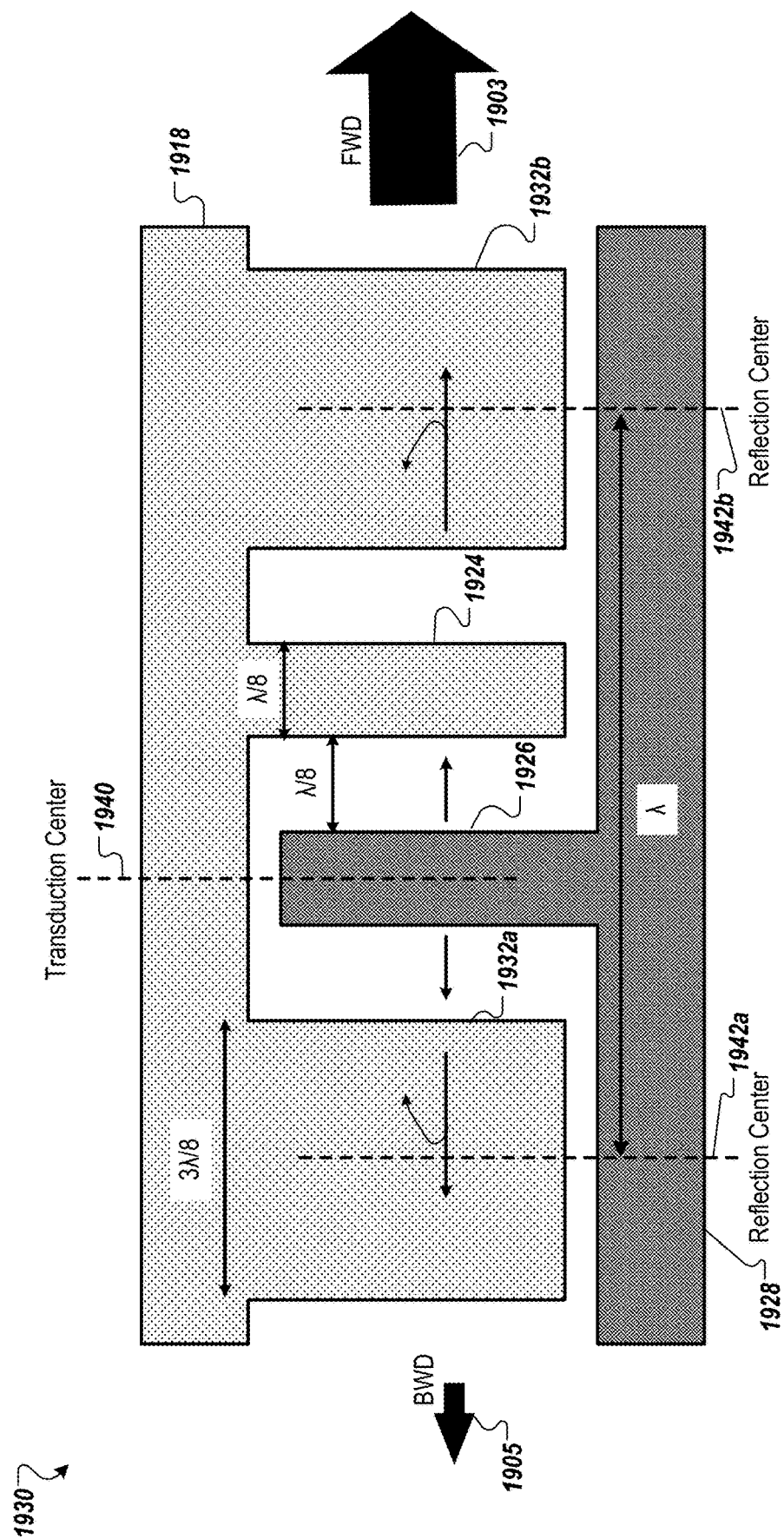
FIG. 19B is a schematic diagram of a SPUDT unit cell of an S0 mode ADL according to one embodiment.

FIG. 19B is a schematic diagram of a SPUDT unit cell 1930 of an S0 mode ADL according to one embodiment. The S0 mode ADL can be the same or similar to the ADL 1900. In some embodiments, the first IDT 1916a can include at least a transducer unit cell 1930. The transducer unit cell 1930 includes a ground line 1918 coupled to the first port (e.g., first port 1920), acoustic reflectors 1932a and 1932b coupled to the ground line 1918, a first transduction electrode 1924 coupled to the acoustic reflectors 1932a and 1932b and to the ground line 1918 of the first port 1920, a signal line 1928 coupled to the first port 1920, and a second transduction electrode 1926 coupled to the signal line 1928 and disposed between the acoustic reflector 1932a and the first transduction electrode 1924. A center of the second transduction electrode 1926 can be defined as a transduction center 1940. A first half of the acoustic reflector 1932a is positioned at a first end of the transducer unit cell 1930 at a first distance away from the transduction center 1940, and a second half of the acoustic reflector 1932b is positioned at a second end of the transducer unit cell 1930 at a second distance away from the transduction center 1940. The second distance is different from the first distance. In some embodiments, the second distance is 5λ/8 and the first distance is 3λ/8. In other embodiments, the second distance is between 40% and 95% greater than the first distance. The second transduction electrode 1926 is disposed between the first half of the acoustic reflector 1932a and the first transduction electrode 1924.

The transducer unit cell 1930 may be a transducer unit cell of the S0 mode ADL 1900 of FIG. 19A. The first and second IDTs 1916a and 1916b on the opposite ends of the ADL 1900 may be SPUDTs. The SPUDTs can be composed of cascaded transducer unit cells 1930 that each include a pair of transduction electrodes 1924 and 1926 (that are λ/8 wide) and one (total effective) distributed acoustic reflector composed of half of acoustic reflector 1932a and half of acoustic reflector 1932b. In the depicted embodiment, each acoustic reflector 1932a and 1932b is 3λ/8 wide and shorted to the ground bus line 1918 (such as for the DART unit cells of FIG. 2B). In other embodiments, each acoustic reflectors can be λ/4 wide (such as for the EWC unit cells of FIG. 2C). In each transducer unit cell 1930, the two acoustic reflectors 1932a and 1932b can be arranged on opposite sides of transduction center 1840 nonsymmetrically with different spacings of 3λ/8 and 5λ/8 respectively. The transduction center 1940 referred to herein is defined as the center of the second electrode 1926 (e.g., the non-grounded electrode or the signal electrode). After launching from the transduction center 1840, the acoustic wave propagating toward the left (e.g., the backward direction (BWD) 1905) can get partially reflected from the left-side acoustic reflector 1932a and can start traversing in the forward direction (FWD) 1903, e.g., towards the right. As the reflected acoustic wave returns to the transduction center 1940, it may experience a total of −2π phase delay that results from a −1.5π phase delay from the propagation and a −0.5π phase delay from the reflection, which can cause the reflected acoustic wave to constructively interfere with the acoustic wave that is directly launched toward the FWD direction 1903. On the other hand, the acoustic wave propagating toward the FWD direction 1903 can be partially reflected from the right-side acoustic reflector 1932b and can start traversing in the backward direction (BWD) 1905, e.g., towards the left. As the reflected acoustic wave returns to the transduction center 1940, it can experience a −2.5π phase delay from the propagation and a −0.5π phase delay from the reflection. The acoustic wave may see a total delay of −3π upon its arrival back to the transducer center 1940 and can destructively interfere with the acoustic wave directly launched toward the BWD direction 1905. With a sufficient amount of cascading reflections distributed in the unit cells, near perfect cancellation of the BWD wave propagation can be achieved, which can result in the removal of the bi-directionality in the transducers and a 6-dB reduction in the IL of the ADL.

Figure 20A:
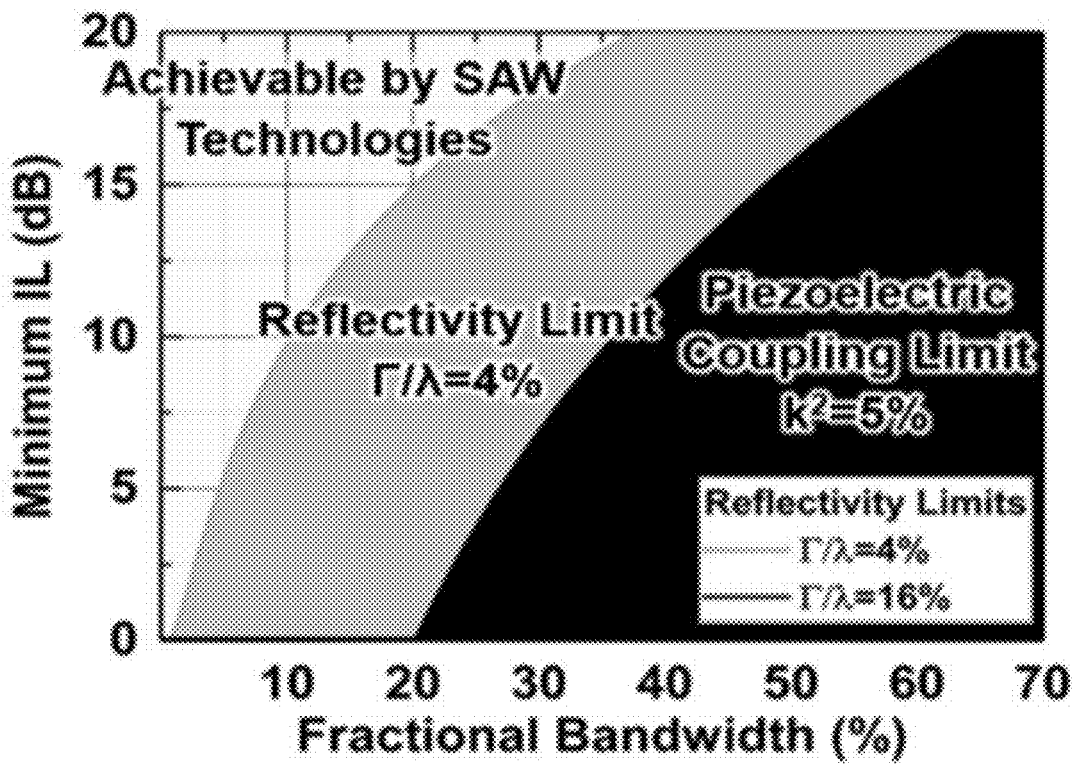
FIG. 20A is a graph that illustrates the tradeoff between the minimum insertion loss and fractional bandwidth (FBW) for unidirectional ADLs with surface acoustic wave (SAW) modes showing piezoelectric and reflectivity limits according to one embodiment.
Figure 20B:
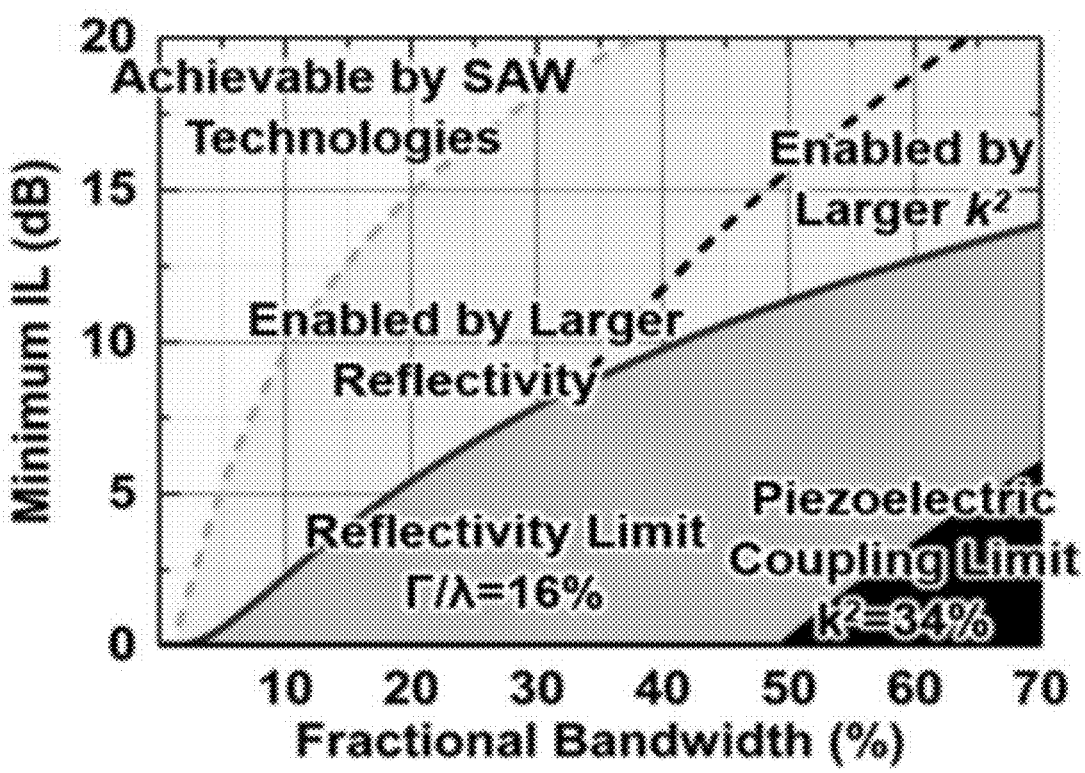
FIG. 20B is a graph that illustrates the tradeoff between the minimum insertion loss and fractional bandwidth for unidirectional ADLs in S0-mode lithium niobate ($LiNbO_3$), showing piezoelectric and reflectivity limits according to one embodiment.

FIG. 20A is a graph that illustrates the tradeoff between the minimum insertion loss and fractional bandwidth for unidirectional ADLs with SAW modes showing piezoelectric and reflectivity limits according to one embodiment. The performance of S0-mode ADLs (shown in FIG. 19B) can be compared with the SAW technology regarding their fundamental limits. As mentioned earlier, two factors, namely, $k^2$ and the reflectivity in SPUDTs, can fundamentally limit the performance of SPUDT-based ADLs. Their impact on ADL performance is shown in FIGS. 20A-20B for SAW ADLs and S0-mode ADLs respectively. $k^2$ may be intrinsically bounded by the piezoelectric properties of the material and effective coupling efficiency of the transducer for a given mode. It can set the limit on the maximum FBW over which impedance matching can be attained without imposing a significant IL. For ADLs working beyond the maximum FBW, the IL can be expressed as $$IL = FBW^2 \cdot Q_T / c_{piezo}, \text{ when } FBW > \sqrt{c_{piezo}/Q_T} \qquad (36)$$

where $$c_{piezo} = \frac{v_f - v_m}{v} \cdot \left[1 + \frac{3(v_f - v_m)}{2v}\right]. \qquad (37)$$

and $Q_T$ is the normalized quality factor of the transducer and may be only determined by the transduction structure. The parameter $c_{piezo}$ is the material piezoelectric constant determined by the material coupling coefficient and can be calculated through the phase velocities of the acoustic wave in the thin film sections with free surface $v_f$ and metalized surface $v_m$.

FIG. 20B is a graph that illustrates the tradeoff between the minimum insertion loss and fractional bandwidth for unidirectional ADLs in S0-mode $LiNbO_3$, showing piezoelectric and reflectivity limits according to some embodiments. For one design, with $Q_T$ of 0.6594, $v_f$ of 7018 m/s, and $v_m$ of 6047 m/s, the maximum electromechanical coupling coefficient $k^2$ is 35%. Based on Eq. (36), a $k^2$ of 35% translates to a maximum FBW of 50%, beyond which a larger FBW comes at the cost of a higher IL. In other words, the black region shown in FIG. 20B may be forbidden and may not be accessible.

Figure 21A:
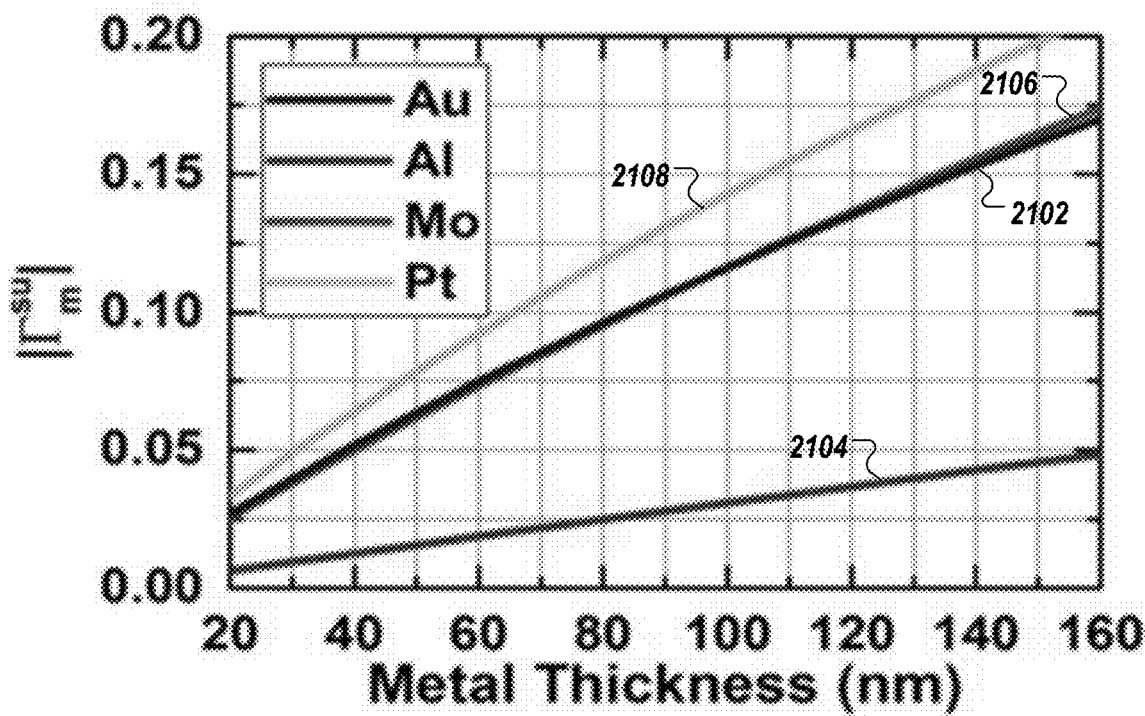
FIG. 21A is a graph that illustrates the mechanical reflection coefficients caused by the thin film interface, with and without electrodes according to one embodiment.

FIG. 21A is a graph that illustrates the mechanical reflection coefficients caused by the thin film interface, with and without electrodes according to some embodiments. The graph of FIG. 21A shows the attainable reflections in the embedded reflectors may limit the unidirectionality of the transducer pairs and thereby the IL of the ADL. Curve 2102 corresponds to Au, curve 2104 corresponds to Al, curve 2106 corresponds to Mo, and curve 2108 corresponds to Pt. The dependence of IL on reflectivity can be expressed as $$IL = 1 - e^{-\Gamma_\lambda/FBW}, \qquad (38)$$

where $\Gamma_\lambda$ is the reflection per wavelength. Eq. (38) quantitatively explains that a platform with a lower $\Gamma_\lambda$ may require more cells e.g., acoustic reflectors, to achieve the same unidirectionality and IL and intrinsically leads to a smaller FBW due to the dependence of transducer frequency-domain response on the number of cells ($FBW_{transducer} \sim 1/N$). $\Gamma_\lambda$ can be calculated based on a model that separates the reflection into the mechanically and electrically induced reflections. The mechanical reflection may be caused by different effective acoustic impedances in the sections of $LiNbO_3$ with and without electrodes, while the electrical reflection (described in further detail with respect to FIG. 21B) can be induced by the constant potential boundary condition in the metalized $LiNbO_3$ sections.

The mechanical reflection per unit cell can be calculated as $$\Gamma_m = \Gamma_{su} e^{j\alpha} \frac{1 - e^{-j2\alpha}(1 - \Gamma_{su}^2)}{1 - \Gamma_{su}^2 e^{-j2\alpha}}, \qquad (39)$$

where $\Gamma_m$ is the mechanical reflection coefficient at the reflection center, $\Gamma_{su}$ is the step-up reflection coefficient, and $\alpha$ is the electrical width of the reflector, which is $3\pi/4$ for some embodiments of a SPUDT design. $\Gamma_{su}$ can be obtained from COMSOL frequency-domain FEA. In the FEA, the mechanical reflection coefficient of a single reflector can be obtained. $\Gamma_{su}$ may then be extracted through the multi-reflection theory. In some embodiments, for a stack of 135 nm aluminum electrodes on 800 nm LiNbO$_3$, $\Gamma_{su}$ is −0.045 as shown in FIG. 20A. Thus, $\Gamma_m$ is calculated to be −0.057.

Figure 21B:
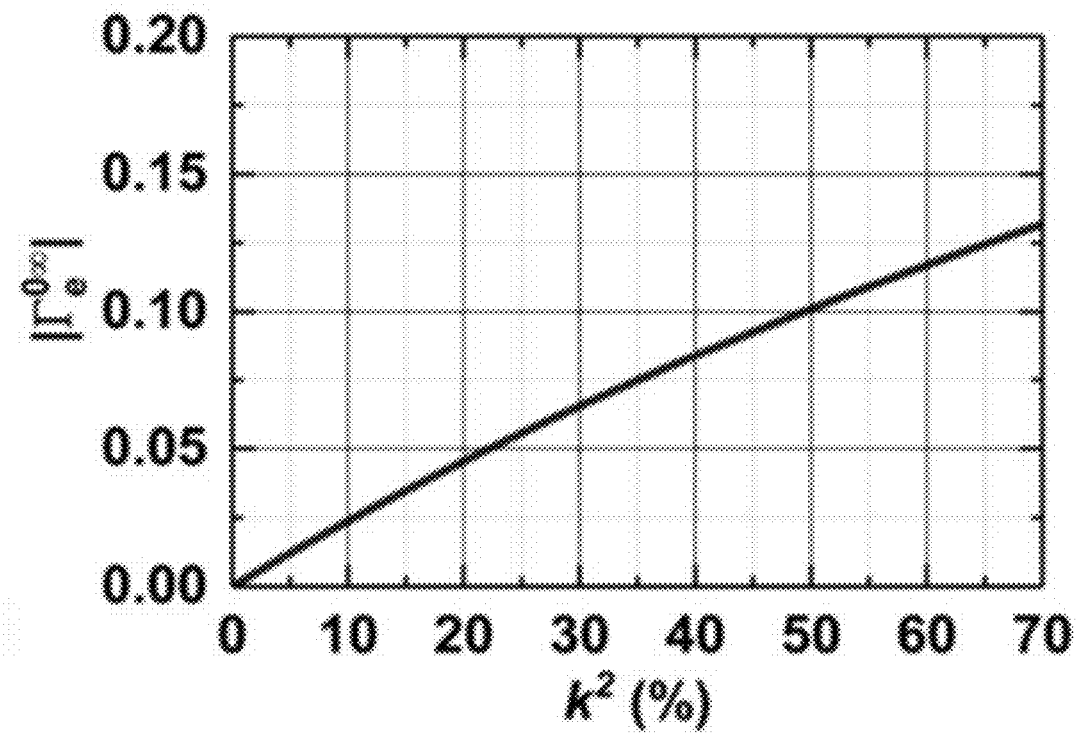
FIG. 21B is a graph that illustrates the electrical reflection coefficients caused by the thin film interface, with and without electrodes according to one embodiment.

FIG. 21B is a graph that illustrates the electrical reflection coefficients caused by the thin film interface, with and without electrodes according to some embodiments. The electrical reflection can be calculated as $$\Gamma_e = \Gamma_{0\infty} e^{j\alpha} \frac{1 - e^{-j2\alpha}(1 - \Gamma_{0\infty}^2)}{1 - \Gamma_{0\infty}^2 e^{-j2\alpha}}, \quad (40)$$

where $\Gamma_e$ is the electrical reflection coefficient at the reflection center and $\Gamma_{0\infty}$ is the reflection coefficient due to the phase velocity difference in the metalized and free piezoelectric surfaces. $\Gamma_{0\infty}$ can be obtained from COMSOL FEA eigenmode simulation of a piezoelectric slab with electrically open or short surface boundary conditions. It should be noted that the electrodes are assumed to be massless. The relationship of the reflectivity to metal electrode thickness and metal type of the SPUDT is shown in FIG. 20B. For the S0 mode with a wavelength, λ, of 6.4 μm in an 800 nm in LiNbO$_3$ film, $\Gamma_{0\infty}$ is −0.0743, and thus $\Gamma_e$ is calculated to be −0.105 j.

The comprehensive reflection coefficient $F_\lambda$, which includes the effects of mechanical and electrical reflections, can be calculated through the multireflection theory and expressed as $$\Gamma_\lambda = \frac{\Gamma_m + \Gamma_e}{1 + \Gamma_m \cdot \Gamma_e}. \quad (41)$$

The total reflection coefficient per reflector is calculated to be −0.16 j, which may be significantly larger than those obtained in SAW devices with a similar electrode thickness. The large reflectivity is collectively caused by a higher $\Gamma_e$ from a larger $k^2$ and a higher $\Gamma_m$ from the more substantial electrode mass loading on a suspended thin film (e.g., $\Gamma_e$ and $\Gamma_m$ can be approximately two to five times larger in the ADLs described herein as compared with SAW-based ADLs, and can be approximately on the order of 0.2). Based on Eq. (38), the forbidden region caused by the limit on reflectivity is illustrated in FIG. 20B.

Upon comparing the graphs of FIG. 20A and FIG. 20B, it is evident that the S0-mode ADL may allow access to a more favorable FBW-IL trade space and overcomes the fundamental performance limits of the SAW ADL. Combined with their better energy confinement in the suspended structure and consequently lower PL, S0 ADLs can potentially enable wider BW and lower loss performance in the gigahertz frequency range.

FIGS. 22A-22E are a set of graphs that illustrate a simulated performance of the gigahertz S0 ADLs with a 6.4-μm cell length, the same gap length of 0.2 mm, but different numbers of SPUDT cells (5-20) according to some embodiments.

Figure 22A:
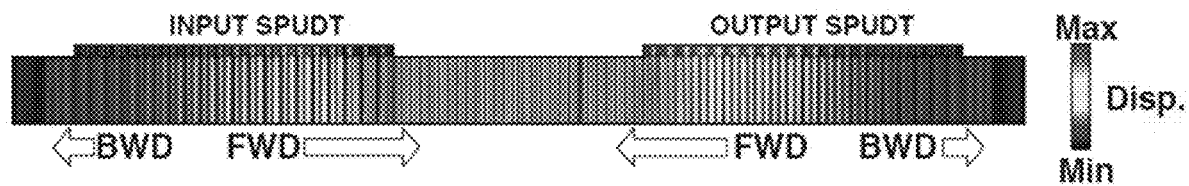
FIGS. 22A-22E are a set of graphs that illustrate a simulated performance of the gigahertz S0 ADLs with a 6.4-μm cell length, the same gap length of 0.2 mm, but different numbers of SPUDT cells (5-20) according to some embodiments.

FIG. 22A is a cross-sectional mode shape depicting the unidirectionality of the SPUDT transducers for an ADL with 20 cells and a gap length of 0.1 mm according to one embodiment. It should be noted that as depicted, the thickness of the cross-section is exaggerated as illustrated. To better capture the intricacies and understand the frequency-domain responses of the S0-mode ADL, COMSOL FEA can be used for validating the S0-mode ADL prototype designs. To demonstrate the design fundamentals of the S0-mode ADLs, simplified 2D simulations can be used, assuming that the acoustic waves are plane waves and the fringe effects near the release windows can be neglected. The 3D simulation can also be analyzed, emphasizing the propagation characteristics of the S0 mode acoustic waves in our proposed structure. The 2D simulation is set up as follows. A slab of the proposed S0-mode ADL structure can be modeled in COMSOL, with the IDTs but not the bus line parts, as shown in FIG. 22A. Periodic boundary conditions may be applied to the transverse edges for both the mechanical and electrical domains. The 2D simulation may also assume the whole structure, including the acoustic waveguide, to be lossless, given that PL may remain unknown for S0-mode waves at these frequencies. PL can be experimentally derived by making a series of measurements. Perfectly matched layers can be applied to both ends of the S0-mode ADL.

First, the S0-mode ADL designs with different numbers of transducer unit cells, but the same gap length (0.2 mm), can be investigated to determine the number of cells in one design for an acceptable SIC application. In the simulation, without loss of generality, the transducer unit cell length can be chosen to be 6.4 μm. Considering potential in-house fabrication capabilities, the film stack is set as 135 nm-thick aluminum IDTs on the top of a suspended 800 nm LiNbO$_3$ thin film. As shown in the simulated cross-sectional mode shape (FIG. 22A), the SPUDTs on both ends significantly reduce the energy leakage to the BWD direction.

Figure 22B:
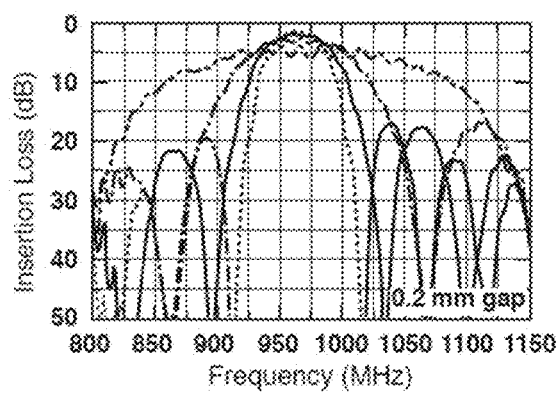
Figure 22C:
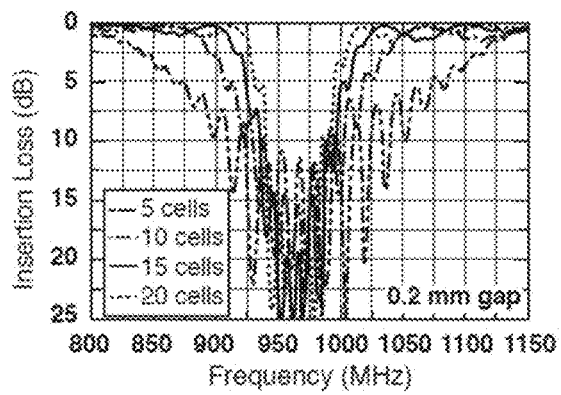

FIGS. 22B-22C show the IL and the RL of the S0-mode ADL, respectively, with the ports conjugately matched according to some embodiments. For a device with 20 cells, an IL of 1.3 dB and a 3 dB FBW of 4.2% can be expected, while an IL of 3.9 dB and an FBW of 16% can be obtained for a device with five cells.

Figure 22D:
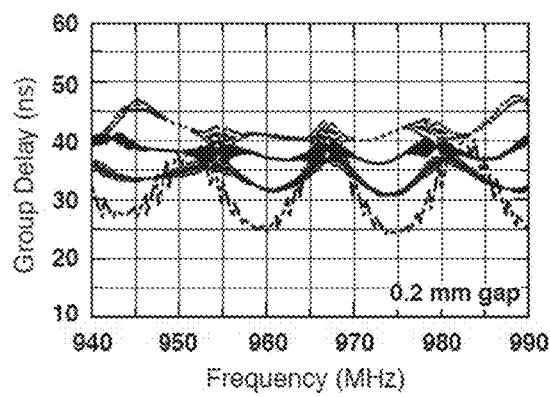

FIG. 22D is a graph illustrating the group delay according to one embodiment. Simulated group delays are shown in FIG. 2D. Delays from 25 to 45 ns can be obtained with longer delays which may be induced by longer acoustic wave propagation distances in devices with more cells. The ripples in delay may likely be caused by the multi-reflection between the transducers. The absolute delay value and the origin of the ripples will be discussed below.

Figure 22E:
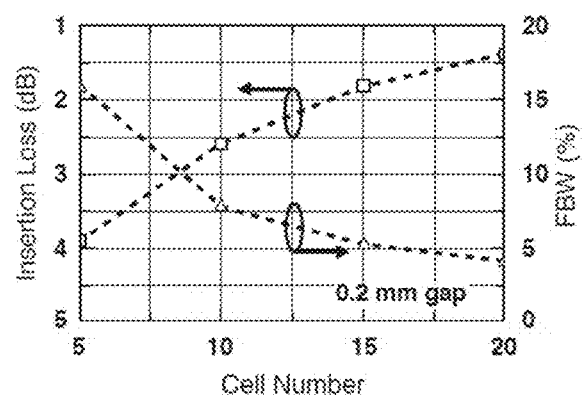

FIG. 22E shows the extracted IL and FBW, illustrating their tradeoff according to one embodiment. The tradeoff between IL and FBW for an ADL platform is shown in FIG. 22E. The simulation results indicate a substantially improved trade space that can lead to low IL over a broad BW. For providing delays for SIC, a priority should be placed on providing low IL for adequately wide FBW. Based on the one demonstration of SIC, 4% FBW (20 cells) may be selected as an exemplary design prototype.

FIGS. 23A-23D are a set of graphs illustrating simulated performances of the gigahertz S0 ADLs with 6.4-μm cell length, the same number of SPUDT cells of 20, but different gap lengths varying from 0.1 to 0.8 mm according to some embodiments. The effects of the gap length can be studied by simulating designs with the same number of cells (N=20) but different gap lengths varying from 0.1 to 0.8 mm. The study can allow insights towards an accurate prediction of the delays of different ADL designs. The other parameters of the simulated structure may be left the same as the previous group of ADLs.

Figure 23A:
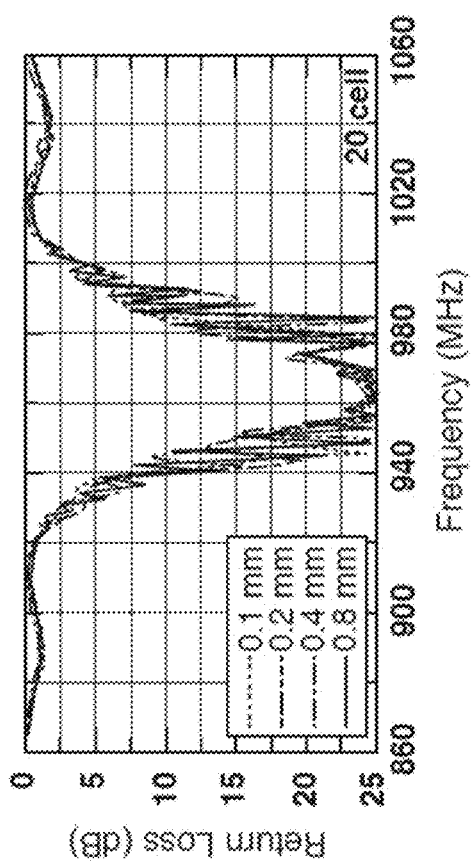
FIGS. 23A-23D are a set of graphs illustrating simulated performances of the gigahertz S0 ADLs with 6.4-μm cell length, the same number of SPUDT cells of 20, but different gap lengths varying from 0.1 to 0.8 mm according to some embodiments.
Figure 23C:
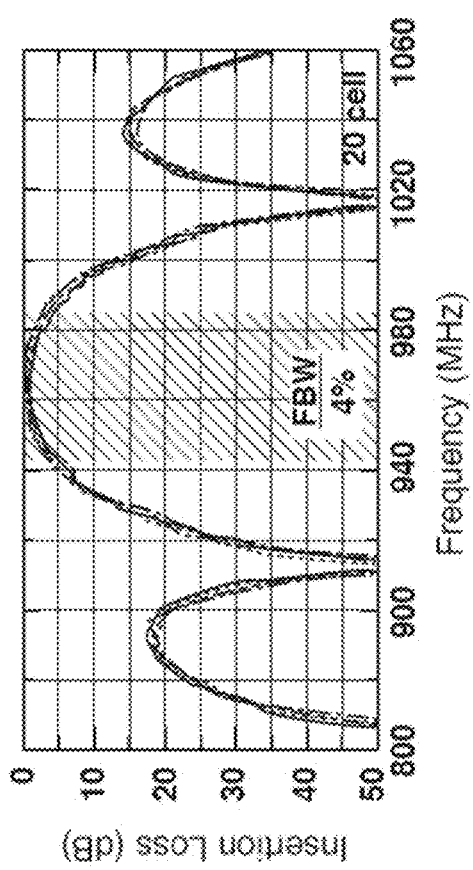
Figure 23B:
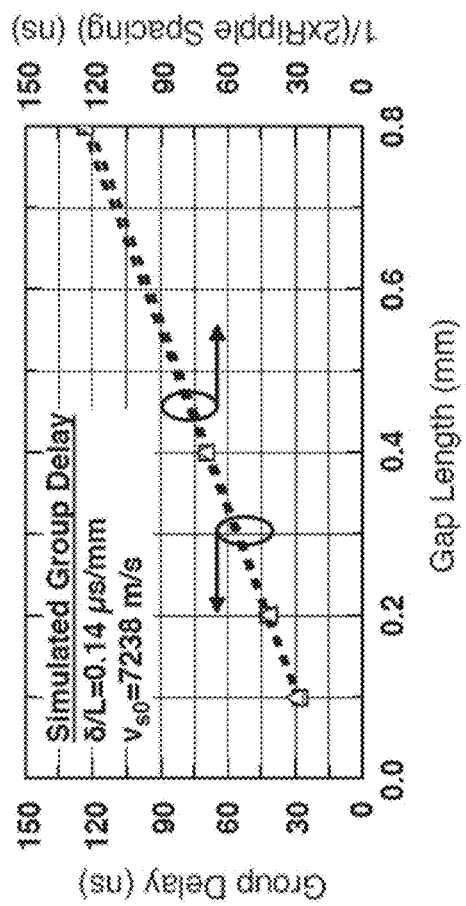

FIGS. 23A-23B are graphs illustrating the simulated IL and the RL of the ADLs with conjugately matched ports and various gap lengths according to some embodiments. It can be seen in FIG. 23A that an IL around 1.1 dB and an FBW of approximately 4.2% are obtained for different devices with various gap lengths, which may be due to the lossless nature of the simulation setup.

FIG. 23C is a graph that illustrates the simulated group delay of the ADLs with various gap lengths according to one embodiment. ADLs with more considerable delay lengths may lead to longer delays, as summarized in FIG. 23D.

Figure 23D:
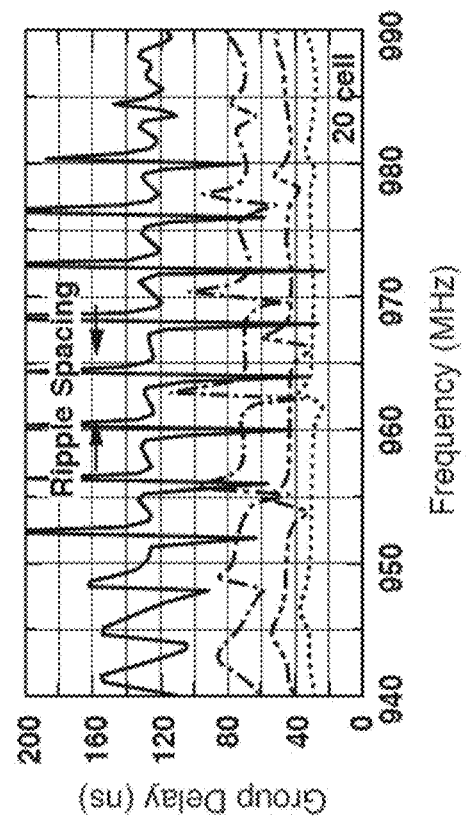

FIG. 23D is a graph illustrating the extracted group delay and the frequency spacing between the ripples, showing that the multi-reflections due to finite directionality may be the source of the ripples in the group delay according to one embodiment.

The group delay τ can be approximated as $$\tau \approx (L_g + N \cdot \lambda)/v_o \qquad (42)$$

where $L_g$ is the gap length, N is the cell number, λ is the cell length, and $v_o$ is the phase velocity of S0 mode in LiNbO$_3$ thin film with the electrically open-surface boundary condition. As shown in 2210, an extracted $v_o$ can be 7238 m/s, which may be equivalent to providing 0.14 μs/mmin S0 ADLs. Another observation is that the frequency spacing between ripples may be smaller for more extended devices. Upon analyzing the frequency spacing quantitatively, e.g., see 2210, the relation between the ripple spacing $\Delta f_{sp}$ and the delay τ can be summarized as $$\Delta f_{sp} \approx \frac{1}{2\tau}. \qquad (43)$$

Such a conclusion indicates that the ripples can be caused by highly partial standing waves (with low standing wave ratio) formed between the two sets of IDTs on opposite ends. However, such effects may be less severe in an SH0 ADLs on the suspended LiNbO$_3$ thin films. The more subdued ripples may largely be a result of the higher damping of SH0 acoustic waves, which can significantly lower the quality factor Q of such a mode and mitigate the local group delay fluctuations. The simulations show the target performance of S0 ADLs for SIC applications, and may validate the enhanced design space of the new platform. However, scaling S0 ADLs toward the gigahertz range may not merely reduce the cell length, which is the same as the S0 mode wavelength. The presence of other spurious modes may create new challenges for attaining high-performance gigahertz ADLs.

Figures 24A, 24B, 24C, 24D:
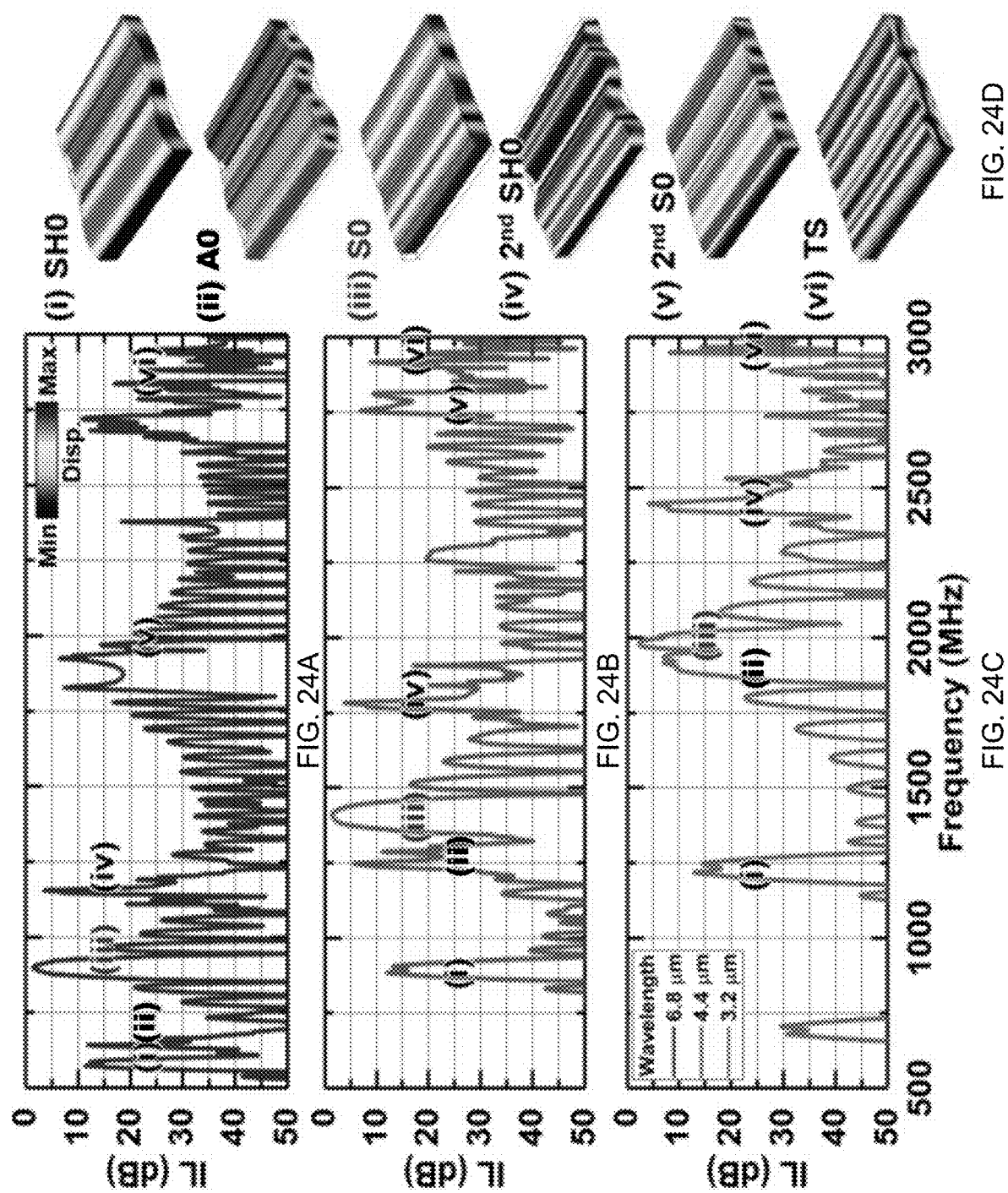
FIGS. 24A-24C are a set of graphs that illustrate simulated performance of gigahertz S0 ADLs with different center frequencies according to some embodiments.
FIG. 24D is a graph that illustrates main passbands and mode shape of each mode, according to one embodiment.

FIGS. 24A-24C are a set of graphs that illustrate simulated performance of gigahertz S0 ADLs with different center frequencies according to some embodiments. Different ADLs can include the same number of SPUDT cells of 20, the same gap length of 0.1 mm, but different cell length varying from 6.8 to 3.2 μm. FIG. 24D is a graph that illustrates main passbands and mode shape of each mode, according to one embodiment. Main passbands can also be identified for each embodiment and the mode shape of each mode is shown in FIG. 24D.

To illustrate some challenges of scaling S0 ADLs toward higher frequencies, a group of devices with the same gap length (0.1 mm) and number of cells (20), but different cell lengths (6.4 to 3.2 μm) can be simulated using FEA for an 800-nm film. The simulation results are shown in the graph of FIG. 23D with port impedance conjugately matched for the S0 mode. Six significant modes can exist in a frequency range from 500 to 3000 MHz, and a passband can be created from each mode. As presented in FIG. 23D, different modes may be identified with the displacement mode shapes obtained from FEA. The center frequencies of different bands can scale up with shorter cell lengths. However, as highlighted in FIG. 24C, the spacing between the S0 and A0 modes may be significantly reduced for higher frequency ADLs. In the case of a 3.2-μm cell length on the 800-nm thin film, e.g., see FIG. 24C, the S0 and A0 passbands can merge. In the overlapped passband, both the IL and RL may degrade because part of the signal can be coupled into the low k$^2$ A0 mode and may travel at a different group velocity.

It thus may not be adequately reflected by the embedded acoustic reflectors designed for S0 to achieve unidirectionality in the SPUDT transducers, which may result in more loss that may be absent in non-overlapping cases. Such a mode overlapping phenomenon can limit the available BW of the S0 ADL.

Figures 25A, 25B:
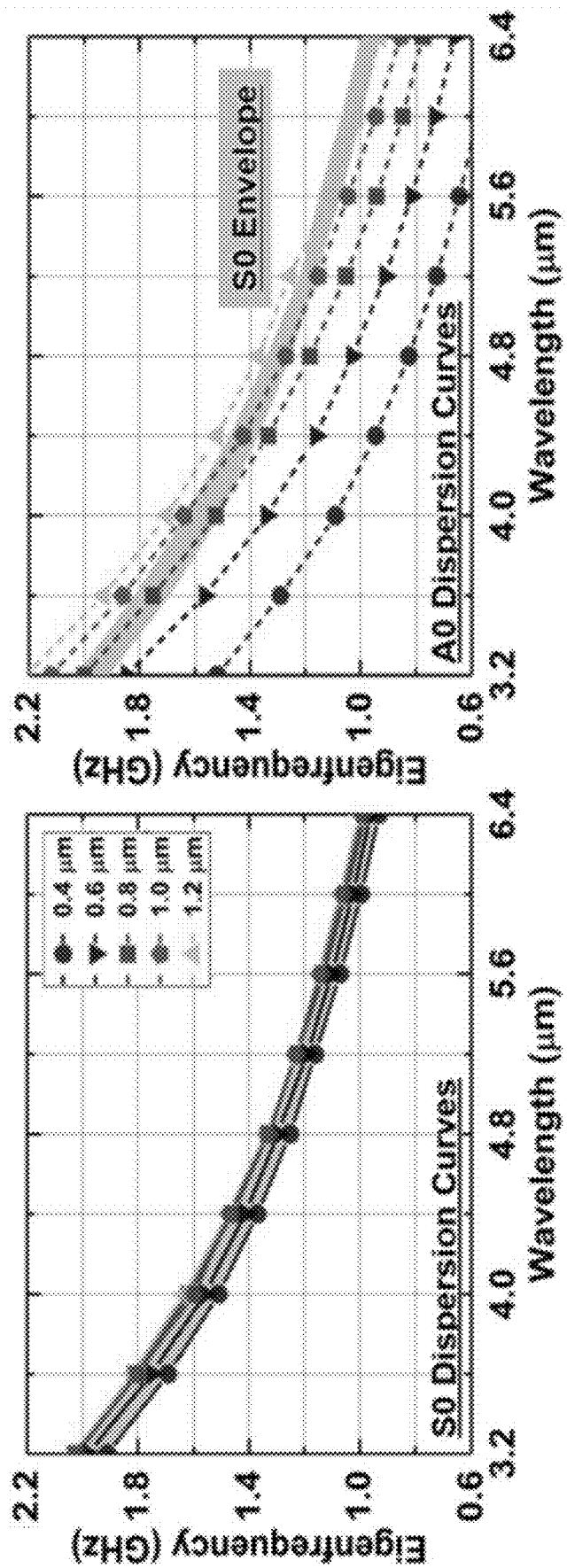
FIGS. 25A-25B are a set of graphs that illustrate dispersion curves of an S0 mode and a fundamental antisymmetric (A0) mode with different wavelengths in $LiNbO_3$ thin films with various thicknesses according to some embodiments.

FIGS. 25A-25B are a set of graphs that illustrate dispersion curves of an S0 mode and an A0 mode with different wavelengths in LiNbO$_3$ thin films with various thicknesses according to some embodiments. The A0 mode may be influenced more by the film thickness than the S0 mode. When the A0 dispersion curves become close to the S0 mode, the available FBW of the S0 mode may be reduced. The dispersion curves of S0 and A0 mode in a transducer cell are presented in FIG. 25A and FIG. 25B, respectively, for LiNbO$_3$ films with different thicknesses. The curves can be obtained using eigenmode FEA on a single cell with periodic boundary conditions in both the electrical and mechanical domains. As shown in FIG. 25A, reducing the wavelength from 6.4 to 3.2 μm can result in the increase of the center frequency of the S0 mode from 1 to 2 GHz. Moreover, the dispersion curves of the S0 mode show a weak dependence on the thickness-to-wavelength ratio. For the ADLs described herein, a thicker film can lead to a higher compound phase velocity in the transducer. The dispersion curves of the A0 mode also show a similar trend, e.g., a shorter wavelength and a thinner film may lead to a lower center frequency as shown in FIG. 25B. The S0-mode dispersion curves are plotted on the same figure, and show an overlapping of both modes for certain film thickness. It can be seen that a thinner film can provide a much larger space for scaling up the operating frequency. However, it may be nontrivial to micro-fabricate the long ADLs (lengths up to several millimeters may be required for adequate delays) on thin films. Therefore, it may require some consideration of the attainable operating frequency and the in-house fabrication capabilities. An 800 nm thin film can be used for demonstrating S0-mode ADL prototypes between 1 and 2 GHz. Note that it may be feasible to scale the S0-mode ADLs to even higher frequencies.

Figure 26A:
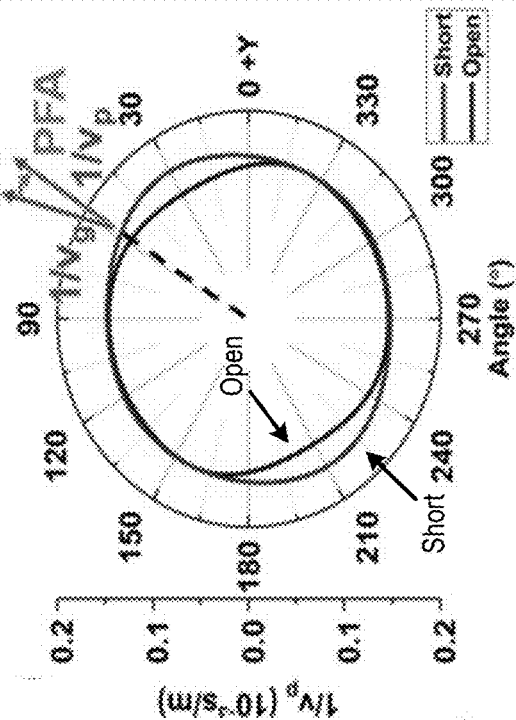
FIGS. 26A-26D are a set of graphs that illustrate S0-mode propagation characteristics in an X-cut or Y-cut $LiNbO_3$ film around 1 GHz according to some embodiments.
Figure 26B:
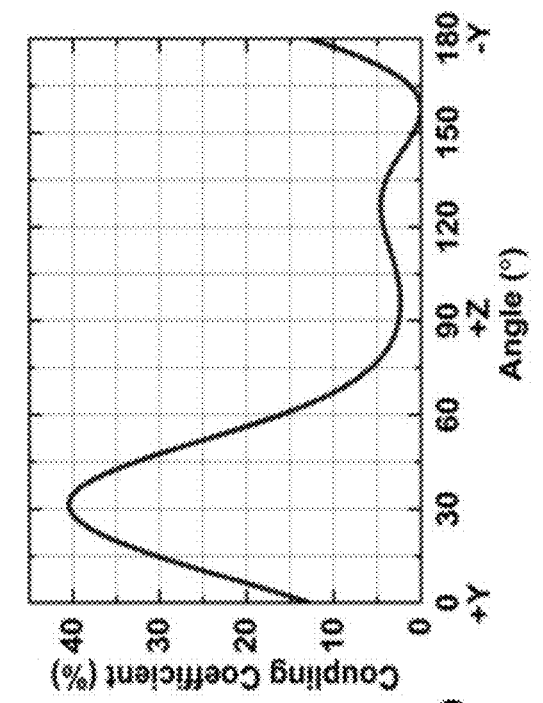
Figure 26C:
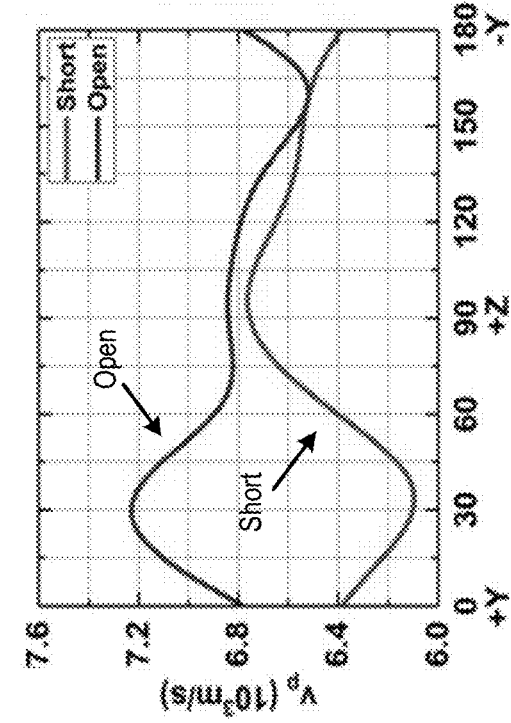
Figure 26D:
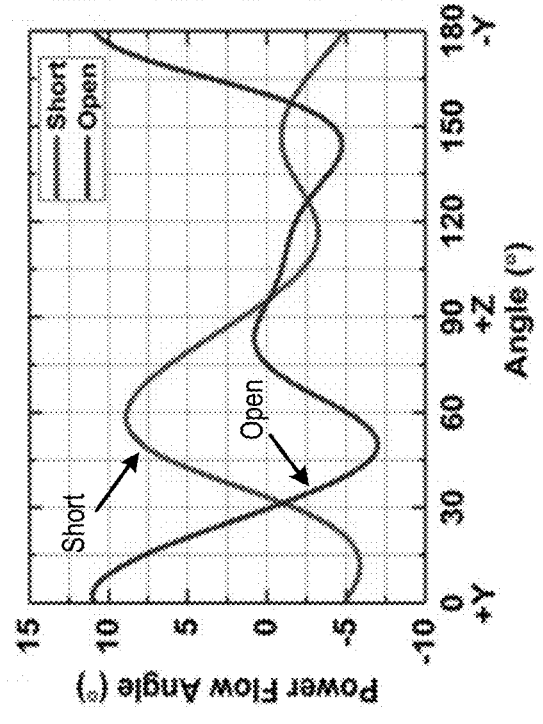

FIGS. 26A-26D are a set of graphs that illustrate S0-mode propagation characteristics in an X-cut or Y-cut LiNbO$_3$ film around 1 GHz according to some embodiments. FIG. 26A shows phase velocities of the S0 waves in an electrically open LiNbO$_3$ thin film ($v_o$) and an electrically short LiNbO$_3$ thin film ($v_s$). FIG. 26B shows slowness curves of the S0 mode in electrically open and short LiNbO$_3$ thin films. FIG. 26C shows calculated power flow angle. FIG. 26D shows calculated coupling coefficient k$^2$ of the S0 mode.

The description thus far has been based on a plane wave simplification. Such an assumption may only be valid when the launched acoustic waves propagate perfectly perpendicular to IDTs in the cut plane and do not have a wave vector component along the transverse direction. In other words, it requires the wave-front to propagate in alignment with the energy transportation direction. Therefore, it may be necessary to examine these two wave propagation directions in an actual ADL structure.

The wavefront propagation direction can be shown to be the same as that of the phase velocity $v_p$, which can be described as $$v_p = \hat{k}\omega/|k| \tag{44}$$

where ω is the angular frequency, k is the wave vector, and $\hat{k}$ is the unit vector of k. The energy transportation direction can be generally proved to be in the same direction as the group velocity $v_g$ of acoustic waves, which is described as $$v_g = \vec{\nabla}\omega \tag{45}$$

which means the gradient of the angular frequency co as a function of the wave vector k. The angle between $v_p$ and $v_g$ can be defined as the power flow angle (PFA), pointing from $v_g$ to $v_p$. PFAs of acoustic waves may not always be zero for anisotropic materials, such as $LiNbO_3$. If the PFA is non-zero, the launched acoustic waves may propagate into the bus line regions (e.g., see FIGS. 19A-19B) when reaching the other end, and may be missed by the receiving IDTs. As a result, having a non-zero PFA may introduce more IL to the actual devices than predicted by the 2D simulation (e.g., see FIGS. 22 and 23). Therefore, the PFA should be examined for the S0-mode in X-cut or Y-cut $LiNbO_3$ to identify an in-plane orientation at which large $k^2$ and adequately small PFA can be accessed simultaneously.

A slowness curve method developed for various acoustic applications may for calculating PFA for Lamb waves in thin piezoelectric films. The slowness curve is traced by the locus of the vector that is defined as the inverse of the phase velocity over the in-plane orientations, e.g., see FIG. 26A. The phase velocity direction of the S0 mode propagating along a given in-plane orientation can coincide with the radial vector pointing along the in-plane Euler angle. The direction of the group velocity can be normal to the slowness curve for all in-plane orientations, as shown in FIG. 25A.

In the depicted embodiment, the phase velocities $v_p$ of the S0 mode in X-cut or Y-cut $LiNbO_3$ at different in-plane orientations can be calculated. The S0 mode with a 6.4-μm wavelength in an 800-nm-thin film may be used as an example. In other embodiments, the wavelength can be chosen to be between 3.2 μm and 6.8 μm. COMSOL eigenmode FEA can be used for obtaining the phase velocities of the electrically open $LiNbO_3$ thin film ($v_o$) and electrically short $LiNbO_3$ thin film ($v_s$) at different in-plane orientations, e.g., see FIG. 26A. A phase velocity of approximately 6500 m/s can be obtained for the S0 mode in this film stack. $v_s$ may be slower than $v_o$ due to a piezoelectric softening effect. The slowness curves for different boundary conditions are plotted in FIG. 26A with an example of PFA presented. Using the aforementioned method, PFA curves at different in-plane orientations for both boundary conditions are plotted in FIG. 26B. Targeting the high $k^2$ of the S0 mode in X-cut or Y-cut $LiNbO_3$, the PFA zero points near 30° to the +y-axis can be investigated, see FIG. 26D. In the electrically open case, the PFA reaches zero when the propagation direction is approximately 29.5° to the +y-axis. For the electrically short case, the PFA reaches zero at a propagation direction of approximately 33.2° to the +y-axis. Deviation from these angles can cause a non-zero PFA and a misalignment between the propagating acoustic wave and the receiving transducer direction, which may degrade the device performance. Moreover, the suspended structure itself can introduce more multi-reflections within the IDTs and between the etched transverse edges. FEA can be used to analyze the effects.

Figure 27A:
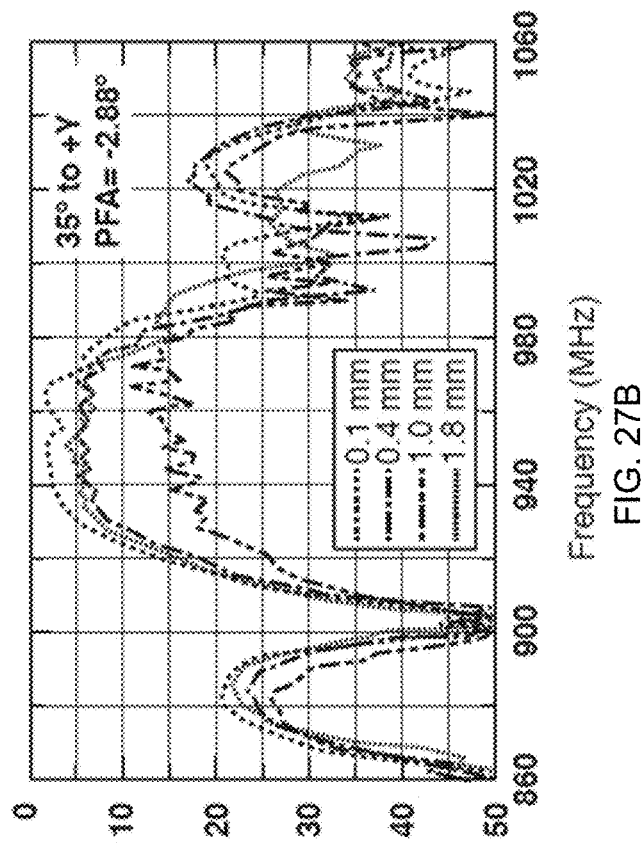
FIGS. 27A-27C are a set of graphs that illustrate simulated effects of a nonzero power flow angle (PFA) on ADL performance according to some embodiments.
Figure 27B:
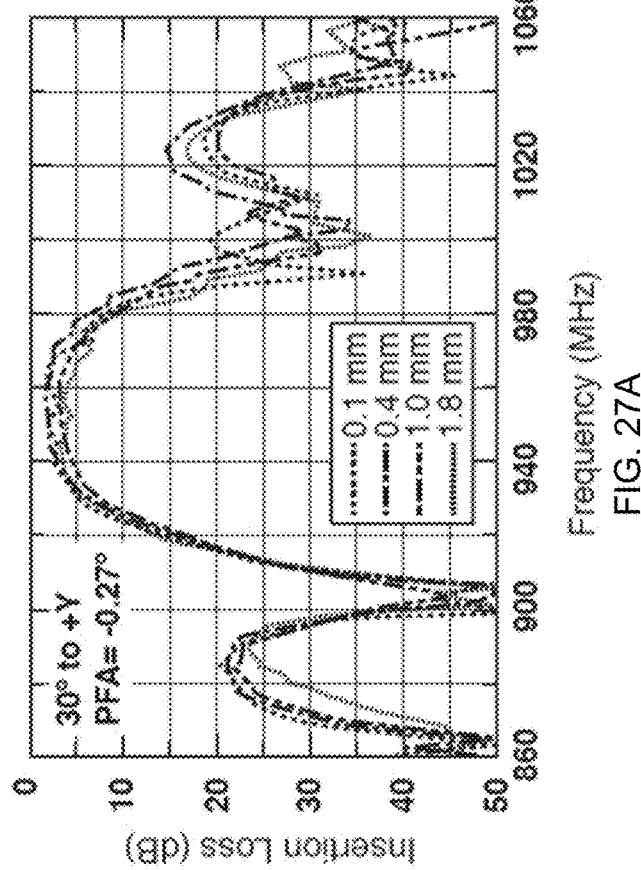
Figure 27C:
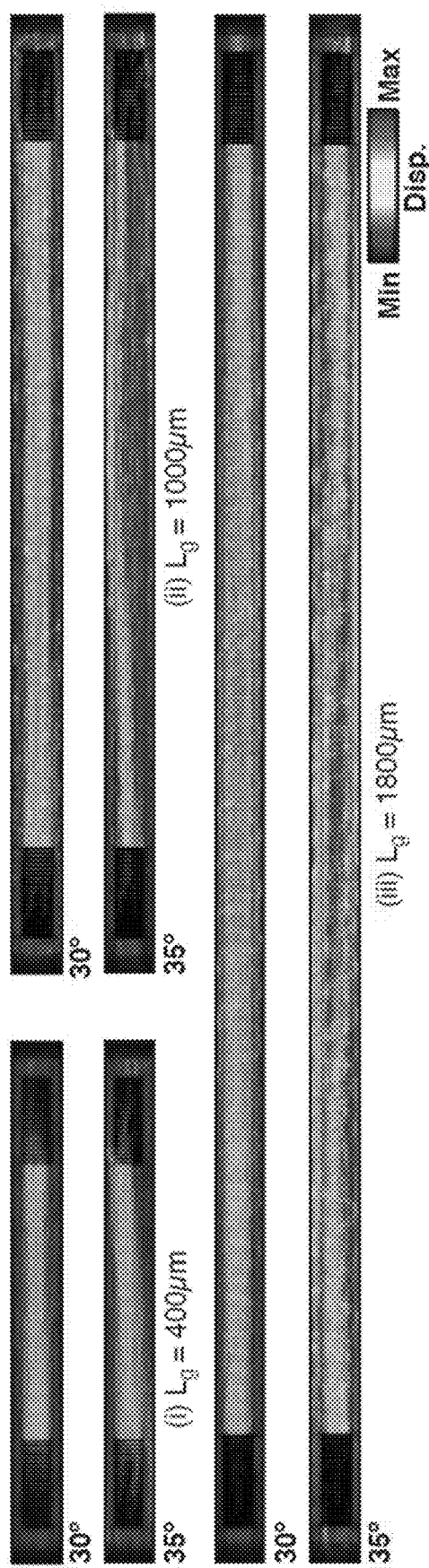

FIGS. 27A-27C are a set of graphs that illustrate simulated effects of a nonzero PFA on ADL performance according to some embodiments. The transmission coefficients (conjugately matched) for two groups of S0-mode ADLs with different in-plane device orientations at 30° to +y-axis with a PFA of −0.27° and 35° to +y-axis with a PFA of −2.88 are shown (e.g., FIG. 27A and FIG. 27B respectively). FIG. 27C shows displacement mode shapes for devices at different orientations and PFAs. A larger deviation from the zero PFA can lead to larger ILs for certain gap widths as the guided acoustic waves may miss the output transducers in their zig-zag paths.

To better illustrate the effects of a non-zero PFA, two groups of S0 ADLs with different in-plane orientations can be simulated with COMSOL FEA. In the 3D model, the total width of the ADL can be 86 μm. The aperture width, defined as the overlap length between the electrodes (e.g., see FIGS. 19A-19B), can be 50 μm. The other dimensions can be the same as those for the 2D simulation in reference to FIG. 23. The mechanical boundary conditions in the transverse direction are set to be free, while perfectly matched layers are used at the two ends in the longitudinal direction. For ADLs orientated 30 to the +y axis (e.g., FIG. 27A), the displacement mode shape shows that most of the power can still propagate toward the receiving transducer (e.g., see FIG. 27C) due to a small PFA of −0.27° at this orientation. In comparison to the results obtained from the 2D simulation (e.g., in reference to FIG. 23), the slight degradation of IL for longer ADLs can be due to the minor wave scattering into the bus line area where IDTs may not be present to effectively collect the power carried by the waves. In contrast to devices orientated 30° to the +y-axis, devices orientated 35° to the +y-axis (e.g., see FIG. 27B) may show a significant directional deviation in energy transportation as seen from the displacement mode shape (e.g., see FIG. 27C) to a larger PFA of −2.88°. The launched acoustic waves may therefore impinge upon the transverse free boundaries of the suspended thin film and follow a reflection-induced zig-zag path down the waveguide. Due to the existence of the transverse free boundaries, a longer ADL can potentially perform better than a shorter ADL, e.g., the 1.8-mm device in FIG. 27B, if the reflected waves coincidentally get collected by the output IDTs. Nonetheless, to avoid complications and attain low IL for different lengths, the ADLs should be aligned to the zero PFA orientation as close as possible. It is also noteworthy that the PFA issue can be potentially mitigated using slanted transducers.

In summary, the significantly improved FBW-IL trade space is theoretically shown in the new platform, and may promise superior gigahertz ADLs for SIC applications. Next, the design of S0 SPUDT is presented, with the two relevant parameters, namely, the number of cells and gap length, explored for determining the center frequency, IL, FBW, and delay of the ADLs. Potential challenges in scaling S0-mode ADLs to higher frequencies have been identified, and an approach considering both the targeting frequencies and fabrication process has been developed.

Figure 28:
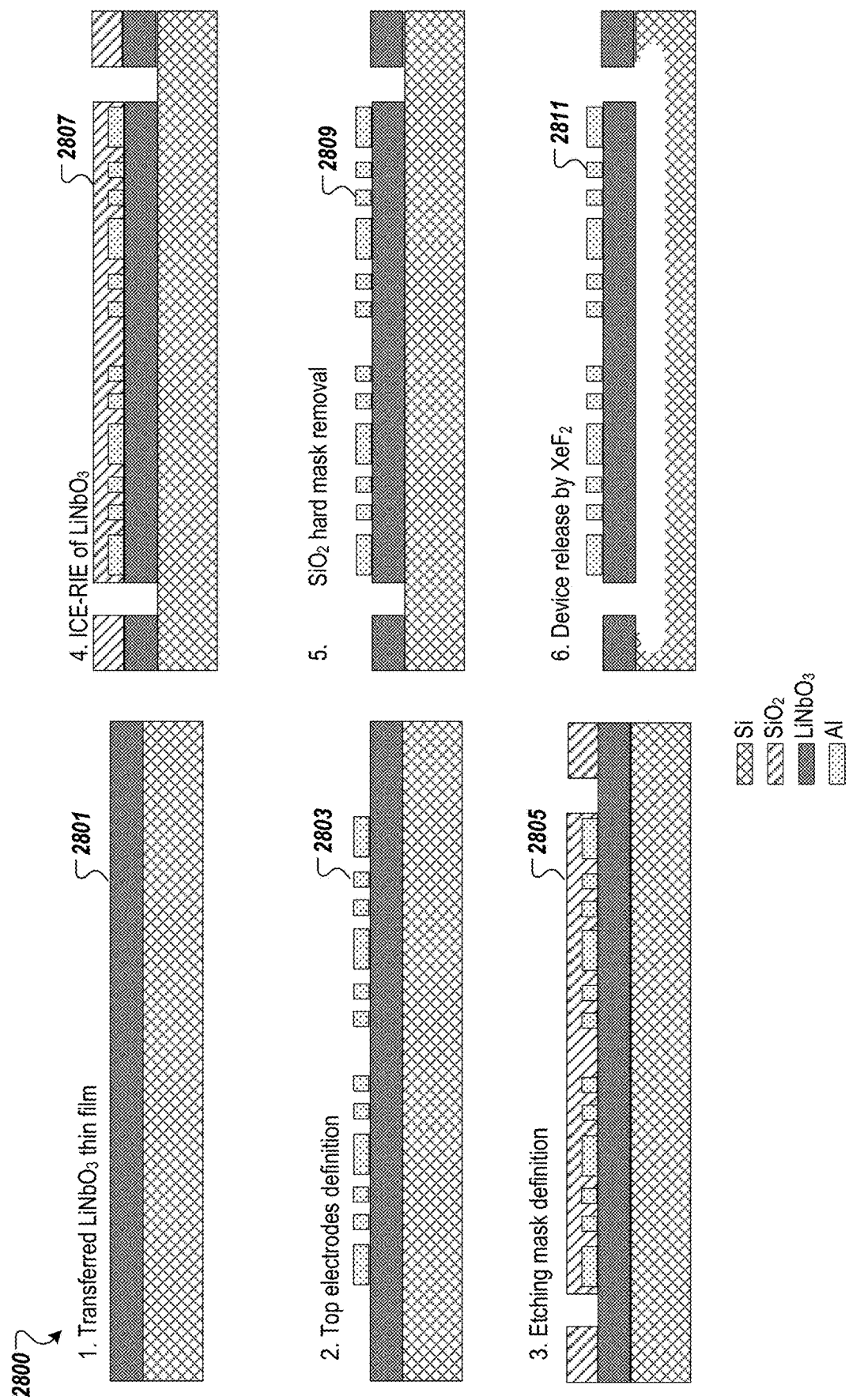
FIG. 28 is a flowchart of a method of fabricating a gigahertz S0-mode ADL according to one embodiment.

FIG. 28 is a flowchart of a method 2800 of fabricating a gigahertz S0-mode ADL according to one embodiment. The ADL can be fabricated with the method 2800. An X-cut or Y-cut $LiNbO_3$ thin film of 800 nm on a 4 inch Si wafer can be provided by NGK Insulators, Ltd., for this fabrication process. First, the electrodes can be defined with e-beam lithography to create feature sizes as small as 400 nm (step 2801). Then, 135 nm-thick aluminum electrodes can be patterned using sputtering and lift off (step 2803). Aluminum can be chosen for its good conductivity for lowering the electrical loss and also its compatibility with the following steps. The thickness of the electrodes can be chosen within the limit of an e-beam photoresist-based lift-off process. Next, a 2-μm $SiO_2$ layer can be deposited using plasma-enhanced chemical vapor deposition (PECVD) and patterned with fluorine-based reactive ion etching (RIE) (step 2805). The release windows in the $LiNbO_3$ film can be subsequently etched using chlorine-based inductive coupled plasma (ICP-RIE) (step 2807). The remaining $SiO_2$ can then be removed with low-power ICP (step 2809). Finally, the ADLs can be released with isotropic $XeF_2$ etching (step 2811). In this process, the diced sample can have a side aligned with the +y-axis of the $LiNbO_3$ material. The ADL orientation is preset in the lithography mask with each ADL tilted 30° with respect to the reference +y-axis on the mask. In the implementation, the reference axis on the mask may be aligned to the side of the sample that was aligned with the +y-axis of the $LiNbO_3$ crystal.

FIGS. 29A-29F are optical microscope images of fabricated ADLs according to some embodiments. FIG. 29A shows zoomed-out view, FIG. 29B shows the transducer, and FIG. 29C shows zoomed-in views of the longest fabricated device with a 6.4 mm gap. FIG. 29D shows a shorter device with a 0.2-mm gap. FIG. 29E shows a five-cell SPUDT test device for validating the effects of cell numbers. FIG. 29F shows a test structure for identifying the PL in a metalized $LiNbO_3$ thin film. Some relevant parameters are shown in Table 2 below.

listed in Table 2. Groups A and B are used for validating the relevant design parameters (number of cells and gap length) for determining the IL, FBW, and group delay. Group C is used to demonstrate scaling of lower frequency ADLs to the gigahertz frequency range. Groups D, E, and F are used to identify the PL of S0 mode at different conditions, which cannot be directly obtained by FEA.

Figure 30A:
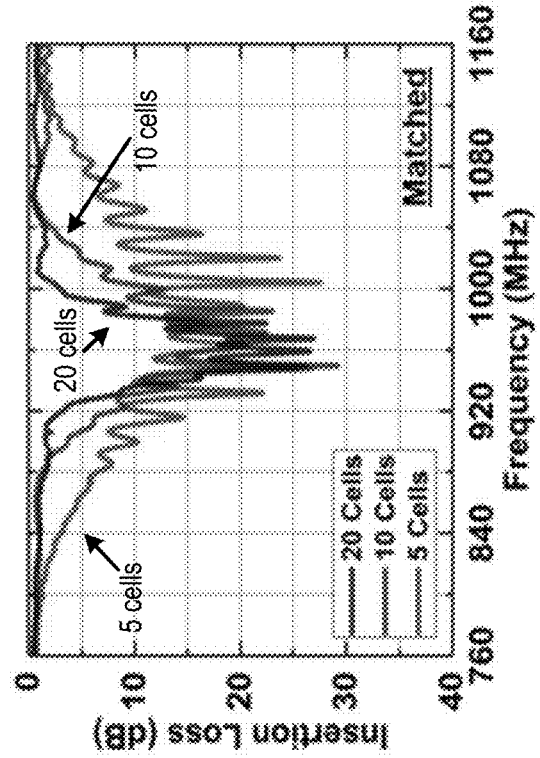
FIGS. 30A-30D are a set of graphs that illustrate the measured performance of the gigahertz S0 ADLs with the same 64-μm cell length, the same gap length of 0.2 mm, but different numbers of SPUDT cells (5-20) according to one embodiment.
Figure 30B:
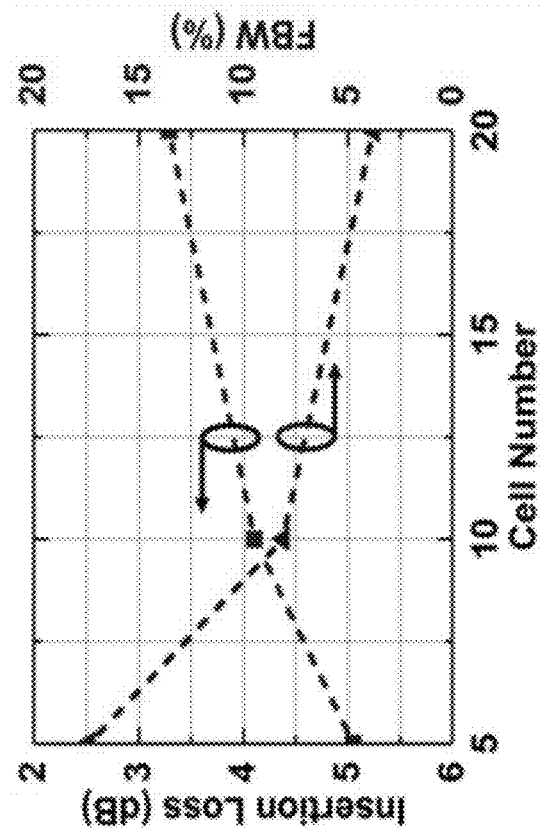
Figure 30C:
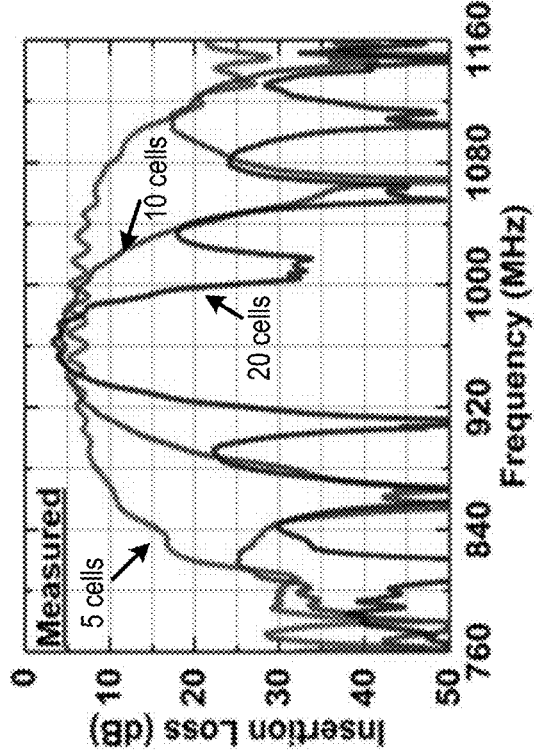
Figure 30D:
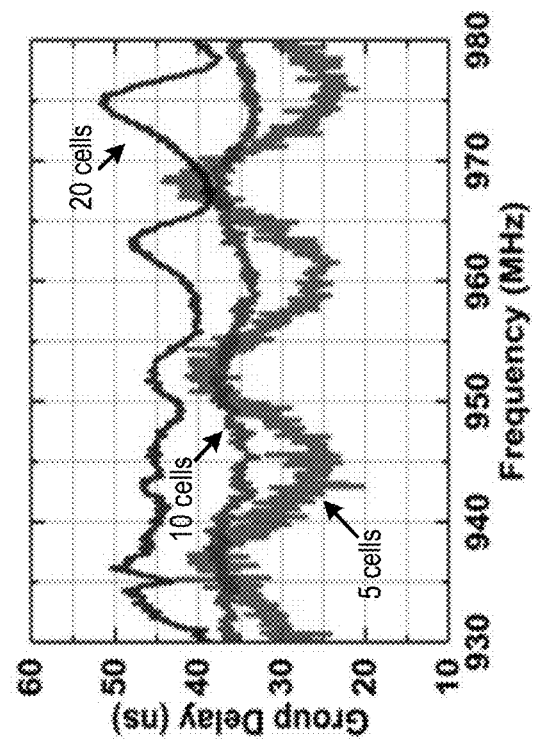

FIGS. 30A-30D are a set of graphs that illustrate the measured performance of the gigahertz S0 ADLs with the same 64-μm cell length, the same gap length of 0.2 mm, but different numbers of SPUDT cells (5-20) according to some embodiments. The fabricated ADLs can be measured with a vector network analyzer (VNA) at a power level of −10 dBm in dry air, and then conjugately matched in a Keysight Advanced Design System. The ADLs in Group A are designed to investigate the impact of the number of cells on the IL-FBW tradeoff. ADLs with the same cell length of 6.4 μm and the same gap length of 0.2 mm, but different numbers of SPUDT cells of 5, 10, and 20 can be fabricated. The measured IL and RL are shown in FIG. 30A and FIG. 30B, respectively, with the ports conjugately matched. For an ADL with 20 cells, an IL of 3.2 dB and a 3 dB FBW of 3.8% can be obtained, while for an ADL with five cells, an IL of 5.0 dB and an FBW of 17.4% are shown. The tradeoff between IL and FBW for S0-mode ADLs is shown in FIG. 30D. Compared to the simulated results in FIG. 22E, a slight

TABLE 2

| Symbol | Parameter | Value | Symbol | Parameter | Value |
| --- | --- | --- | --- | --- | --- |
| λ | Cell length (μm) | 3.2-6.8 | $L_g$ | Gap length (mm) | 0.1-6.4 |
| $R_e$ | Electrode ratio | 0.125 | $W_a$ | Aperture width (μm) | 50 |
| $R_r$ | Reflector ratio | 0.375 | $W_d$ | Device width (μm) | 86 |
| N | Number of cells | 5-20 | $T_{Al}$ | Aluminum thickness (nm) | 130 |
| $L_t$ | Transducer length (μm) | 64-136 | $T_{LN}$ | LiNbO3 thickness (nm) | 800 |

The optical images of the fabricated ADLs are shown in FIGS. 29A-29F with the parameters marked in the figures. The longest fabricated ADL has a high aspect ratio (e.g., total length/aperture width) of 128 and shows no visible warping under a microscope, e.g., FIG. 29A, demonstrating adequate stress management in the fabrication. The SPUDT electrodes can be also defined with high fidelity in width and are highly uniform across cells e.g., see FIG. 29B and FIG. 29C. Three relevant parameters of the ADL designs (number of cells, gap length, and cell length) can be investigated individually. The number of cells can vary from 5 to 20, e.g., see FIG. 29E. The gap length can vary between 0.1 and 6.4 mm, e.g., see FIG. 29D, which can provide delays ranging from 20 to 900 ns. The cell length can vary from 6.8 to 3.2 μm, covering center frequencies from 900 MHz to 2 GHz. Some test ADLs can also be fabricated to investigate the PL of the metalized $LiNbO_3$ thin film. Most of the fabricated ADLs exhibit flat surfaces and well-defined electrodes from optical inspection and perform as anticipated. The orientation of the fabricated ADLs can be optically identified to be 30.8° to the +y-axis. A slight deviation from 30° to the +y-axis may be caused by a slight misalignment in the fabrication.

To fully break down the IL, attain empirical data on the PL of S0, and ultimately validate the simulated performance limits of ADLs as described above, different groups of devices can be fabricated. A summary of the fabricated ADLs is shown in groups from A to F in Table 2. For easy references and comparisons, the figures showing the simulation and measurement results of these groups are also degradation in IL can be observed. The IL-FBW may still be dramatically improved from SAW ADLs, allowing access to the previously forbidden design space for low-loss wideband ADLs and the SIC applications. The measured group delays are shown in FIG. 30C. Delays from 25 to 45 ns are obtained, with longer delays which are induced by longer transducers with a larger number of cells. The frequency spacing between adjacent ripples may be inversely proportional to the group delay, as expected in FIG. 22. The larger ripples in both the amplitude and the group delay of the ADLs with fewer cells may be caused by insufficient suppression of triple travel signals (TTSs) from the lower unidirectionality in the transducers.

FIGS. 31A-31D are a set of graphs that illustrate measured S-parameters of the fabricated ADLs (N=20, λ=6.4 μm) with identical transducers but different $L_g$ (0.2-6.4 mm) according to some embodiments. The ADLs in Group B are designed to investigate the effects of longer gap lengths. The ADLs in group B can include ADLs with identical transducers (λ=6.4 μm) but different gap lengths (0.2-6.4 mm). The performance shows an FBW of 4% and a minimum IL of 3.2 dB, e.g., see FIG. 31A and FIG. 31B. Group delays between 40 and 900 ns can be obtained for different gaps, e.g., see FIG. 31C. The small ripples in the IL and the group delays may be caused by the finite directionality of the IDTs and the slight resonant nature of the SPUDT. The finite directionality can be improved by enhancing the reflectivity per transducer unit cell and achieving a further reduced TTS between the transducers. The slight resonant nature of the SPUDT can be mitigated using the optimization approaches developed for SAW SPUDT devices namely, optimizing the reflection and transduction functions simultaneously across the transducer.

Figure 31A:
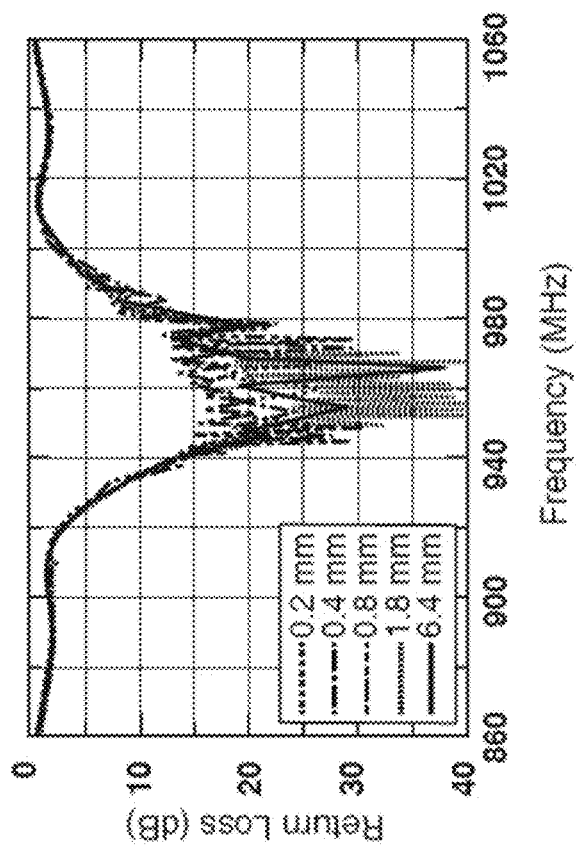
FIGS. 31A-31D are a set of graphs that illustrate measured S-parameters of the fabricated ADLs (N=20, λ=6.4 μm) with identical transducers but different $L_g$ (0.2-6.4 mm) according to some embodiments.
Figure 31B:
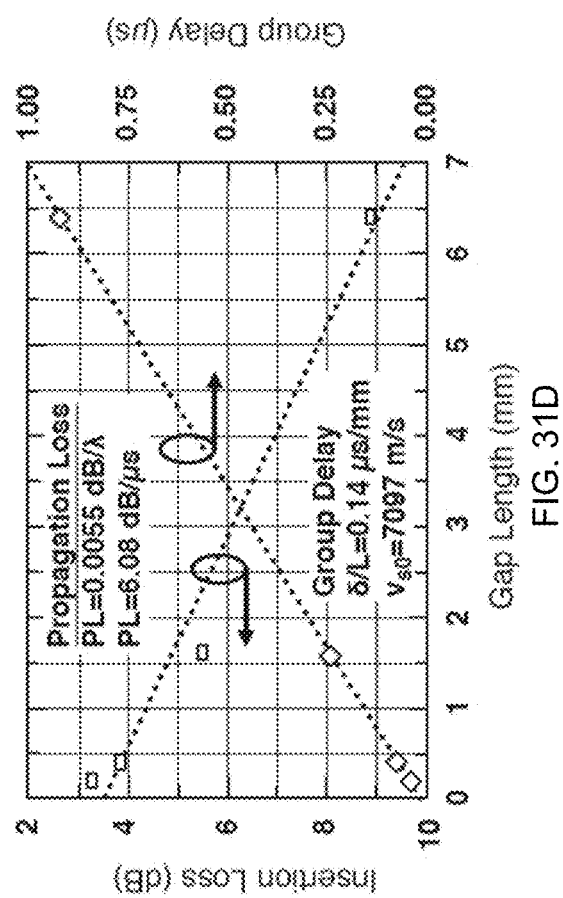
Figure 31C:
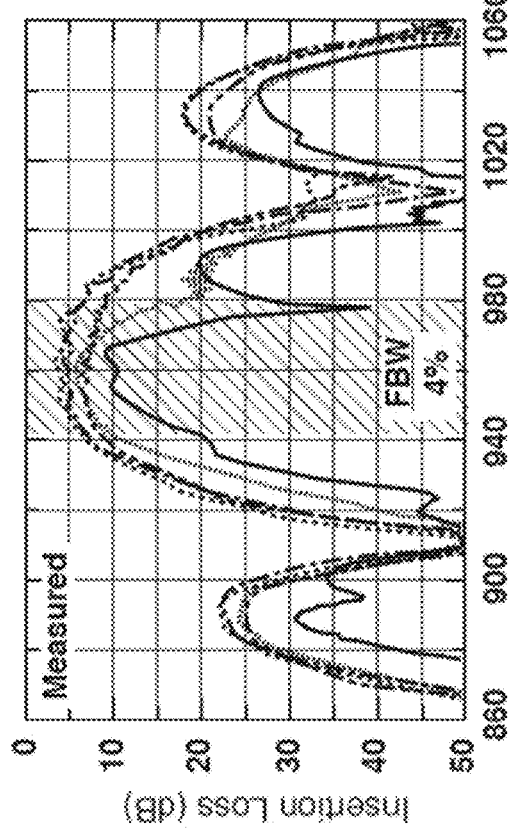
Figure 31D:
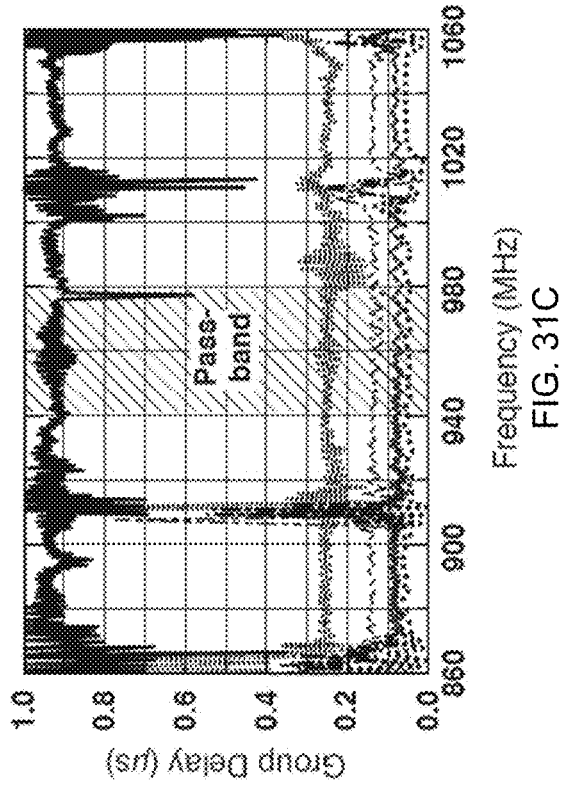

The IL of ADLs with different lengths can be further analyzed. Naturally, the IL can increase for longer delays, which is commensurate with the more damped signals reflected from a further distance in the SIC scheme. FIG. 31D shows the extracted PL in the dry air ambiance and phase velocity is 6.08 dB/μs and 7097 m/s. It should be noted that the PL extracted here may be a conservative estimation, because longer devices with a high aspect ratio over 128 may suffer from the non-zero PFA issue (even for a small PFA). The etched transverse free boundaries can help to confine the energy in the propagation path.

Figure 32A:
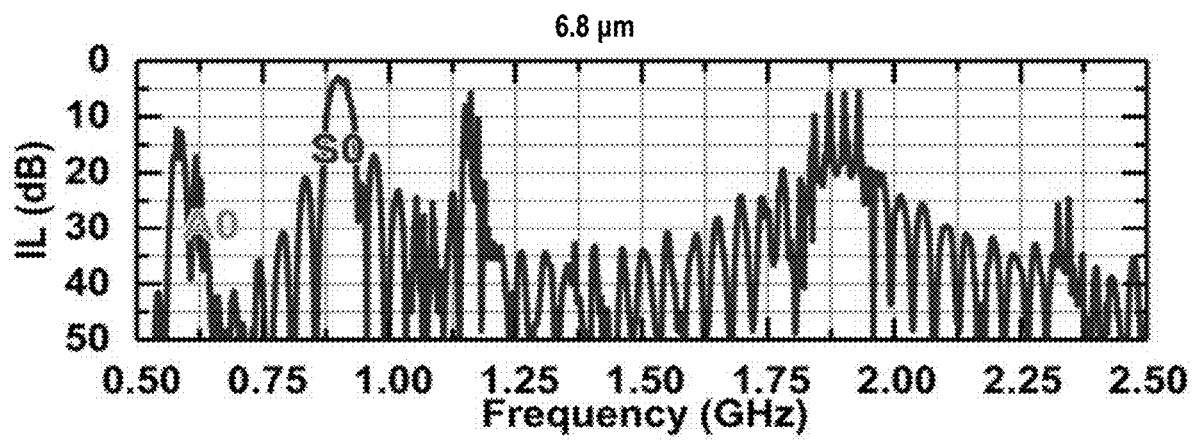
FIGS. 32A-32C are a set of graphs that illustrate measured performance of the gigahertz S0 ADLs with different center frequencies according to some embodiments.
Figure 32B:
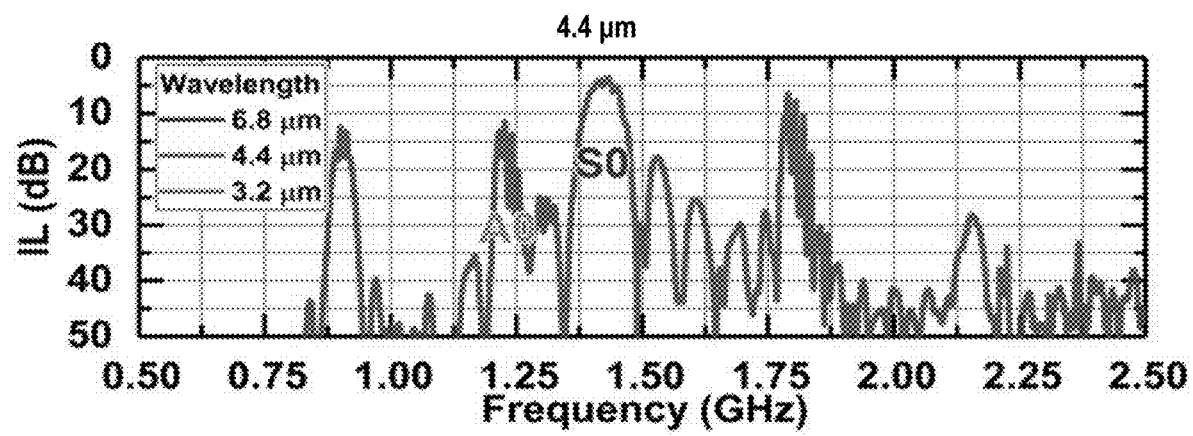
Figure 32C:
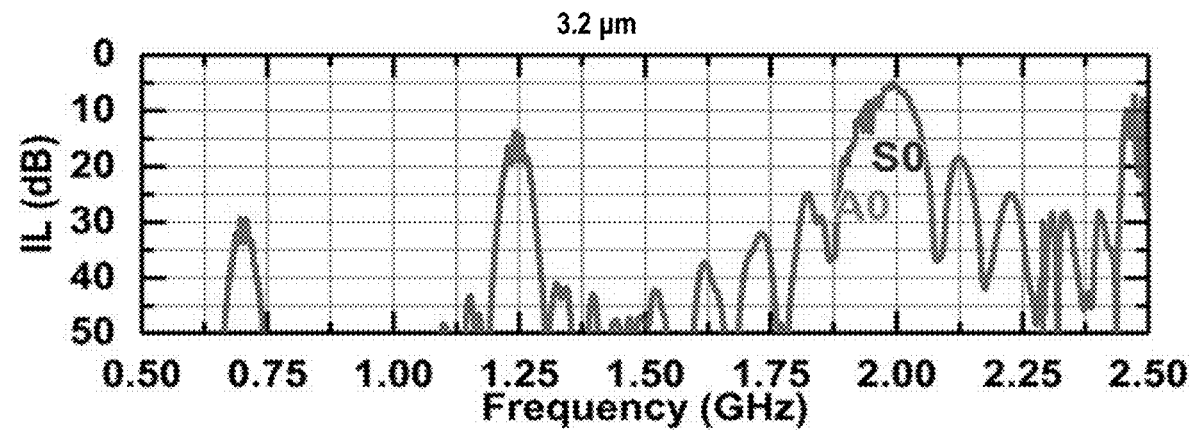

FIGS. 32A-32C are a set of graphs that illustrate measured performance of the gigahertz S0 ADLs with different center frequencies according to some embodiments. The ADLs have the same number of SPUDT cells of 20, the same gap length of 0.1 mm, but different cell lengths, corresponding to 6.8 μm in FIG. 32A, 4.4 μm in FIG. 32B, and 3.2 μm in FIG. 32C.

FIGS. 33A-33C are a set of graphs that illustrate measured S-parameters of the ADLs (N=20, $L_g$=0.1 mm) with identical gap lengths but different λ (3.2-6.8 μm) or center frequencies according to some embodiments. The Group C ADLs can have the same gap length of 0.1 mm but different transducers (λ=3.2-6.8 μm). The wideband measurement results are shown in the graph of FIGS. 32A-32C. The transmission at higher frequencies has the same or similar trend regarding S0 and A0 modes as predicted by the simulation (e.g., see FIG. 24). For an 800 nm-thick 20-cell LiNbO$_3$ ADL, the S0 passband can show good performance up to 2 GHz. Various transducer wavelengths can result in passbands ranging from 0.8 to 2 GHz with FBWs around 4% (e.g., FIG. 33A and FIG. 33B). An IL of 3.0 dB can be achieved for the 900 MHz ADL, while an IL of 5.2 dB can be attained for the 2 GHz ADL. The slightly larger IL for higher frequency ADLs can be caused by the larger electrical length for a given $L_g$ at a higher frequency and the constant PL/λ can be empirically observed over the said frequency range. As shown in FIG. 33C, a delay as low as 20 ns can be demonstrated over the 0.8-2 GHz range. The slight ripples in the group delay may be caused by the multi-reflections in SPUDTs.

FIGS. 34A-34D are a set of graphs that illustrate extracted propagation parameters of the gigahertz S0 mode acoustic waves according to some embodiments. The propagation characteristics of S0 waves in LiNbO$_3$ thin film can be further investigated. The devices with different cell lengths can be fabricated and measured (Group D in Table 3), shown below.

TABLE 3

KEY PARAMETERS OF THE FABRICATED DEVICES

| Index | Cell Length (μm) | Gap Length (mm) | No. of Cells | Sim. (FIG.) | Meas. (FIG.) | Comments |
|---|---|---|---|---|---|---|
| Group A | 6.4 | 0.2 | 5-2 | 5 | 13 | No. of cells |
| Group B | 6.4 | 0.2-6.4 | 20 | 6 | 14 | Gap length |
| Group C | 3.2-6.8 | 0.1 | 20 | 7 | 15-16 | Cell length |
| Group D | 3.2-6.4 | 0.1-6.4 | 20 | — | 17 | PL at different frequencies |

TABLE 3-continued

KEY PARAMETERS OF THE FABRICATED DEVICES

| Index | Cell Length (μm) | Gap Length (mm) | No. of Cells | Sim. (FIG.) | Meas. (FIG.) | Comments |
|---|---|---|---|---|---|---|
| Group E | 5.2 | 0.1-1.6 | 20 | — | 18 | PL in metalized thin film |
| Group F | 6.4 | 0.2-6.4 | 20 | — | 19 | TCF, PL in vacuum |

The phase velocity $v_o$ and PL can be extracted from devices with different gap lengths. The extracted $v_o$ is shown in FIG. 34A with a constant value of approximately 7000 m/s over the 1-2 GHz range in the 800 nm thin film. The PL at different frequencies is shown in FIG. 34B and FIG. 34C using three metrics, including PL per unit distance, PL per wavelength, and PL per unit time. Due to the non-zero PFA, the PL extracted here may be a conservative estimation. The longer ADLs in this group may suffer additional IL due to the transverse propagation of S0 waves (e.g., see FIG. 27). Therefore, the PL extracted here may be worse than the real cases. An increase of PL can be observed at higher frequencies.

Figure 35A:
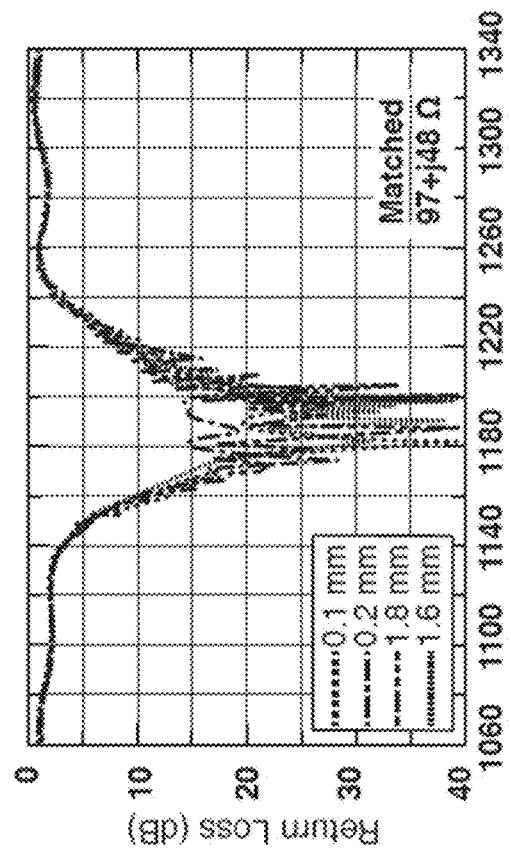
FIGS. 35A-35D are a set of graphs that illustrate measured S-parameters of the ADLs (N=20, λ=5.2 μm) with identical transducers but different gap lengths $L_g$ (0.1-1.6 mm) covered with 135 nm of aluminum (Al) according to some embodiments.
Figure 35B:
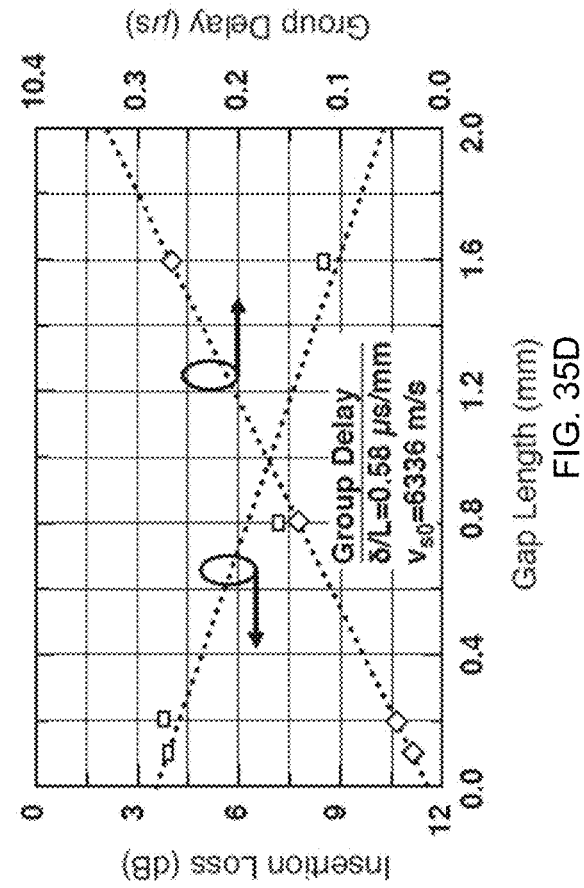
Figure 35C:
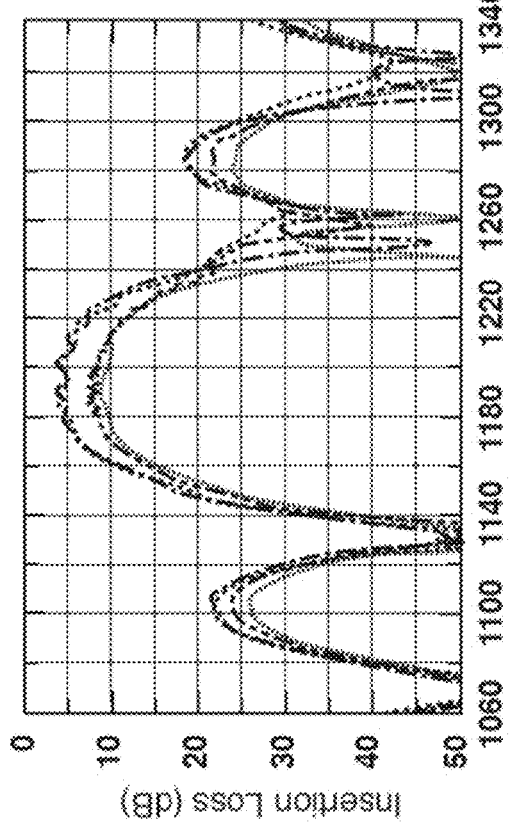
Figure 35D:
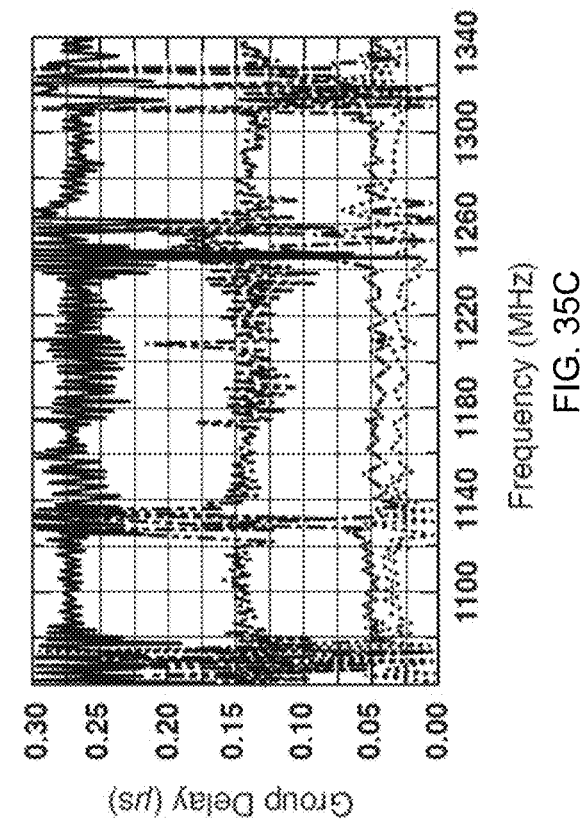

FIGS. 35A-35D are a set of graphs that illustrate measured S-parameters of the ADLs (N=20, λ=5.2 μm) with identical transducers but different gap lengths $L_g$ (0.1-1.6 mm) covered with 135 nm of Al according to some embodiments. The propagation characteristics of S0 waves in LiNbO$_3$ thin film ADLs with the metalized surface can be extracted for understanding the PL in the transducer cells where the metalized thin film might be the main damping contributor. The S-parameters for a group of ADLs (Group E) centered at 1185 MHz can measured, e.g., see FIG. 35A, FIG. 35B, and FIG. 35C. The extracted relevant parameters are shown in FIG. 35D. Due to the piezoelectric softening effect, the phase velocity may be lower than that measured in an electrically open piezoelectric thin film. The measured $v_s$ is 6336 m/s. The extracted PL is 0.0017 dB/Å, or 21.2 dB/μs, which may be much larger than the values in the electrically open thin film. Such a result implies that the metalized area may be a main contributor of the IL in the transducer sections of the ADLs.

Figures 36A, 36B:
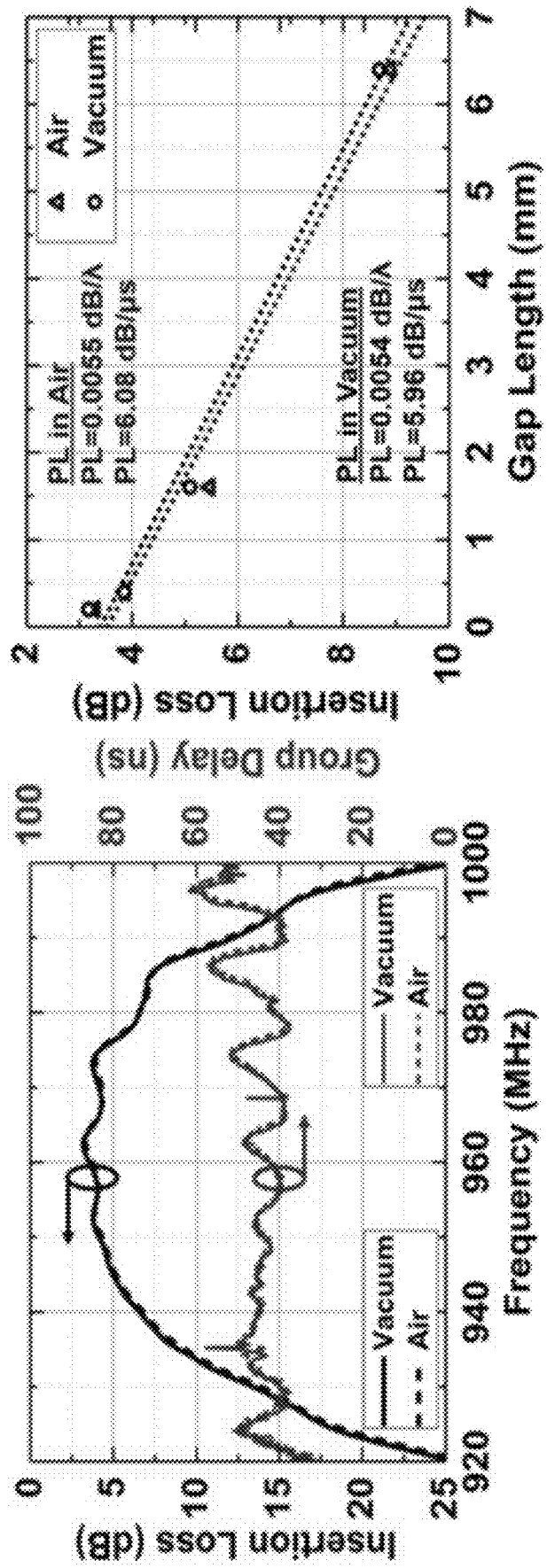
FIGS. 36A-36B are a set of graphs that illustrate a comparison of the measured IL and group delays of the S0-mode ADLs in vacuum and in air according to some embodiments.

FIGS. 36A-36B are a set of graphs that illustrate a comparison of the measured IL and group delays of the S0-mode ADLs in vacuum and in air according to some embodiments. FIG. 35A shows the IL and group delay of an ADL (N=20, λ=6.4 μm $L_g$=0.2 mm) measured in vacuum and air. FIG. 36B shows the PL in vacuum and air extracted from a group of (N=20, λ=6.4 μm $L_g$=0.2-6.4 mm, Group F in Table 3). The devices in Group F can be measured in vacuum for testing the effects of vacuum ambiance on the ADL performance. The results are presented FIG. 36A for an ADL and compared to the (N=20, λ=6.4 μm $L_g$=0.2 mm, of FIG. 29D). The different measurement environment brings little difference to the performance. The PL of these ADLs measured in air and vacuum is then compared in FIG. 36B. The PL may slightly drop from 6.08 to 5.96 dB/μs. Therefore, it can be found that the air damping may not be the main loss in ADLs.

Figure 37A:
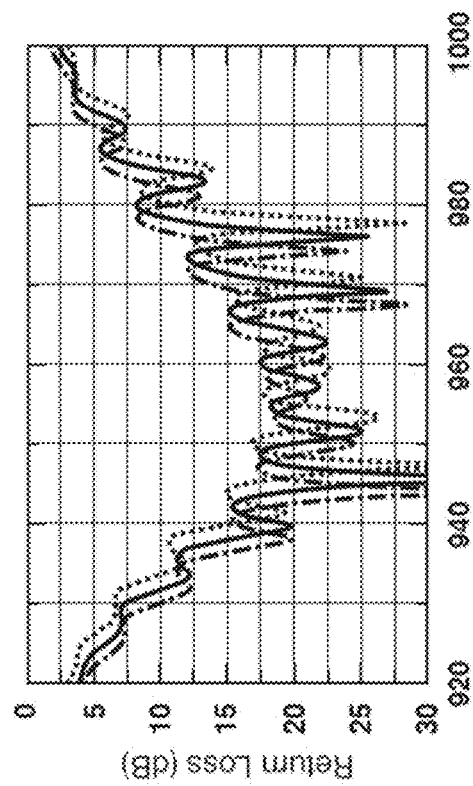
FIGS. 37A-37D are a set of graphs that illustrate measured temperature dependence of an ADL (N=20, λ=6.4 μm, $L_g$=0.2 mm) in vacuum according to some embodiments.
Figure 37B:
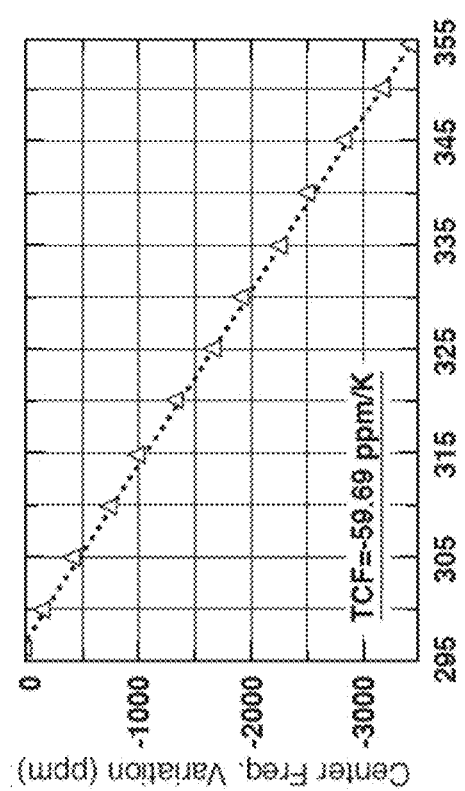
Figure 37C:
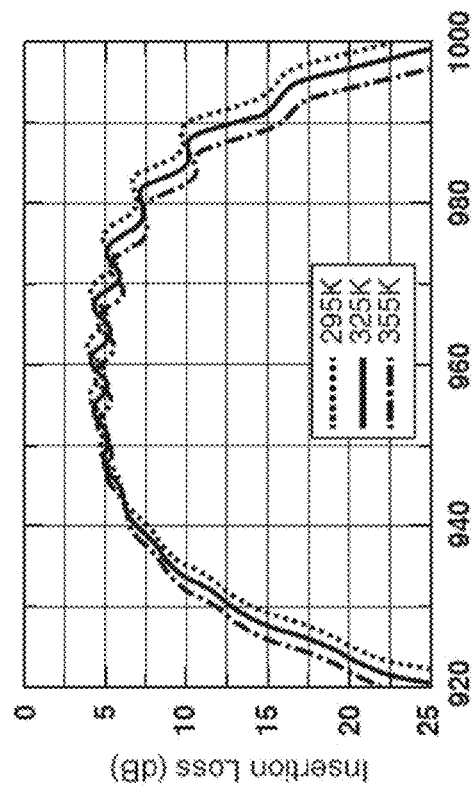
Figure 37D:
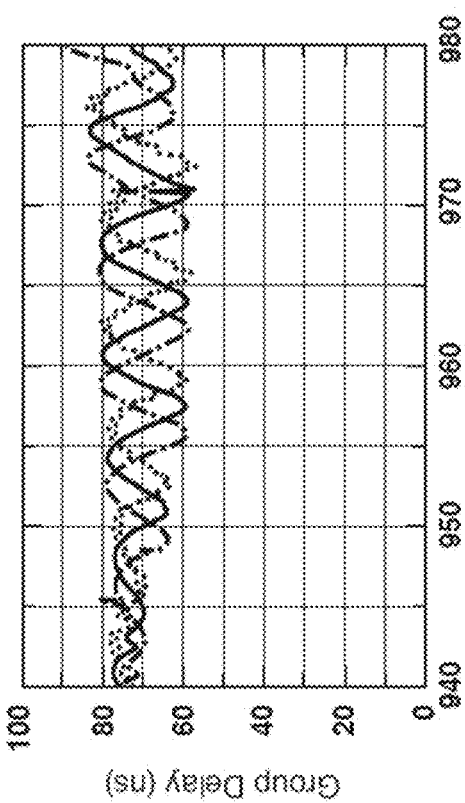

FIGS. 37A-37D are a set of graphs that illustrate measured temperature dependence of an ADL (N=20, λ=6.4 μm $L_g$=0.2 mm) in vacuum according to some embodiments. Temperature dependence may be another factor in SIC applications for covering the entire operating temperature range of the front-end modules. Therefore, one ADL in Group F can be measured at different temperatures, ranging from 295 to 355 K. The conjugately matched results are shown in FIG. 37A, FIG. 37B, and FIG. 37C, with both the transmission, reflection, and group delay plotted. The passband can drift to lower frequencies due to the negative temperature coefficient of stiffness of the LiNbO$_3$ film. The temperature coefficient of the center frequency (TCF) is plotted in FIG. 37D, showing a TCF around-59.69 ppm/K. The result shows good linearity over the measured frequency range. The TCF is close to the previously reported TCF in S0-mode X-cut or Y-cut LiNbO$_3$. The temperature coefficient of delay may be challenging to extract accurately due to the existence of ripples in the group delay measurements.

Based on the FEA simulation that has been validated by measurements and the experimental extracted results, the IL of the gigahertz S0 ADLs can be broken down for identifying the space for future improvement (Table 4).

TABLE 4

EXAMPLES OF IL BREAKDOWN

| Damping Source | 0.2 mm ADL IL | 6.4 mm ADL IL |
| --- | --- | --- |
| Finite Uni-directionality | 1.3 dB | 1.3 dB |
| PL in Transducers | 0.25 dB | 0.25 dB |
| PL in Waveguide | 0.17 dB | 5.5 dB |
| Others (Including Electrical Loading & Non-zero PFA) | 1.4 dB | 1.85 dB |
| Total | 3.2 dB | 8.9 dB |

A pair of ADLs in Group A can be studied as examples, one with a 0.2 mm gap length (e.g., FIG. 29D) and the other one with a 6.4 mm gap length (e.g., FIG. 29A). For the 0.2 mm ADL, the first damping contributor may be the finite unidirectionality in the transducers. Based on the FEA of a lossless structure (e.g., FIG. 22), 1.3 dB may be from such an effect. The second damping source may be the PL in the transducers, which can be calculated from the extrapolated delay in the transducers and the PL in LiNbO$_3$ thin-film sections with and without electrodes. A total of 0.25 dB may be due to the PL in the transducers. The third damping term may be the PL in the waveguide between the transducers. For the 0.2 mm ADL, the loss is 0.17 dB. Finally, the last 1.4 dB IL may be collectively caused by the electrical loading of the IDTs and the non-zero PFA. Similarly, the IL breakdown of the 6.4 mm ADL is shown in the Table 4, with the PL in the waveguide which may be the main loss contributor.

In summary, low-loss wideband gigahertz S0-mode ADLs may offer a significantly improved FBW-IL tradeoff for an S0-mode ADL. The design parameters of S0-mode ADLs, including cell number, gap length, and cell length, have been investigated through simulation. The fabricated miniature ADLs show an FBW of 4% and a minimum IL of 3.2 dB at a center frequency of 0.96 GHz. Various delays ranging from 20 to 900 ns can be obtained for digitally addressable delay synthesis. Multiple ADLs with center frequencies from 0.9 to 2 GHz can be fabricated. The PL of the S0 mode in the gigahertz frequency range can also be experimentally measured, showing a PL of 6.08 db/µs at 0.96 GHz or 0.0055 db/). (dB per wavelength). The PL at different frequencies, measured conditions, and electrical boundary conditions can be experimentally extracted. The demonstrated ADLs can provide wide-range and high-resolution reconfigurable delays for future SIC applications.

SH0-Mode Lithium Niobate Acoustic Delay Lines

The emerging enhanced mobile broadband (eMBB) applications for fifth-generation (5G) communication may require unprecedented signal processing capabilities. Acoustic devices, in which RF signals may be converted into and processed in the acoustic domain before the conversion back to the electromagnetic (EM) domain, can be great candidates for providing low-loss wideband signal processing capabilities for at least three potential advantages. First, acoustic devices are small because of their significantly shorter wavelength ($\lambda$) compared to their EM counterparts, and therefore may be suitable for handheld and mobile applications. Second, various signal processing functions can be passively implemented by designing a transfer function of transducers and waveguides. Thus, acoustic devices do not compete with the power-hungry analog-to-digital converters (ADC) and digital signal processors (DSP) in the follow-on stages for the power budget. Third, recent demonstrations of low-loss and high electromechanical coupling ($k^2$) piezoelectric platforms can allow for low loss over a wide bandwidth (BW), thus potentially overcoming the high loss and narrow bandwidth bottleneck that has currently precluded acoustic signal processing from eMBB applications.

For some RF acoustic devices, acoustic delay lines (ADLs) can be used for a wide range of applications, including transversal filters, correlators, time-domain equalizers, oscillators, sensors, and time-varying non-reciprocal systems. In some embodiments, ADLs can be built based on surface acoustic wave (SAW) platforms. The performance of SAW ADLs, namely the substantial insertion loss (IL) and the narrow fractional bandwidth (FBW), may be fundamentally curbed by the moderate $k^2$ and achievable reflectivity of the transducers, even in designs targeting low loss such as single-phase unidirectional transducers (SPUDTs). In other embodiments, ADLs can be based on longitudinal modes in lithium niobate (LiNbO$_3$) thin films. Such ADLs can be implemented to support fundamental shear-horizontal (SH0) modes or fundamental symmetrical (S0) modes, and may show a significantly improved IL-FBW design space. The enhanced performance may be collectively enabled by large $k^2$ (e.g., up to 40%), the notable reflectivity in the embedded reflectors, and the low propagation loss (PL) in single-crystal quality LiNbO$_3$ thin films.

It can be challenging to achieve broadband performance with some ADLs for at least two reasons. First, although a large FBW can be obtained, the absolute BW of the demonstrations may be limited because of their low center frequencies below 500 MHz. Second, the FBW of the high-frequency S0 mode demonstrations may also be limited by their adjacent modes that can cause the overlap of passbands. Therefore, to achieve broadband ADLs, it may be necessary to first identify a suitable acoustic mode with large $k^2$, low loss, sufficient spectral clearance to adjacent modes, and scale to the GHz frequency range. Among various candidates, the SH0 mode in X-cut LiNbO$_3$ is promising. Some SH0 ADLs can have high $k^2$ and low loss at lower frequencies. Moreover, high-frequency SH0-mode acoustic devices can have a sparse mode-space. However, due to the highly dispersive characteristics of the mechanical modes in thin-film LiNbO$_3$, it can be non-trivial to scale up the operating frequency.

In some embodiments, the SH0-mode ADLs show 3 dB FBW may range from 4% to 34.3%, and IL between 3.4 and 11.3 dB. Multiple ADLs can have center frequencies from 0.7 GHz to 1.2 GHz. The PL of an SH0-mode ADL at 1.08 GHz can be extracted as 0.0182 dB per wavelength (dB/λ), and the phase velocity is 4255 m/s. The SH0-mode ADLs can potentially facilitate broadband applications at the GHz range.

Figure 38A:
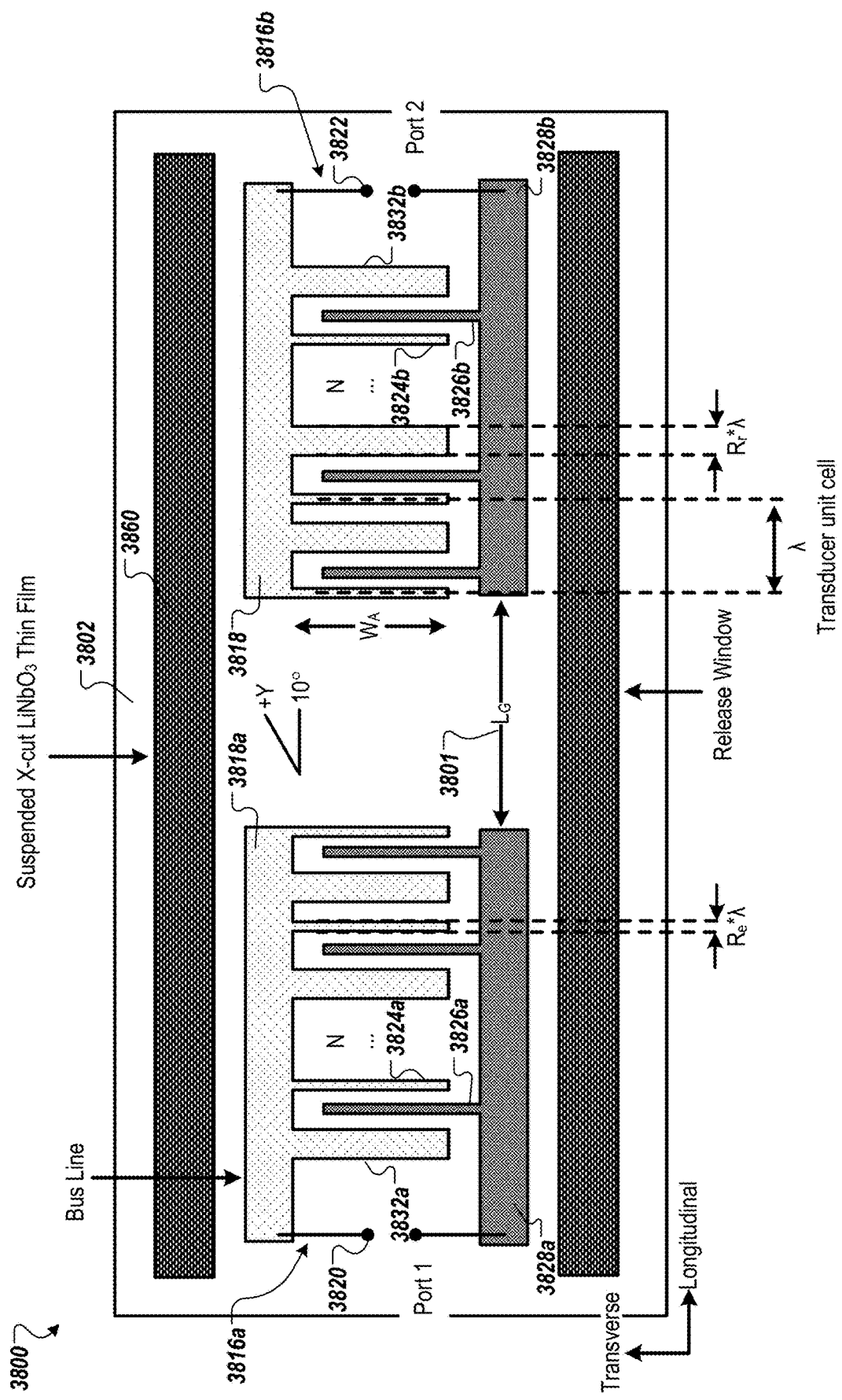
FIG. 38A is a schematic of a fundamental shear-horizontal (SH0) mode ADL according to one embodiment.

FIG. 38A is a schematic of an SH0 mode ADL 3800 according to one embodiment. The SH0-mode ADL can have a pair of single-phase unidirectional transducers (SPUDTs) 3816a and 3816b according to one embodiment. The SH0-ADL can include a piezoelectric thin film 3802 located above a carrier substrate. The piezoelectric thin film 3802 can be an X-cut or Y-cut LiNbO$_3$ thin film adapted to propagate an acoustic wave within the piezoelectric thin film in at least one of a fundamental symmetrical (S0) mode, a first-order symmetrical (S1) mode, a fundamental shear-horizontal (SH0) mode, or a first-order antisymmetric (A1) mode excited by an electric field oriented in a longitudinal direction along a length of the piezoelectric thin film; or a first-order antisymmetric (A1) mode or a first-order shear-horizontal (SH1) mode excited by the electric field oriented at least partially in a thickness direction (e.g., mutually perpendicular to the longitudinal and transverse directions indicated in 3800) of the piezoelectric thin film 3802.

In some further embodiments, the Y-cut LiNbO$_3$ thin film includes one of a 128Y-cut, 54Y-cut, or 36Y-cut LiNbO$_3$ thin film and the second mode includes one of a first-order symmetric (S1) mode. In some cases, the rotated Y cuts can also additionally propagate the acoustic wave in at least one of the first modes (S0, S1, SH0, and A1) excited by the electric field oriented in the longitudinal direction or one of the second modes (A1 and SH1) excited by the electric field oriented at least partially in the thickness direction. In various embodiments, a first interdigitated transducer (IDT) 3816a be disposed on a first end of the piezoelectric thin film 3802. The first IDT 3816a can convert a first electromagnetic signal, traveling in the longitudinal direction, into the acoustic wave. A second IDT 3816b can be disposed on a second end of the piezoelectric thin film with a gap 3810 (L$_g$) between the second IDT 3816b and the first IDT 3816a. The second IDT 3816b can convert the acoustic wave into a second electromagnetic signal. In some embodiments, the ADL 3800 can support at least one of an S0, S1, S2, SH0, SH1, A0, A1, or A3 mode. In the present disclosure, as an illustrative example, the ADL includes 135 nm aluminum IDTs on top of a suspended 800 nm X-cut or Y-cut LiNbO$_3$ thin film (e.g, the piezoelectric thin film 3802). In some embodiments, the piezoelectric thin film 3802 can be suspended above a carrier substrate. In other embodiments, the piezoelectric thin film 3802 can be disposed on a high acoustic impedance layer interposed between the piezoelectric thin film 3802 and the carrier substrate. The high acoustic impedance layer can be composed of at least one of silicon (Si), sapphire, fused silica, quartz, silicon carbide (SiC), diamond, aluminum nitride (AlN), aluminum oxide (Al$_2$O$_3$), tungsten, molybdenus, platinum, or combinations thereof. In other embodiments, the piezoelectric thin film 3802 can be disposed on a Bragg reflector interposed between the piezoelectric thin film 3802 and the carrier substrate. The Bragg reflector can be composed of a set of alternating layers including a first layer with a first acoustic impedance (e.g., a high acoustic impedance layer) and a second layer with a second acoustic impedance (e.g., a low acoustic impedance layer). The second acoustic impedance may be lower than the first acoustic impedance.

In some embodiments, the SH0 ADL 3800 further includes a waveguide 3860 inside of which is disposed of the piezoelectric thin film 3802, the first IDT 3816a, the second IDT 3816b, a first port 3820 coupled to the first IDT 3816a, and a second port 3822 coupled to the second IDT 3816b.

The first port 3820 is to receive the first electromagnetic signal and the second port 3822 is to output the second electromagnetic signal.

The first IDT 3816a can be an input transducer in order to convert an RF signal into an acoustic signal. The first IDT 3816a can include an input ground line 3818a, and an input signal line 3828a. The input ground line 3818a can be coupled to an input ground transduction electrode 3824a and an input acoustic reflector 3832a. In some embodiments, the input ground line 3818a can be coupled to more than one input ground transduction electrode 3824a and more than one input acoustic reflector 3832a. The input signal line 3828a can be coupled to an input signal electrode 3826a. In some embodiments, the input signal line 3828a can be coupled to more than one input signal electrode 3826a. The first IDT 3816a (e.g., the input transductor) can serve as an input port 3820 (e.g., PORT 1) for an input signal (e.g., an RF signal).

The second IDT 3816b can be an output transducer in order to convert the acoustic signal into an EM signal. The second IDT 3816b can include an output ground line 3818b and an output signal line 3828b. The output ground line 3818b can be coupled to an output ground transduction electrode 3824b and an output acoustic reflector 3832b. In some embodiments, the output ground line 3818b can be coupled to more than one output ground transduction electrode 3824b and more than one output acoustic reflector 3826b. The output signal line 3828b can be coupled to an output signal electrode 3826b. In some embodiments, the output signal line 3828b can be coupled to more than one output signal electrode 3826b.

The second IDT 3816b can be an output port 3822 (e.g., PORT 2) for an output signal (e.g., an EM signal). A gap length 3801 (L$_g$) can be defined as the distance between the first IDT 3816a and the second IDT 3816b. In some cases, the gap length 3801 can range between 0.1 mm and 6.4 mm. In other cases, the gap length 3801 can range between 0 mm to several centimeters. In other embodiments, the first IDT 3816a can be the output transducer and the second IDT 3816b can be the input transducer.

The ADL 3800 can be oriented at 10° with respect to the +y-axis of the X-cut or Y-cut LiNbO$_3$ in order to take advantage of the high phase velocity and large coupling of the SH0 mode. In some other embodiments, the device may be oriented at an angle between −10° to 30° with respect to the positive y-axis of the thin film.

Figure 38B:
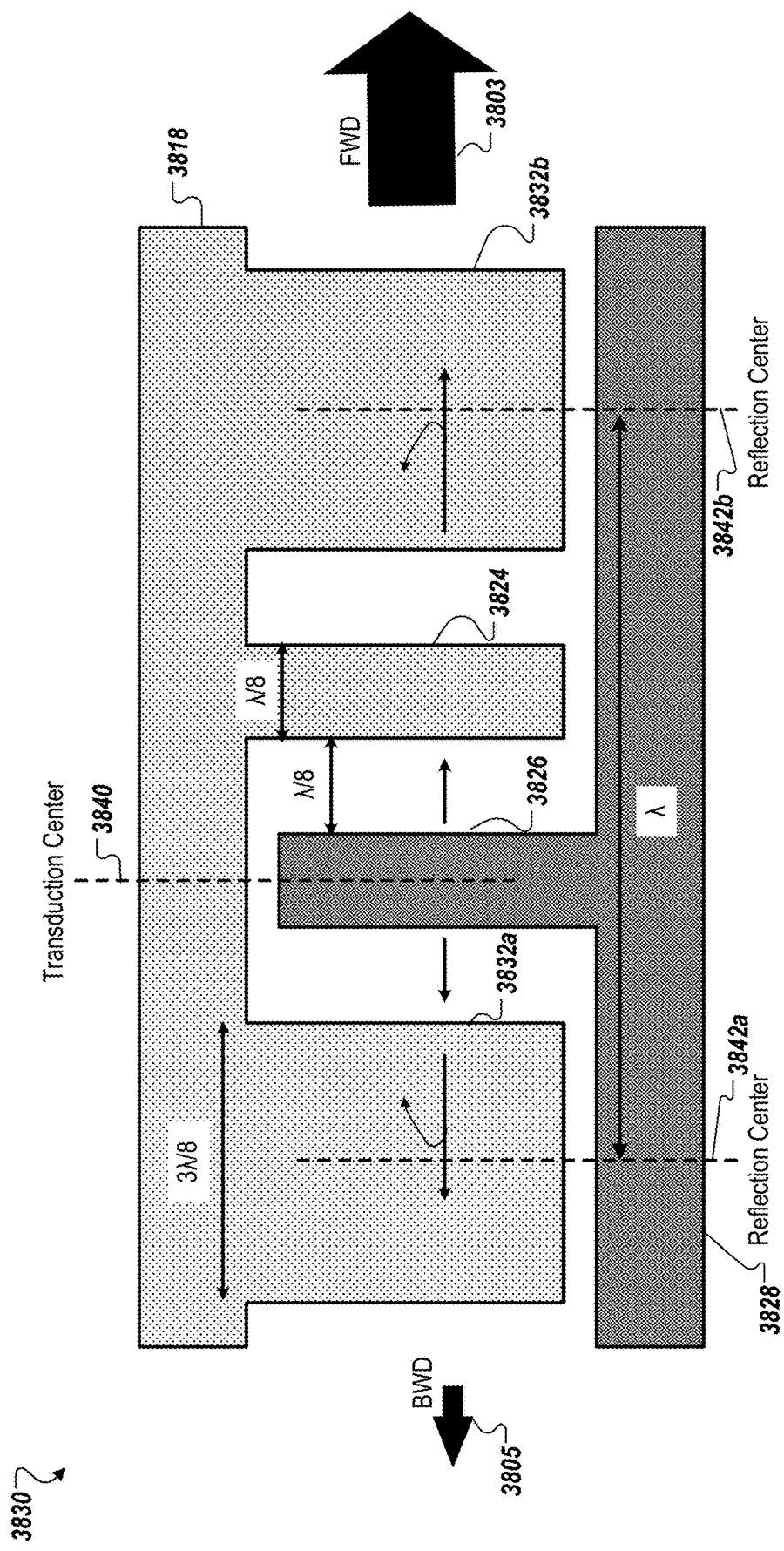
FIG. 38B is a schematic diagram of a transduction unit cell of an SH0 mode ADL according to one embodiment.

FIG. 38B is a schematic diagram of a transduction unit cell 3830 of an SH0 mode ADL according to one embodiment. In some embodiments, the transduction unit cell 3830 is a SPUDT. In some embodiments, the first IDT 3816a can be composed of at least one transducer unit cell 3830. The transducer unit cell 3830 can include a ground line 3818 coupled to the first port 3820, acoustic reflectors 3832a and 3832b coupled to the ground line 3818, a first transduction electrode 3824 coupled to the acoustic reflectors 3832a and 3832b, and to the ground line 3818 of the first port 3820, a signal line 3828 coupled to the first port 3820, and a second transduction electrode 3826 coupled to the signal line 3828 and disposed between the acoustic reflector 3832a and the first transduction electrode 3824c. A center of the second transduction electrode 3826 can be defined as a transduction center 3840. A back part (e.g., back half in one example) of the acoustic reflector 3832a is positioned at a first end of the transducer unit cell 3830 at a first distance away from the transduction center 3840, and a front part (e.g., front half in one example) of the acoustic reflector 3832b is positioned at a second end of the transducer unit cell 3830 at a second distance away from the transduction center 3840. The second distance is different from the first distance. In other embodiments, the second distance is between 40% and 95% greater than the first distance. The second transduction electrode 3826 is disposed between the front part of the acoustic reflector 3832a and the first transduction electrode 3824. As such, the transduction unit cell 3830 is between the reflection center 3842a and the reflection center 3842b.

In some embodiments, the transducer unit cell 3830 is a transducer unit cell of the SH0-mode ADL 3800 of FIG. 38A. In some embodiments, the first IDT 3816a and the second IDT 3816b on opposite ends of the ADL 3800 are SPUDTs. The first IDT 3816a and the second IDT 3816b can be composed of cascaded transducer unit cells 3830 that each includes a pair of transduction electrodes 3824 and 3826 (that are both λ/8 wide) and a distributed acoustic reflector composed of a back part (e.g., a back half in one example) of the acoustic reflector 3832a and a front part (e.g., a front half in one example) of the of acoustic reflector 3832b. Each acoustic reflector 3832a and 3832b is (3λ/8 wide) and shorted to the ground line 3818. In each transducer unit cell 3830, the two acoustic reflectors 3832a and 3832b can be arranged on opposite sides of transduction center 3840 non-symmetrically with different spacings of 3λ/8 and 5λ/8 respectively. The transduction center 3840 referred to herein is defined as the center of the second transduction electrode 3826 (e.g., the non-grounded electrode or the signal electrode). In some embodiments, a width of the back half of the acoustic reflector 3832a and a width of the front half of the acoustic reflector 3832b are less than four times greater than a width of the transduction electrodes 3824 and 3826.

In various embodiments with continued reference to FIG. 38B, after launching from the transduction center 3840, the acoustic wave propagating toward the left (e.g., the backward direction (BWD) 3805) can get partially reflected from the acoustic reflector 3832a and can start traversing in the forward (FWD) direction 3803, e.g., towards the right. As the reflected acoustic wave returns to the transduction center 3840, it may experience a total of −2π phase delay that results from a −1.5π phase delay from the propagation and a −0.5π phase delay from the reflection. In this way, the reflected acoustic wave can constructively interfere with the acoustic wave launched directly toward the FWD direction 3803. On the other hand, the acoustic wave propagating toward the FWD direction 3803 can get partially reflected from the acoustic reflector 3832a and can start traversing in the BWD direction 3805, e.g., towards the left. As the reflected acoustic wave returns to the transduction center 3840, it can experience a −2.5π phase delay from the propagation and a −0.5π phase delay from the reflection. The signal (e.g., the reflected acoustic wave) can experience a total delay of −3π upon its arrival back to the transduction center 3840 and can destructively interfere with the acoustic wave launched directly toward the BWD direction 3805. With a sufficient number of cascading reflections distributed in the unit cells, a near (e.g., approximately) perfect cancellation of the BWD wave propagation can be achieved, which can result in an effective removal of the bi-directionality in the transducers and a 6-dB reduction in the IL of the ADL.

For illustrative purposes, the SH0 mode ADL 3800 can include 135 nm aluminum IDTs on top of a suspended 80-nm LiNbO$_3$ thin film. In other embodiments the IDTs be composed of at least one of Au, Mo, Al, Pt, or other suitable conductive material. In other embodiments, the thickness of the IDTs may be between 5 nm to 10 μm and the thickness of the thin film can be between 30 nm to 100 μm. A pair of free boundaries can exist in the transverse direction for defining the acoustic waveguide. A pair of IDTs 3816a and 3816b can be located on opposite ends of the ADL 3800. The IDTs 3816a and 3816b can be composed of cascaded transducer unit cells (e.g., 3830), and each transducer unit cell includes a pair of transduction electrodes 3824 and 3826 that are each λ/8 wide and one grounded distributed acoustic reflector composed of half of acoustic reflector 3832a and half of acoustic reflector 3832b. Each acoustic reflector 3832a and 3832b is 3λ/8 wide. A transduction center 3840 is located at the center of the transduction electrode 3826 because the gap 3801 between two grounded electrodes causes no transduction. The reflection centers 3842a and 3842b are located at a center of the acoustic reflectors 3832a and 3832b, respectively, because the pair of λ/8 electrodes 3824 and 3826 causes no reflection based on the multi-reflection theory. In each transducer unit cell 3830, the transduction center 3840 can be located non-symmetrically from the acoustic reflectors 3832a and 3832b on both sides. The non-symmetry can cause a difference in the phase delay of the acoustic wave reflected from the acoustic reflectors 3832a and 3832b on both sides. It can be shown that the reflected acoustic wave propagating towards the FWD direction 3803 can constructively interfere with the acoustic wave launched directly towards FWD direction 3803, while the reflected acoustic wave propagating towards the BWD direction 3805 can destructively interfere with the acoustic wave launched directly towards BWD direction 3805. Thus, with a sufficient number of cascaded acoustic reflectors, substantial cancelation of the BWD wave propagation can be achieved, which can result in an effective removal of the bi-directionality in the transducers and an IL reduction of the ADL.

Figure 39A:
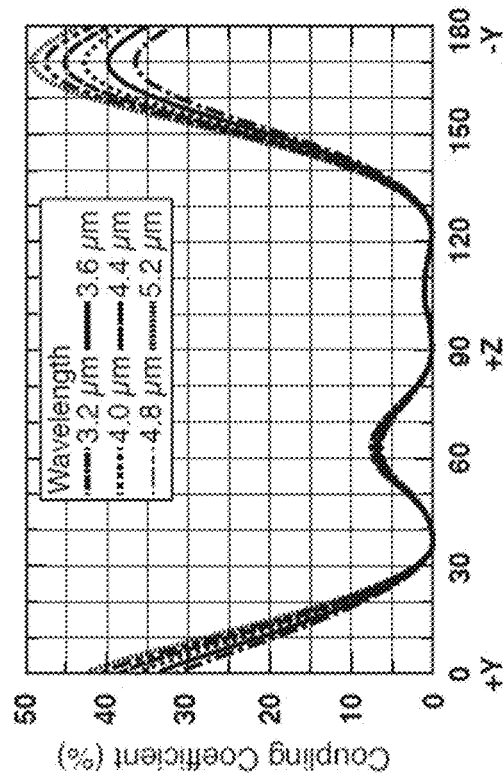
FIGS. 39A-39D are a set of graphs that illustrate the simulated characteristics of SH0-mode ADLs at different in-plane orientations in a 0.8 μm-thick X-cut $LiNbO_3$ thin film according to some embodiments.
Figure 39B:
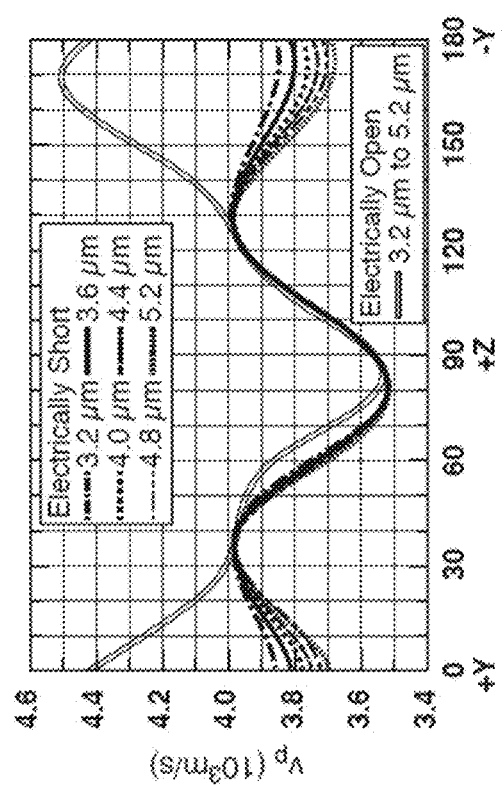
Figure 39C:
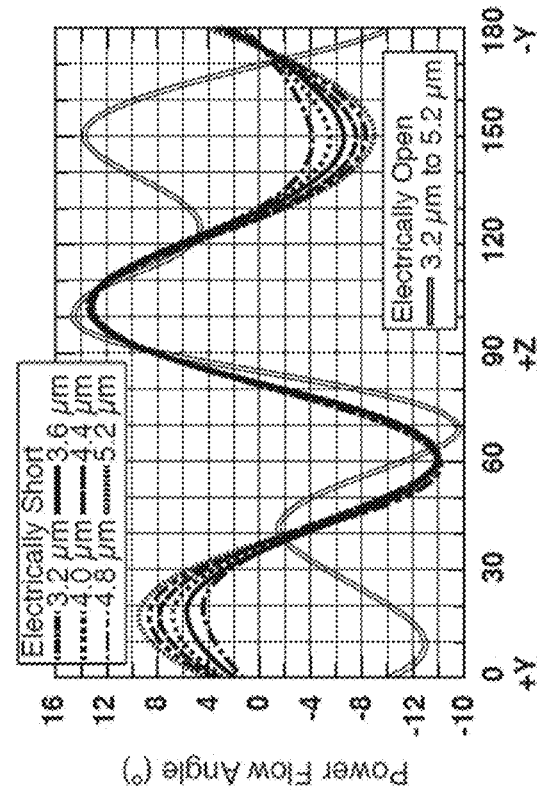
Figure 39D:
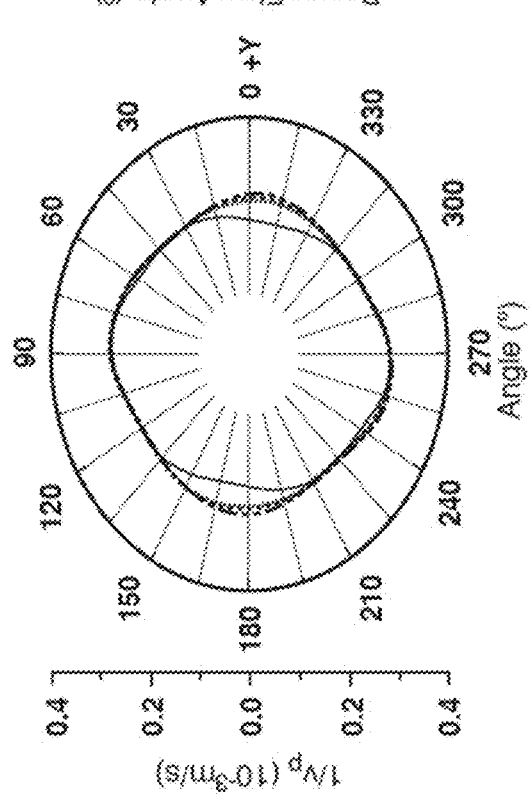

FIGS. 39A-39D are a set of graphs that illustrate the simulated characteristics of SH0-mode ADLs at different in-plane orientations in a 0.8 μm-thick X-cut LiNbO$_3$ thin film according to some embodiments. FIG. 39A illustrates the phase velocity with electrically open and short boundary conditions, FIG. 39B illustrates k$^2$, FIG. 39C is the slowness curve, and FIG. 39D illustrates a power flow angle of SH0-mode ADLs at different longitudinal wavelengths.

In the depicted embodiment, the GHz SH0-mode ADLs are oriented at −10° with respect to the +Y-axis in X-cut or Y-cut LiNbO$_3$ for two reasons. First, the SH0 mode in such orientation can take advantage of a large k$^2$. The dependence of k$^2$ on the in-plane orientation can be analyzed via finite element analysis (FEA) in COMSOL as shown in FIG. 39A, starting from the phase velocities of SH0 acoustic waves under electrically open and short boundary conditions. The phase velocity of the thin film with electrically short boundary conditions ($v_m$) may be smaller than that of the electrically open boundary condition ($v_f$), which can be caused by the piezoelectric softening effect. The dispersion of the SH0 acoustic wave near 1 GHz is also plotted in FIG. 39A. SH0 modes at a larger wavelength A may have a slower phase velocity in an electrically shorted LiNbO$_3$ film (3684-3853 m/s) while SH0 modes in an electrically open film may be barely dispersive (4504 m/s). The k$^2$ can then be calculated with the obtained phase velocities. The maximum k$^2$ can be obtained at an angle of −10° with respect to the +Y-axis as shown in FIG. 39B. Consistent with the dispersion of $v_p$, lower frequency SH0-mode acoustic waves (e.g., with larger λ) can have a slightly larger k$^2$ (40% at 1 GHz).

The second reason for the selected orientation can be to attain a small power flow angle (PFA) for the SH0-mode acoustic waves, consequently enabling ADLs with longer delays. The PFA is defined as the angle between the phase velocity and the group velocity (pointing to the phase velocity). PFAs for acoustic waves in anisotropic materials (e.g., LiNbO$_3$) may not always be zero. If the PFA is significant, the acoustic waves launched in an ADL can bounce between free boundaries in the transverse direction (e.g., see FIG. 38). For ADLs with longer delays, the acoustic energy might leak out from the bus line area (without SPUDTs for collecting the energy). The PFA can be derived from the slope of the slowness curve shown in FIG. 39C of GHz SH0 waves as and presented in FIG. 39D. The PFA of SH0 in the film with electrically open and short conditions can have different signs near the orientation with the highest k$^2$. The PFA of SH0 in a LiNbO$_3$ film with the electrically open condition can reach zero at −11° to +Y, while PFA for that with the electrically short condition can reach zero at −6° to the +Y-axis. The dispersion phenomena can also be observed, but the crossover points are similar. To summarize, due to the large k$^2$ and small PFA, GHz SH0 ADLs can be oriented at −10° to the +Y-axis in X-cut LiNbO$_3$.

FIGS. 40A-40B are a set of graphs that illustrate the performance trade-off between minimum IL and FBW of SPUDT in various platforms according to some embodiments. The design space below each curve represents a forbidden region for a platform with such characteristics. The graph of FIG. 40A shows the performance trade-off between minimum IL and FBW of SPUDT in various platforms with different coupling coefficients. FIG. 39B shows illustrate the performance trade-off between minimum IL and FBW of SPUDT in various platforms with different reflectivity per wavelength.

Based on the structure introduced in FIG. 37, the performance limitations of GHz SH0 ADLs can be evaluated. As stated in the introduction, both the performance limitations of the SH0 ADL and the frequency spacing of SH0 to the adjacent modes at GHz may be a factor for broadband applications. This subsection will investigate both aspects.

Two performance bounds, namely the piezoelectric limitation and the reflectivity limitation, can define the performance of SPUDT-based ADL. The piezoelectric limitation can set the maximum 3 dB-FBW that a device can achieve without trading off IL. The maximum FBW can be directly related to k$^2$ of the intended mode and the effective coupling efficiency of the transducer in the chosen platform. The limitation can be presented as:

$$IL = FBW^2 \cdot Q_T / c_{piezo}, \text{ when } FBW > \sqrt{c_{piezo}/Q_T} \quad (46)$$

where $$c_{piezo} = \frac{v_f - v_m}{v} \cdot \left[1 + \frac{3(v_f - v_m)}{2v}\right]. \quad (47)$$

And where $Q_T$ is the normalized quality factor of the transducer and can be determined by the transduction structure. $c_{piezo}$ is the material piezoelectric constant and can be determined by the material coupling coefficient. Especially for a design with a λ of 3.6 μm, a $Q_T$ of 0.659, $v_f$ of 4502 m/s, and $v_m$ of 3807 m/s, e.g., see FIG. 38A, the maximum coupling coefficient can be 40%. Therefore, the piezoelectric limit of GHz SH0 ADLs on the IL-FBW trade space can be plotted, with the forbidden region marked in grey, as shown in FIG. 39A. It shows a significantly enlarged design space (up to 65%) when compared with a conventional piezoelectric platforms with lower k$^2$ (<10%).

The second performance limitation may be caused by the finite attainable unidirectionality provided by the embedded reflectors. To achieve a certain IL, more reflectors (thus more cells) may be needed for a platform with less reflectivity per cell. An increased number of cells can lead to narrower bandwidth of the transfer functions (FBW~1/N). Such a performance bound can be expressed as:

$$IL = 1 - e^{-\Gamma_\lambda / FBW}, \quad (48)$$

where $\Gamma_\lambda$ is the reflection per wavelength and can be calculated based on the mechanically induced refection ($\Gamma_m$) and electrically induced reflection ($\Gamma_e$) as:

$$\Gamma_\lambda = \frac{\Gamma_m + \Gamma_e}{1 + \Gamma_m \cdot \Gamma_e} \quad (49)$$

$$\Gamma_m = \Gamma_{su} e^{j\alpha} \frac{1 - e^{-j2\alpha}(1 - \Gamma_{su}^2)}{1 - \Gamma_{su}^2 e^{-j2\alpha}} \quad (50)$$

$$\Gamma_e = \Gamma_{0\infty} e^{j\alpha} \frac{1 - e^{-j2\alpha}(1 - \Gamma_{0\infty}^2)}{1 - \Gamma_{0\infty}^2 e^{-j2\alpha}}, \quad (51)$$

where $\Gamma_{su}$ and $\Gamma_{0\infty}$ are the step-up mechanical and electrical reflection coefficient in the interface between the metalized and un-metallized sections respectively. α is the electrical width of the reflector, which can be 3π/4 for a SPUDT according to one embodiment. $\Gamma_{su}$ can be extracted from the COMSOL FEA simulation, using a mechanical scattering parameter approach explained in. For one specific design with 135 nm Al on 800 nm LiNbO$_3$, $\Gamma_{su}$ is −0.047. Thus, $\Gamma_m$ can be calculated as −0.066 j. The imaginary part may refer to a −90° phase difference for the reflected wave. $\Gamma_{0\infty}$ can be extracted from $v_m$, and $v_f$. For $v_f$ of 4502 m/s, and $v_m$, of 3807 m/s (e.g., see FIG. 38A), $\Gamma_{0\infty}$ is −0.084. Thus, $\Gamma_e$ is calculated to be −0.118 j. Using Eq. (49), $\Gamma_\lambda$ is −0.183 j. Such $\Gamma_\lambda$ may be considerably larger than that of the incumbent SAW technology (−0.06 j), which may be collectively contributed to by the larger $\Gamma_m$ from the larger k$^2$ and larger $\Gamma_m$ from the suspended thin film structure. The design space is shown by FIG. 39B on the IL-FBW tradeoff figure with the forbidden region marked in grey. It can be seen that for GHz SH0 mode ADLs, the achievable reflectivity may be the limiting factor, and the minimum IL for ADLs with FBW of 4%, 8%, 16%, and 32% are 0.1 dB, 0.9 dB, 3.2 dB, and 7.2 dB, respectively, which have surpassed the theoretical limits of some SAW ADLs, according to some embodiments. It is noteworthy that these performance limits are first-order estimations based on the continuity approximation, and more accurate IL-FBW trade-off will be presented in the next subsection using FEA.

Figure 41A:
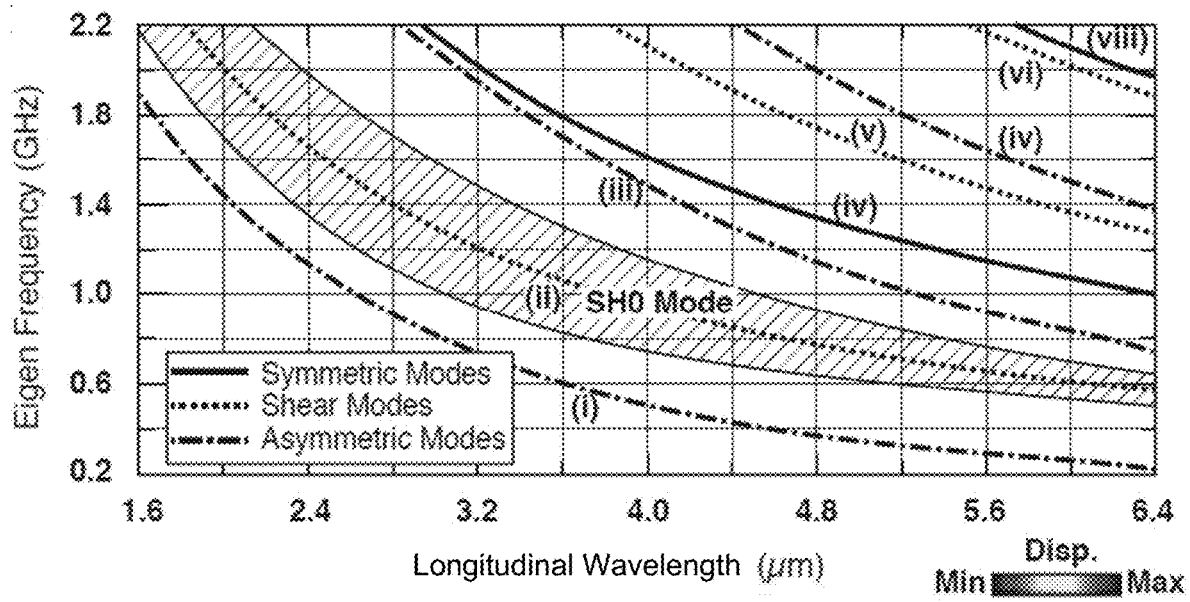
FIGS. 41A-41C are a set of graphs that illustrate dispersion curves of different modes in an 800 nm-thick X-cut or Y-cut $LiNbO_3$ thin film, sorted into symmetrical, shear, and asymmetrical modes according to some embodiments.
Figure 41B:
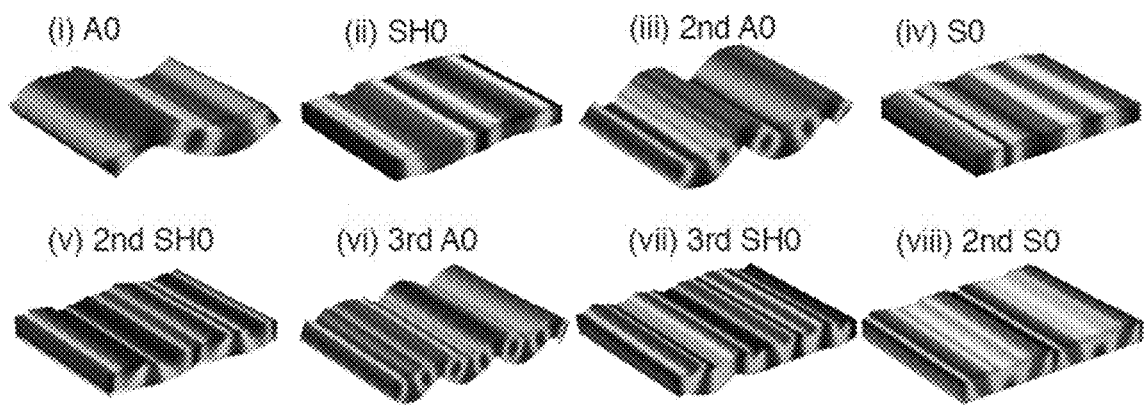
Figure 41C:
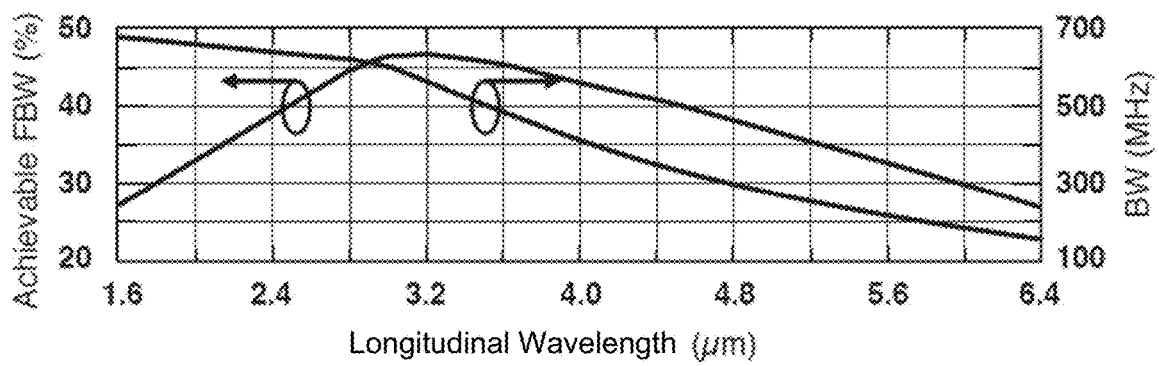

FIGS. 41A-41C are a set of graphs that illustrate dispersion curves of different modes in an 800 nm-thick X-cut or Y-cut LiNbO$_3$ thin film, sorted into symmetrical, shear, and asymmetric modes according to some embodiments. The achievable BW (SH0 mode) is highlighted in FIG. 41A. FIG. 41B shows displacement mode shapes of different modes as labeled in the dispersion curve according to one embodiment. FIG. 41C shows extracted achievable FBW and BW with different λ according to one embodiment. An additional factor for enabling broadband ADLs may be the frequency spectral spacing between the mode of interest and the adjacent modes. If the passbands of the primary mode and the spurious modes partially overlap, the ADL performance degradation may occur for two causes. First, over the overlapped frequency range, the spurious modes may distort the transmission and reflection as part of the energy may be coupled into the undesired mode, introducing ripples in the scattering parameters. Second, the spurious modes may cause notable ripples in the group delay due to the fact that different modes can have different phase velocities and thus produce various group delays.

FEA can be used to identify the dispersion curves of various modes in a single SPUDT cell with λ between 1.6 μm and 6.4 μm (SH0 eigenfrequency 0.6-2 GHz). Periodic boundary conditions can be applied to the longitudinal edges. The dispersion curves of asymmetric modes, shear modes, and symmetric modes are plotted in FIG. 40A with their displacement mode shapes presented in FIG. 40B. Due to the dispersion of the modes in thin film LiNbO$_3$, the spectral spacing between the SH0 and the first-order A0 modes may set the maximum FBW at shorter wavelengths, while the spectral spacing between the SH0 and second-order A0 modes may set the maximum FBW at longer wavelengths. The maximum achievable FBW can be quantitatively calculated based on the admittance transfer function of a pair of IDTs with the cell number N(>1), approximated as:

$$|H(\omega)| = \omega h_0 e^{-j\beta L} \cdot \text{sinc}^2(N_t \beta W_p), \quad (52)$$

where ω is the angular frequency, $h_0$ is a coupling constant related to the material properties and acoustic wave mode, L is the distance between the center of the transducers, $N_t$ is the number of the transducer pitches, $W_p$ is the pitch width, β is the wave vector (2π/λ), and sinc is the sampling function. Such an admittance transfer function follows the sinc-squared function, and the bandwidth is inversely proportional to N and independent of the $k^2$ of the mode. In other words, for an ADL with a specific topology, different modes can have the same bandwidth. Based on the above analysis, the maximum achievable FBW of GHz SH0-mode ADLs can be approximated as:

$$FBW_{max} = 2 \cdot \min\left(\frac{f_{SH0} - f_{A0}}{f_{SH0} + f_{A0}}, \frac{f_{2nd\_A0} - f_{SH0}}{f_{2nd\_A0} + f_{SH0}}\right) \quad (53)$$

where $f_{SH0}$, $f_{A0}$, and $f_{2nd\_A0}$ are the eigenfrequencies of the SH0, the A0, and the second-order A0 modes respectively. The calculated FBW is plotted in FIG. 41C, reaching a maximum of 46.7% at λ=3.2 μm. The FBW can be above 30% for devices between 0.6 to 2 GHz, demonstrating a vast design space across different frequencies from 1 to 2 GHz as highlighted in FIG. 41A. The absolute BW is also presented in FIG. 4C, showing its increase towards the GHz frequency range and saturation at approximately 2 GHz which may be due to the decrease in FBW. The frequency at which the BW begins to saturate may be determined by the film thickness. Wider FBW and BW can be expected for higher frequency SH0 ADLs built on thinner LiNbO$_3$ films. For a first demonstration of broadband GHz SH0 ADLs, 800 nm LiNbO$_3$ may be selected based on fabrication capabilities.

Figure 42A:
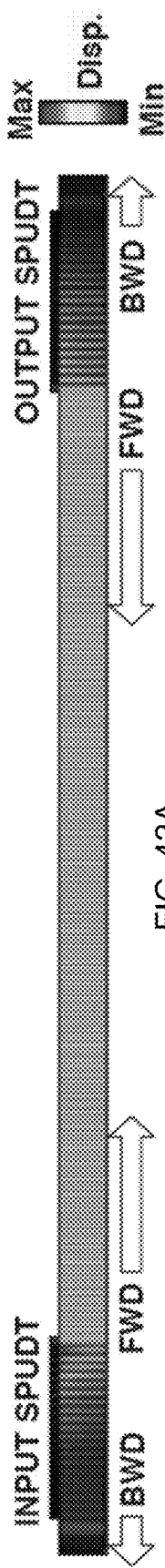
FIGS. 42A-42E are a set of graphs that illustrate the simulated performance of the GHz SH0 ADLs with a 36 μm cell length, the same gap length of 0.4 mm, but different numbers of SPUDT cells (3, 5, 10, and 20) according to some embodiments.
Figure 42C:
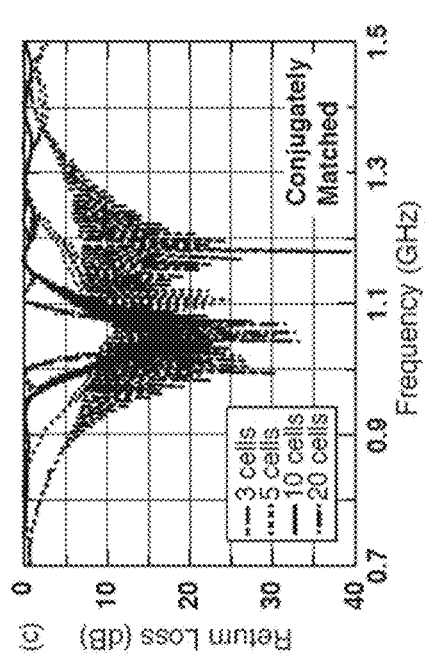
Figure 42B:
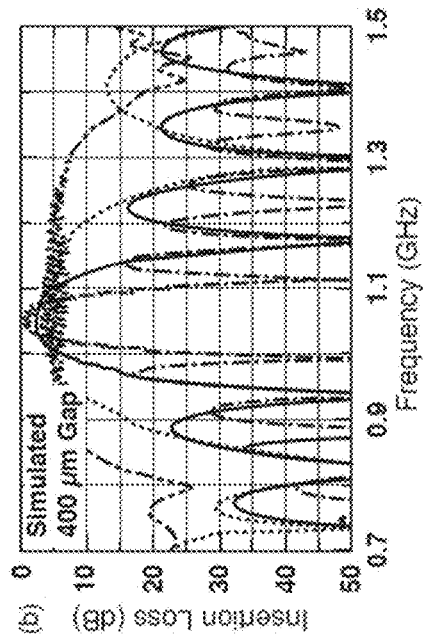
Figure 42E:
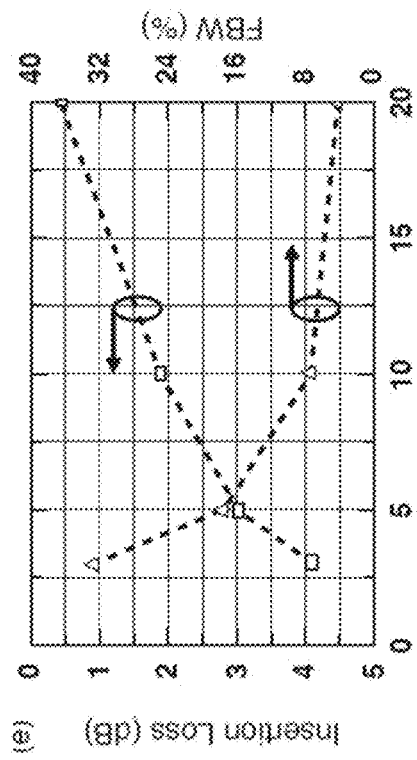
Figure 42D:
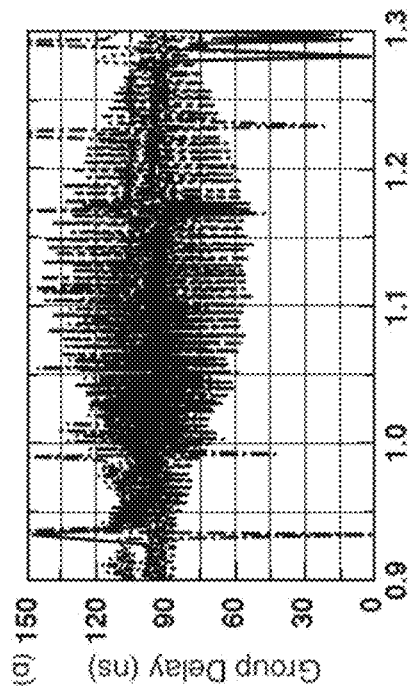

FIGS. 42A-42E are a set of graphs that illustrate the simulated performance of the GHz SH0 ADLs with a 36 μm cell length, the same gap length of 0.4 mm, but different numbers of SPUDT cells (3, 5, 10, and 20) according to some embodiments. FIG. 42A is the cross-sectional mode shape depicting the unidirectionality of the SPUDT transducers for an ADL with 20 cells and a gap length of 0.4 mm. It should be noted that as depicted, the thickness of the cross-section may be exaggerated. FIG. 42B shows the IL, FIG. 42C shows the RL, FIG. 42D shows the group delay, and FIG. 42E shows the extracted IL and FBW, illustrating their trade-off according to one embodiment.

After theoretically investigating the design space of broad-band SH0 ADLs in LiNbO$_3$, COMSOL FEA can be used to capture the intricacies and understand the frequency domain responses. Two-dimensional (2D) simulations can be set up with periodic boundary conditions applied to the transverse edges for both the mechanical and electrical domains. Perfectly matched layers can applied to the longitudinal ends of the ADL. The simulation assumes lossless conditions in both the electrical and mechanical domains.

In the simulation, the film stack can be set as 135 nm-thick aluminum electrodes on an 800 nm-thick single crystal X-cut or Y-cut LiNbO$_3$ according to an embodiment. A can be set to be 3.6 μm, the gap length ($L_g$) can be 0.4 mm, while the cell number (N) can vary from 3 to 20. FIG. 42A shows the displacement mode shape of the ADL at the center frequency, demonstrating minimum power flow towards the BWD and thus validating the unidirectionality of the SPUDT. FIG. 42B and FIG. 42C show the simulated IL and RL with the ports conjugately matched, respectively. The IL-FBW trade-off can be clearly observed and is summarized in FIG. 42E. For a 3-cell ADL, the IL can be 4 dB, and the 3 dB FBW can be 32.7%, while for 20 cell ADL, the IL can be 0.4 dB and the 3 dB FBW can be 4.6%. These results show an improved IL-FBW design space in comparison to state of the art (SOA) in one embodiment. FIG. 42D shows the group delays, exhibiting around 100 ns for the miniature ADLs shorter than 0.6 mm. The ripples in the passband may be caused by a combination of the internal reflections in the SPUDT and the lack of adequate unidirectionality in the SPUDT with fewer cell numbers. The group delay flatness can be further improved by weighting the transduction centers and reflection centers within a transducer and also by increased the reflectivity per reflector.

To summarize, the SPUDT ADL design is first presented based on the analysis of $k^2$, velocity, and PFA of SH0 at GHz. A maximum achievable FBW is then presented based on both the IL-FBW tradeoff of SPUDT designs (coupling and reflectivity limitations) and the analysis of the mode space. Finally, FEA can be used to investigate the design intricacies and to obtain the frequency response.

FIGS. 43A-43F are optical microscope images of the fabricated SH0-mode ADLs according to some embodiments. FIG. 43A is a zoomed-out image of an ADL with a 20-cell SPUDT with a wavelength Λ of 36 μm, and a gap length $L_g$ of 0.1 mm. FIG. 43B is a zoomed-out image of an ADL with a 3-cell SPUDT with Λ of 36 μm, and $L_g$ of 0.4 mm. FIG. 43C, FIG. 43D, FIG. 43E, and FIG. 43F are zoomed-in images of a SPUDT with N between 3 to 20 cells with Λ of 36 μm. The relevant parameters are shown in Table 5 below.

TABLE 5

| Symbol | Parameter | Value | Symbol | Parameter | Value |
|---|---|---|---|---|---|
| λ | Cell length (μm) | 3.2-5.2 | $W_a$ | Aperture width (μm) | 50 |
| N | Number of cells | 3-20 | $W_d$ | Device width (μm) | 86 |

TABLE 5-continued

| Symbol | Parameter | Value | Symbol | Parameter | Value |
|---|---|---|---|---|---|
| $L_g$ | Gap length (mm) | 0.1-1.6 | $L_T$ | Transducer length (μm) | 10.8-104 |
| $T_{LN}$ | LiNbO3 thickness (nm) | 800 | $T_{Al}$ | Aluminum thickness (nm) | 135 |

The devices may be in-house fabricated, according to one embodiment. An 800 nm X-cut LiNbO$_3$ thin film on a 4-inch Si wafer can be provided by NGK Insulators, Ltd. for the fabrication, according to one embodiment. The optical images of fabricated ADLs are shown in FIGS. 43A-43F. The ADLs show no visible warping under a microscope, as shown in FIG. 43A and FIG. 43B. The SPUDT transducers may be well defined with high fidelity as shown in FIG. 43C and FIG. 43D. The relevant design parameters, in particular, the cell length (λ), the gap length ($L_g$), and the number of cells (N) are labeled, and their typical values are presented in Table 5.

Five groups of SH0 ADLs, as shown in Table 5, are designed to provide an understanding of broadband performance space. ADLs in Group A have the same transducer design (λ and N) but different $L_g$, for identifying the propagation parameters of SH0 at gigahertz frequencies. Group B includes ADLs with the same N of 20 and $L_g$ of 0.1 mm, but different), for exploring the frequency scalability and also validating the dispersion presented in FIG. 41. The minimum A may be limited to 3.2 μm due to present fabrication capabilities. Groups C and D are similar to Group B, but with a different number of transducer unit cells N, in particular, of 10 and 5 respectively, demonstrating the dependence of IL and FBW on N. A set of ADLs with a maximum FBW of 34.3% and a group delay of 100 ns can be demonstrated by the ADLs of Group E. Measured results and discussions will be presented in the next section.

TABLE 6

| Index | Cell Length (μm) | Gap Length (mm) | No. of Cells | Meas. Fig. | Comments |
|---|---|---|---|---|---|
| Group A | 3.6 | 0.1-1.6 | 20 | 7 | Gap Length |
| Group B | 3.2-5.2 | 0.1 | 20 | 8-9 | Cell No. & Wavelength |
| Group C | 3.2-5.2 | 0.1 | 10 | 10 | Cell No. & Wavelength |
| Group D | 3.2-5.2 | 0.1 | 5 | 11 | Cell No. & Wavelength |
| Group E | 3.6 | 0.4 | 3-20 | 12-13 | Broadband ADL |

Figure 44A:
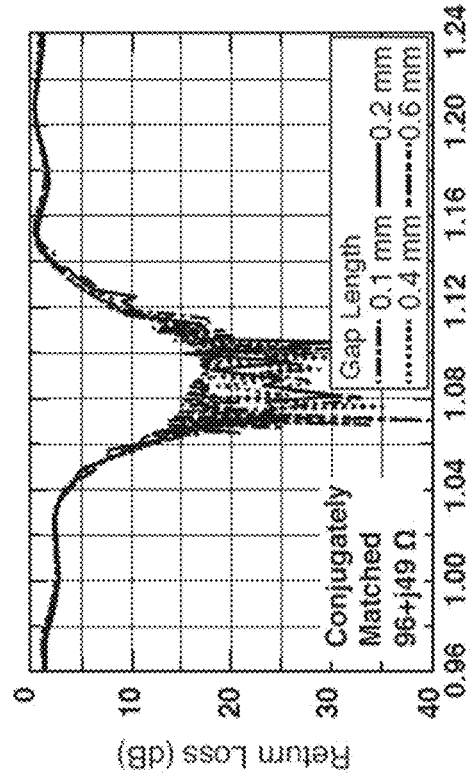
FIGS. 44A-44D are a set of graphs that show the measured S-parameters of SH0-mode ADLs (Group A, N=20, λ=36 μm) with identical transducers but different gap lengths, $L_g$ (0.1-16 mm) according to some embodiments.
Figure 44B:
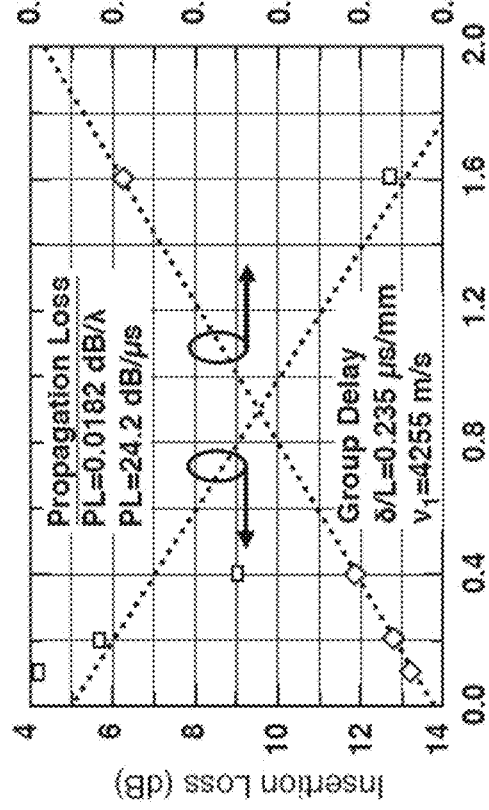
Figure 44C:
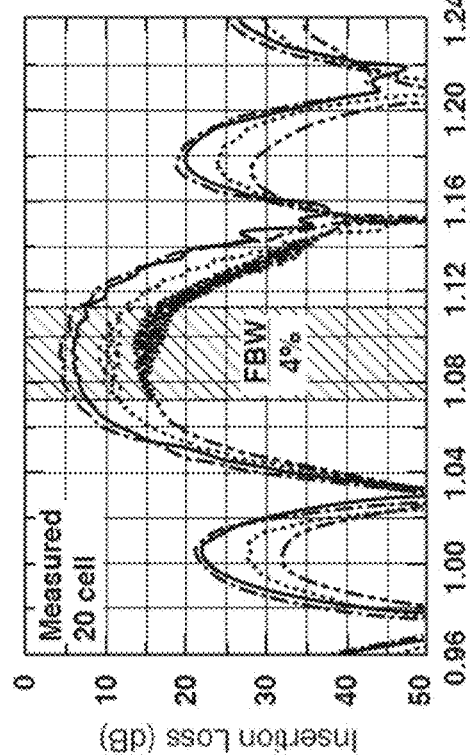
Figure 44D:
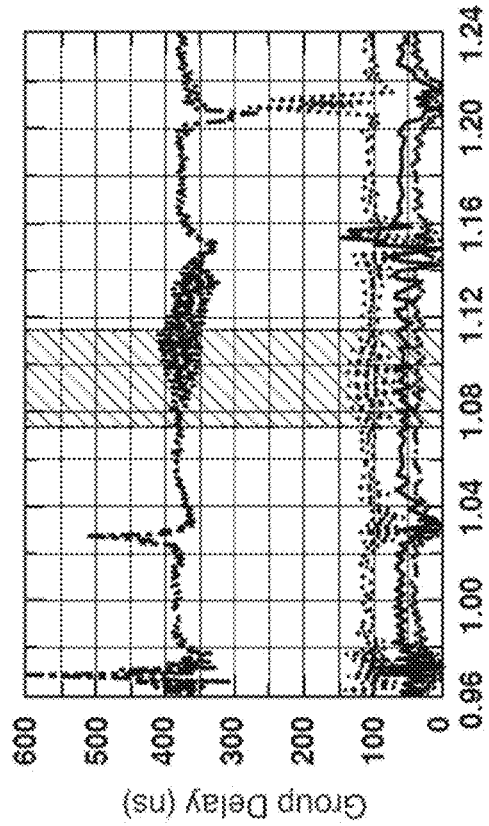

FIGS. 44A-44D are a set of graphs that show the measured S-parameters of SH0-mode ADLs (Group A, N=20, λ=36 μm) with identical transducers but different gap lengths, $L_g$ (0.1-16 mm) according to some embodiments. FIG. 44A shows the IL, FIG. 44B shows the RL, and FIG. 44C shows group delay responses. FIG. 44D shows the extracted propagation loss (242 dB/μs), and phase velocity (4255 m/s) of the SH0 mode for an ADL with 800 nm X-cut or Y-cut LiNbO$_3$ at 1.1 GHz.

The fabricated ADLs can be measured with a vector network analyzer (VNA) at the −10 dBm power level in air, and then conjugately matched using Keysight Advanced Design System. The ADLs in Group A (N=20, λ=3.6 $L_g$=0.1-1.6 mm) can be designed for investigating the propagation characteristics of SH0-mode acoustic waves at gigahertz frequencies and demonstrating longer delays. The measured IL and RL are shown in FIG. 44A and FIG. 44B with the ports conjugately matched, in one embodiment. The ADLs show a passband centered at 1.09 GHz. A minimum IL of 4.2 dB and a 3 dB FBW of 4% can be achieved for an ADL with a 0.1 mm gap length. An increase in the IL can be observed for longer ADLs, which can be caused by the PL of SH0 in the LiNbO$_3$ waveguide and the additional power loss due to a slight PFA caused by an angular misalignment. Group delays between 42 ns and 391 ns can be obtained, as shown in FIG. 44C. The in-band ripples observed for group delays in FIG. 44C may have the same source as the ripples in the IL of FIG. 44A.

The propagation characteristics can be experimentally extracted, as shown in FIG. 44D, which shows a PL of 24.2 dB/μs and phase velocity of 4255 m/s for the SH0 mode in 800 nm X-cut or Y-cut in LiNbO$_3$ at 1.1 GHz, in one embodiment. The PL may be higher than that of S0 mode at the same frequency, which is in agreement with the comparison in PL between S0 and SH0 at lower frequencies. The phase velocity of SH0 may be slower than that of S0 mode, which can lead to a shorter ADL for the same desired delay. It is worth noting that the current PL may be exacerbated by a non-zero PFA. For example, the increased IL for the device with 0.4 mm $L_g$ may likely be caused by the non-zero PFA, leading to an additional energy loss of no less than 1.9 dB. The effects can be mitigated by implementing a wider aperture or slanted electrodes.

FIGS. 45A-45C are a set of graphs that show the measured performance of the ADLs (Group B, N=20, $L_g$=0.1 mm) with different λ (32-52 μm) or center frequencies according to some embodiments. FIG. 45A shows the IL. FIG. 45B shows the RL. FIG. 45C shows the measured group delays of different ADLs in their passbands. The ADLs in Group B (N=20, $L_g$=0.1 mm, λ=3.2-5.2 μm) are designed for investigating the frequency scalability and also to validate the dispersion curves. The fabricated 20-cell ADLs can exhibit passbands ranging from 0.7 GHz to 1.2 GHz, with a 3 dB-FBW of 4%. An IL of 3.5 dB can be achieved for the 0.7 GHz ADL, while an IL of 4.4 dB can be attained for the 1.2 GHz ADL. The increasing IL at higher frequencies can be caused by an increasing loss in both the electrical domain (larger series resistance in the IDTs and dielectric loss in LiNbO$_3$) and the mechanical domain (larger PL). Delays of approximately 40 ns can be obtained, with in-band ripples that may be caused by a finite directionality and the internal reflections of a SPUDT.

FIGS. 46A-46F are a set of graphs that illustrate the measured wideband performance of different ADLs in Group B according to some embodiments. FIG. 46A, FIG. 46B, and FIG. 46C show the IL. FIG. 46D, FIG. 46E, and FIG. 46F show the RL. Adjacent modes can exist as predicted in FIGS. 41A-41C. The wideband performance of the SH0-mode ADLs is presented in FIGS. 46A-46F. A highly dispersive nature of different modes in the thin-film LiNbO$_3$ can be observed, since the first-order A0 mode is closer to the SH0 mode for shorter), while the second-order A0 mode is closer to the SH0 mode for longer Λ. A clean spectrum without spurious modes in the adjacent spectrum can be observed, which can enable wider FBW ADLs.

ADLs in Group C (N=10, $L_g$=0.1 mm, λ=3.2-5.2 μm) and Group D (N=5, $L_g$=0.1 mm, λ=3.2-5.2 μm) can be designed for investigating the impact of cell numbers (N) on the fractional bandwidth, when compared with ADLs in Group B (presented in the description of FIGS. 45A-45C). The fabricated 10-cell ADLs (e.g., those of Group C, FIGS. 46C and 46D) have a 3 dB-FBW of 8%, a minimum IL of 5.1 dB at 0.7 GHz, and a maximum IL of 5.6 dB at 1.1 GHz, with group delays of approximately 30 ns.

FIGS. 47A-47C are a set of graphs that illustrate the measured performance of the ADLs (Group C, N=10, $L_g$=0.1 mm) with different λ (3.2-5.2 μm) or center frequencies according to some embodiments. FIG. 47A is the IL. FIG. 47B is the RL. FIG. 47C is the measured group delays of different ADLs in their corresponding passbands. The fabricated 5-cell ADLs (e.g., Group D, FIGS. 47A-47C) have a 3 dB-FBW of 18%, a minimum IL of 4.8 dB at 0.7 GHz, and a maximum IL of 5.5 dB at 1.2 GHz, with group delays around 25 ns.

FIGS. 48A-48C are a set of graphs that illustrate the measured performance of the ADLs (Group C, N=5, $L_g$=0.1 mm) with different λ (32-52 μm) or center frequencies according to some embodiments. FIG. 48A is the IL. FIG. 48B is the RL. FIG. 48C is the measured group delays of different ADLs in their corresponding passbands.

When comparing ADLs in Groups B, C, and D, four differences can be observed. First, the IL of ADLs with more cells tend to be smaller, which may be due to a greater amount of energy propagating towards the FWD direction caused by more reflectors (e.g., larger N). Second, the FBW of ADLs with more cells tends to be smaller, which may be a direct result of a narrower band transfer function (e.g., see Eq. 52). The above two results agree with the IL-FBW trade-off. Third, group delays tend to be longer for devices with more cells, due to longer transducers in those devices. Finally, ADLs with fewer cells tend to have larger ripples in the IL and group delay, because the triple travel signal (TTS) may not be effectively suppressed due to a lack of directionality in the SPUDT. These results demonstrate the large design space of gigahertz SH0 ADLs for various applications with different specifications.

FIGS. 49A-49D are a set of graphs that illustrate the measured performance of the ADLs (Group E, λ=36 μm, $L_g$=04 mm) with different N(3-20) or FBW according to some embodiments. FIG. 49A is the IL. FIG. 49B is the RL. FIG. 49C is the measured group delays of different ADLs in their passbands. FIG. 49D is the extracted IL and FBW illustrating the trade-off on their respective use.

Due to the existence of PL, the TTS can experience approximately three times larger PL when compared to the main signal. Therefore, for ADLs with larger PL due to longer delays, the in-band ripples in IL and group delay can still be relatively small for devices with even broader FBW (e.g., fewer cells). The ADLs in Group E ($L_g$=0.4 mm, λ=3.6 μm, N=3-20) can be designed to investigate the performance of ADLs with even broader FBW when a significant delay exists.

The measured IL and RL are presented in FIG. 49A and FIG. 49B with ports conjugately matched, in one embodiment. For the ADL with 20 cells, an IL of 9.0 dB and a 3-dB FBW of 3.9% can be obtained, while for the device with 3 cells, an IL of 11.3 dB and an FBW of 34.3% are shown. The extracted IL-FBW tradeoff is presented in FIG. 49D, showing the same trend as simulated, e.g., in reference to FIG. 42. The group delay is presented in FIG. 49C, showing that due to PL, the wider band ADLs may not have significantly increased ripples in the passbands. The IL break down is presented in Table 7. It can be observed that the finite directionality may not be the only main contributor to SH0 ADLs at gigahertz frequencies. Additional main contributors may be the PL, additional IL due to non-zero PFA, and other loss including electrical loading from the resistance of IDTs and the dielectric loss in LiNbO$_3$.

TABLE 7

| Damping Source | 3 Cell | 5 Cell | 10 Cell | 20 Cell |
|---|---|---|---|---|
| Finite Uni-directionality | 4.0 dB | 3.0 dB | 1.9 dB | 0.4 dB |
| PL in Waveguide | 2.0 dB | 2.1 dB | 2.2 dB | 2.4 dB |
| IL due to Non-zero PFA | 1.9 dB | 1.9 dB | 1.9 dB | 1.9 dB |
| Others (e.g., Electrical Loading) | 3.4 dB | 3.9 dB | 3.6 dB | 4.3 dB |
| Total | 11.3 dB | 10.9 dB | 9.6 dB | 9.0 dB |

FIGS. 50A-50F are a series of graphs illustrating the measured wideband performance of different devices in Group E according to some embodiments. FIG. 50A, FIG. 50B, and FIG. 50C show the IL. FIG. 50D, FIG. 50E, and FIG. 50F show the RL. Large FBW can be achieved due to a large spectral spacing between the SH0 and adjacent modes. The wideband performance presented in FIG. 50 shows a clean spectrum without spurious modes in the passband, even for the device with 34.3% FBW, in one embodiment. In one embodiment, the ADL described herein is close to the calculated maximum achievable FBW at this frequency (e.g., 45%, FIG. 41). The demonstrated broadband ADLs can be enabled due to the enhanced IL-FBW design space of the SH0 mode and the clean spectrum collectively.

Figure 51A:
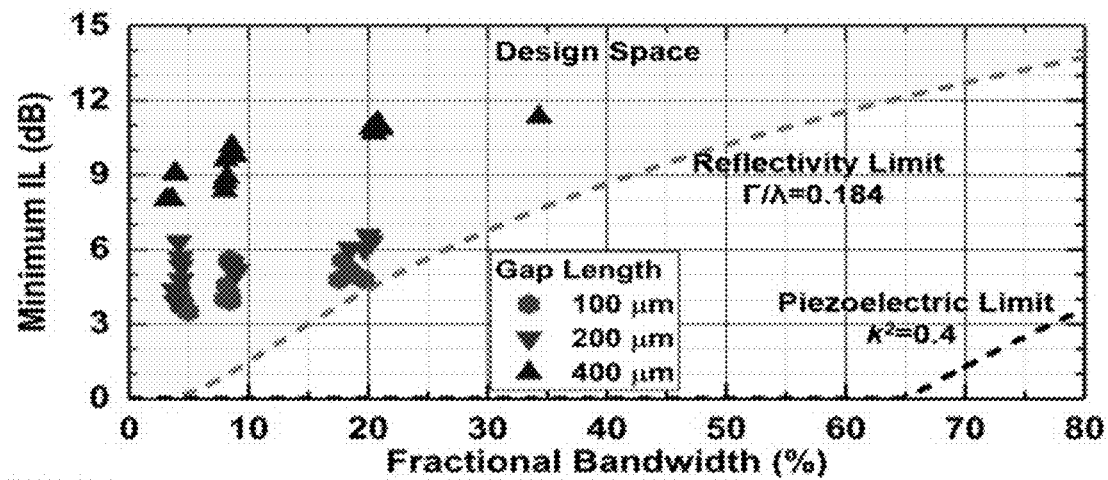
FIGS. 51A-51B are a set of graphs that illustrate a design space validation for gigahertz SH0 ADLs according to some embodiments.
Figure 51B:
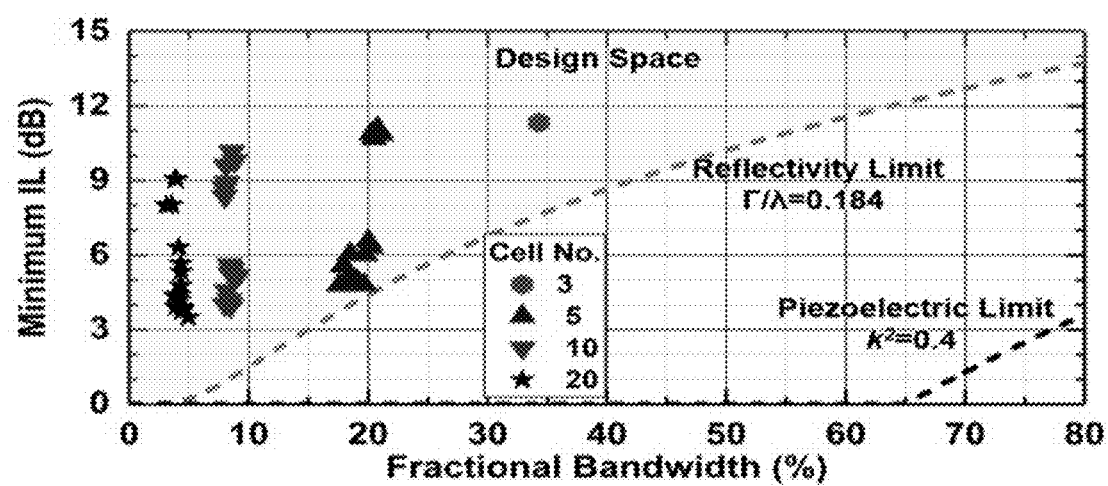

FIGS. 51A-51B are a set of graphs that illustrate a design space validation for gigahertz SH0 ADLs according to some embodiments. The demonstrated ADLs are labeled and sorted based on the gap length and cell number respectively. To better study the design space of broadband ADLs using SH0 at gigahertz frequencies, the extracted relevant parameters are plotted on the IL-FBW trade-off. The data points can be sorted based on the gap length in FIG. 51A, showing that the propagation related losses (PL and additional IL from non-zero PFA) may be the main source of the IL. The impact of cell number on the performance is presented in FIG. 51B, showing that different design specifications can be met using various applications. The demonstrated performance may surpass a SAW SOA ADL, and may open up new design space for eMBB applications.

Broadband SH0 ADLs in lithium niobate operating in the gigahertz range have been demonstrated herein. The design space of the gigahertz SH0 ADLs is fully investigated based on both the IL-FBW trade-off and the spectral spacing between the SH0 and adjacent modes, showing that the large $k^2$, large reflectivity from the thin film structure, and the clean spectrum near the SH0 mode collectively enable broadband performance. The adjacent modes can be considered modes that are adjacent to the intended mode on the frequency spectrum. In other words, adjacent modes are modes at a slightly higher or a slightly lower frequency to the intended mode. The implemented ADLs may show 3 dB fractional bandwidths ranging from 4% to 34.3%, insertion loss between 3.4 dB and 11.3 dB over the frequency range from 0.7 to 1.2 GHz. The PL and phase velocity of SH0 at 1.08 GHz are extracted as 0.0182 dB/A, and 4255 m/s, respectively. The demonstrated SH0 delay platform could potentially provide broadband passive signal processing capabilities for future eMBB applications.

Figure 52:
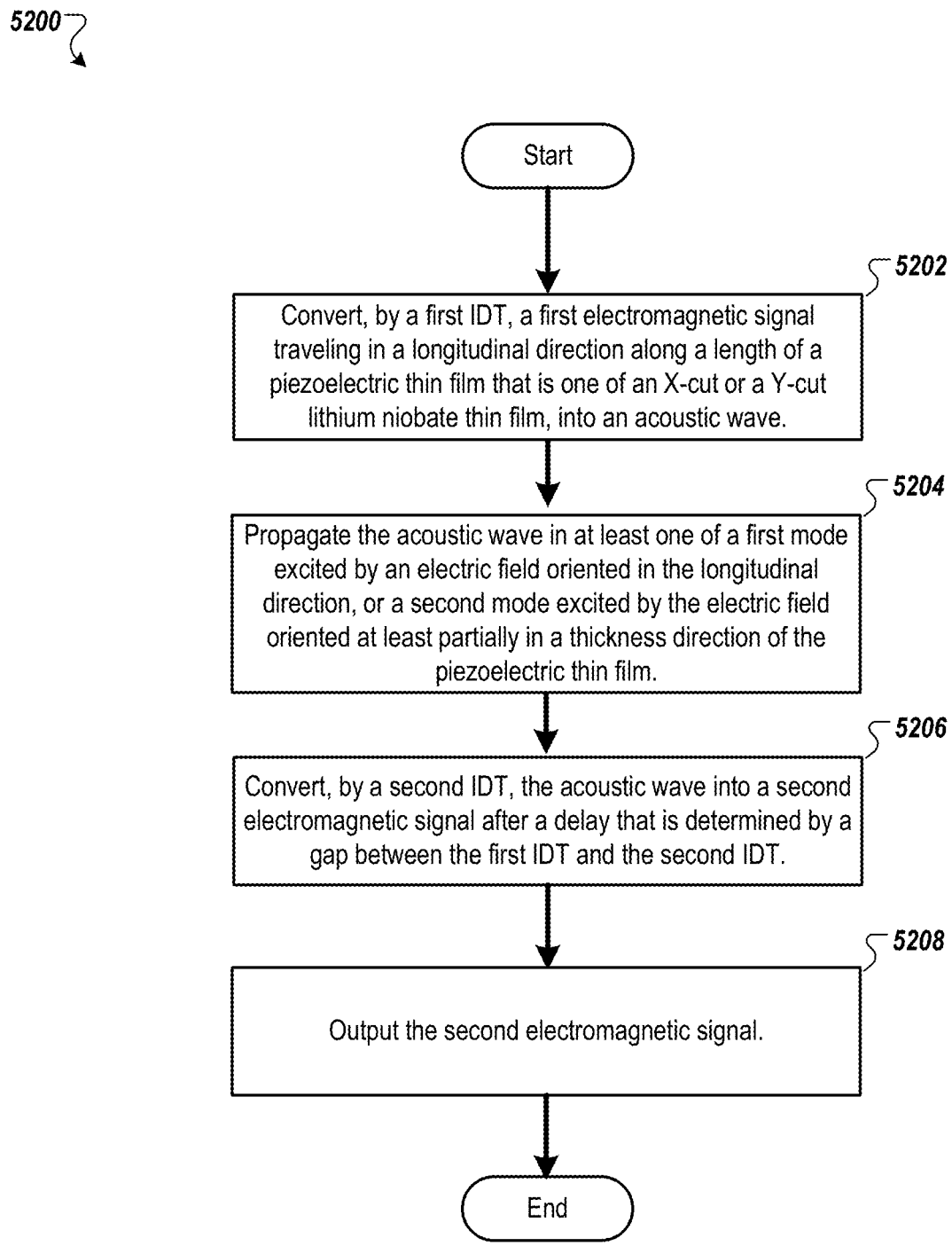
FIG. 52 is a flow diagram of a method of the operation of an ADL according to one embodiment.

FIG. 52 is a flow diagram of a method 5200 of the operation of an ADL according to one embodiment. In one embodiment, the method 5200 is performed by any of the processing devices described herein. In one embodiment, the method 5200 is performed by processing logic coupled to or located within an ADL, such as the ADL 200 described herein. In one embodiment, the ADL includes at least one of an X-cut or Y-cut lithium niobate thin film.

Referring to FIG. 52, at operation 5202, the method 5200 includes converting, by a first interdigitated transducer (IDT) disposed on a first end of a piezoelectric thin film, a first electromagnetic signal traveling in a longitudinal direction along a length of the piezoelectric thin film into an acoustic wave. The piezoelectric thin film is one of an X-cut or Y-cut lithium niobate (LiNbO$_3$) thin film located above a carrier substrate. At operation 5204, the method 5200 includes propagating the acoustic wave in at least one of: a first mode excited by an electric field oriented in the longitudinal direction; or a second mode excited by the electric field oriented at least partially in a thickness direction of the piezoelectric thin film. At operation 5206, the method 5200 includes converting, by a second IDT disposed on a second end of the piezoelectric thin film, the acoustic wave into a second electromagnetic signal after a delay determined by a gap between the first IDT and the second IDT. At operation 5208, the method 5200 includes outputting the second electromagnetic signal.

In further embodiments, the first mode is one of a fundamental symmetrical (S0) mode, a first-order symmetrical (S1) mode, or a fundamental shear-horizontal (SH0) mode and the second mode is one of a first-order antisymmetric (A1) mode or a first-order shear-horizontal (SH1) mode. In still further embodiments, a voltage potential can be applied across a signal line coupled to the first IDT to generate the electric field.

The words "example" or "exemplary" are used herein to mean serving as an example, instance, or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims may generally be construed to mean "one or more" unless specified otherwise or clear from context to be directed to a singular form. Moreover, use of the term "an implementation" or "one implementation" or "an embodiment" or "one embodiment" or the like throughout is not intended to mean the same implementation or implementation unless described as such. One or more implementations or embodiments described herein may be combined in a particular implementation or embodiment. The terms "first," "second," "third," "fourth," etc. as used herein are meant as labels to distinguish among different elements and may not necessarily have an ordinal meaning according to their numerical designation.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. An apparatus comprising:
a piezoelectric thin film located above a carrier substrate, wherein the piezoelectric thin film is one of an X-cut or a Y-cut lithium niobate (LiNbO$_3$) thin film adapted to propagate an acoustic wave in at least one of:
a first mode excited by an electric field oriented in a longitudinal direction along a length of the piezoelectric thin film; or
a second mode excited by the electric field oriented at least partially in a thickness direction of the piezoelectric thin film;
a first interdigitated transducer (IDT) disposed on a first end of the piezoelectric thin film, the first IDT to convert a first electromagnetic signal, traveling in the longitudinal direction, into the acoustic wave; and
a second IDT disposed on a second end of the piezoelectric thin film with a gap between the second IDT and the first IDT, the second IDT to convert the acoustic wave into a second electromagnetic signal, and the gap to determine a time delay of the acoustic wave before output of the second electromagnetic signal.

2. The apparatus of claim 1, wherein the first mode is one of a fundamental symmetrical (S0) mode, a first-order symmetrical (S1) mode, a fundamental shear-horizontal (SH0) mode, or a first-order antisymmetric (A1) mode.

3. The apparatus of claim 1, wherein the second mode is one of a first-order antisymmetric (A1) mode or a first-order shear-horizontal (SH1) mode.

4. The apparatus of claim 1, wherein the Y-cut LiNbO$_3$ thin film comprises one of a 128Y-cut, 54Y-cut, or 36Y-cut LiNbO$_3$ thin film and the second mode comprises a first-order symmetric (S1) mode.

5. The apparatus of claim 1, wherein the piezoelectric thin film is suspended above the carrier substrate.

6. The apparatus of claim 1, wherein the piezoelectric thin film is disposed on a high acoustic impedance layer interposed between the piezoelectric thin film and the carrier substrate, the high acoustic impedance layer comprising one of silicon (Si), sapphire, fused silica, quartz, silicon carbide (SiC), diamond, aluminum nitride (AlN), aluminum oxide (Al$_2$O$_3$), tungsten, molybdenum, platinum, or combinations thereof.

7. The apparatus of claim 1, wherein the piezoelectric thin film is disposed on a combination of a plurality of high acoustic impedance layers and a plurality of low acoustic impedance layers interposed between the piezoelectric thin film and the carrier substrate.

8. The apparatus of claim 7, wherein respective ones of the plurality of the low acoustic impedance layers are alternately disposed on respective ones of the plurality of high acoustic impedance layers.

9. The apparatus of claim 1, further comprising:
a waveguide inside of which is disposed the piezoelectric thin film, the first IDT, and the second IDT;
a first port coupled to the first IDT, the first port to receive the first electromagnetic signal; and
a second port coupled to the second IDT, the second port to output the second electromagnetic signal.

10. The apparatus of claim 9, wherein the first IDT comprises at least a transducer unit cell comprising:
a ground line coupled to the first port;
a back part of a first acoustic reflector coupled to the ground line, wherein a center of the first acoustic reflector comprises a first reflection center;
a front part of a second acoustic reflector coupled to the ground line, wherein a center of the second acoustic reflector comprises a second reflection center;
a first transduction electrode coupled to the first acoustic reflector, the second acoustic reflector, and to the ground line of the first port;
a signal line coupled to the first port; and
a second transduction electrode coupled to the signal line and disposed between the first acoustic reflector and the first transduction electrode, wherein a center of the second transduction electrode comprises a transduction center.

11. The apparatus of claim 10, wherein the first reflection center is located at a first end of the transducer unit cell at a first distance away from the transduction center, the second reflection center is located at a second end of the transducer unit cell at a second distance away from the transduction center, the second distance is different from the first distance, and wherein the first transduction electrode is located between the transduction center and the second reflection center.

12. The apparatus of claim 11, wherein the second distance is between 40% and 95% greater than the first distance.

13. The apparatus of claim 10, wherein the first transduction electrode and the second transduction electrode have a first width, and a combination of the back part and the front part of the first and second acoustic reflectors have a second width that is less than four times greater than the first width.

14. The apparatus of claim 10, wherein the first reflection center is located at a first distance from the transduction center on a first side of the transduction center and the second reflection center is located at a second distance different than the first distance from the transduction center on a second side of the transduction center, the second side being opposite from the first side such that a first plurality of components of the acoustic wave propagating toward the second reflection center interfere constructively and a second plurality of components of the acoustic wave propagating toward the first reflection center interfere destructively.

15. The apparatus of claim 1, wherein the longitudinal direction is oriented between 10 degrees clockwise and 30 degrees counterclockwise to a Y-direction of the one of the X-cut or Y-cut LiNbO$_3$ thin film.

16. A full-duplex radio comprising:
an antenna to transmit a first radio frequency (RF) signal in a first frequency range and receive a second RF signal at the first frequency range;
transmit (TX) chain circuitry coupled to the antenna;
receive (RX) chain circuitry coupled to the antenna, wherein the RX chain circuitry receives the second RF signal and a reflected portion of the first RF signal;
a directional coupler in the TX chain circuitry, the directional coupler to direct a portion of the first RF signal to the RX chain circuitry; and
a plurality of acoustic delay lines (ADLs) coupled between the TX chain circuitry and the RX chain circuitry to provide a signal delay, wherein the portion of the first RF signal experiences the signal delay and destructively interferes with the reflected portion of the first RF signal, and wherein each ADL of the plurality of ADLs comprises:
a piezoelectric thin film located above a carrier substrate, wherein the piezoelectric thin film is one of an X-cut or Y-cut lithium niobate (LiNbO$_3$) thin film adapted to propagate an acoustic wave;
a first interdigitated transducer (IDT) disposed on a first end of the piezoelectric thin film, the first IDT to convert a first electromagnetic signal, traveling in a longitudinal direction along a length of the piezoelectric thin film, into the acoustic wave; and
a second IDT disposed on a second end of the piezoelectric thin film with a gap between the second IDT and the first IDT, the second IDT to convert the acoustic wave into a second electromagnetic signal, and the gap to determine a time delay of the acoustic wave before output of the second electromagnetic signal.

17. The full-duplex radio of claim 16, wherein the acoustic wave is propagated in at least one of:
a first mode excited by an electric field oriented in a longitudinal direction along a length of the piezoelectric thin film; or
a second mode excited by the electric field oriented at least partially in a thickness direction of the piezoelectric thin film.

18. The full-duplex radio of claim 17, wherein:
the first mode is one of a fundamental symmetrical (S0) mode, a first-order symmetrical (S1) mode, a fundamental shear-horizontal (SH0) mode, or a first-order antisymmetric (A1) mode; and
the second mode is one of a first-order antisymmetric (A1) mode or a first-order shear-horizontal (SH1) mode.

19. The full-duplex radio of claim 17, wherein the Y-cut LiNbO$_3$ thin film comprises one of a 128Y-cut, 54Y-cut, or 36Y-cut LiNbO$_3$ thin film and the second mode comprises a first-order symmetric (S1) mode.

20. The full-duplex radio of claim 16, wherein the first IDT comprises at least a transducer unit cell comprising:
a ground line coupled to a first port;
an acoustic reflector coupled to the ground line;
a first transduction electrode coupled to the acoustic reflector and to the ground line of the first port, wherein a center of the first transduction electrode comprises a transduction center;
a signal line coupled to the first port; and
a second transduction electrode coupled to the signal line and disposed between the acoustic reflector and the first transduction electrode.

21. The full-duplex radio of claim 16, wherein the longitudinal direction is oriented between 10 degrees clockwise and 30 degrees counterclockwise to a Y-direction of the one of the X-cut or Y-cut LiNbO$_3$ thin film.

22. A method comprising:
converting, by a first interdigitated transducer (IDT) disposed on a first end of a piezoelectric thin film, a first electromagnetic signal traveling in a longitudinal direction along a length of the piezoelectric thin film into an acoustic wave, wherein the piezoelectric thin film is one of an X-cut or Y-cut lithium niobate ($LiNbO_3$) thin film located above a carrier substrate;

propagating the acoustic wave in at least one of:
- a first mode excited by an electric field oriented in the longitudinal direction; or
- a second mode excited by the electric field oriented at least partially in a thickness direction of the piezoelectric thin film;

converting, by a second IDT disposed on a second end of the piezoelectric thin film, the acoustic wave into a second electromagnetic signal after a delay determined by a gap between the first IDT and the second IDT; and outputting the second electromagnetic signal.

23. The method of claim 22, wherein:
the first mode is one of a fundamental symmetrical (S0) mode, a first-order symmetrical (S1) mode, a fundamental shear-horizontal (SH0) mode, or a first-order antisymmetric (A1) mode; and
the second mode is one of a first-order antisymmetric (A1) mode or a first-order shear-horizontal (SH1) mode.

24. The method of claim 22, wherein the Y-cut $LiNbO_3$ thin film comprises one of a 128Y-cut, 54Y-cut, or 36Y-cut $LiNbO_3$ thin film and the second mode comprises a first-order symmetric (S1) mode.

25. The method of claim 22, further comprising applying a voltage potential across a signal line coupled to the first IDT to generate the electric field.

* * * * *